(12) United States Patent
Kapur et al.

(10) Patent No.: US 9,379,258 B2
(45) Date of Patent: Jun. 28, 2016

(54) FABRICATION METHODS FOR MONOLITHICALLY ISLED BACK CONTACT BACK JUNCTION SOLAR CELLS

(71) Applicant: Solexel, Inc., Milpitas, CA (US)

(72) Inventors: Pawan Kapur, Burlingame, CA (US); Anand Deshpande, Cupertino, CA (US); Virendra V. Rana, Los Gatos, CA (US); Mehrdad M. Moslehi, Los Altos, CA (US); Sean M. Seutter, San Jose, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 14/493,341

(22) Filed: Sep. 22, 2014

(65) Prior Publication Data

US 2015/0171240 A1  Jun. 18, 2015

Related U.S. Application Data

(63) Continuation-in-part of application No. 14/179,526, filed on Feb. 12, 2014, which is a continuation-in-part of application No. 14/072,759, filed on Nov. 5, 2013.

(60) Provisional application No. 61/880,777, filed on Sep.

(Continued)

(51) Int. Cl.
*H01L 21/00* (2006.01)
*H01L 31/0224* (2006.01)
(Continued)

(52) U.S. Cl.
CPC .... *H01L 31/022441* (2013.01); *H01L 27/1421* (2013.01); *H01L 31/02167* (2013.01);
(Continued)

(58) Field of Classification Search
CPC ............. H01L 31/022441; H01L 31/10516; H01L 31/0516; H01L 31/1868; H01L 31/1864; H01L 27/1421
USPC .......................................................... 438/67
See application file for complete search history.

(56) References Cited

U.S. PATENT DOCUMENTS

| | | |
|---|---|---|
| 5,011,567 A | 4/1991 | Gonsiorawski |
| 5,641,362 A | 6/1997 | Meier |

(Continued)

FOREIGN PATENT DOCUMENTS

WO   WO/2014/137283   9/2014

OTHER PUBLICATIONS

Kiefer et al ,"High effeciency n-type emitter-wrap-through silicon solar cells", IEEE Journal of Photovoltaics, vol. 1, No. 1 (Jul. 2011) pp. 49-53).*

*Primary Examiner* — Caridad Everhart
(74) *Attorney, Agent, or Firm* — John Wood

(57) ABSTRACT

Fabrication methods for making back contact back junction solar cells. A base dopant source, a field emitter dopant source, and an emitter dopant source are deposited on the back surface of a solar cell substrate. The solar cell substrate is annealed forming emitter contact regions corresponding to the emitter dopant source, field emitter regions corresponding to the field emitter dopant, and base contact regions corresponding to the base dopant source. The base dopant source, field emitter dopant source, and the emitter dopant source are etched. A backside passivation layer is deposited on the back surface of the solar cell. Contacts are opened to the emitter contact regions and the base contact regions through the backside passivation layer. Patterned base metallization and patterned emitter metallization is formed on the back surface of the solar cell with electrical interconnections to the base contact regions and the emitter contact regions.

9 Claims, 106 Drawing Sheets

Related U.S. Application Data 20, 2013, provisional application No. 61/763,580, filed on Feb. 12, 2013, provisional application No. 61/859,602, filed on Jul. 29, 2013, provisional application No. 61/722,620, filed on Nov. 5, 2012.

(51) Int. Cl.
*H01L 31/0216* (2014.01)
*H01L 27/142* (2014.01)
*H01L 31/05* (2014.01)
*H01L 31/068* (2012.01)

(52) U.S. Cl.
CPC .... *H01L31/02168* (2013.01); *H01L 31/02245* (2013.01); *H01L 31/0516* (2013.01); *H01L 31/0682* (2013.01); *Y02E 10/50* (2013.01)

(56) References Cited

U.S. PATENT DOCUMENTS

| | | |
|---|---|---|
| 5,871,591 A | 2/1999 | Ruby et al. |
| 5,928,438 A | 7/1999 | Salami et al. |
| 6,429,037 B1 | 8/2002 | Wenham et al. |
| 7,820,475 B2 | 10/2010 | De ceuster et al. |
| 7,888,168 B2 | 2/2011 | Weidman et al. |
| 8,153,496 B1 | 4/2012 | Ramappa |
| 8,163,638 B2 | 4/2012 | De ceuster et al. |
| 8,409,912 B2 | 4/2013 | De ceuster et al. |
| 8,465,909 B2 | 6/2013 | Bateman et al. |
| 8,486,747 B1 | 7/2013 | Gilman |
| 2005/0172998 A1 | 8/2005 | Gee et al. |
| 2007/0264746 A1* | 11/2007 | Onishi et al. ............ 438/98 |
| 2010/0029077 A1 | 2/2010 | Barr et al. |
| 2010/0051085 A1* | 3/2010 | Weidman et al. ........ 136/244 |
| 2010/0184250 A1 | 7/2010 | Blake et al. |
| 2011/0120551 A1 | 5/2011 | Prince et al. |
| 2011/0132448 A1 | 6/2011 | Payne et al. |
| 2011/0192316 A1 | 8/2011 | Chou et al. |
| 2012/0138138 A1 | 6/2012 | Granek et al. |
| 2012/0142140 A1* | 6/2012 | Li et al. .................... 438/98 |
| 2012/0192943 A1* | 8/2012 | Vermang et al. ........ 136/256 |
| 2012/0204946 A1* | 8/2012 | Haverkamp et al. ...... 136/256 |
| 2012/0305063 A1 | 12/2012 | Moslehi et al. |
| 2013/0084715 A1* | 4/2013 | Yang ........................ 438/778 |
| 2013/0192670 A1 | 8/2013 | Hang et al. |
| 2013/0213469 A1 | 8/2013 | Kramer et al. |

* cited by examiner

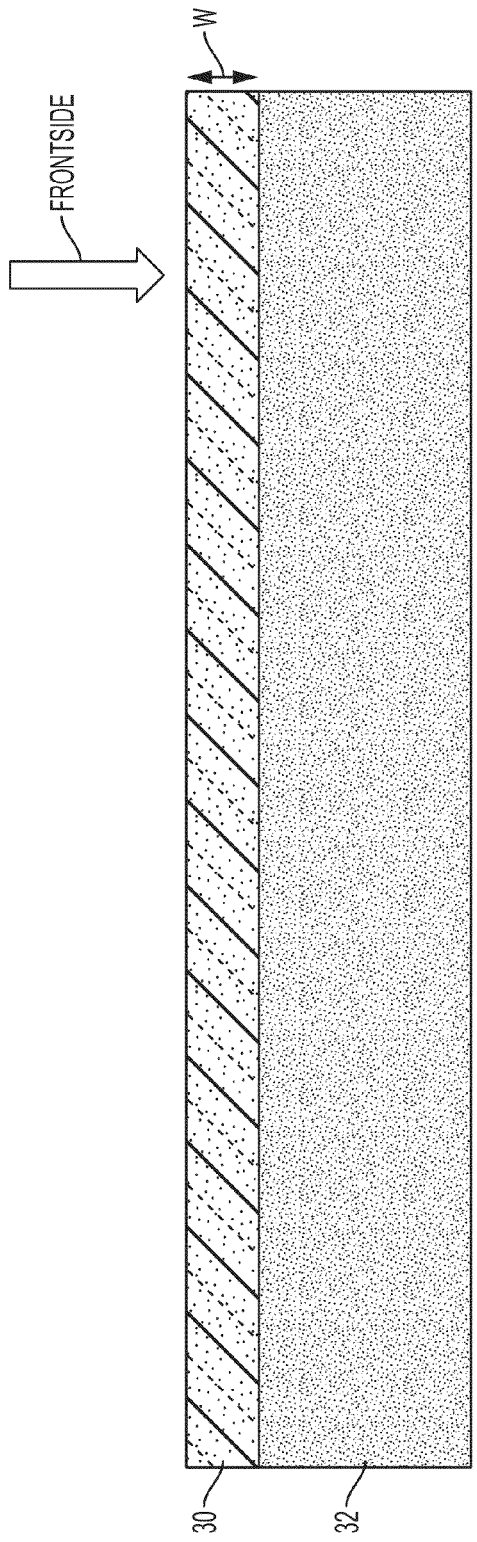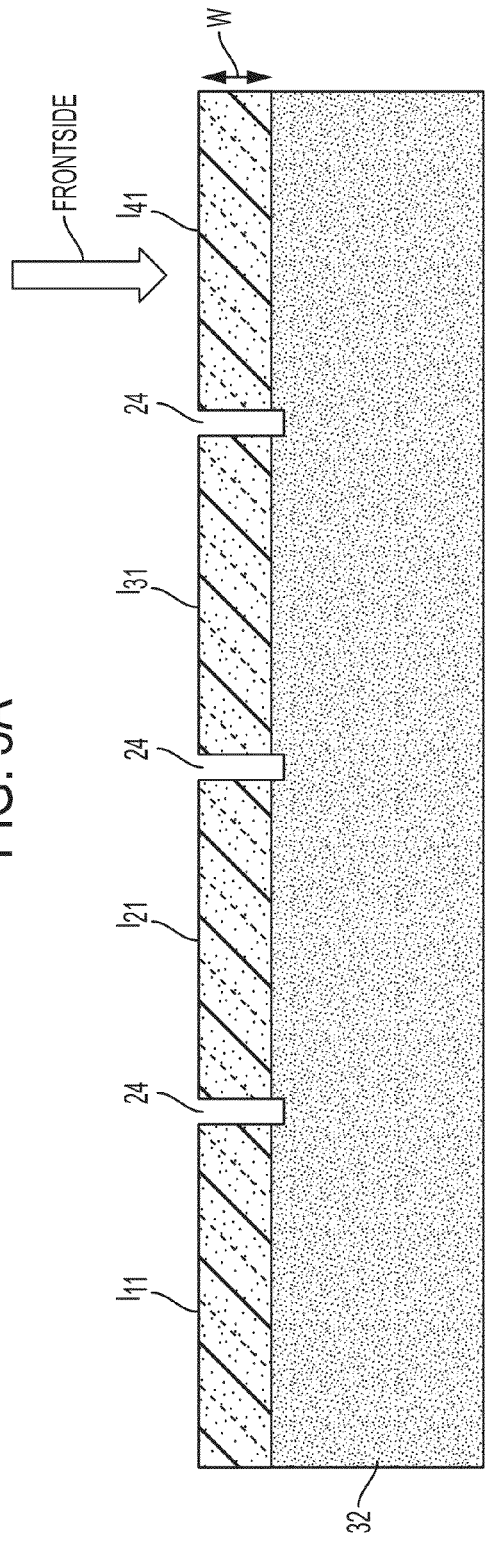

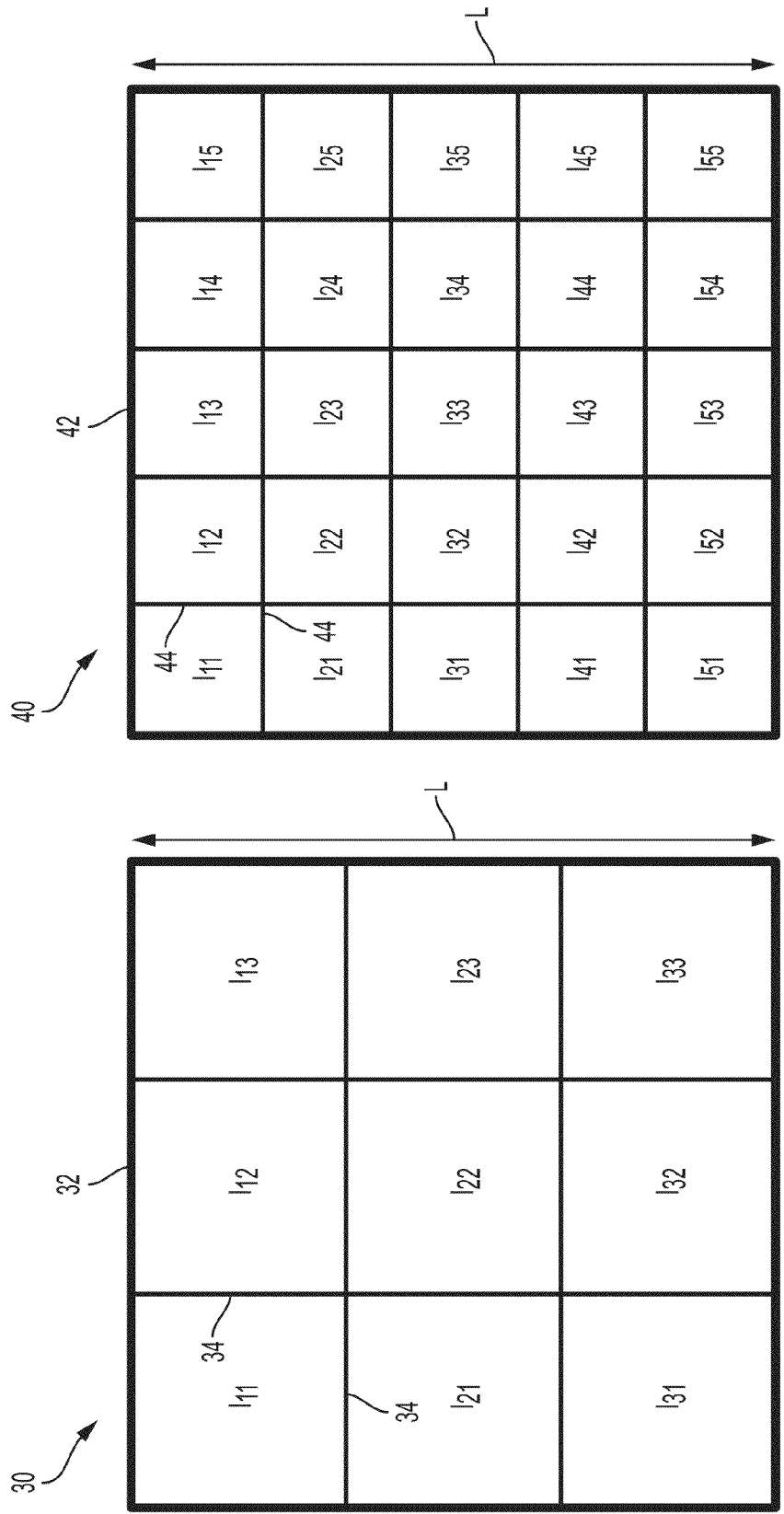

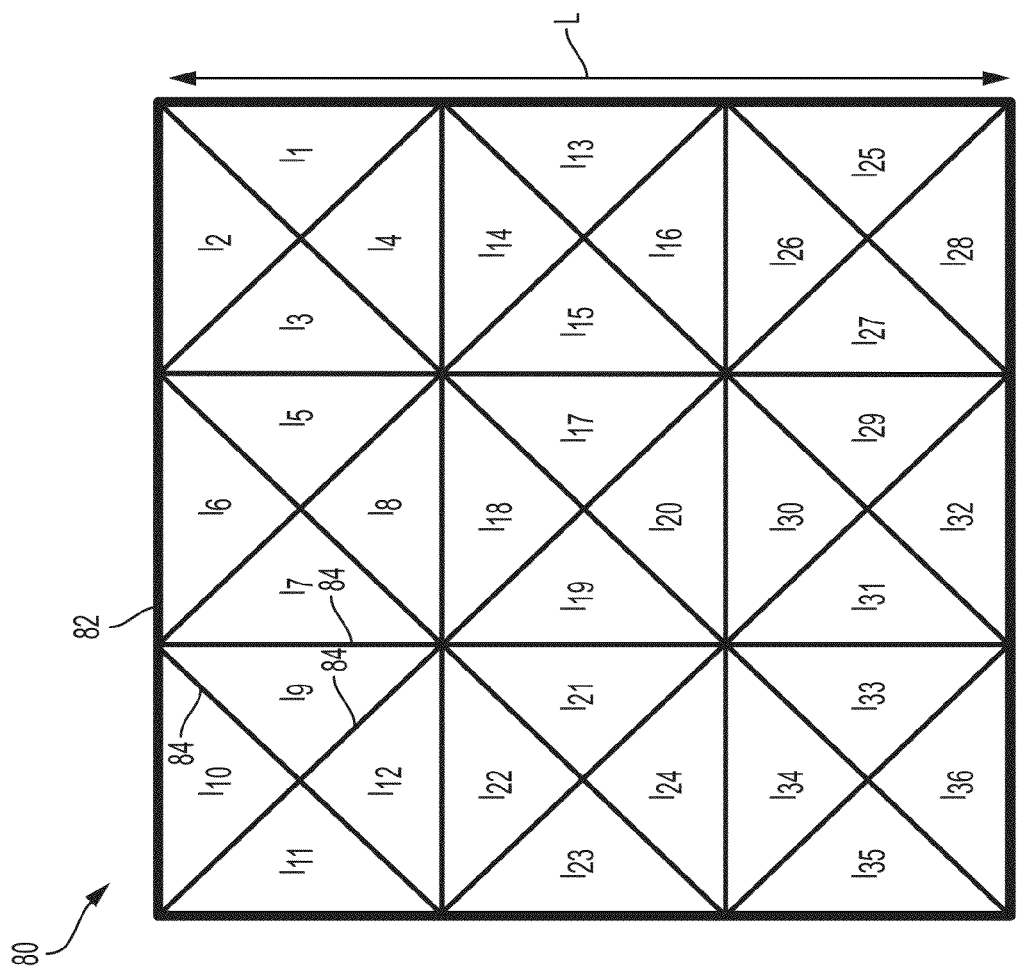

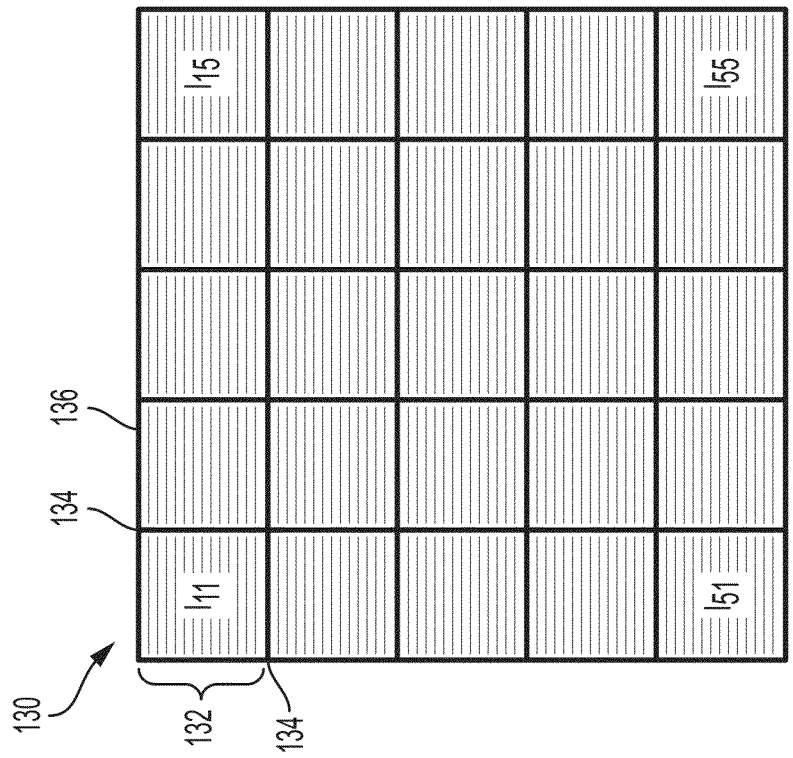
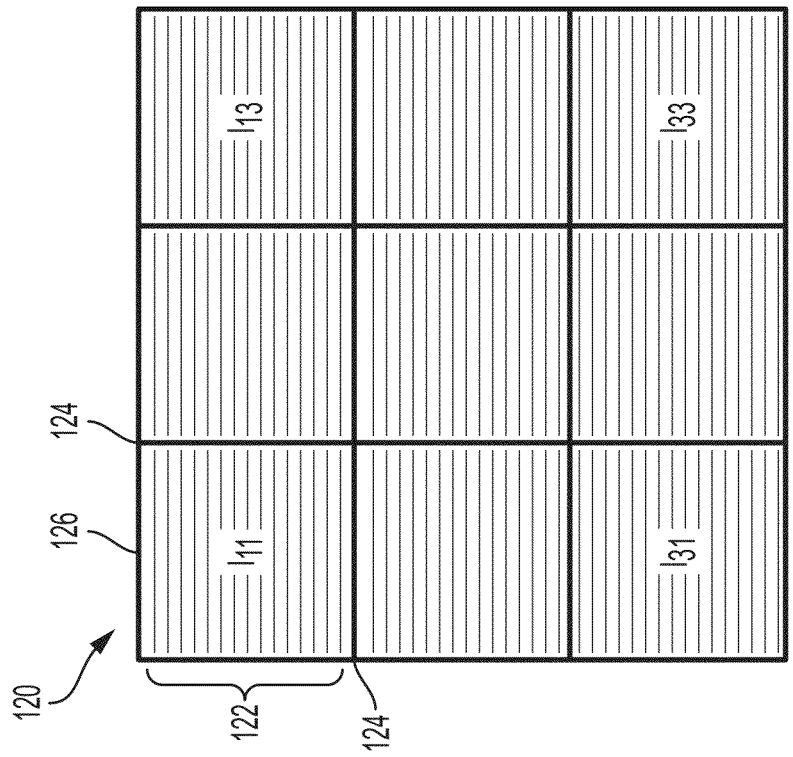
FIG. 10A
FIG. 10B

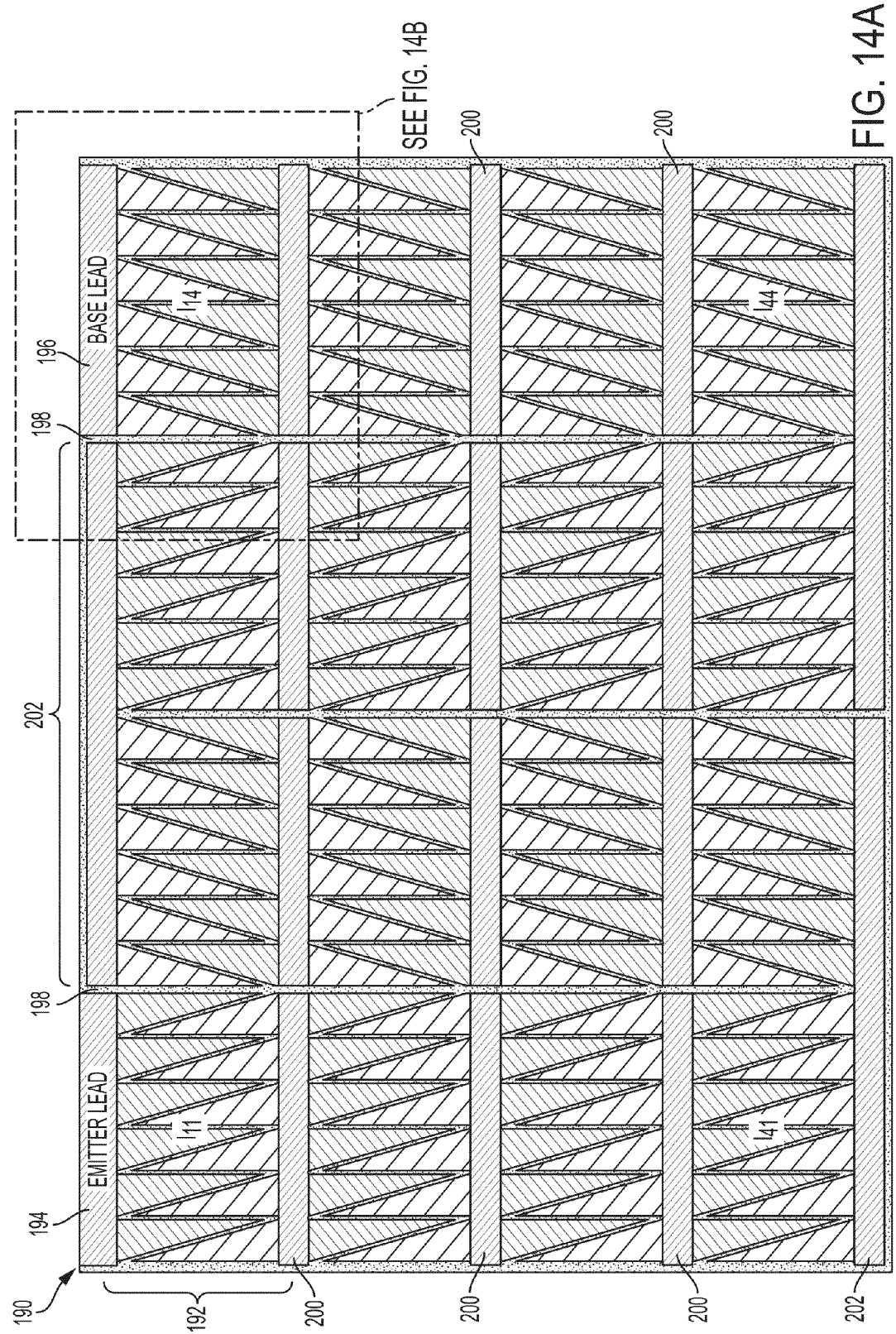

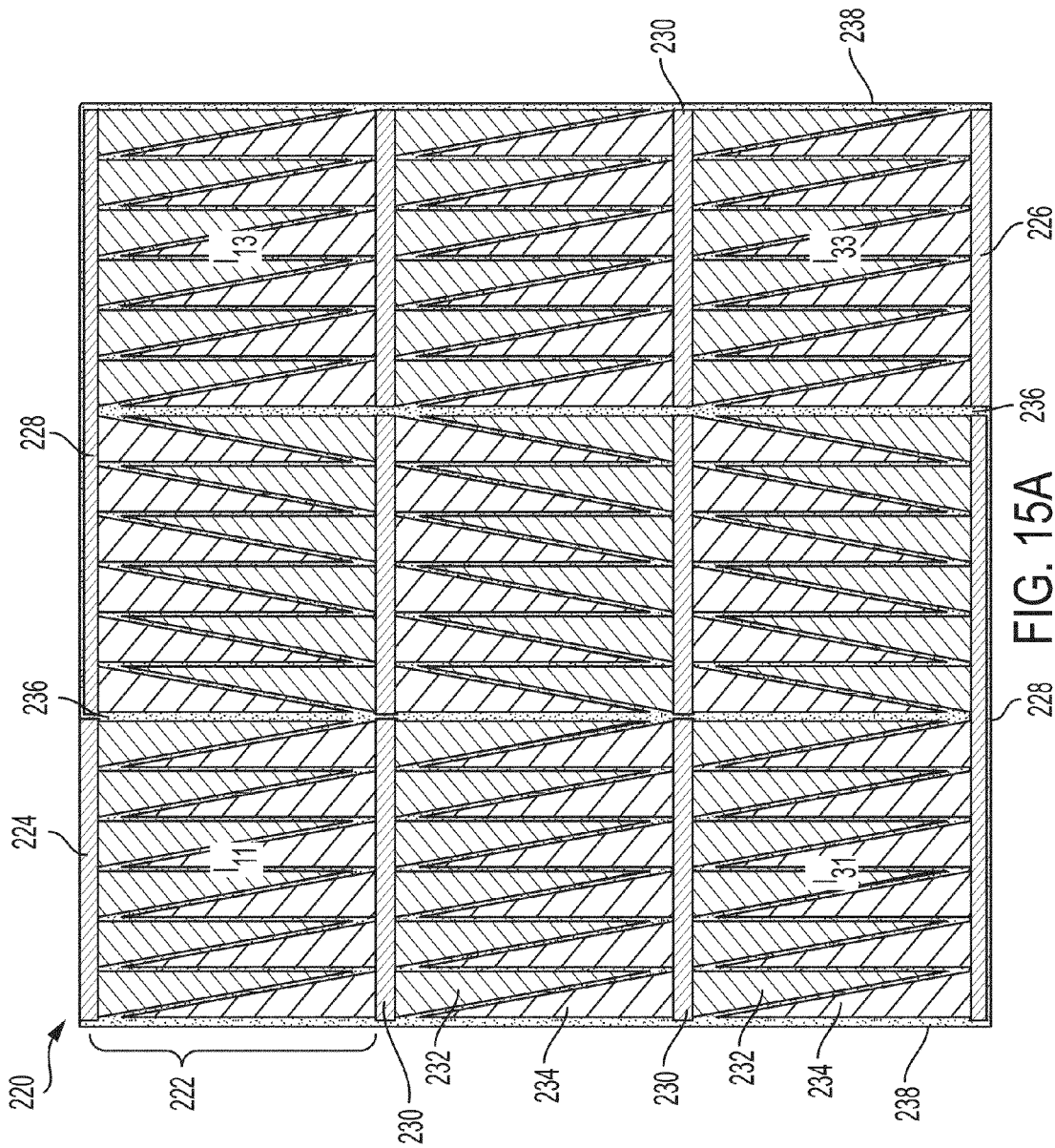

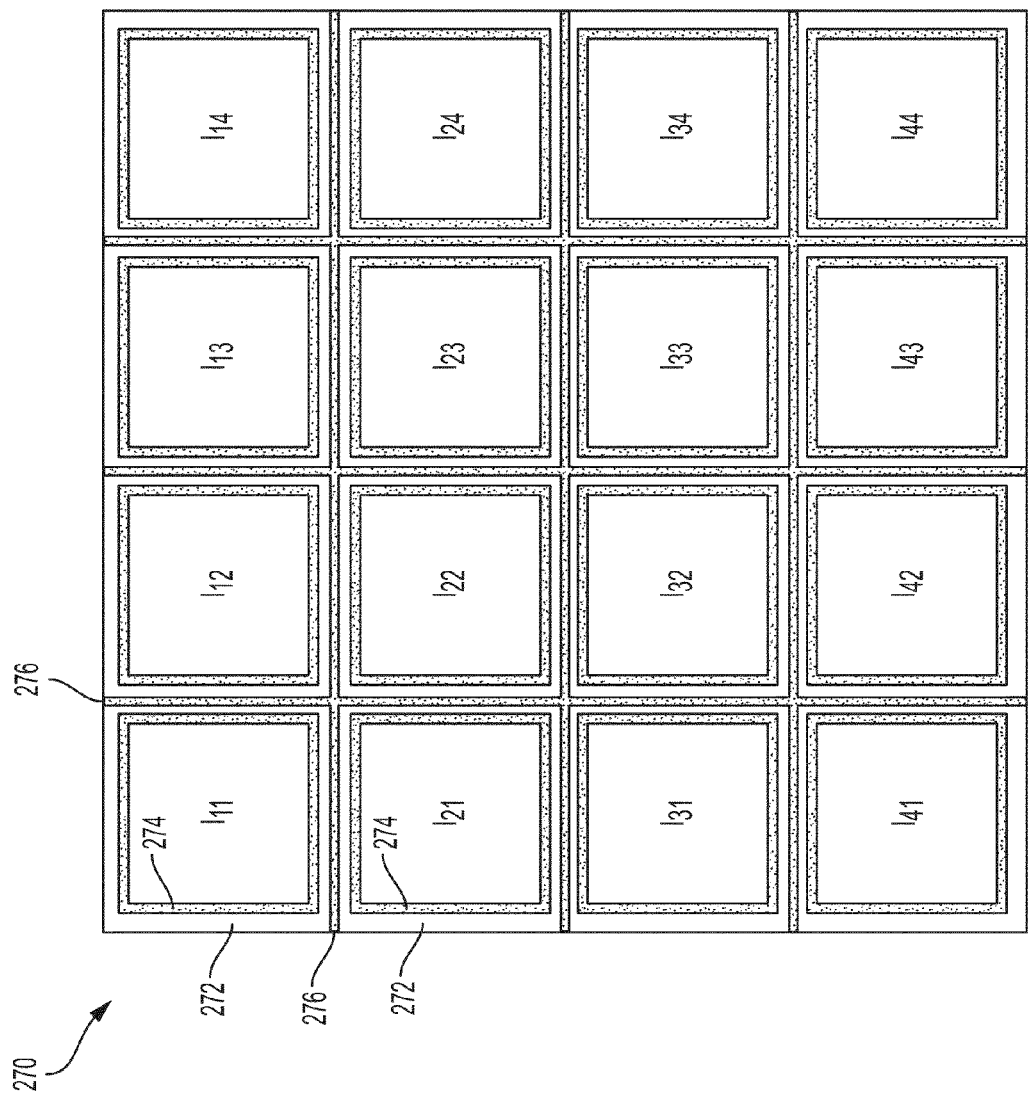

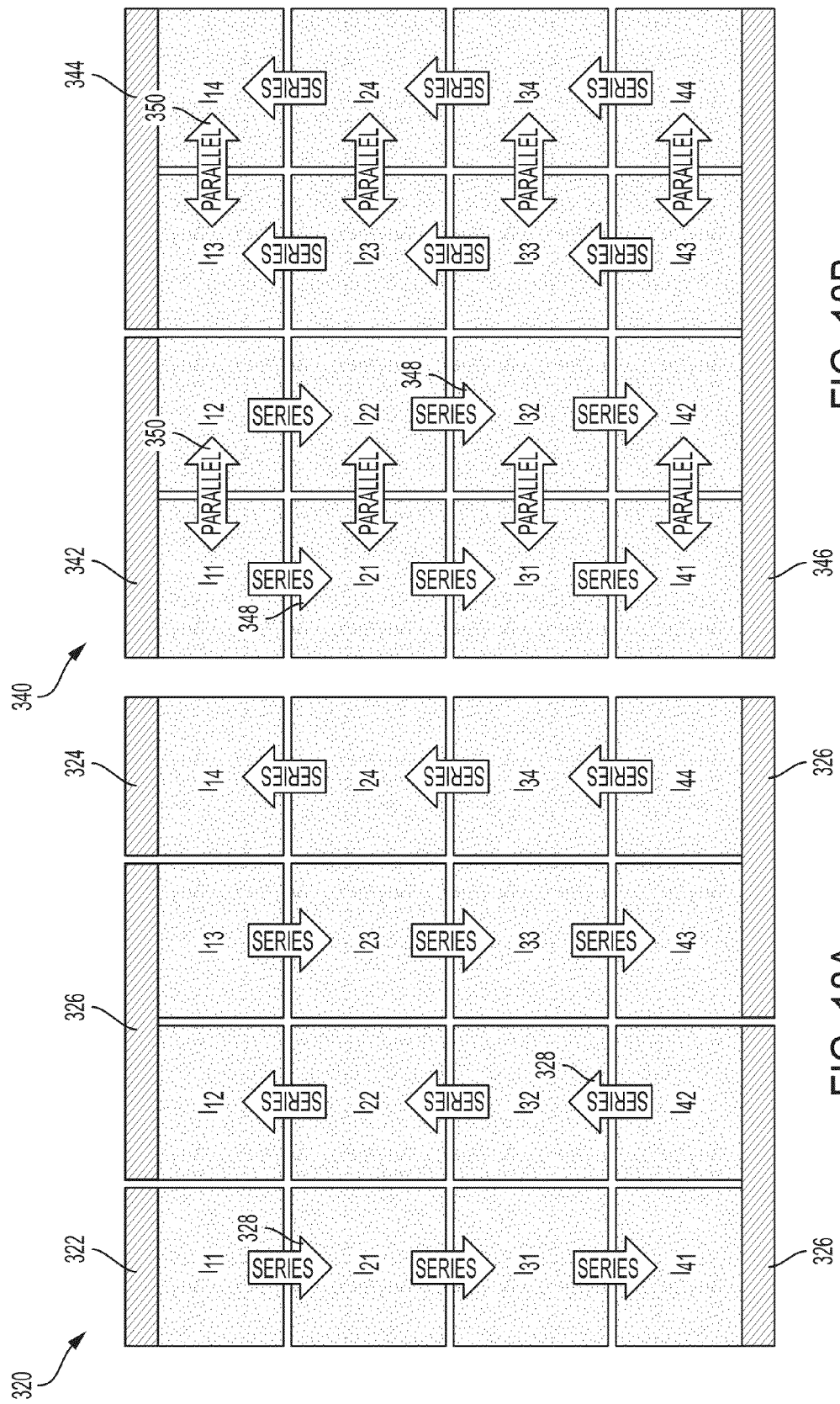

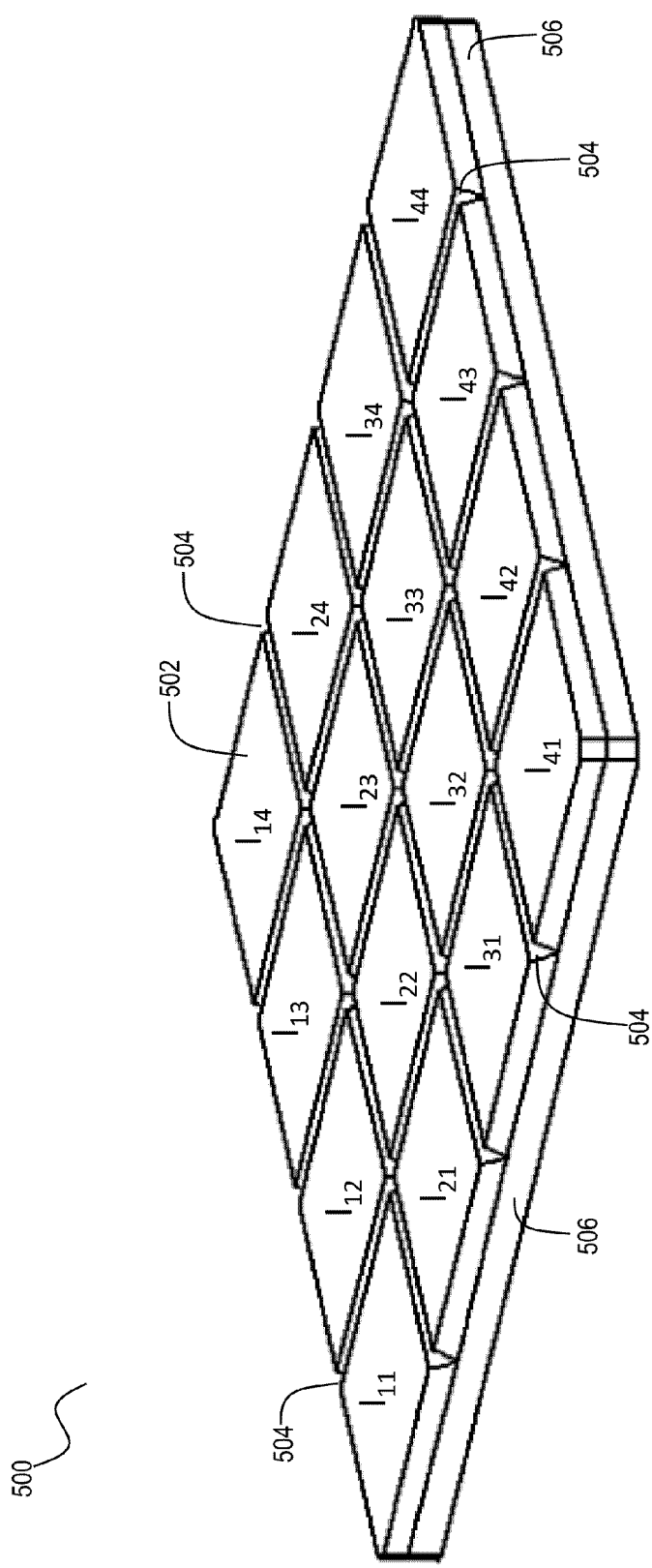

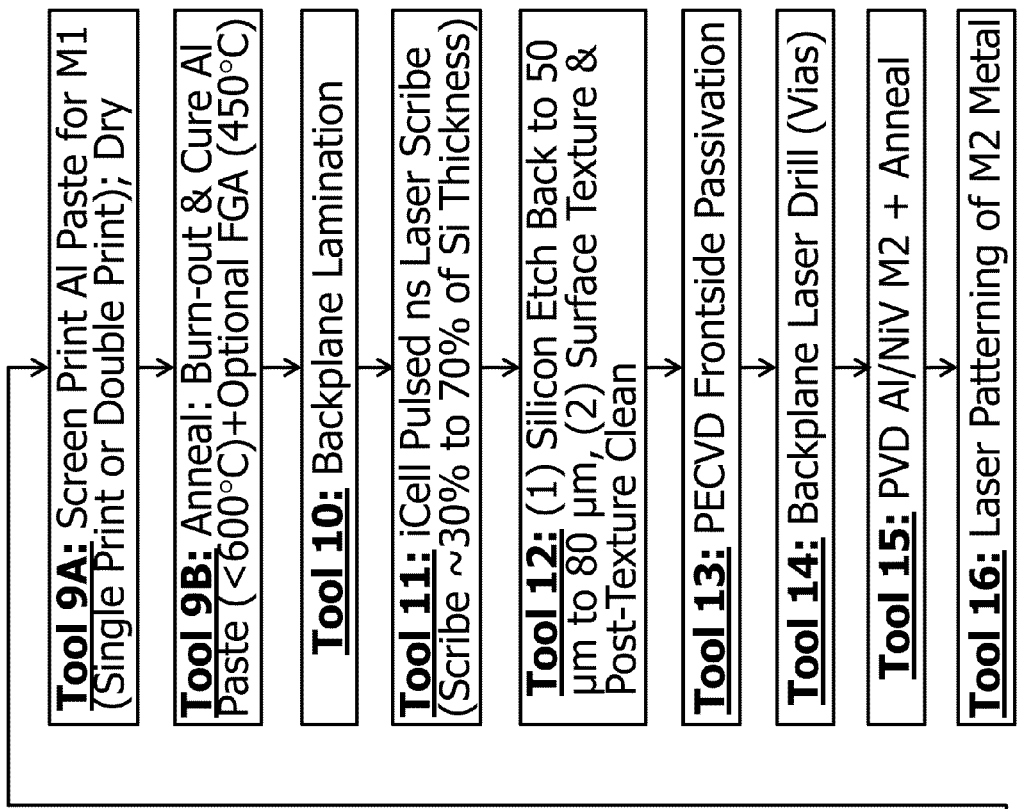
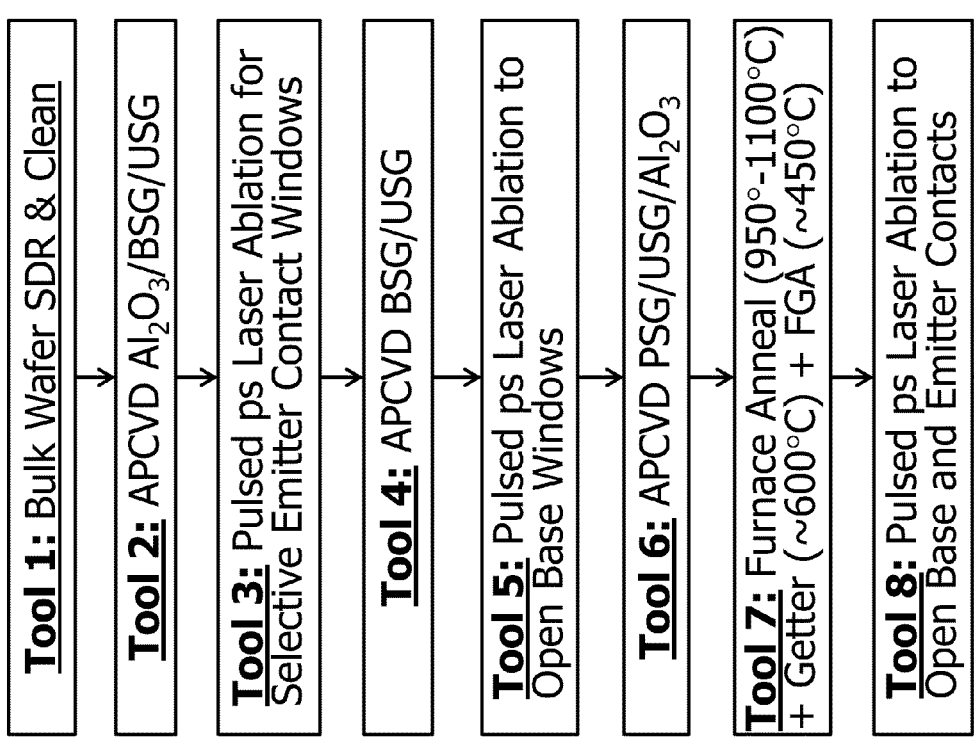
Fig. 34C

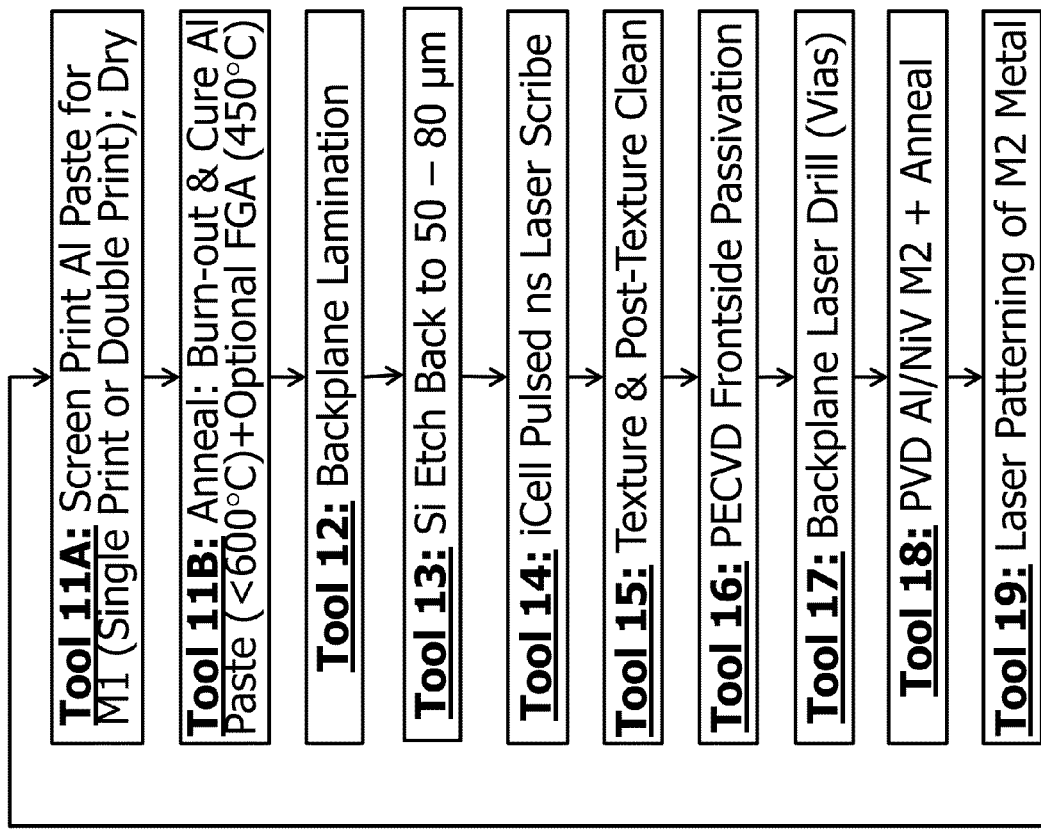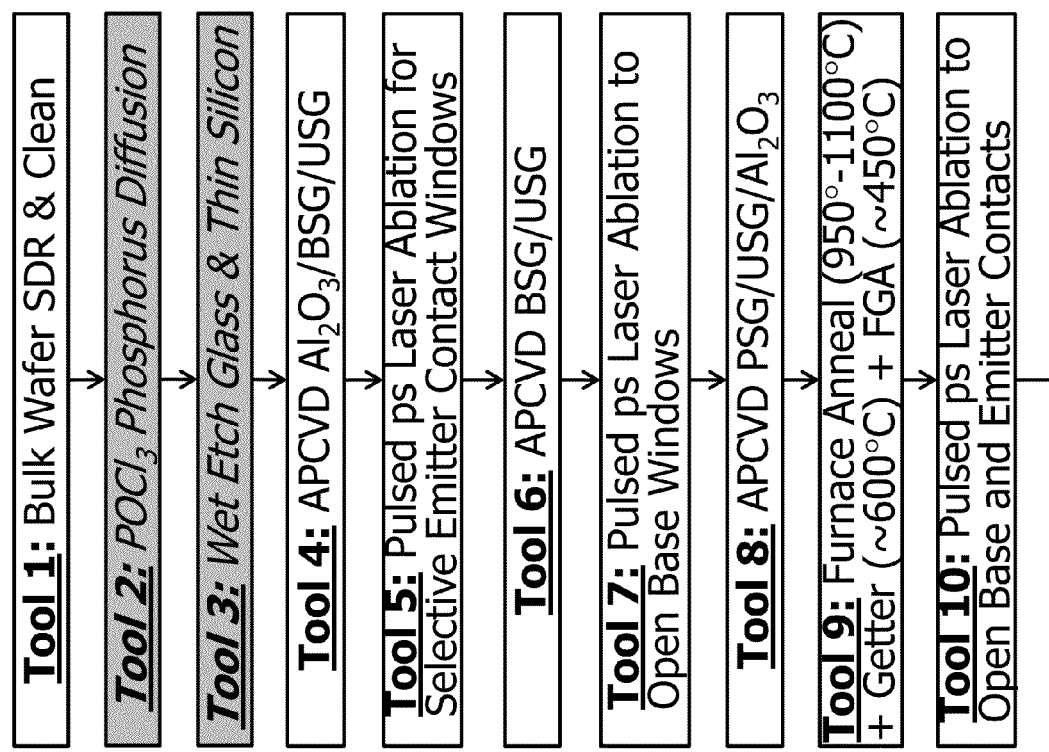
Fig. 35A

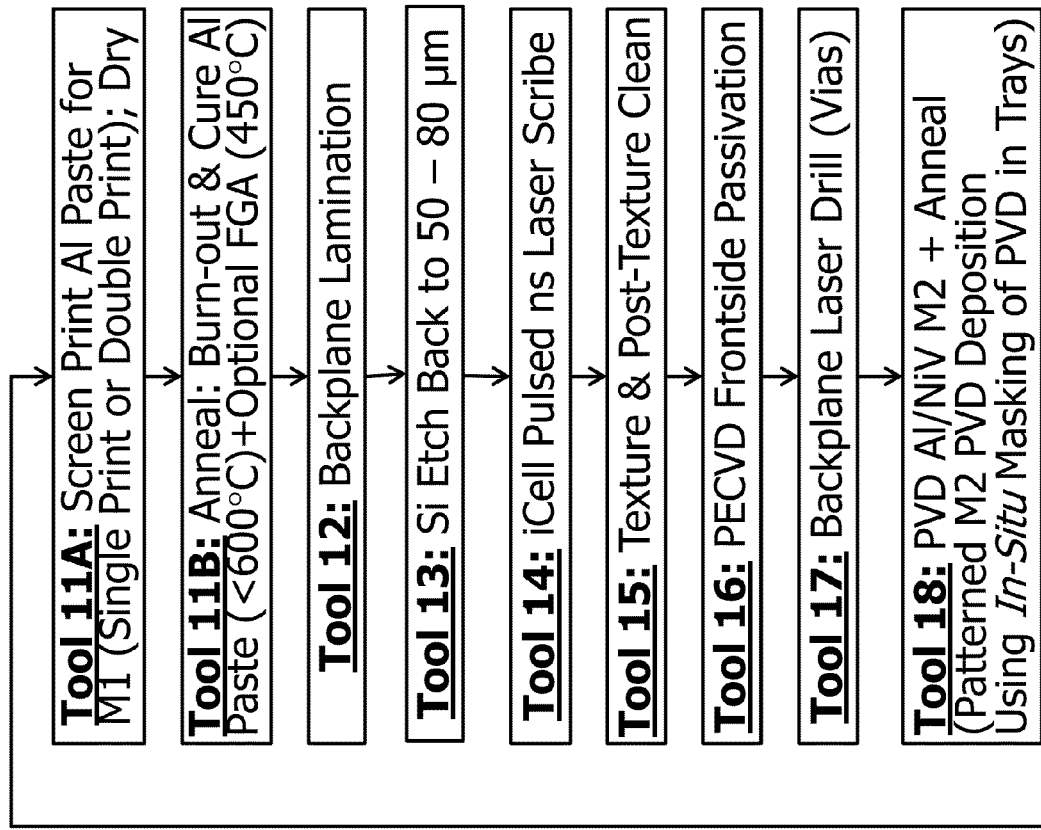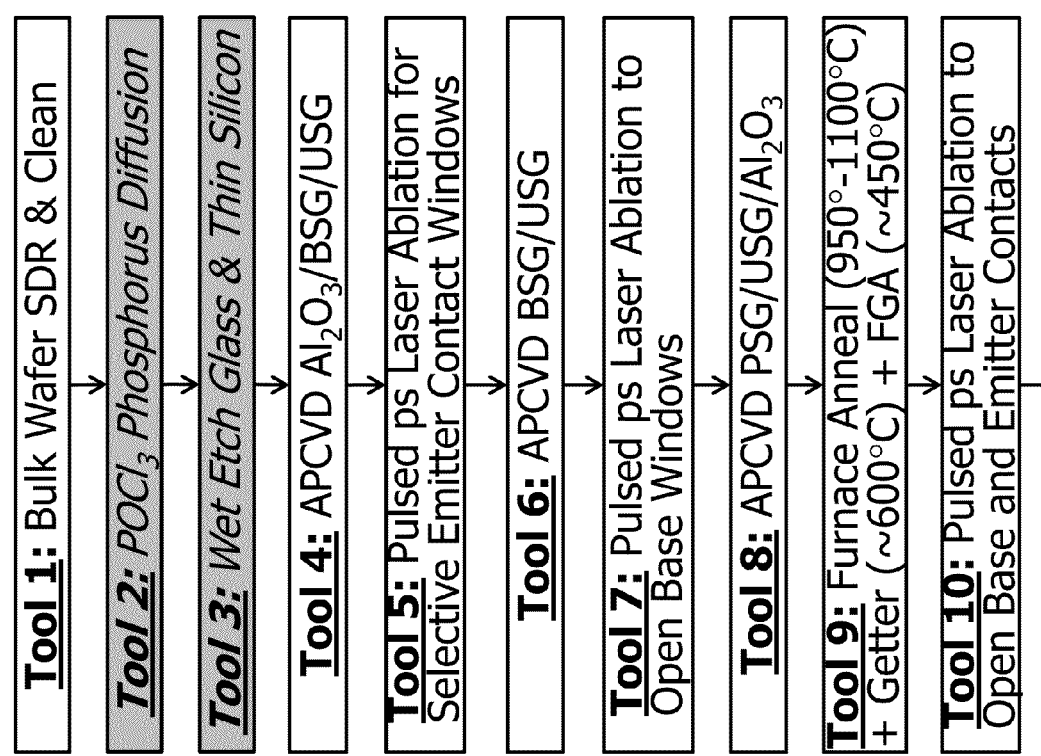
Fig. 35B

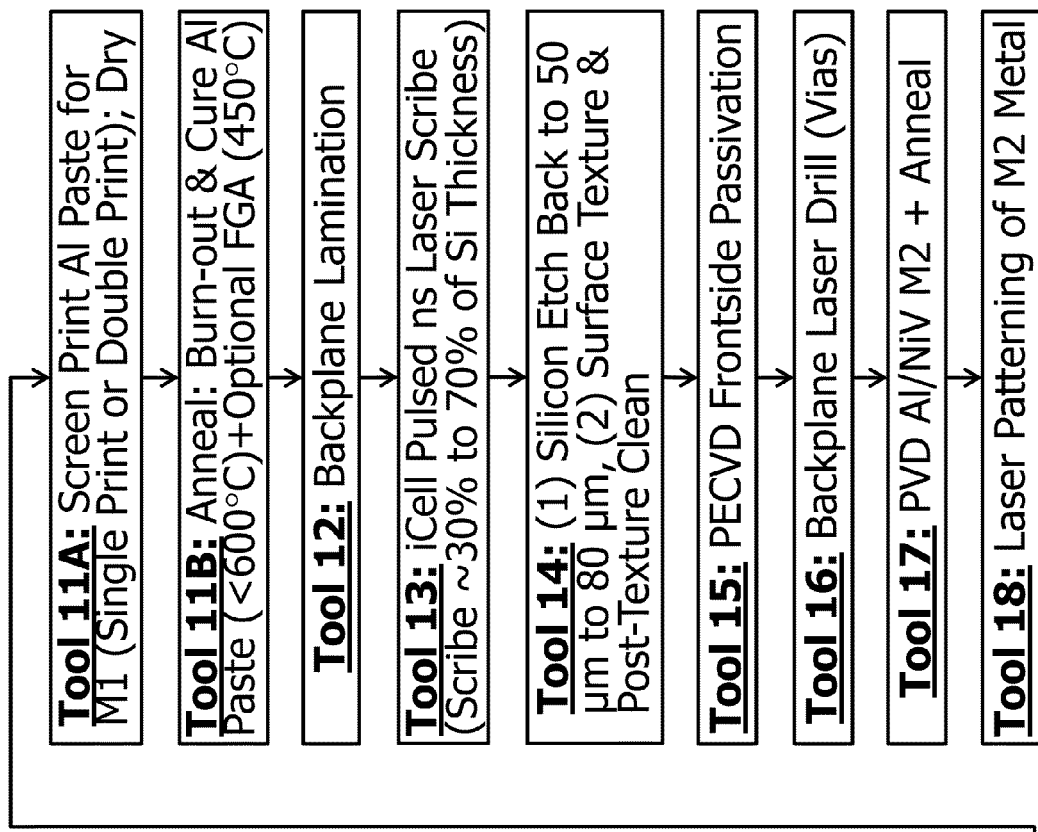
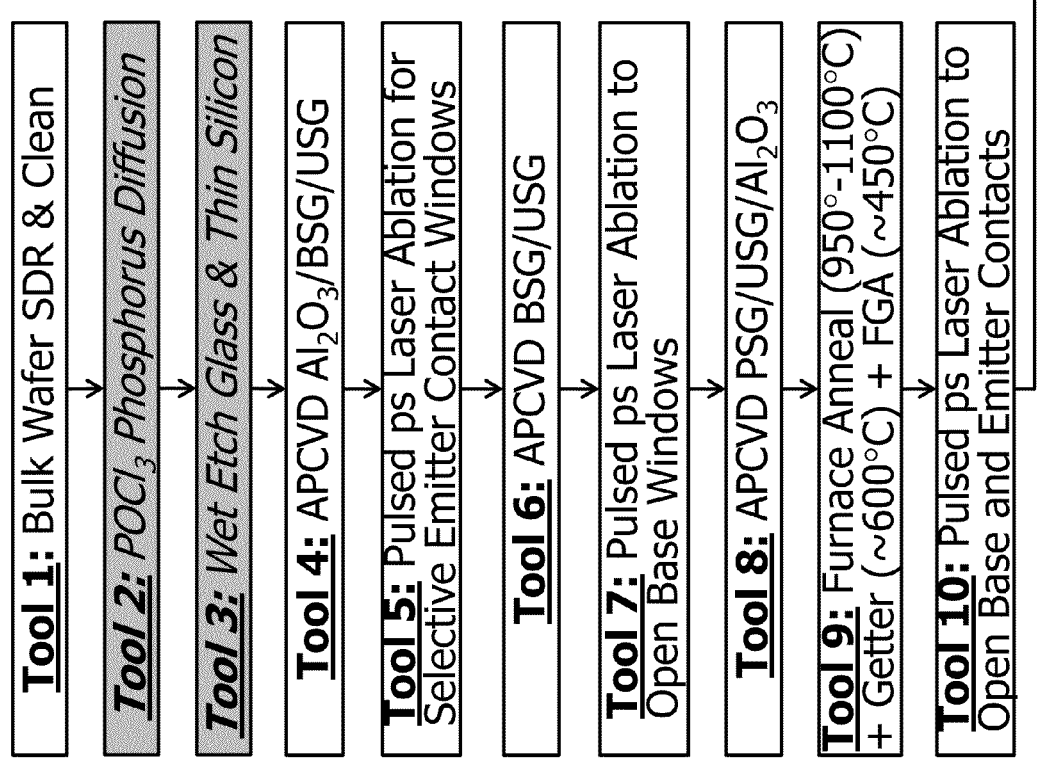
Fig. 35C

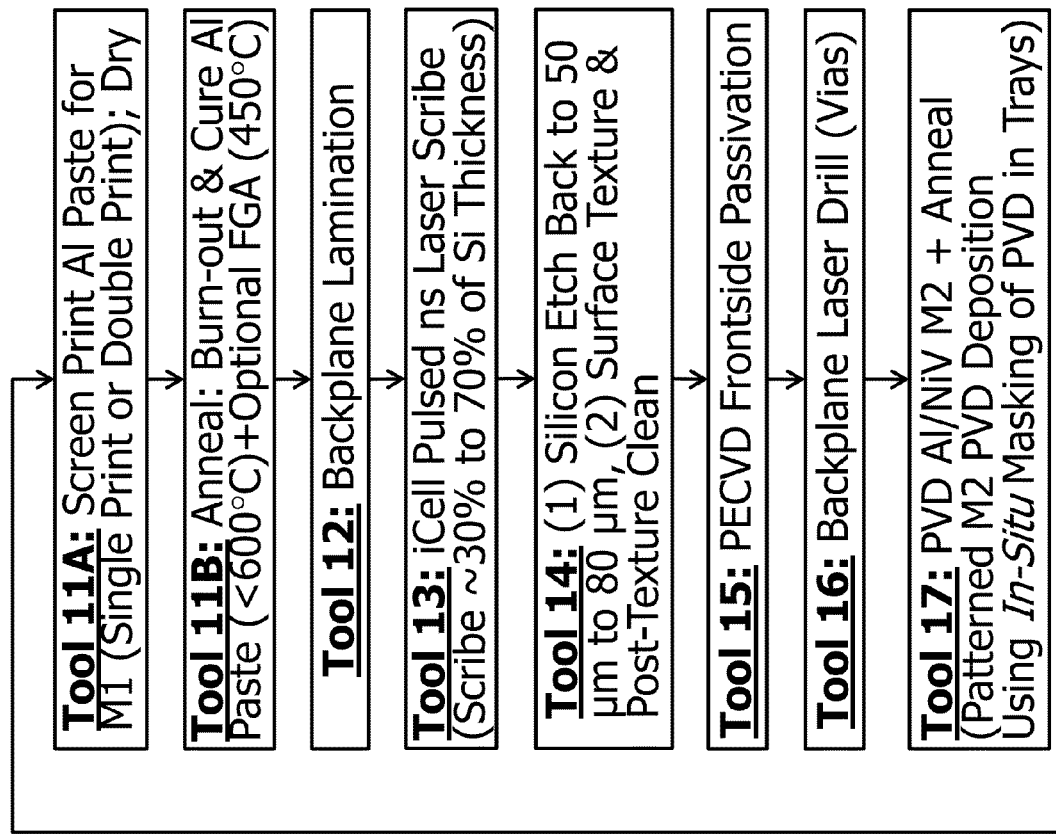
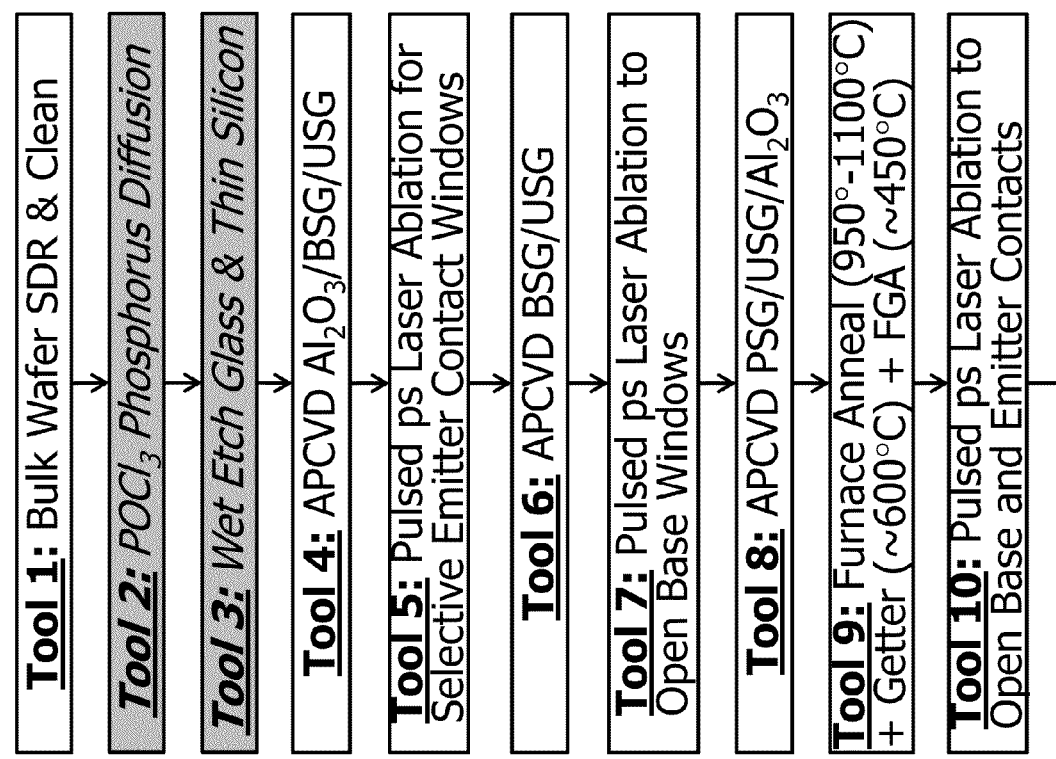
Fig. 35D

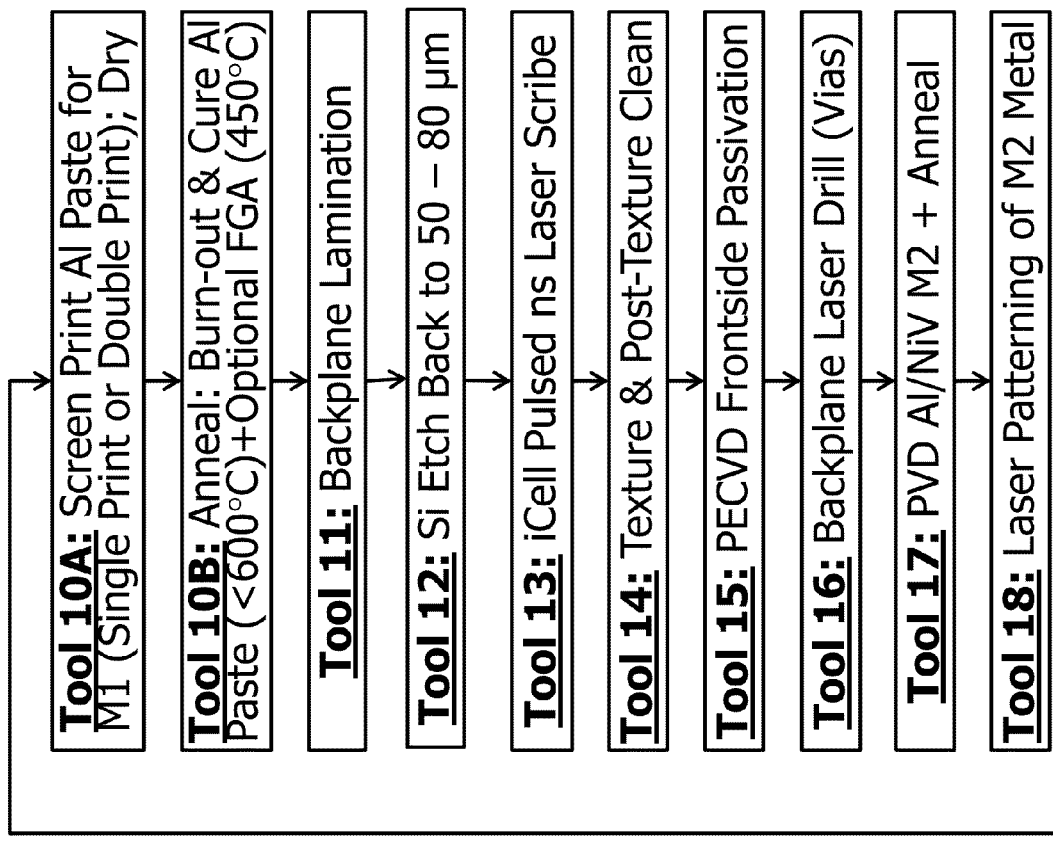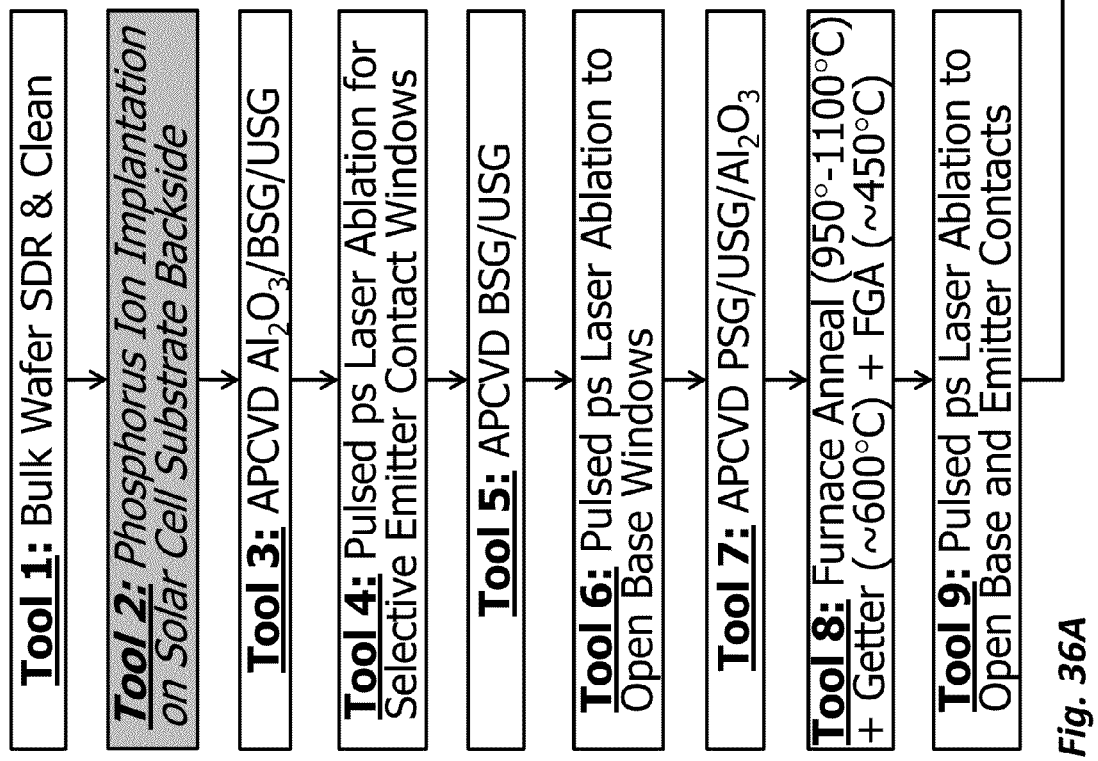
Fig. 36A

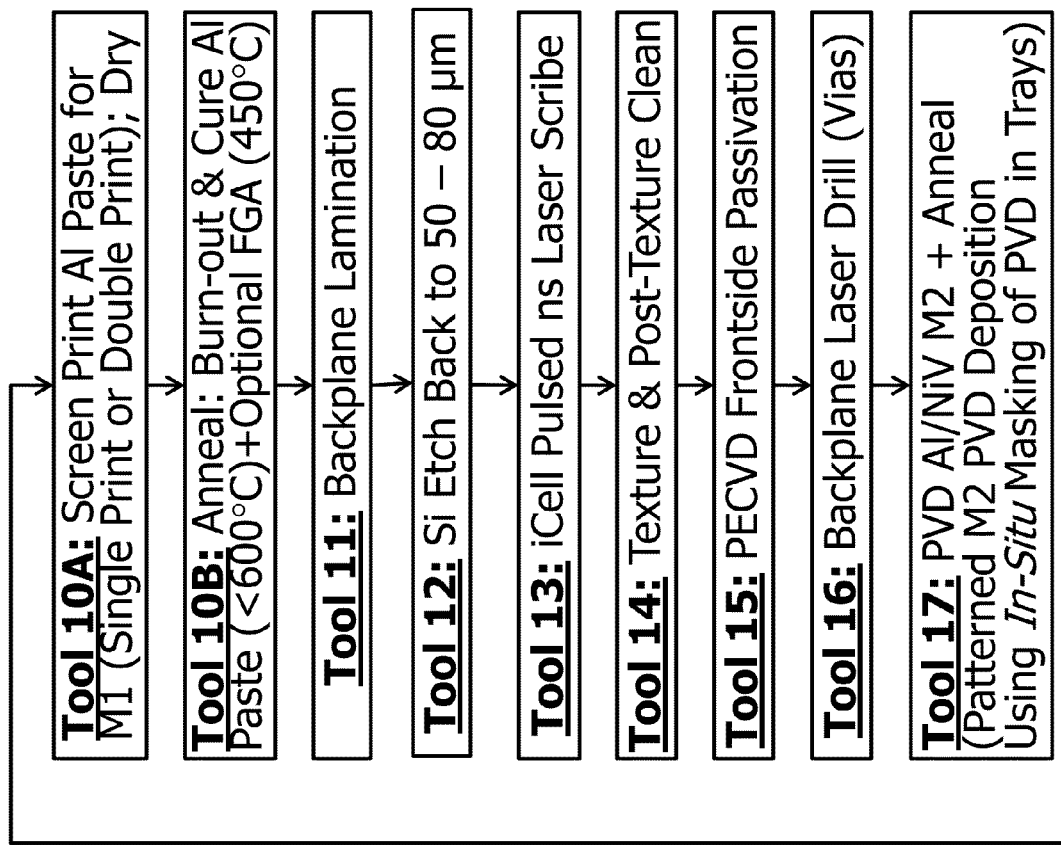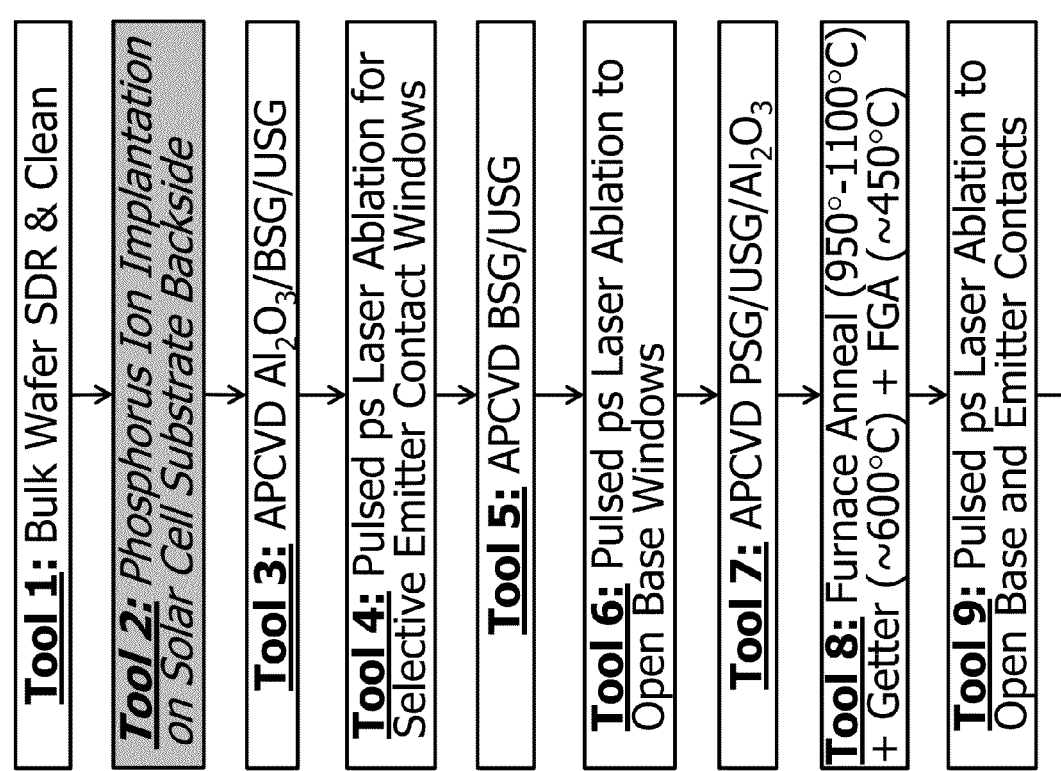
Fig. 36B

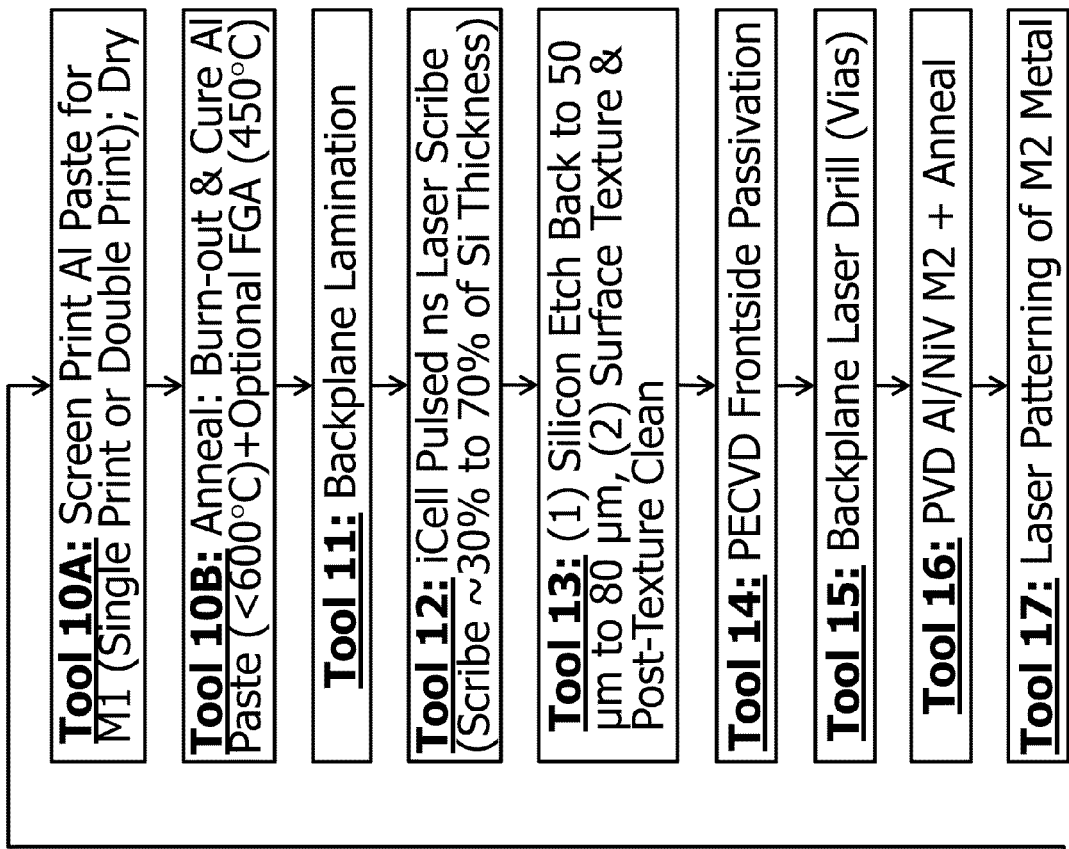
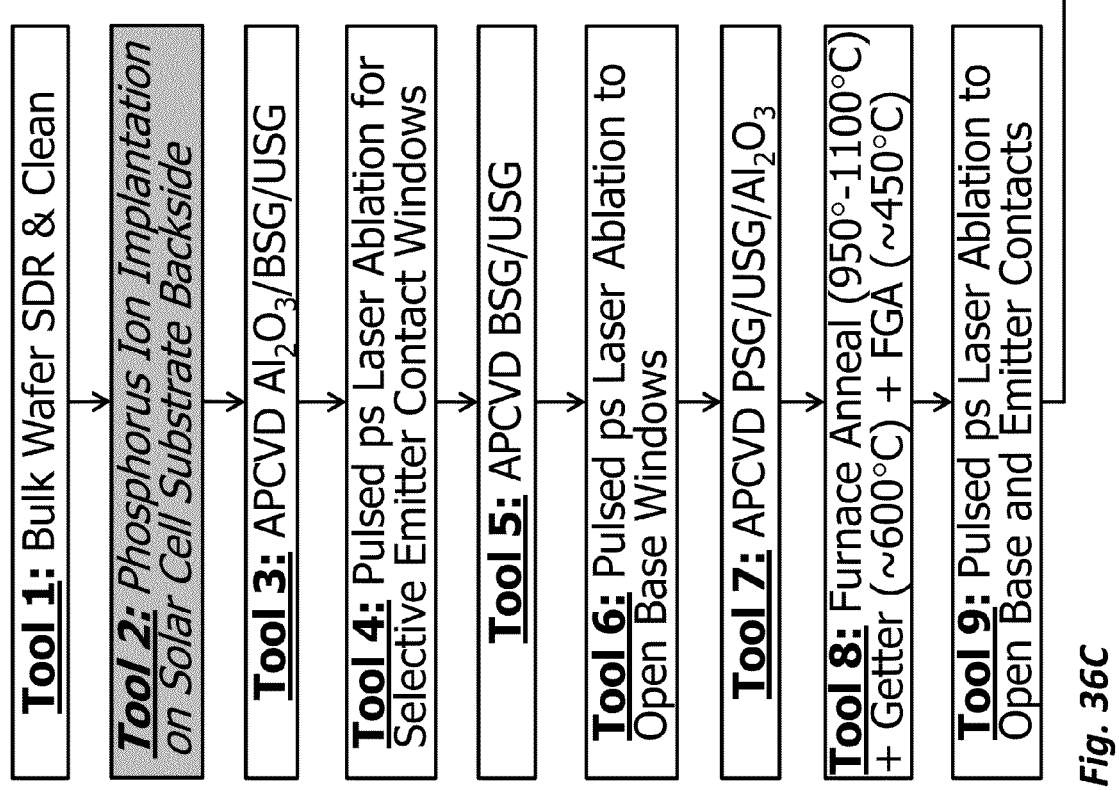
Fig. 36C

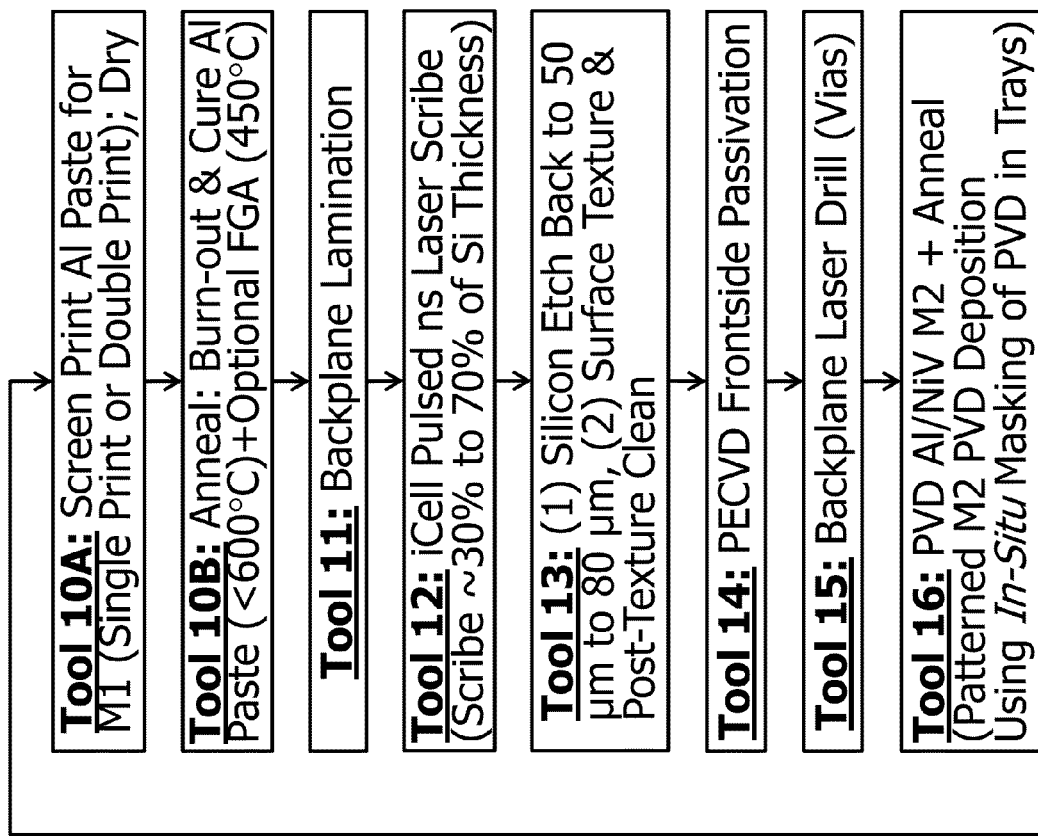
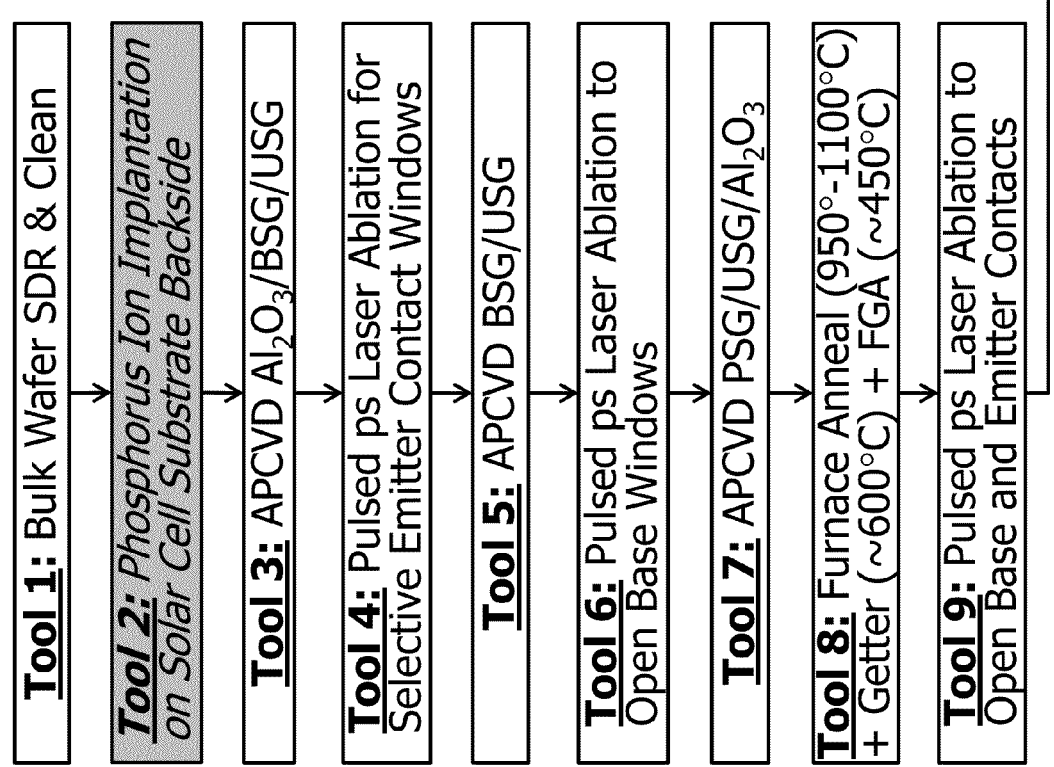
Fig. 36D

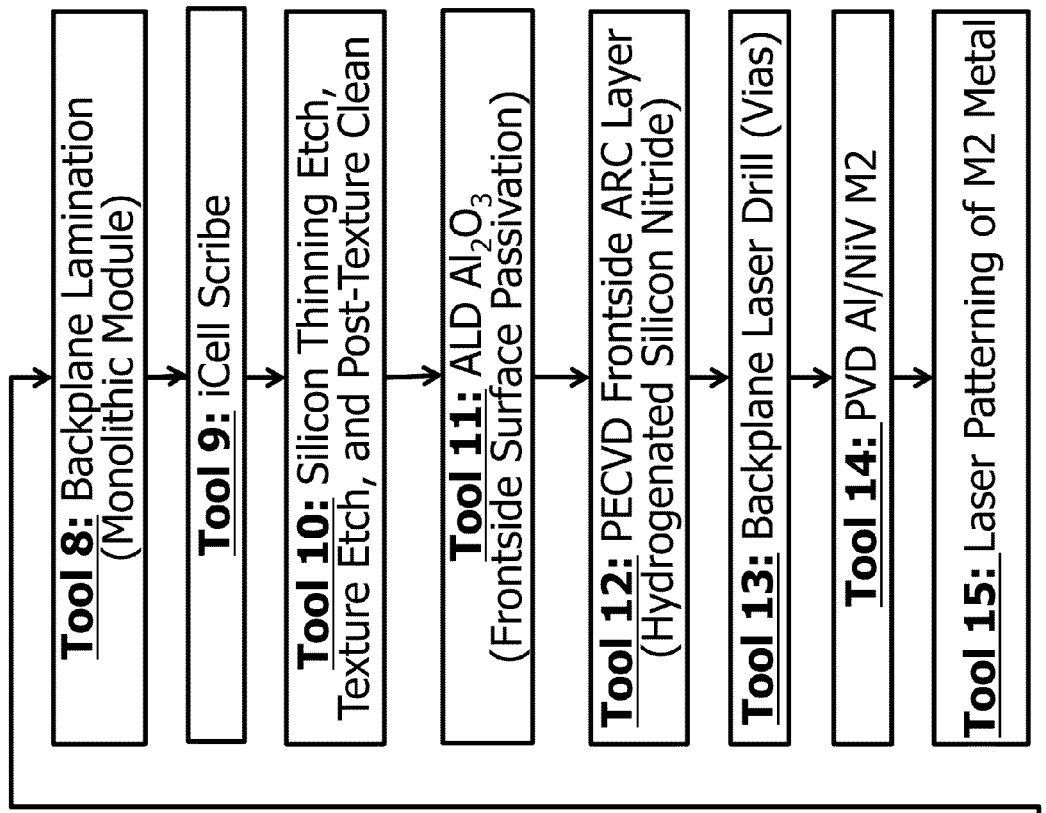
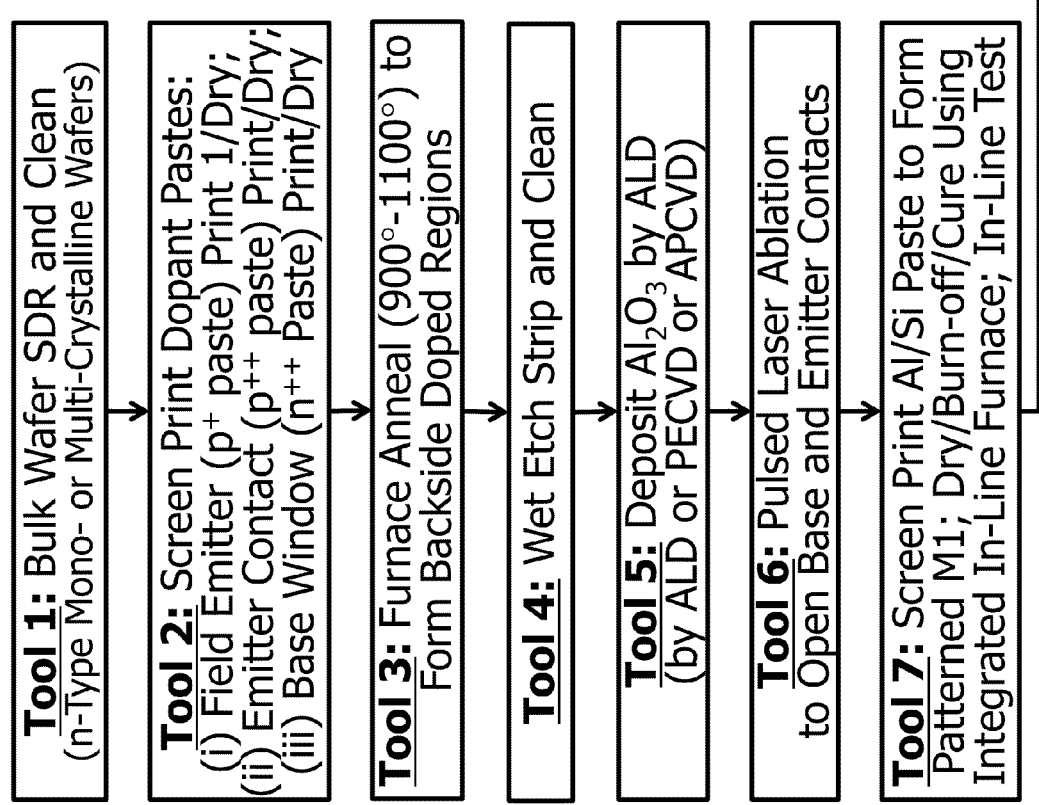
Fig. 50A

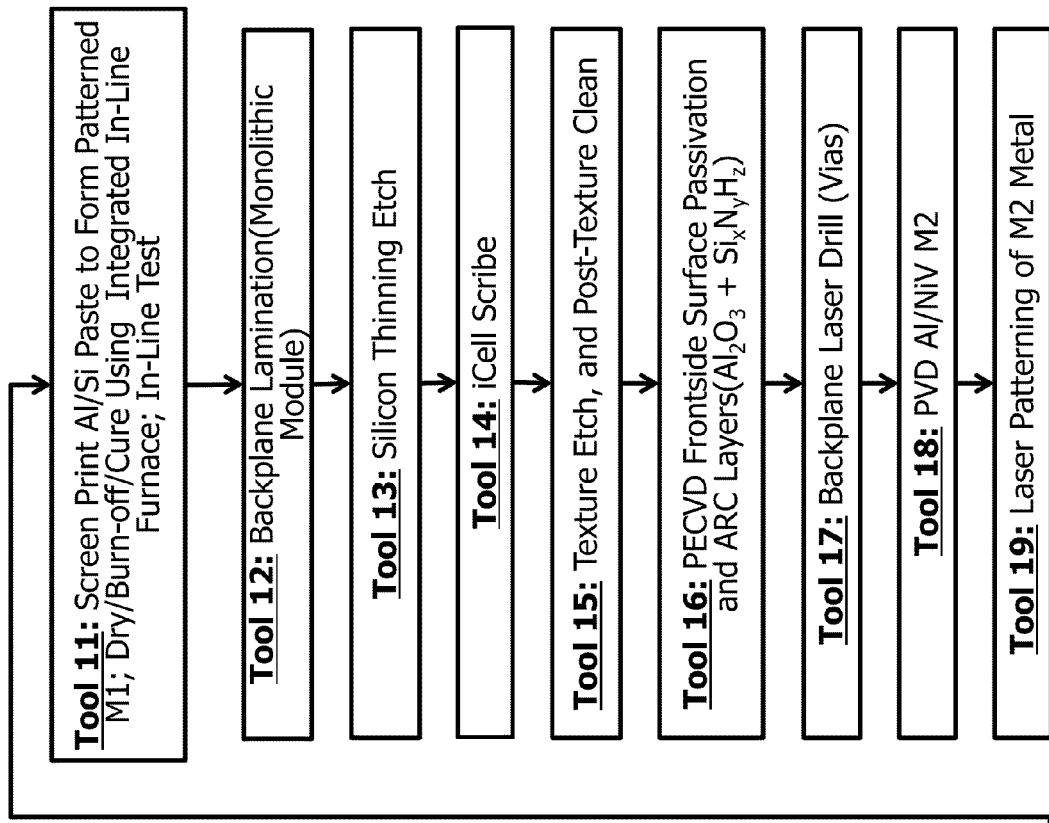
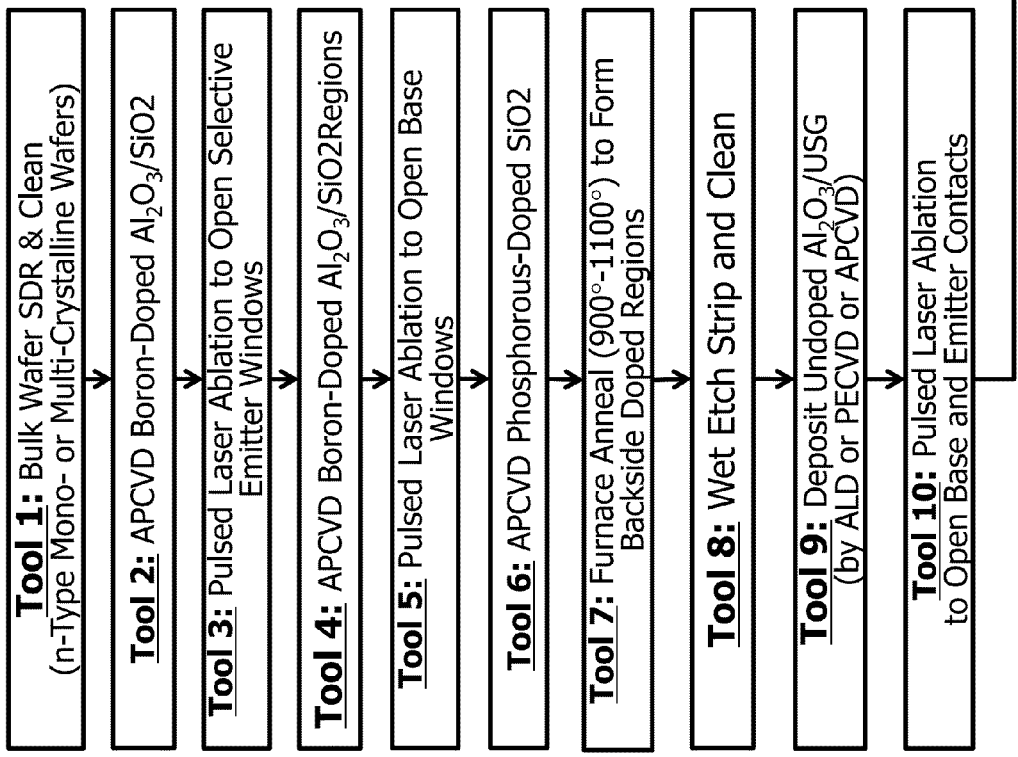
Fig. 58B

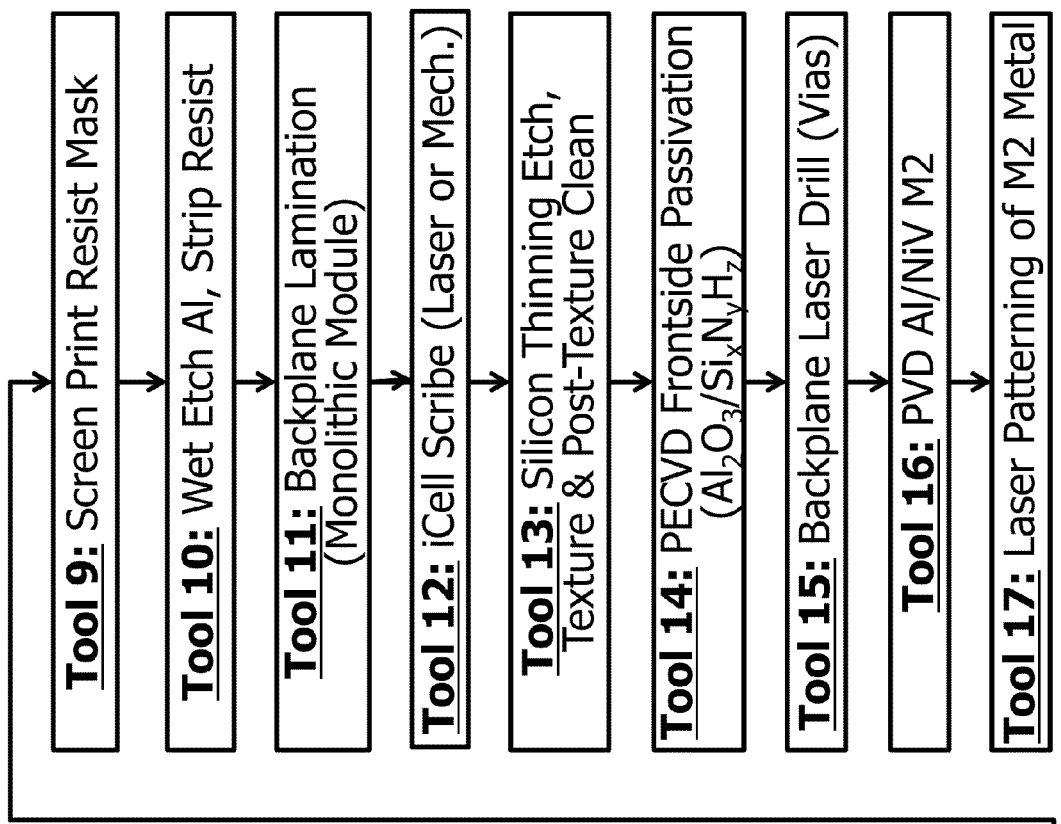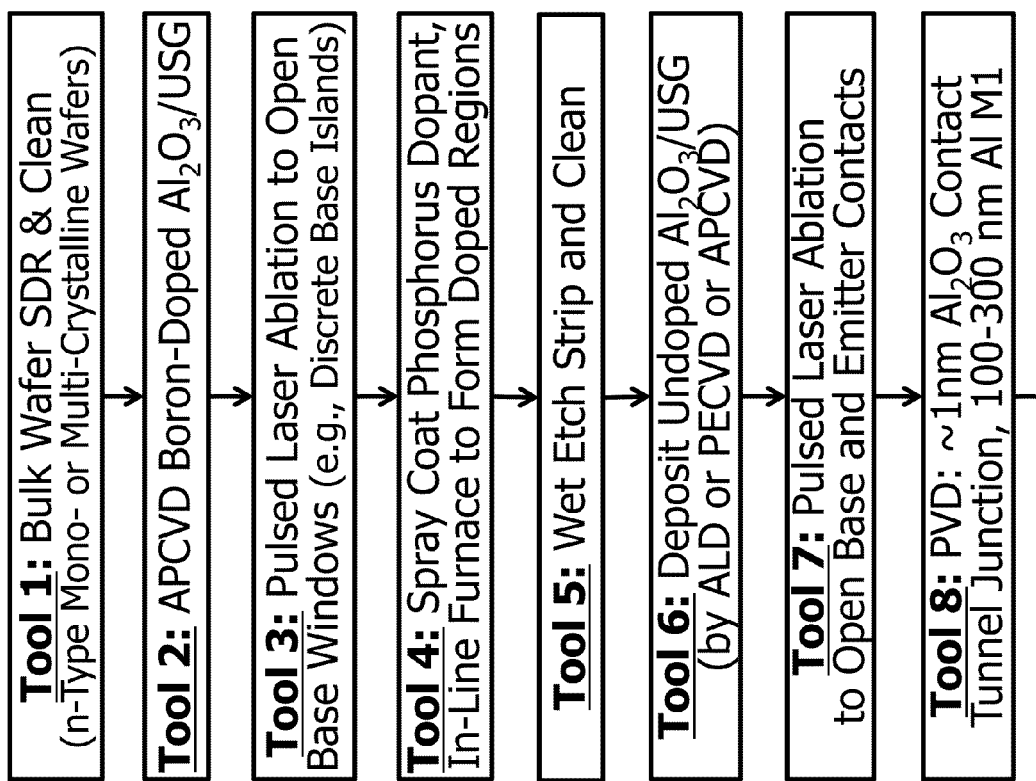
Fig. 60

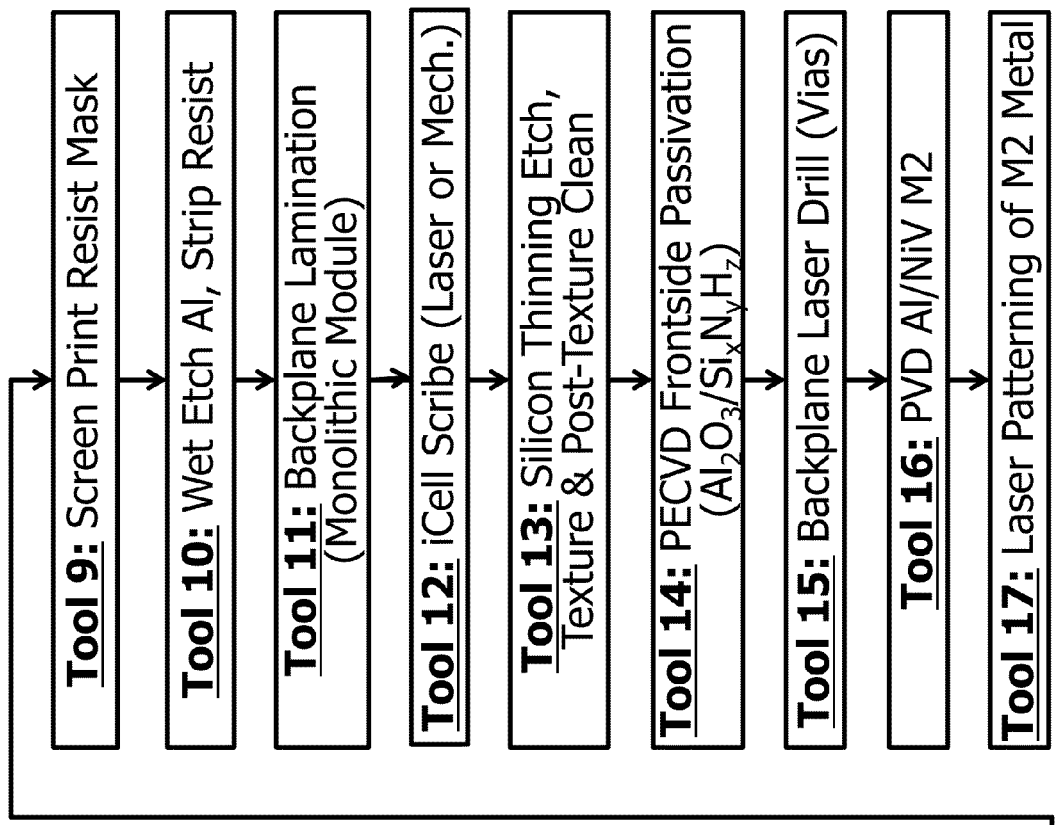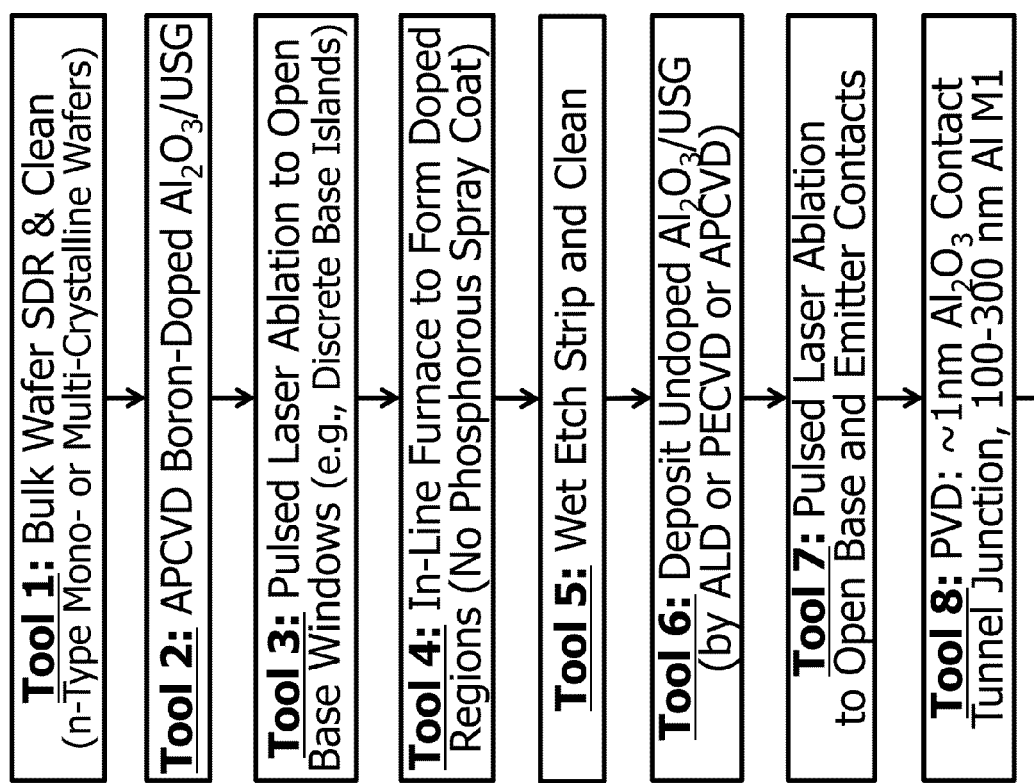
Fig. 61

FABRICATION METHODS FOR MONOLITHICALLY ISLED BACK CONTACT BACK JUNCTION SOLAR CELLS

CROSS-REFERENCE TO RELATED APPLICATIONS

This application claims the benefit of U.S. provisional patent application 61/880,777 filed Sep. 20, 2013, which is hereby incorporated by reference in its entirety.

This application is a continuation-in-part of U.S. utility patent application Ser. No. 14/179,526 filed Feb. 12, 2014 which claims the benefit of U.S. provisional patent applications 61/763,580 filed Feb. 12, 2013 and 61/859,602 filed on Jul. 29, 2013, which are hereby incorporated by reference in their entirety.

U.S. utility patent application Ser. No. 14/179,526 is also a continuation-in-part of U.S. utility patent application Ser. No. 14/072,759 filed Nov. 5, 2013 which claims the benefit of U.S. provisional patent application 61/722,620 filed on Nov. 5, 2012, which are hereby incorporated by reference in their entirety.

FIELD OF THE INVENTION

The present disclosure relates in general to the fields of solar photovoltaic (PV) cells and modules, and more particularly to monolithically isled or tiled photovoltaic (PV) solar cells and associated modules providing numerous benefits.

BACKGROUND

Crystalline silicon photovoltaic (PV) modules, as of 2012, account for approximately at least 85% of the overall global PV annual demand market and cumulative globally installed PV capacity. The manufacturing process for crystalline silicon PV is based on the use of crystalline silicon solar cells, starting with mono-crystalline or multi-crystalline silicon wafers made of czochralski (CZ) silicon ingots or cast silicon bricks. Non-crystalline-silicon-based thin film PV modules (for example CdTe, CIGS, organic, and amorphous silicon PV modules) may offer the potential for low cost manufacturing process but typically provide much lower conversion efficiencies (in the range of up to about 14% in STC module efficiency) for commercial thin-film PV modules as compared to the mainstream crystalline silicon PV modules (which may provide module efficiencies in the range of approximately 14% up to about 20%, and mostly in the range of about 14% to 17%), and an unproven long-term track record of field reliability as compared to well-established crystalline silicon solar PV modules. The leading-edge crystalline silicon PV modules offer superior overall energy conversion performance, long-term field reliability, non-toxicity, and life cycle sustainability compared to various other PV technologies. Moreover, recent progress and advancements have driven the overall manufacturing cost of crystalline silicon PV modules to below $0.80/Wp. Disruptive monocrystalline silicon technologies—such as high-efficiency thin monocrystalline silicon solar cells fabricated using reusable crystalline silicon templates, thin (e.g., crystalline silicon absorber thickness from approximately 10 µm up to about 100 µm, and typically ≤70 µm) epitaxial silicon, thin silicon support using backplane attachment/lamination, and porous silicon lift-off technology—offer the promise of high-efficiency (solar cell and/or module efficiencies of at least 20% under Standard Test Conditions or STC) and PV module manufacturing cost at well below $0.50/Wp at mass manufacturing scale.

Current crystalline silicon (or other semiconductor absorber material) solar cell structures and processing methods often suffer from several disadvantages relating to cell bow and cell cracking/breakage during and/or after cell processing as well as during the operation of crystalline silicon PV modules installed in the field. Solar cell processing often induces significant stresses (e.g., thermal and/or mechanical stresses) on a semiconductor substrate which may lead to thermally-induced warpage and crack generation and propagation (by thermal cycling or mechanical stresses). Bowed or non-planar solar cell substrates pose significant challenges and possible manufacturing yield degradation during solar cell processing (such as during processing of crystalline silicon solar cells), and may present requirements for clamping down the solar cell substrate and/or the substrate edges onto a supporting substrate carrier to flatten the cell substrate during manufacturing process. Flattening solutions may complicate the solar cell manufacturing process, resulting in increased manufacturing cost and/or some manufacturing throughput and yield compromises. Bowed or non-planar solar cell substrates may further result in cell microcracks and/or breakage problems during module lamination and also subsequently during the PV module operation in the field (resulting in PV module power degradation or loss). These problems may be further aggravated in larger area solar cells, such as the commonly used 156 mm×156 mm format (square or pseudo square) solar cells.

Further, conventional solar cells, particularly those based on an interdigitated back-contact or IBC design, often require relatively thick metallization patterns—due to the relatively high cell electrical current—which may add complexity to cell processing, increase material costs, and add significant physical stresses to the cell semiconductor material. Thermal and mechanical stresses induced by relatively thick (e.g., in the thickness range of 10's of microns for IBC cell metallization) metallization patterns on the solar cell frontside and/or backside, coupled with the coefficient of thermal expansion or CTE mismatch between conductive metals (e.g., plated copper used for IBC solar cells or screen-printed aluminum-containing and/or silver-containing metallization pastes used for conventional front-contact solar cells) and semiconductor materials (e.g., thin crystalline silicon absorber layer) may substantially increase the risk of producing microcracks, cell breakage, and cell bowing during cell processing (i.e., during and after cell metallization) and module processing (during and after cell-to-cell interconnections and module lamination assembly) as well as during field operation of the installed PV modules (i.e., due to weather conditions, temperature changes, wind-induced and/or snow-load-induced and/or installation-related module bending stresses).

Additionally, crystalline silicon modules often utilize relatively expensive external bypass diodes, which must be capable of handling relatively high forward-biased electrical currents in the range of approximately several amperes up to about 10 amperes and relatively high reverse bias voltages in the range of approximately 10 volts to 20 volts, in order to eliminate hot-spot effects caused by the partial or full shading of solar cells and to prevent the resulting potential solar cell and module reliability failures. Such shade-induced hot-spot phenomena, which are caused by reverse biasing of the shaded cell or cells in a PV module, may permanently damage the affected PV cells as well as the PV module encapsulation material and cell-to-cell interconnections, and even cause fire hazards, if the sunlight arriving at the surface of the PV cells in a PV module is partially blocked or not sufficiently uniform within the PV module—for instance, due to full or even partial shading of one or a plurality of solar cells. Bypass diodes are often placed on sub-strings of the PV module—typically one external bypass diode per sub-string of 20 solar cells in a standard 60-cell crystalline silicon solar module with three 20-cell sub-strings or one external bypass diode per sub-string of 24 solar cells in a 72-cell crystalline silicon solar module with three 24-cell sub-strings, while many other module formats and configurations with different numbers of embedded solar cells are possible for modules with any number of cells. This connection configuration with external bypass diodes across the series-connected cell strings prevents the reverse bias hot spots due to any shaded cells and enables the PV modules to operate with a relatively high degree of reliability throughout their lifetime under various real life shading or partial shading and soiling conditions. In the absence of solar cell shading or soiling, each cell in the string essentially acts as an electrical current source with relatively matched electrical current values with the other cells in the series-connected string of cells, with the external bypass diode in the sub-string being reversed biased with the total voltage of the sub-string in the module (for example, 20 cells in a series-connected string create approximately about 10V to 12V reverse bias across the bypass diode in a crystalline silicon PV system). With shading of a cell in a string, the shaded cell is reverse biased, turning on the bypass diode for the sub-string containing the shaded cell, thereby allowing the current from the good/non-shaded solar cells in the non-shaded sub-strings to flow in the external bypass circuit. While the external bypass diodes (typically three external bypass diodes included in the standard mainstream 60-cell crystalline silicon PV module junction box) protect the PV module and cells in case of shading of the cells, they can also actually result in significant loss of power harvesting and energy yield for the installed PV systems.

Currently, a majority of silicon solar cells are made using p-type (e.g., boron doped) crystalline silicon wafers (both multi-crystalline and mono-crystalline). Such cells are fragile and may break easily (and thus often must be packaged in rigid, framed, glass-covered modules), suffer from efficiency limits (typical p-type cell efficiency is limited to about 20%), efficiency degradations (such as Light-Induced Degradation or LID) due to iron boron (Fe—B) and boron-oxygen (B—O) pairings. Much work is being invested into developing foundation technology and transitioning to n-type (e.g., phosphorus doped) starting wafers which do not suffer from the same degradations and enable higher efficiency cells as compared to p-type starting wafers.

Further, the majority of solar modules installed or being produced utilize multi-crystalline or mono-crystalline silicon solar cells which are front contact cells (with frontside or sunnyside fingers and busbars). Such front contact cells may suffer from optical shading losses cause by front side metallization, including metallization fingers and busbars. Back contact architectures circumvent this problem.

The highest efficiency back contact cells employ interdigitated back-contact (IBC), back junction architectures which enable close proximity between the harvested carriers in the emitter and the terminals and also allow for lightly doped front surfaces which provide good blue response of the cells. Moreover, n-type wafers used for back-contact/back-junction (IBC) solar cells typically provide much higher minority carrier lifetimes compared to p-type wafers, resulting in additional higher cell efficiency upsides.

For best efficiency performance, back contact back junction IBC solar cells typically require very high minority carrier lifetime wafers—thus higher-lifetime n-type wafers are more suitable than p-type wafers for IBC cells. This may be to a large extent owed to the fact that the mean path that the generated minority carriers (for instance, holes in the case of n-type wafers and n-type IBC cell base) travel to be collected at the emitter junction located at the rear side of the cell is relatively large due to the distance to the rear collecting junction terminal from the cell frontside which is governed by the thickness of the wafer or semiconductor absorber layer.

While a certain thickness of the wafer (or semiconductor absorber) is beneficial for effectively harvesting a large fraction of infrared photons (such as those with energies closer to the bandgap energy of crystalline silicon), there is a diminishing return for value-add light absorption with larger absorber thickness, and both bulk recombination losses and the increased travel distance for the generated minority carriers (which are prone to recombination losses) lead to a deterioration of the overall cell efficiency performance as cell absorber thicknesses increase more than a certain optimum range, for example in the range of approximately 20 and 90 $\mu$m for mono-crystalline silicon, depending on the starting wafer quality (minority carrier lifetime or diffusion length). Correspondingly, from a cell efficiency performance point of view, crystalline silicon absorber thicknesses between approximately 20 and 90 $\mu$m may be optimal—the actual optimal thickness value depending on the absorber material quality as measured by minority carrier lifetime or diffusion length, and may be somewhat smaller than 20 $\mu$m or larger than 90 $\mu$m. The practical limitation to producing high-efficiency crystalline silicon cells using very thin wafers (e.g., $\leq$120 $\mu$m thickness for 156 mm$\times$156 mm wafers) is the mechanical yield of such wafers throughout the cell manufacturing process (as well as subsequent module lamination process). The mechanical yield may be decreased due to breakage of such thin wafers during cell fabrication processes and handling, such as screen printing and wet processes, as well as due to breakage from excessive film stress or excessive bow, especially as back contact cells typically require very thick high-conductivity (e.g., plated copper) backside metallization (often many tens of microns thick plated copper to carry the relatively large cell currents, at low voltage, across inter-digitated back-contact, IBC, fingers).

The need for such thick metallization often requires the use of plating, such as electroplating, of Cu or stacks of Ni, Cu and Sn of the metal structures. Introducing electroplating, including copper electroplating, into production has been a substantial technological challenge for solar companies, none the least because of the inherent risk of intrinsic metal contamination of the silicon absorber layer with the metal from the plating solution or during further processing or aging. Moreover, copper plating for IBC cells may require multiple process steps (for example: formation of PVD seed layer, screen printed resist pattern, copper-nickel-tin electroplating, strip resist pattern, wet etch exposed seed) and has significant consumable costs as well as additional fab facilities CAPEX/OPEX costs to support the back-end plating line. The IBC cell requirement for relatively thick plated copper metallization also presents significant risks in terms of stresses introduced by the thick copper due to the thermal (CTE) mismatch between the relatively thick (e.g., 30 to 80 $\mu$m thick) plated copper layer and silicon.

These constraints as well as others have kept manufacturing costs for desirable back contact IBC cell architectures relatively high and limited mass adoption.

BRIEF SUMMARY OF THE INVENTION

Therefore, a need has arisen for high efficiency solar cell fabrication methods and designs. In accordance with the disclosed subject matter, methods and structures for back contact back junction solar cells and modules are provided. These innovations substantially reduce or eliminate disadvantages and problems associated with previously developed solar cells.

According to one aspect of the disclosed subject matter, fabrication methods for the formation of back contact back junction solar cells are provided. A base dopant source, a field emitter dopant source, and an emitter dopant source are deposited on the back surface of a solar cell substrate. The solar cell substrate is annealed forming emitter contact regions corresponding to the emitter dopant source, field emitter regions corresponding to the field emitter dopant, and base contact regions corresponding to the base dopant source. The base dopant source, field emitter dopant source, and the emitter dopant source are etched. A backside passivation layer is deposited on the back surface of the solar cell. Contacts are opened to the emitter contact regions and the base contact regions through the backside passivation layer. Patterned base metallization and patterned emitter metallization is formed on the back surface of the solar cell with electrical interconnections to the base contact regions and the emitter contact regions.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description be within the scope of the claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIGS. 3A and 3B are cross-sectional diagrams showing a backplane-attached solar cell after solar cell processing steps including isolation trench formation;

FIG. 5A shows a process flow based on epitaxial silicon and porous silicon lift-off processing, FIG. 5B shows a process flow based on starting crystalline silicon wafers, and FIG. 5C shows a process flow based on epitaxial silicon and lift-off processing;

FIGS. 6A and 6B are top view diagrams of a square-shaped 3×3 and 5×5 isled square icell, respectively;

FIGS. 7C, 7D, and 7E are top view diagrams of embodiments of a triangular-shaped 16, 36, and 32 isled square icell, respectively;

FIGS. 10A and 10B are backside view diagrams showing a busbarless first metallization layer pattern (M1) formed on a square-shaped 3×3 and 5×5 isled icell, respectively;

FIG. 14A is a backside view diagram showing a second metallization layer pattern (M2) formed on a square-shaped 4×4 isled icell and FIG. 14B is an expanded view of a portion of FIG. 14A;

FIGS. 15A and 15B are backside view diagrams showing a second metallization layer pattern (M2) formed on a square-shaped 3×3 and 5×5 isled icell, respectively;

FIG. 16A is a top view diagram of an isled master cell (icell), each isle having a monolithically-integrated bypass switch (MIBS);

FIGS. 18A and 18B are schematic diagrams showing an icell having an all-series electrically connected and hybrid parallel-series electrically connected 4×4 array of isles (the design of FIG. 18B referred to as 2×8HPS design);

FIG. 30 is a diagram of monolithically isled solar cell having a 4×4 array of sub-cells;

FIGS. 34A through 34D are process flow embodiments for the manufacture of interdigitated back contact solar cells with no FSF or BSF;

FIGS. 35A through 35D are process flow embodiments for the manufacture of interdigitated back contact solar cells with a buried BSF;

FIGS. 36A through 36D are process flow embodiments for the manufacture of interdigitated back contact solar cells with a buried BSF;

FIGS. 60 and 61 are solar cell fabrication process flow embodiments for the formation of a back contact back junction solar cell utilizing a single cascade process and tunnel contacts.

DETAILED DESCRIPTION

Figure 1:
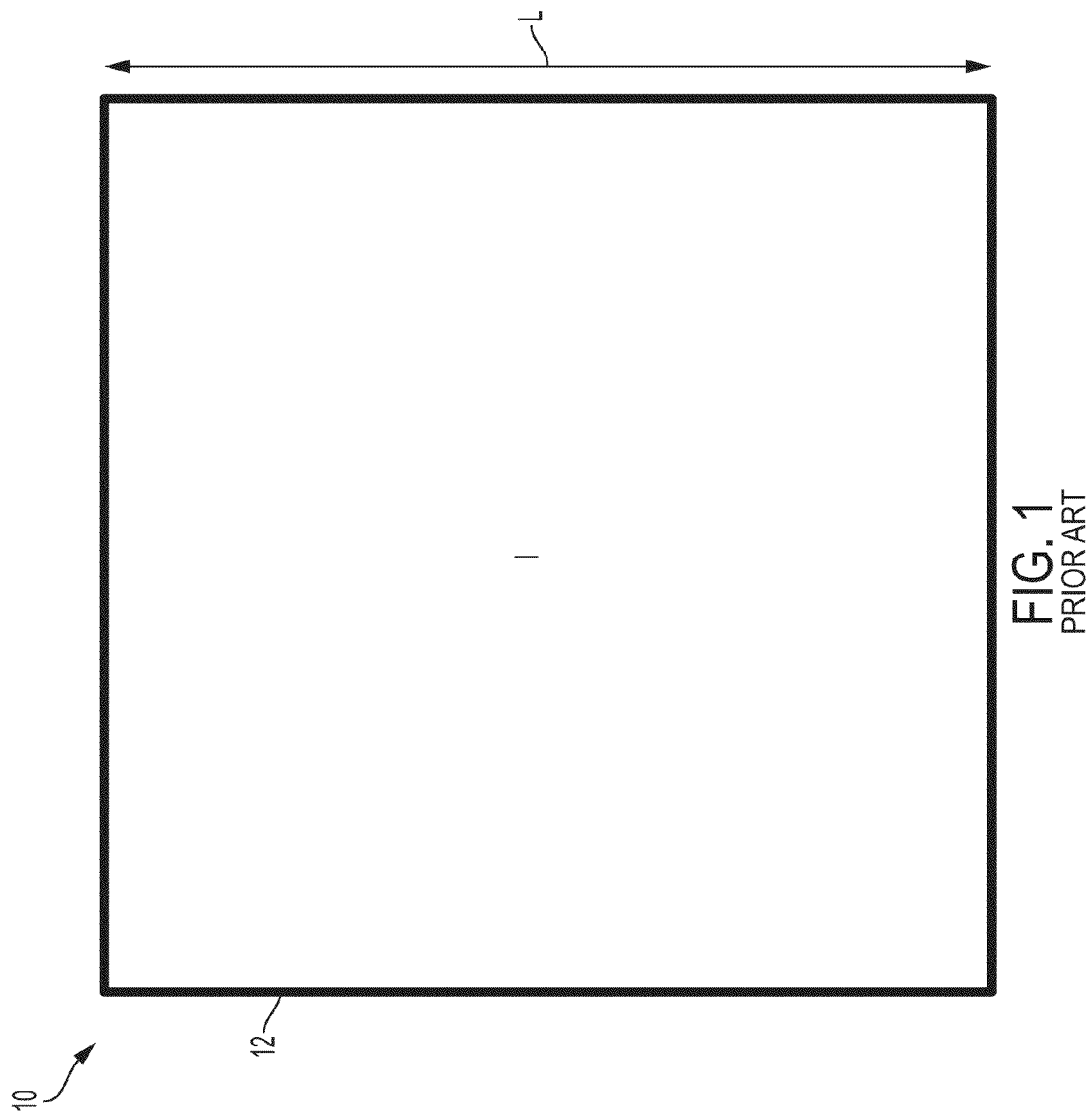
FIG. 1 is a top view diagram of a square-shaped single isle master cell.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

Importantly, the exemplary dimensions and calculations disclosed for embodiments are provided both as detailed descriptions for specific embodiments and to be used as general guidelines when forming and designing solar cells in accordance with the disclosed subject matter.

And although the present disclosure is described with reference to specific embodiments, such as backplane-attached/back-contact solar cells such as interdigitated back-contact (IBC) solar cells using monocrystalline silicon substrates and other described fabrication materials, one skilled in the art could apply the principles discussed herein to other solar cells including but not limited to non-IBC back-contact solar cells (such as Metallization Wrap-Through or MWT back-contact solar cells, traditional front contact cells) other fabrication materials including alternative semiconductor materials (such as materials comprising one or a combination of silicon, gallium arsenide, germanium, gallium nitride, other binary and ternary semiconductors, etc.), technical areas, and/or embodiments without undue experimentation.

Further, while the isled (also called tiled) master cell architectures (also referred to herein as icell, an acronym for Isled Cell) and representative manufacturing process flow descriptions are described with reference to thin epitaxial silicon back-contact/back-junction IBC solar cells formed using porous silicon lift-off processing on reusable monocrystalline templates and flexible backplanes, the novel concepts and embodiments disclosed herein can also be applied and effectively utilized in numerous other types of solar cells (and resulting solar PV modules) including, but not limited to:

- Thin epitaxial silicon back-contact/back-junction IBC solar cells formed using porous silicon lift-off processing on reusable multi-crystalline templates and either flexible or rigid backplanes;
- Thin epitaxial silicon back-contact/back-junction IBC solar cells formed using porous silicon lift-off processing on reusable monocrystalline templates and relatively rigid backplanes;
- Thin epitaxial Silicon Heterojunction (SHJ) solar cells formed using porous silicon lift-off processing on reusable multi-crystalline templates and either flexible or rigid backplanes;
- Back-junction/back-contact IBC solar cells formed using wire-sawn Czochralski (CZ) or Float-Zone (FZ) monocrystalline wafers and flexible backplanes;

Back-junction/back-contact IBC solar cells formed using wire-sawn Czochralski (CZ) or Float-Zone (FZ) monocrystalline wafers and rigid backplanes;

Back-junction/back-contact IBC solar cells formed using wire-sawn cast or ribbon multi-crystalline wafers and flexible backplanes;

Back-junction/back-contact IBC solar cells formed using wire-sawn cast or ribbon multi-crystalline wafers and rigid backplanes;

Back-contact non-IBC (e.g., Metallization Wrap-Through or MWT) solar cells formed using wire-sawn cast multi-crystalline wafers and flexible backplanes;

Back-contact non-IBC (e.g., Metallization Wrap-Through or MWT) solar cells formed using wire-sawn cast multi-crystalline wafers and rigid backplanes;

Back-contact non-IBC (e.g., Metallization Wrap-Through or MWT) solar cells formed using wire-sawn Czochralski (CZ) or Float-Zone (FZ) monocrystalline wafers and flexible backplanes;

Back-contact non-IBC (e.g., Metallization Wrap-Through or MWT) solar cells formed using wire-sawn Czochralski (CZ) or Float-Zone (FZ) monocrystalline wafers and rigid backplanes;

Semiconductor Heterojunction (SHJ) solar cells formed using wire-sawn Czochralski (CZ) or Float-Zone (FZ) monocrystalline wafers and flexible backplanes;

Semiconductor Heterojunction (SHJ) solar cells formed using wire-sawn Czochralski (CZ) or Float-Zone (FZ) monocrystalline wafers and rigid backplanes;

Front-contact solar cells formed using wire-sawn Czochralski (CZ) or Float-Zone (FZ) monocrystalline wafers and flexible backplanes;

Front-contact solar cells formed using wire-sawn Czochralski (CZ) or Float-Zone (FZ) monocrystalline wafers and rigid backplanes;

Front-contact solar cells formed using wire-sawn cast monocrystalline wafers and flexible backplanes;

Front-contact solar cells formed using wire-sawn cast monocrystalline wafers and rigid backplanes; and Any of the above-mentioned solar cells using a different semiconductor material other than crystalline silicon.

The terms isle, island, tile, paver, sub-cell, and/or mini-cell are used interchangeably herein to describe the electrically and physically isolated individual semiconductor regions formed monolithically from a master cell substrate (i.e., an initial continuous semiconductor substrate) attached to a common or continuous backplane layer or sheet. The term isled master cell, icell, or modified main cell refers to the plurality of isles or sub-cells formed from the same original semiconductor substrate layer and the subsequent modified isled solar cell. The original semiconductor layer or substrate from which the mini-cells are formed may be referred to as a master cell.

Further, term backplane may be used herein to describe a combination of materials on the cell backside—such as metallization layers and electrically insulating layers attached to the solar cell backside—providing mechanical and structural support to a master cell (and its plurality of isles or mini-cells), and to enable an advanced solar cell interconnection design. Alternatively and in some instances, the term backplane may be used to describe a material layer, such as an electrically insulating flexible prepreg layer, formed and positioned on the backside of the solar cell, hence, enabling a solar cell metallization structure comprising at least two metallization layers on the cell backside. The backplane layer may be made of either a rigid or flexible thin sheet of material (for instance, with backplane sheet thickness in the range of up to about 250 microns). For applications involving back-contact solar cells (including either interdigitated back-contact—IBC or metallization-wrap-through—MWT), the backplane layer may be made of an electrically insulating material (either a flexible or a rigid material). For applications involving front-contact solar cells, the backplane layer may be either electrically insulating or electrically conducting. In most instances, the term backplane refers to the continuous thin sheet of support material, including but not limited to a thin sheet of prepreg material, which can be either flexible or rigid. The use of a flexible backplane sheet in conjunction and in accordance with the disclosed subject matter also enables packaging of the solar cells in flexible, lightweight PV modules (not requiring much heavier glass cover sheets for frontside or for both frontside and backside).

The present application provides various structures and methods for monolithic isled solar cells and modules. The term monolithic integrated circuit is used to describe a plurality of semiconductor devices and corresponding electrical interconnections that are fabricated onto a slice of semiconductor material layer, also known as the semiconductor substrate. Hence, a monolithic integrated circuit is typically manufactured on a thin continuous slice or layer of a semiconductor material such as crystalline silicon. The monolithic icell structures described herein are monolithic semiconductor integrated circuits as the integrated sub-cells are all formed or manufactured on a slice of semiconductor substrate layer (from either a starting semiconductor wafer or a grown semiconductor layer formed by a vapor-phase or liquid-phase growth method such as epitaxial deposition). Further, the combination of a continuous backplane attached to the semiconductor substrate layer backside enables monolithic integrated icell embodiments in accordance with the disclosed subject matter.

Physically or regionally isolated isles (i.e., the initial semiconductor substrate partitioned into a plurality of substrate isles supported on a shared continuous backplane) are formed from one initially continuous semiconductor layer or substrate—thus the resulting isles (for instance, trench isolated from one another using trench isolation regions or cuts through the semiconductor substrate) are monolithic—attached to and supported by a continuous backplane (for example a flexible backplane such as an electrically insulating prepreg layer). The completed solar cell comprises a plurality of monolithically integrated isles or mini-cells, in some instances attached to a flexible backplane (e.g., one made of a prepreg materials, for example having a relatively good Coefficient of Thermal Expansion or CTE match to that of the semiconductor substrate material), providing increased solar cell flexibility and pliability while suppressing or even eliminating micro-crack generation and crack propagation or breakage in the semiconductor substrate layer. Further, a flexible monolithically isled (or monolithically integrated group of isles) cell (also called an icell) provides improved cell planarity and relatively small or negligible cell bow throughout solar cell processing steps such as any optional semiconductor layer thinning etch, texture etch, post-texture clean, PECVD passivation and anti-reflection coating (ARC) processes (and in some processing embodiments also allows for sunny-side-up PECVD processing of the substrates due to mitigation or elimination of thermally-induced cell warpage), and final solar cell metallization. While the solar cells disclosed herein may be used to produce rigid glass-covered PV modules, the structures and methods disclosed herein also enable flexible, lightweight PV modules formed from the monolithic isled master cells (i.e., icells) which substantially decrease or eliminate solar cell micro-cracking during module lamination and also during PV module operation in the field. These flexible, lightweight PV modules may be used in a variety of markets and applications including, but not limited to, the residential rooftop (including residential Building-Integrated Photovoltaics or BIPV rooftop shingles/tiles), commercial rooftops, ground mount utility-scale power plants, portable and transportable PV power generation, automotive (such as solar PV sunroof), and other specialty applications.

Aspects of the innovations disclosed herein, either individually or in combination, may provide the following advantages among others:

- An isled solar cell (icell) enables scaling of the solar cell voltage and current, specifically scaling up the solar cell voltage (in other words increasing the master cell output voltage) and scaling down the solar cell current (in other words decreasing the master cell output current) based on the number (e.g., N×N array) of cell isles/tiles (or sub-cells) which, among numerous other advantages including reduced metallization sheet conductance or thickness requirements (hence, reduced metallization material and process cost), lowers the maximum electrical current rating requirement for associated embedded power electronics components such as embedded shade management diodes (e.g., lower current rating Schottky or pn junction diodes), or embedded Maximum-Power-Point Tracking (MPPT) power optimizers (such as embedded MPPT DC-to-DC micro-converters or MPPT DC-to-AC micro-inverters). This may reduce the sizing (e.g., footprint and/or package thickness) and cost of embedded power electronics components such as bypass switches (bypass switches with higher current ratings typically have higher costs as compared to bypass switches with lower current ratings), and improve the embedded power electronics device (such as the bypass switch used for distributed shade management, or the MPPT power optimizer used for distributed enhanced power/energy harvest from the PV module) performance due to the reduced electrical current (for instance, flowing through the bypass switch when it is activated and forward-biased to protect a shaded solar cell). A lower-rated current (for example, about 1 to 2 A) Schottky barrier diode typically costs much less, can have a much smaller package, and dissipates much less power than a 10 A to 20 A Schottky barrier diode. The embodiments disclosed herein (for instance, using N×N isles for the master cell or icell), with icell electrical interconnection configured to provide higher cell voltage (with a scale-up factor of up to N×N) and lower cell current (with a scale-down factor of up to N×N) can reduce the resulting solar cell current while increasing the solar cell voltage for the same solar cell power in order to enable the use of lower cost, smaller, and less power-dissipating bypass diodes. For example, consider a crystalline silicon master cell or icell with a maximum-power-point voltage of $V_{mp} \approx 0.60V$ and a maximum-power-point current of $I_{mp} \approx 9.3$ A (with the solar cell producing a maximum-power-point power of $P_{mp} \approx 5.6$ W). A master cell or icell with a 5×5 array of mini-cells (N=5), with all the isles or sub-cells connected in electrical series (S=25), for example using a combination of a first level metal (M1) on the backside of the solar cell and a second level metal (M2) on an electrically insulating backplane layer as described further herein, will result in a modified cell with $V_{mp}=15V$ and $I_{mp}=0.372$ A—in other words, the master cell or icell voltage is scaled up by a factor of 25 and the master cell or icell current is scaled down by the same factor of 25 (compared to the solar cell of the same master cell size but without the icell structures disclosed herein).

- Higher conversion-efficiency, embedded/distributed lower cost, and smaller footprint Maximum-Power-Point Tracking (MPPT) power optimizer (DC-to-DC or DC-to-AC) chips with superior performance such as dynamic range response may be embedded within the module laminate and/or integrated directly on the backsides of the solar cells (for instance, on the backplanes of the backplane-attached icells disclosed herein) due to the higher voltage and lower current master cell (icell) made of a plurality of isles or mini-cells. In one embodiment, the icell may use an inexpensive single-chip MPPT power optimizer (DC-to-DC micro-converter or DC-to-AC micro-inverter).

- Allows for inexpensive implementation of distributed cell-level integrated shade management (an embedded bypass switch connected to each icell), providing higher effective energy yield for the installed PV modules in the field. In one embodiment, this may comprise a monolithically integrated bypass switch (MIBS) formed peripherally around each isle so that during partial shading only the affected/shaded tiles or mini-cells are shunted while the remaining ones produce and deliver electrical power.

- The scaled down electrical current of an isled solar cell (an icell)—for instance, decreased by a factor of N×N isles—decreases the required patterned metallization sheet conductance and thickness due to the reduced ohmic losses. In other words, the metallization sheet conductance and thickness requirements are relaxed due to substantially reduced ohmic losses. A thinner solar cell metallization structure has a number of benefits relating to solar cell processing and may provide significant manufacturing cost reduction (for instance, much less metallization material required per cell) as well as reducing thermal and mechanical stresses relating to relatively thick (e.g., 10's of microns for interdigitated back-contact solar cells) metallization structures and the CTE mismatch between conductive metal and semiconductor material. Usually the metallization materials such as copper or aluminum have a much higher CTE compared to the semiconductor materials. For instance, linear CTEs of aluminum, copper, and silver (high-conductivity metals) are about 23.1 ppm/° C., 17 ppm/° C., and 18 ppm/° C., respectively. However, the linear CTE of silicon is around 3 ppm/° C. Therefore, there is a relatively large CTE mismatch between these high-conductivity metallization materials and silicon. These relatively large CTE mismatches between the metallization materials and silicon can cause serious cell manufacturing yield and PV module reliability problems, particularly when using relatively thick metallization structures for solar cells (such as thick plated copper used in IBC solar cells).

- In a multi-layer metallization pattern, such as the dual layer metallization patterns described herein for interdigitated back-contact (IBC) solar cells, the second level metal (M2), for example comprising aluminum or copper, can be made much thinner due to the current and voltage scaling of the icell architecture, and thus deposited without wet plating and using a process which is substantially less mechanically stressful on the cell and chemically intrusive to the cell (for example a dry processing method such as physical-vapor deposition—PVD such as metal evaporation and/or plasma sputtering—or metal paste screen printing or metal ink printing by inkjet printing, etc.).

In some instances, the cost of material forming the backplane (such as prepreg) is reduced as the icell architecture using a plurality of flexible isles reduces/relaxes the CTE requirements of the prepreg (for instance, by relaxing the relative CTE matching requirement between the backplane layer and semiconductor substrate). Relative CTE matching requirements between the backplane sheet and the semiconductor substrate are reduced as there is less continuous cell area attached to the backplane (because of the trench isolation regions partitioning the semiconductor substrate into a plurality of isles or sub-cells on the continuous backplane sheet)—the continuous mini-cell area attached to the continuous backplane is defined by the isle area or region surrounded by trench isolation.

Trench separated and electrically partitioned substrate regions for isles provide relative flexibility, further mitigate cell bow, and maintain relative planarity across the master cell (entire icell area) during cell processing (and in some instances also allowing for cell passivation processing such as sunnyside-up cell PECVD deposition) and reduce long term material stresses after cell fabrication, module lamination, and during the operation of the PV modules in the field under varying weather conditions.

Important applications of the disclosed innovations include but are not limited to: flexible solar cells and flexible, lightweight PV modules for the residential rooftop, Building-Integrated PhotoVoltaics (BIPV) in residential and commercial buildings, commercial rooftops, ground-mount utility-scale power plants, automotive applications, portable electronics, portable and transportable power generation, and other specialty applications. The embodiments disclosed herein include both rigid or flexible solar cells which may be packaged or laminated into rigid glass-covered solar PV modules for a wide range of applications, including the above-mentioned residential rooftop, commercial rooftop, BIPV, ground-mount utility, automotive, portable and transportable power generation, and other specialty applications.

FIG. 1 is a representative schematic diagram of a square-shaped single isle cell pattern—prior art standard solar cell geometry without plurality of isles to create an icell. Although shown as a full-square-shaped cell here, the solar cell may be shaped as pseudo square, rectangular, other polygonal shapes, or any other geometrical shape of interest. FIG. 1 is a schematic diagram showing a top or plan view of a single-isle I (or non-isled or non-tiled) standard square-shaped solar cell 10 defined by cell peripheral boundary or edge regions 12 and having a side length L. Current or mainstream crystalline silicon solar cells are often rectangular/square shaped (mostly either full square or pseudo square shaped wafers) with cell square area on the order of X by X (with X typically being in the range of about 100 mm up to 210 mm or even larger values), for example, 125 mm×125 mm or 156 mm×156 mm or 210 mm×210 mm solar cells. And although a square shaped solar cell is used as an exemplary master cell (master cell is defined as a single solar cell made from an original continuous semiconductor substrate) shape herein, master cells may come in various shapes (for example pseudo-square) and have various geometrical dimensions.

Cell peripheral boundary or edge region 12 has a total length of 4L, thus solar cell 10 has a total peripheral dimension of 4L. Assuming a solar cell semiconductor (e.g., silicon substrate layer) absorber thickness of W (see the cross-sectional diagram of FIG. 3A), the cell edge area as a fraction of the cell active area is defined as the ratio R where $R=(4LW)/(L^2)=4W/L$. For a thin-silicon solar cell having L=156 mm and W=40 μm (microns) thick silicon substrate (for example an epitaxially grown silicon also known as epi, layer, or alternatively s silicon layer formed from an original wire-sawn CZ or FZ or multi-crystalline silicon wafer): $R=4\times40\times10^{-3}/156$, thus R=0.0010 (or 0.10%). And for a more conventional standard solar cell with W=200 μm thick silicon substrate (for example, from a CZ monocrystalline wafer or a cast multi-crystalline wafer): R=0.0050 (or 0.50%). Generally, a solar cell structure should have a relatively small edge area as compared to active cell area (also called edge to cell ratio)—for instance, less than about 5%, and in some instances less than about 1%—in order to minimize the edge-related solar cell recombination losses which may result in reduced open-circuit voltage and/or reduced short-circuit current, and hence, reduced solar cell conversion efficiency. The edge-induced losses can be substantially mitigated by proper passivation of the solar cell edge regions and through isolation/separation of the emitter junction region from the edge region (hence, providing allowance for larger edge area fraction without loss of solar cell efficiency).

Figure 2:
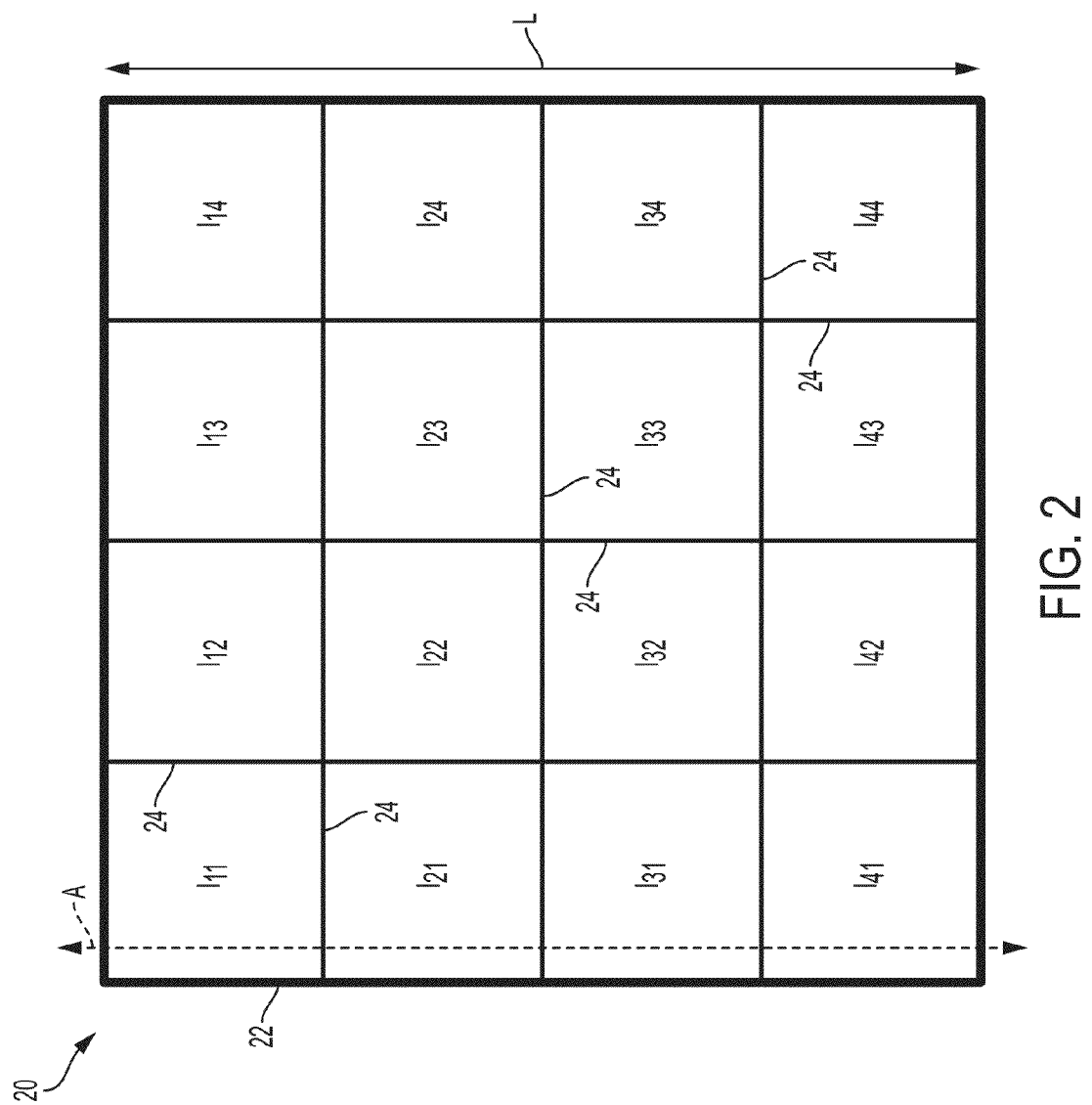
FIG. 2 is a top view diagram of a square-shaped 4×4 isled square master cell (or isled cell "icell")

FIG. 2 is a representative schematic plan view (frontside or sunnyside view) diagram of an icell pattern (shown for square-shaped isles and square-shaped icell) along with uniform-size (equal-size) square-shaped isles for N×N=4×4=16 isles (or sub-cells, mini-cells, tiles). This schematic diagram shows a plurality of isles (shown as 4×4=16 isles) partitioned by trench isolation regions. FIG. 2 is a schematic diagram of a top or plan view of 4×4 uniform isled (tiled) master solar cell or icell 20 defined by cell peripheral boundary or edge region 22, having a side length L, and comprising sixteen (16) uniform square-shaped isles formed from the same original continuous substrate and identified as $I_{11}$ through $I_{44}$ attached to a continuous backplane on the master cell backside (backplane and solar cell backside not shown). Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and in some instances less than or equal to about 100 μm—for instance, in the range of a few up to about 100 μm) shown as trench isolation or isle partitioning borders 24. Main cell (or icell) peripheral boundary or edge region 22 has a total peripheral length of 4L; however, the total icell edge boundary length comprising the peripheral dimensions of all the isles comprises cell peripheral boundary 22 (also referred to as cell outer periphery) and trench isolation borders 24. Thus, for an icell comprising N×N isles or mini-cells in a square-shaped isle embodiment, the total icell edge length is N× cell outer periphery. In the representative example of FIG. 2 showing an icell with 4×4=16 isles, N=4, so total cell edge length is 4× cell outer periphery 4L=16L (hence, this icell has a peripheral dimension which is 4 times larger than that of the standard prior art cell shown in FIG. 1). For a square-shaped master cell or icell with dimensions 156 mm×156 mm, square isle side dimensions are approximately 39 mm×39 mm and each isle or sub-cell has an area of 15.21 cm² per isle.

FIGS. 3A and 3B are representative schematic cross-sectional view diagrams of a backplane-attached solar cell during different stages of solar cell processing. FIG. 3A shows a simplified cross-sectional view of the backplane-attached solar cell after processing steps and before formation of the partitioning trench regions. FIG. 3B shows a simplified cross-sectional view of the backplane-attached solar cell after some processing steps and after formation of the partitioning trench regions to define the trench-partitioned isles. FIG. 3B shows a schematic cross-sectional view of the icell of FIG. 2 along the view axis A of FIG. 2 for an icell pattern (shown for square-shaped isles and square-shaped icell), indicating the uniform-size (equal-size) square-shaped isles for N×N=4×4=16 isles (or sub-cells, mini-cells, tiles).

FIGS. 3A and 3B are schematic cross-sectional diagrams of a monolithic master cell semiconductor substrate on a backplane before formation of trench isolation or partitioning regions, and a monolithic isled or tiled solar cell on a backplane formed from a master cell after formation of trench isolation or partitioning regions, respectively. FIG. 3A comprises semiconductor substrate 30 having width (semiconductor layer thickness) W and attached to backplane 32 (e.g., an electrically insulating continuous backplane layer, for instance, a thin flexible sheet of prepreg) similar to that shown in FIG. 1. FIG. 3B is a cross-sectional diagram of an isled solar cell (icell)—shown as a cross-sectional diagram along the A axis of the cell of FIG. 2. Shown, FIG. 3B comprises isles or mini-cells $I_{11}$, $I_{21}$, $I_{31}$, and $I_{41}$ each having a trench-partitioned semiconductor layer width (thickness) W and attached to backplane 32. The semiconductor substrate regions of the mini-cells are physically and electrically isolated by an internal peripheral partitioning boundary, trench partitioning borders 24. The semiconductor regions of isles or mini-cells $I_{11}$, $I_{21}$, $I_{31}$, and $I_{41}$ are monolithically formed from the same continuous semiconductor substrate shown in FIG. 3A. The icell of FIG. 3B may be formed from the semiconductor/backplane structure of FIG. 3A by forming internal peripheral partitioning boundaries in the desired mini-cell shapes (e.g., square shaped mini-cells or isles) by trenching through the semiconductor layer to the attached backplane (with the trench-partitioned isles or mini-cells being supported by the continuous backplane). Trench partitioning of the semiconductor substrate to form the isles does not partition the continuous backplane sheet, hence the resulting isles remain supported by and attached to the continuous backplane layer or sheet. Trench partitioning formation process through the initially continuous semiconductor substrate thickness may be performed by, for example, pulsed laser ablation or dicing, mechanical saw dicing, ultrasonic dicing, plasma dicing, water jet dicing, or another suitable process (dicing, cutting, scribing, and trenching may be used interchangeably to refer to the trench isolation process to form the plurality of isles or mini-cells or tiles on the continuous backplane). Again, the backplane structure may comprise a combination of a backplane support sheet in conjunction with a patterned metallization structure, with the backplane support sheet providing mechanical support to the semiconductor layer and structural integrity for the resulting icell (either a flexible solar cell using a flexible backplane sheet or a rigid solar cell using a rigid backplane sheet or a semi-flexible solar cell using a semi-flexible backplane sheet). Again, while the term backplane may be used to refer to the combination of the continuous backplane support sheet and patterned metallization structure, more commonly the term backplane is used to refer to the backplane support sheet (for instance, an electrically insulating thin sheet of prepreg) which is attached to the semiconductor substrate backside and supports both the icell semiconductor substrate regions and the overall patterned solar cell metallization structure.

As previously noted, crystalline (both mono-crystalline and multi-crystalline) silicon photovoltaics (PV) modules currently account for over approximately 85% of the overall global solar PV market, and the starting crystalline silicon wafer cost of these crystalline silicon PV modules currently constitutes about 30% to 50% of the total PV module manufacturing cost (with the exact ratio depending on the technology type and various economic factors). And while the primary embodiments provided herein are described as back-contact/back junction (Inter-digitated Back-Contact or IBC) solar cells, the monolithic isled solar cell (or icell) innovations disclosed herein are extendible and applicable to various other solar cell architectures such as Metallization Wrap-Through (MWT) back-contact solar cells, Semiconductor HeteroJunction (SHJ) solar cells, front-contact/back-junction solar cells, front-contact/front-junction solar cells, Passivated Emitter and Rear Contact (PERC) solar cells, as well as other front-contact/front-junction solar cells, with all of the above-mentioned cell designs using crystalline silicon (for instance, either mono-crystalline silicon or multi-crystalline silicon with final cell silicon layer thickness in the range of a few microns up to about 200 microns), or another crystalline (mono-crystalline or multi-crystalline) semiconductor absorber material (including but not limited to germanium, gallium arsenide, gallium nitride, or other semiconductor materials, or a combination thereof). The monolithic isled solar cell (or icell) innovations disclosed herein are extendible and applicable to compound semiconductor multi junction solar cells.

Figure 4:
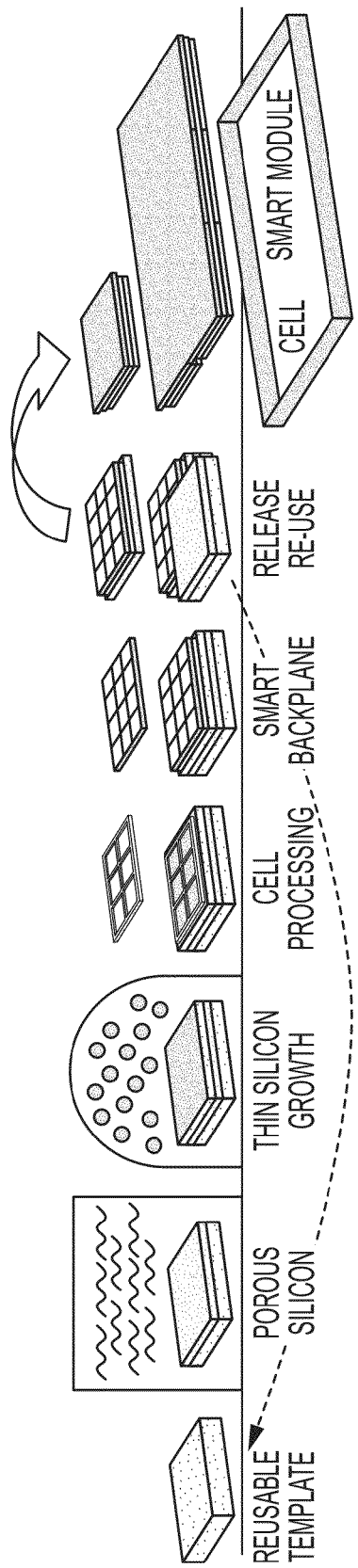
FIG. 4 is a representative process flow for the fabrication of backplane-attached solar cells using epitaxial silicon lift-off processing.

A key advantage of the disclosed monolithically isled solar cells or icells is that they may be monolithically fabricated during cell processing and easily integrated into existing solar cell fabrication process flows. The isled master cell embodiments disclosed herein may be used in conjunction with numerous backplane-attached solar cell designs, processing methods, and semiconductor substrate materials, including the backplane-attached, back-contact solar cells fabricated using epitaxial silicon lift-off process flow shown in FIG. 4. FIG. 4 shows the schematic diagram of a general back-contact solar cell manufacturing process flow highlighting key processing steps of one such cell fabrication process—a crystalline-silicon solar cell manufacturing process using relatively thin (in the thickness range of a few microns up to about 100 microns) epitaxial silicon lift-off processing which substantially reduces silicon material usage and eliminates several process steps in traditional crystalline silicon solar cell manufacturing steps to create low-cost, high-efficiency, back-junction/back-contact crystalline silicon solar cells and modules. Specifically, the process flow of FIG. 4 shows the fabrication of backplane-attached crystalline silicon solar cells having backplanes attached to the backsides of the solar cells (for instance, prepreg backplane sheets laminated to the backsides of the solar cells) for solar cells and modules with optional allowances for smart cell and smart module design (i.e., allowing for embedded distributed electronics components for enhanced power harvest from the solar cells and modules), formed using a reusable crystalline (either mono-crystalline or multi-crystalline) silicon template and epitaxial silicon deposition on a seed and release layer of porous silicon, which may utilize and integrate the monolithically isled cell (icell) structures and methods disclosed herein.

The solar cell process flow of FIG. 4 may be used to form monolithic isled solar cells or icells. The process shown in FIG. 4 starts with a reusable (to be reused at least a few times, in some instances between about 10 up to about 100 times) crystalline silicon template, for example a p-type monocrystalline or multi-crystalline silicon wafer, onto which a thin (a fraction of micron up to several microns) sacrificial layer of porous silicon with controlled porosity is formed (for example by an electrochemical etch process for template surface modification in an HF/IPA or HF/acetic acid wet chemistry in the presence of an electrical current). The porous silicon layer may have at least two layers with a lower porosity surface layer and a higher porosity buried layer. The starting material or reusable crystalline silicon template may be a single crystalline (also known as mono-crystalline) silicon wafer, for example formed using crystal growth methods such as float zone (FZ), czochralski (CZ), magnetic stabilized CZ (MCZ), and may further optionally comprise epitaxial layers grown over such silicon wafers. Alternatively, the starting material or reusable crystalline silicon template may be a multi-crystalline silicon wafer, for example formed using either casting or ribbon, and may further optionally comprise epitaxial layers grown over such silicon wafers. The template semiconductor doping type may be either p or n (often relatively heavy p-type doping to facilitate porous silicon formation), and the wafer shape, while most commonly square shaped, may be any geometric or non-geometric shape such as quasi-square (pseudo square), hexagonal, round, etc.

Upon formation of the sacrificial porous silicon layer, which serves both as a high-quality epitaxial seed layer as well as a subsequent separation/lift-off layer for the resulting epitaxial silicon layer, a thin layer (for example a layer thickness in the range of a few microns up to about 100 microns, and in some instances an epitaxial silicon thickness less than approximately 50 microns) of in-situ-doped (for instance, doped with phosphorus to form a n-type epitaxial silicon layer) crystalline (either mono-crystalline or multi-crystalline) silicon is formed on the sacrificial porous silicon layer, also called epitaxial growth. The in-situ-doped crystalline (either mono-crystalline layer on mono-crystalline template or multi-crystalline layer on multi-crystalline template) silicon layer may be formed, for example, by atmospheric-pressure epitaxy using a chemical-vapor deposition or CVD process in ambient comprising a silicon gas such as trichlorosilane or TCS and hydrogen (and the desired dopant gas such as $PH_3$ for n-type phosphorus doping).

After completion of a portion of solar cell processing steps (including in some instances, backside doped emitter formation, backside passivation, doped base and emitter contact regions for subsequent metallization contacts to the base and emitter regions, and solar cell metallization), a rather inexpensive backplane layer may be attached to the thin epi layer for permanent cell support and reinforcement as well as to support formation of the high-conductivity cell metallization structure of the solar cell (for instance, using a two-layer metallization structure using a patterned first layer of metallization or M1 on the solar cell backside prior to the backplane attachment and a patterned second layer of metallization or M2 on the backside of the backplane-attached solar cell after the backplane attachment and after the lift-off release of the backplane-attached solar cell from the reusable template). The continuous backplane material may be made of a thin (for instance, with a thickness in the range of about 50 microns to about 250 microns thick), flexible, and electrically insulating polymeric material sheet such as an inexpensive prepreg material commonly used in printed circuit boards which meets cell process integration and reliability requirements. The partially-processed back-contact, back junction (IBC) backplane-attached solar cell (for instance, with a solar cell area of about 100 mm×100 mm, 125 mm×125 mm, 156 mm×156 mm, 210 mm×210 mm or larger, or solar cell area in the range of about 100 $cm^2$ to 100's of $cm^2$ and even larger) is then separated and lifted off (released) from the reusable template along the mechanically-weakened sacrificial porous silicon layer (for example through a Mechanical Release or MR lift-off process, breaking off the higher porosity porous silicon interface to enable lift-off release) and the template may be conditioned (e.g., cleaned) and re-used multiple times (for instance, between about 10 and 100 times) to reduce the overall solar cell manufacturing cost. The remaining post-lift-off solar cell processing may then be performed on the backplane-attached solar cell, for example first on the solar cell sunny-side (or frontside) which is exposed after being lifted off and released from the template. Solar cell frontside or sunny-side processing may include, for instance, completing frontside texturization (for instance, using an alkaline or acidic texturing), post-texture surface preparation (cleaning), and formation of the frontside passivation and an anti-reflection coating (ARC) using a deposition process. The frontside passivation and ARC layer may be deposited using a Plasma-Enhanced Chemical-Vapor Deposition (PECVD) process and/or another suitable processing method.

The monolithically isled cell (icell) structures and methods disclosed herein may be integrated into device fabrication, such as the exemplary disclosed solar cell fabrication process flows, without substantially altering or adding manufacturing process steps or tools and thus without substantially adding to the cost of manufacturing the solar cell and without substantially altering the main solar cell manufacturing process flow. In fact, the monolithically isled cell (icell) structures and methods disclosed herein can reduce the cost of manufacturing the solar cell, for instance, by reducing the metallization cost (using less metallization material and lower cost metallization process) and/or by improving the solar cell and module manufacturing yield (due to substantial mitigation of solar cell micro-cracks or breakage).

In one embodiment, scribing (also known as trenching or cutting or dicing), of the master cell semiconductor substrate to form the internal isle partitioning trench boundaries and creating the plurality of trench-partitioned isles or mini-cells or sub-cells or tiles may be performed from the frontside or sunnyside (after lift-off release of the backplane-attached epitaxial silicon substrate layer), using a suitable method such as pulsed laser ablation (for instance, pulsed nanoseconds laser scribing) or a mechanical scribing method or a plasma scribing method, through the master cell silicon substrate layer thickness (for example, the epitaxial silicon layer thickness may be in the range of about a few microns up to about 100 μm). Pulsed laser ablation scribing (or another suitable trench scribing method as described previously) may be performed such that scribing through the thickness of the semiconductor substrate layer forms relatively narrow (e.g., width of less than 100 microns) trench isolation borders all the way through the entire thickness of the thin silicon layer and essentially stops at/on the backplane (removal and scribing of the continuous backplane material layer being rather small or negligible)—thus monolithically producing fully partitioned monolithic isles (or sub-cells or mini-cells or tiles) supported on a continuous backplane layer. Partitioning trench formation methods to form the plurality of isles and their associated trench partitioning boundaries in a master cell substrate having a thickness in the range of about a few microns to as large as about 200 microns (master cell substrate thickness or width shown as W in FIG. 2) include, for example: pulsed laser scribing (or dicing, or trenching), such as by pulsed nanoseconds laser ablation (using a suitable laser wavelength such as UV, green, IR, etc.); ultrasonic scribing or dicing; mechanical trench formation such as by using a mechanical saw or blade; patterned chemical etching (both wet and plasma etching); screen printing of an etch paste following by etching activation and rinsing of the etch paste residue, or any combination of known or the above mentioned trench formation methods. Pulsed laser ablation processing for trench formation may provide several advantages allowing for the direct patterning of the isle or mini-cell boundaries with relatively high process throughput, enabling formation of relatively narrow trenches (e.g., less than about 100 microns trench width), and without any process consumable (hence, very low process cost). However, irrespective of the trench formation method used to partition the plurality of isles or sub-cells, special care should be taken to reduce or minimize the trench width—for example, it may be desired to make the partitioning trench width less than about 100 microns, in order to make the solar cell area loss due to the icell partitioning trenches a relatively small to negligible fraction of the total icell area (for instance less than about 1% of the total icell area). This will ensure that the loss of icell total-area efficiency due to the partitioning trenches is rather negligible (e.g., less than 1% relative). Pulsed nanoseconds laser ablation processing is capable of high-throughput formation of trenches with trench width well below 100 microns (e.g., about 10 to 60 microns). For example, for a square-shaped icell with the master cell area of 156 mm×156 mm and 4×4=16 isles (or mini-cells) and partitioning trenches with trench width of 50 microns (0.05 mm), for example, formed by pulsed laser ablation trenching, the area fraction R of the total trench planar surface area $A_{trench}$ to the total master cell area (or the icell area $A_{icell}$) can be calculated as follows: $R = A_{trench}/A_{icell} = 6 \times 156$ mm$\times 0.05$ mm/(156 mm×156 mm) or R=0.00192. Therefore, this represents an area fraction R of 0.00192 or about 0.2%. This is an extremely small area fraction, ensuring negligible loss of total-area icell efficiency as a result of the partitioning trench areas. In reality, the loss of total-area icell efficiency would be smaller than 0.2% relative under these conditions, since the direct and/or diffused sunlight impinging on the trench isolation or partitioning areas can be at least partially and possibly mostly absorbed on the isle semiconductor edge regions and contribute to the photo-generation process.

The monolithic isled (tiled) solar cell fabrication methods and structures described herein are applicable to various semiconductor (for example, including but not limited to crystalline silicon, such as thin epitaxial silicon or thin crystalline silicon wafer) solar cells (for example, front contact or back contact solar cells of various designs with cell semiconductor absorbers having a thickness in the range of about a few microns up to about 200 microns), including those formed using epitaxial silicon lift-off processing (as described earlier) or those formed using crystalline silicon wafers, such as mono-crystalline (CZ or MCZ or FZ) wafers or multi-crystalline wafers (cast or ribbon-grown wafers).

For back-contact/back-junction square-shaped cells (for example high-efficiency back-contact/back-junction IBC cells formed using either epitaxial silicon lift-off processing or crystalline silicon wafer cells with backplane reinforcement), the master cell isles (also called tiles, pavers, sub-cells, or mini-cells) may be formed (for example, using pulsed nanoseconds laser scribing of crystalline silicon substrate) as an array of N×N square-shaped isles, N×M rectangular-shaped isles, K triangular-shaped isles, or any geometrically shaped isles or combination thereof on the shared master cell (icell) continuous backplane. In the case of solar cells fabricated using epitaxial lift-off processing, the isle partitioning trench formation process may occur immediately after the lift-off release of the partially-processed backplane-attached master cell and before the remaining processing steps such as frontside surface texturing and post-texture surface cleaning, or immediately after frontside texturing and post-texture surface cleaning and before the process(es) to form the front-surface passivation and anti-reflection coating (ARC) layer(s). Performing the process to form the partitioning or isolation trenches (i.e., trenching process) by pulsed laser scribing or another suitable method (such as one of the other methods described earlier, including but not limited to mechanical dicing) before the wet etch texture process (to form the solar cell frontside texture for reduced optical reflection losses) has an added advantage of removing any trenching-process-induced silicon edge damage through wet etching and removal of damaged silicon during the wet texture etch process (which also etches several microns of silicon, including any damaged silicon in the partitioning trench sidewalls, during the texture etch process).

In some solar cell processing embodiments, including those representative process flows described in detail herein, no additional separate fabrication process equipment may be needed for the formation of the monolithically isled master cells (icells). In other words, the formation of trench-partitioned mini-cells or isles within each icell may be integrated fairly easily and seamlessly in solar cell fabrication methods. And in some cases, the monolithic isled solar cell (icell) fabrication process may improve the solar cell fabrication process flow through a reduction of solar cell manufacturing cost, for example, by reducing the cost of solar cell metallization, such as, for instance, by eliminating the need for a copper plating process and associated manufacturing equipment and facilities requirements for copper plating.

Figure 5A:
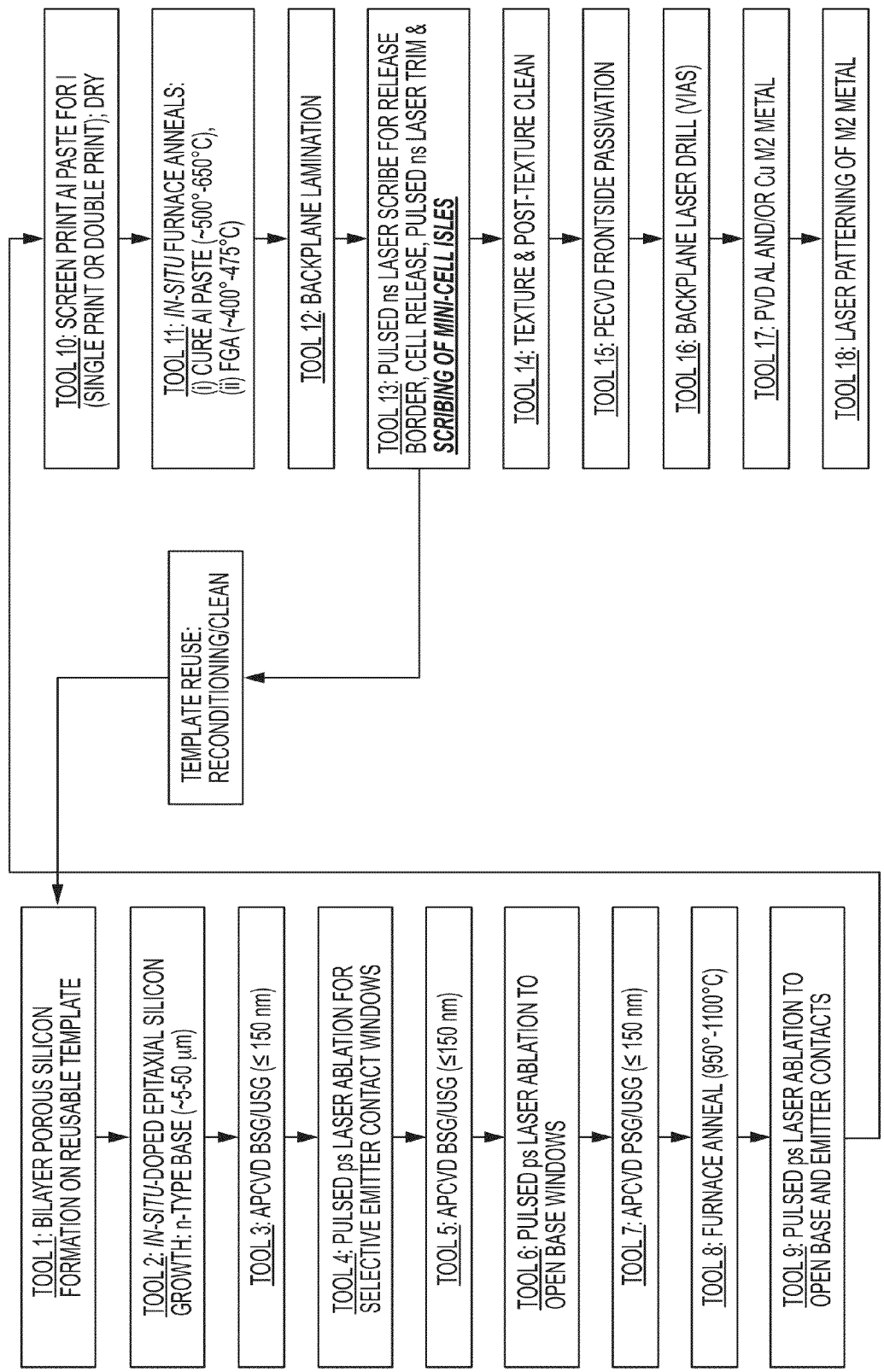
FIGS. 5A through 5C are manufacturing process flows for the formation of back-contact back junction solar cells.

FIG. 5A is a representative backplane-attached icell manufacturing process flow based on epitaxial silicon and porous silicon lift-off processing. This process flow is for fabrication of backplane-attached, back-contact/back junction solar cells (icells) using two patterned layers of solar cell metallization (M1 and M2). This example is shown for a solar cell with selective emitter, i.e., a main patterned field emitter with lighter emitter doping formed using a lighter boron-doped silicate glass (first BSG layer with smaller boron doping deposited by Tool 3), and more heavily-boron-doped emitter contact regions using a more heavily boron-doped silicate glass (second BSG layer with larger boron doping deposited by Tool 5). While this example is shown for an IBC solar cell using a double-BSG selective emitter process, the icell designs are applicable to a wide range of other solar cell structures and process flows, including but not limited to the IBC solar cells without selective emitter (i.e., same emitter boron doping in the field emitter and emitter contact regions). This example is shown for an IBC icell with an n-type base and p-type emitter. However, the polarities can be changed so that the solar cell has p-type base and n-type emitter instead.

FIG. 5A is a representative manufacturing process flow embodiment for the fabrication of back-contact back junction crystalline monolithic isled silicon solar cells (icells). Specifically, FIG. 5A provides for the formation of an epitaxial (epi) solar cell, optionally with a monolithically integrated bypass switch (MIBS) pn junction diode, and having a double borosilicate glass (BSG) selective emitter. As shown in this flow, mini-cell trench isolation regions are formed at Tool 13, after cell release border scribe and cell lift-off release and before texturization of the exposed released side (also known as frontside or sunnyside of the resulting icell). Alternatively, the mini-cell trench isolation regions may be formed after texture and post texture clean in Tool 14, and before frontside passivation (shown as PECVD). Performing the pulsed laser scribing before wet etch texture (texture and post texture clean using Tool 14) may have an added advantage of removing any laser-induced scribed silicon edge damage through wet etching and removal of damaged silicon.

A representative process flow for forming a monolithic isled (tiled) back-contact/back-junction (IBC) solar cell using epitaxial silicon lift-off processing may comprise the following fabrication steps: 1) start with reusable crystalline (mono-crystalline or multi-crystalline) silicon template; 2) form porous silicon on template (for example, bilayer porous silicon with a lower porosity surface layer and a higher porosity buried layer using anodic etch in HF/IPA or HF/acetic acid); 3) deposit epitaxial silicon with in-situ doping (for instance, n-type phosphorus doped epitaxial silicon); 4) perform back-contact/back-junction cell processing while the epitaxial silicon substrate resides on its template, including formation of patterned field emitter junction, backside passivation, doped base and emitter contact regions for subsequent metallized solar cell ohmic contacts, and formation of a first metallization layer (also known as M1)—see FIG. 5A for an example of a back-contact/back-junction (IBC) solar cell fabrication process flow comprising a selective emitter process (with more lightly doped field emitter and more heavily doped emitter contact regions) using double-BSG (BSG is boron-doped silicate glass or boron doped silicon oxide layer formed, for instance, by an atmospheric-pressure chemical-vapor deposition or APCVD process) process flow for selective emitter formation (other methods of selective emitter formation may be used instead of double BSG process, for instance, using screen printed dopant pastes); 5) attach or laminate backplane layer or sheet on back-contact cell backside; 6) laser scribe release border (lift off release boundary) around the backplane boundary at least partially into epitaxial silicon layer thickness and then release by a lift-off process (e.g., mechanical release lift-off to separate the backplane-attached epitaxial silicon substrate from the reusable template by breaking off the mechanically weakened higher porosity porous silicon layer); 7) perform the trenching (also called scribing or cutting or dicing) process using pulsed nanoseconds laser ablation (or one of the other suitable trench isolation formation methods as described earlier) from the solar cell sunnyside (opposite the backplane side) to monolithically partition the silicon substrate into the plurality of mini-cells or isles—for instance, into an array of isles comprising 4×4=16 mini-cells (also optionally trim the master cell peripheral boundary, for instance, using pulsed laser cutting, to establish the precise master cell or icell dimensions with well-defined smooth cell boundary edges); 8) proceed with performing the remaining back-end fabrication processes such as: wet silicon etch/texture in alkaline and/or acidic chemistry (this process performs the texturization on the frontside while the chemically-resistant backplane protects the backside of the solar cell from the texturization chemistry), post-texture surface preparation including wet cleaning (this process performs the frontside surface cleaning while the chemically-resistant backplane protects the backside of the solar cell from the wet cleaning chemistry), deposition of the frontside surface passivation and anti-reflection coating (ARC) layer(s), for instance, by Plasma-Enhanced Chemical-Vapor Deposition (PECVD) or a combination of PECVD for ARC deposition (e.g., hydrogenated silicon nitride) with another process such as Atomic Layer Deposition (ALD) for passivation layer deposition (such as a thin sub-30 nm layer of aluminum oxide, amorphous silicon, or amorphous silicon oxide directly on the cleaned, textured silicon surface and underneath the silicon nitride ARC layer—if using a multi-layer frontside passivation/ARC structure, such as a two-layer structure of one of the above-mentioned passivation layers covered by the silicon nitride ARC layer, the entire stack may also be deposited using PECVD using a vacuum-integrated process). The frontside passivation and ARC layer deposition will not only cover the frontside surfaces of the mini-cells or isles, it will also cover the sidewalls of the trench-partitioned isles or mini-cells, hence, substantially improving the passivation and ARC properties of the icell by improving the passivation and light capturing properties of the trench sidewalls as well as the top surfaces of the isles.

After completion of the frontside texture/cleaning/passivation and ARC deposition processes, the remaining solar cell fabrication process step involves completion of the second metallization layer (M2) on the backplane-attached solar cell backside. In order to accomplish this task, a plurality of via holes are drilled according to a pre-designed via hole pattern, for instance using laser drilling, into the thin (e.g., 25 microns up to 250 microns backplane thickness), electrically insulating, continuous backplane layer (e.g., a 25 micron to 100 micron thick laminated prepreg sheet). The number of via holes on a solar cell (e.g., 156 mm×156 mm icell) backplane may be on the order of 100's to 1000's. The via holes may have average diagonal hole dimension (e.g., average diameter of each via hole) in the range of 10's of microns to 100's of microns (for instance, about 100 microns to 300 microns). The laser-drilled via holes through the electrically insulating backplane layer are positioned to land on the interdigitated base and emitter metallization fingers (formed by the first level of patterned metallization by screen printing of a metallic paste or by physical-vapor deposition and patterning of a metal layer such as a metal comprising aluminum or aluminum-silicon alloy). These via holes will serve as the interconnection channels or plugs between the first layer of patterned metallization or M1 formed directly on the solar cell backside prior to the backplane attachment/lamination and the second layer of patterned metal or M2 to be formed immediately after formation of the laser-drilled via holes. In some instances for the icells disclosed herein, the second level of patterned metallization M2 may be formed by one of several methods, including but not limited to one or a combination of: (1) Physical-Vapor Deposition or PVD (thermal evaporation and/or electron-beam evaporation and/or plasma sputtering) of an inexpensive high-conductivity metal comprising, for instance, aluminum and/or copper (other metals may also be used) followed by pulsed laser ablation patterning, (2) Physical-Vapor Deposition or PVD (thermal evaporation and/or electron-beam evaporation and/or plasma sputtering) of an inexpensive high-conductivity metal comprising, for instance, aluminum and/or copper (other metals may also be used) followed by metal etch patterning (e.g., screen printing of an etch paste or screen printing of a resist followed by a metal wet etch process and subsequent removal of the resist), (3) Screen printing or stencil printing of a suitable metal paste (such as a paste comprising copper and/or aluminum), (4) Inkjet printing or aerosol printing of a suitable metal paste (such as a paste comprising copper and/or aluminum), (5) Patterned plating of a suitable metal, for instance, copper plating. The patterned second layer of metallization (M2) may also comprise a thin capping layer (for instance, a thin <1 micron capping layer of NiV or Ni formed by plasma sputtering or screen printing or plating) to protect the main patterned M2 (e.g., aluminum and/or copper containing high conductivity metal) and to provide a suitable surface for soldering or conductive adhesive as needed. The back-contact/back junction (IBC) solar cells described herein may utilize two layers of patterned metallization (M1 and M2), with the first patterned metallization layer M1 forming the interdigitated base and emitter metallization fingers on each mini-cell or isle according to a fine-pitch pattern (for instance, base-emitter M1 finger pitch in the range of about 200 microns to 2 mm, and in some cases in the range of about 500 microns to about 1 mm), and the second patterned layer of metallization M2 forming the final icell metallization and interconnecting the isles or mini-cells according to a pre-specified current and voltage scaling factor. Patterned M2 may be patterned substantially orthogonal or perpendicular to patterned M1 and have a much larger finger-to-finger pitch than patterned M1 fingers. This will substantially facilitate fabrication of patterned M2 according to a low-cost, high-yield manufacturing process. Patterned M2 not only forms the final icell patterned metallization, it also forms the electrically conductive via plugs through the laser-drilled via holes in order to complete the M2-to-M1 interconnections based on desired icell metallization structure.

It is also possible to extend the icell concept so that the second layer of patterned metallization M2 can be used to not only complete the individual master cell (or icell) electrical interconnections, but also monolithically interconnect a plurality of icells sharing the same continuous backplane layer, hence, resulting in a Monolithic Module structure facilitated and enabled by the icell embodiments and with numerous additional benefits. FIG. 5A is an epitaxial silicon lift off icell representative embodiment showing the process flow for fabricating monolithic icells with each icell being attached to its own separate pre-cut continuous backplane layer, and each individual backplane attached icell being processed through the entire backend process flow after its backplane lamination. The icells processed using this approach will then be tested and sorted at the end of the process and can be assembled into the PV modules by interconnections of the icells to one another, for instance in electrical series, using tabbing and/or stringing of the cells (also involving soldering and/or conductive adhesives to interconnect the plurality of solar cells to one another as part of PV module assembly), and then completion of the module lamination and final module assembly and testing. With reference to FIG. 5A is an epitaxial silicon lift off icell representative embodiment, an alternative embodiment of an icell implementation resulting in a novel monolithic module structure involves attachment or lamination of a plurality of relatively closely-spaced icells (for instance, with the adjacent icell to icell spacing in the range of 50 microns up to about 2 mm, and often in the range of about 100 microns to 1 mm) on their backsides to a larger continuous backplane sheet at the Backplane Lamination (or attachment step) performed by Tool 12. The remaining process steps after Tool 12 are performed concurrently on the plurality of icells sharing a common continuous backplane layer on their backsides (instead of being performed on the individual separate icells, each with their own separate backplane). After completion of the final metallization (patterned second layer of metal M2), the monolithic patterned M2 not only completes the metallization pattern for each icell among the plurality of the icells sharing the larger continuous backplane layer, it also completes electrical interconnections of the plurality of icells to one another according to any desired arrangement, for instance, interconnecting the icells to one another all in series or in a hybrid parallel/series arrangement. This embodiment enables fabrication of icells and the monolithic electrical interconnections among a plurality of icells on a shared continuous backplane layer, hence eliminating the need for subsequent soldering/tabbing/stringing of the icells to one another during the final module assembly. For example, in order to make 6×10=60-cell modules, an array of 6×10=60 icells are attached/laminated on their backsides immediately after completion of the patterned first layer of metal (M1)—after Tool 11 process in FIG. 5A—to a properly sized continuous backplane sheet (e.g., a sheet of prepreg) and the remaining process steps (starting with the backplane lamination/attachment process shown as Tool 12 and through the remaining backend process steps through completion of the second layer of patterned metal M2) are all performed on the large backplane-attached sheet comprising the plurality of (e.g., 6×10=60) icells. In this monolithic module example which comprises 6×10=60 icells, if each icell has dimensions of about 156 mm×156 mm and the spacing between the adjacent icells is about 1 mm, the continuous backplane layer or sheet (e.g., an aramid fiber/resin prepreg sheet with a thickness in the range of about 50 to 100 microns) to be used for attachment/lamination to the backsides of the 6×10 array of icells should have minimum dimensions of about 942 mm×1570 mm (e.g., the sheet may be made somewhat oversized to allow for backplane extensions in the side margins of the monolithic module, for instance, about 1 m×1.6 m backplane sheet dimensions in this 6×10=60 icell monolithic module example). As another example, in order to make 6×12=72-cell modules, an array of 6×12=72 icells are attached/laminated on their backsides immediately after completion of the patterned first layer of metal (M1)—after Tool 11 process in FIG. 5A—to a properly sized continuous backplane sheet (e.g., a sheet of prepreg) and the remaining process steps (starting with the backplane lamination/attachment process shown as Tool 12 and through the remaining backend process steps through completion of the second layer of patterned metal M2) are all performed on the large backplane-attached sheet comprising the plurality of (e.g., 6×12=72) icells. In this monolithic module example which comprises 6×12=72 icells, if each icell has dimensions of about 156 mm×156 mm and the spacing between the adjacent icells is about 1 mm, the continuous backplane layer or sheet (e.g., an aramid fiber/resin prepreg sheet with a thickness in the range of about 50 to 100 microns) to be used for attachment/lamination to the backsides of the 6×12 array of icells should have minimum dimensions of about 942 mm×1884 mm (e.g., the sheet may be made somewhat oversized to allow for backplane extensions in the side margins of the monolithic module, for instance, approximately 1 m×1.9 m backplane sheet dimensions in this 6×12=72 icell monolithic module example). The monolithic interconnections of the plurality of icells on a shared continuous backplane layer using the second layer of patterned metal M2 results in further reduction of the overall solar cell and PV module manufacturing cost as well as improved projected reliability of the PV modules during field operation (due to the elimination of soldered tabs, strings).

The embodiments of this invention can be applied to solar cells using this type of process flow as outlined in the representative process flow of FIG. 5A, as well as many other solar cell designs (as described previously) and solar cell fabrication process flows including but not limited to the solar cells fabricated from starting monocrystalline wafers (e.g., Czochralski or CZ, Float Zone or FZ) or multi-crystalline wafers (from cast crystalline bricks or formed by a ribbon pulling process) or epitaxial growth or other substrate fabrication methods. Moreover, icell embodiments may be applied to other semiconductor materials besides silicon as described previously, including but not limited to gallium arsenide, germanium, gallium nitride, other compound semiconductors, or a combination thereof.

Figure 5B:
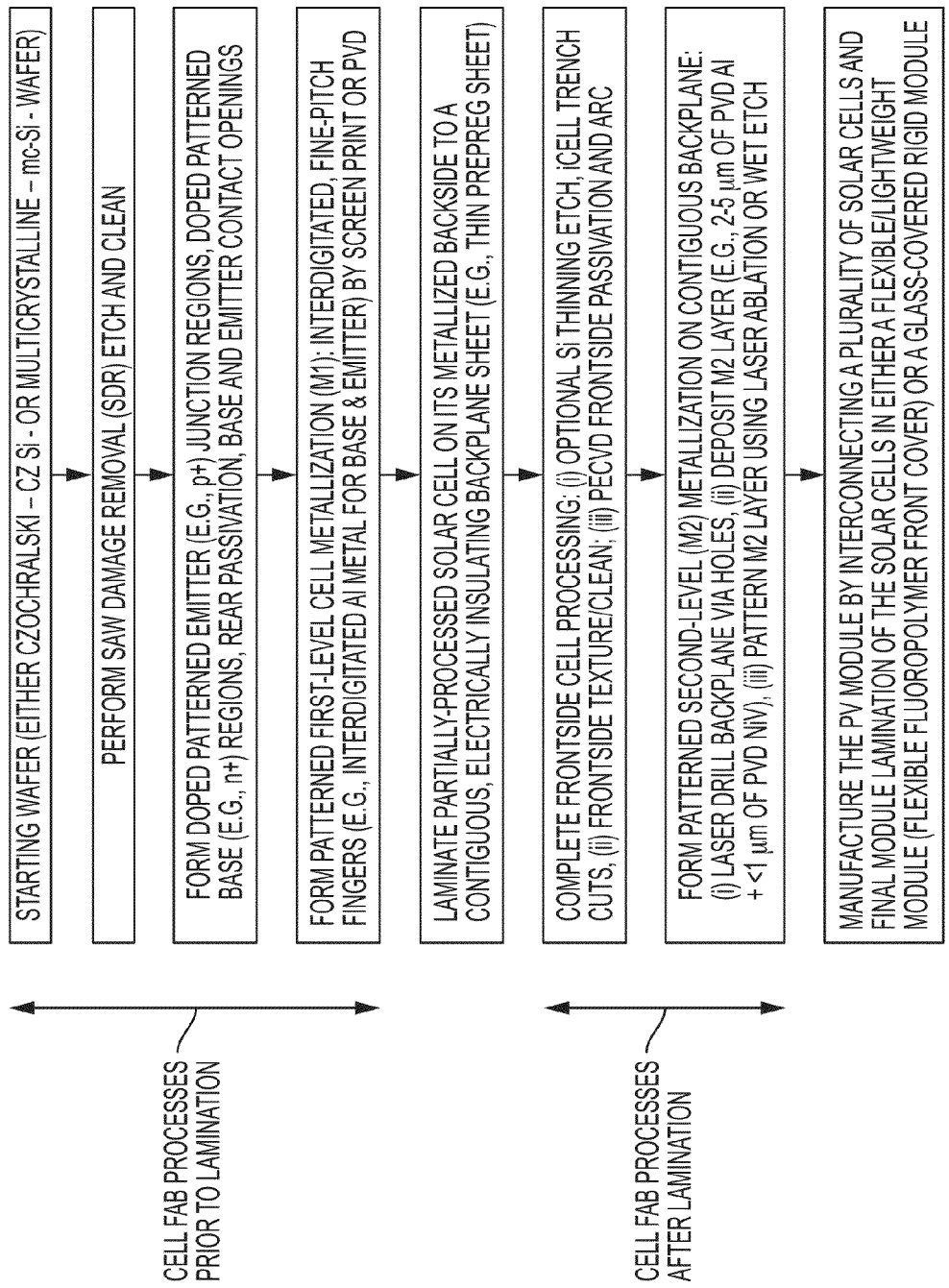

FIG. 5B is a high level solar cell and module fabrication process flow embodiment using starting crystalline (monocrystalline or multi-crystalline) silicon wafers. FIG. 5B shows a high-level icell process flow for fabrication of backplane-attached back-contact/back-junction (IBC) icells using two layers of metallization: M1 and M2. The first layer or level of patterned cell metallization M1 is formed as essentially the last process step among a plurality of front-end cell fab processes prior to the backplane lamination to the partially processed icell (or a larger continuous backplane attached to a plurality of partially processed icells when fabricating monolithic modules as described earlier). The front-end cell fab processes outlined in the top 4 boxes of FIG. 5B essentially complete the back-contact/back-junction solar cell backside structure through the patterned M1 layer. Patterned M1 is designed to conform to the icell isles (mini-cells) and comprises a fine-pitch interdigitated metallization pattern as described for the epitaxial silicon icell process flow outlined in FIG. 5A. In FIG. 5B, the fifth box from the top involves attachment or lamination of the backplane layer or sheet to the partially processed icell backside (or to the backsides of a plurality of partially processed icells when making a monolithic module)—this process step is essentially equivalent to the one performed by Tool 12 in FIG. 5A in case of epitaxial silicon lift-off process). In FIG. 5B, the sixth and seventh boxes from the top outline the back-end or post-backplane-attachment (also called post-lamination) cell fab processes to complete the remaining frontside (optional silicon wafer thinning etch to form thinner silicon absorber layer if desired, partitioning trenches, texturization, post-texturization cleaning, passivation and ARC) as well as the via holes and second level or layer of patterned metallization M2. The "post-lamination" processes (or the back-end cell fab processes performed after the backplane attachment) outlined in the sixth and seventh boxes of FIG. 5B essentially correspond to the processes performed by Tools 13 through 18 for the epitaxial silicon lift off process flow shown in FIG. 5A. The bottom box in FIG. 5B describes the final assembly of the resulting icells into either flexible, lightweight PV modules or into rigid glass-covered PV modules. If the process flow results in a monolithic module comprising a plurality of icells monolithically interconnected together by the patterned M2 (as described earlier for the epitaxial silicon lift off process flow), the remaining PV module fabrication process outlined in the bottom box of FIG. 5B would be simplified since the plurality of the interconnected icells sharing a larger continuous backplane and the patterned M2 metallization for cell-to-cell interconnections are already electrically interconnected and there is no need for tabbing and/or stringing and/or soldering of the solar cells to one another. The resulting monolithic module can be laminated into either a flexible, lightweight PV module (for instance, using a thin flexible fluoropolymer cover sheet such as ETFE or PFE on the frontside instead of rigid/heavy glass cover sheet) or a rigid, glass-covered PV module.

Figure 5C:
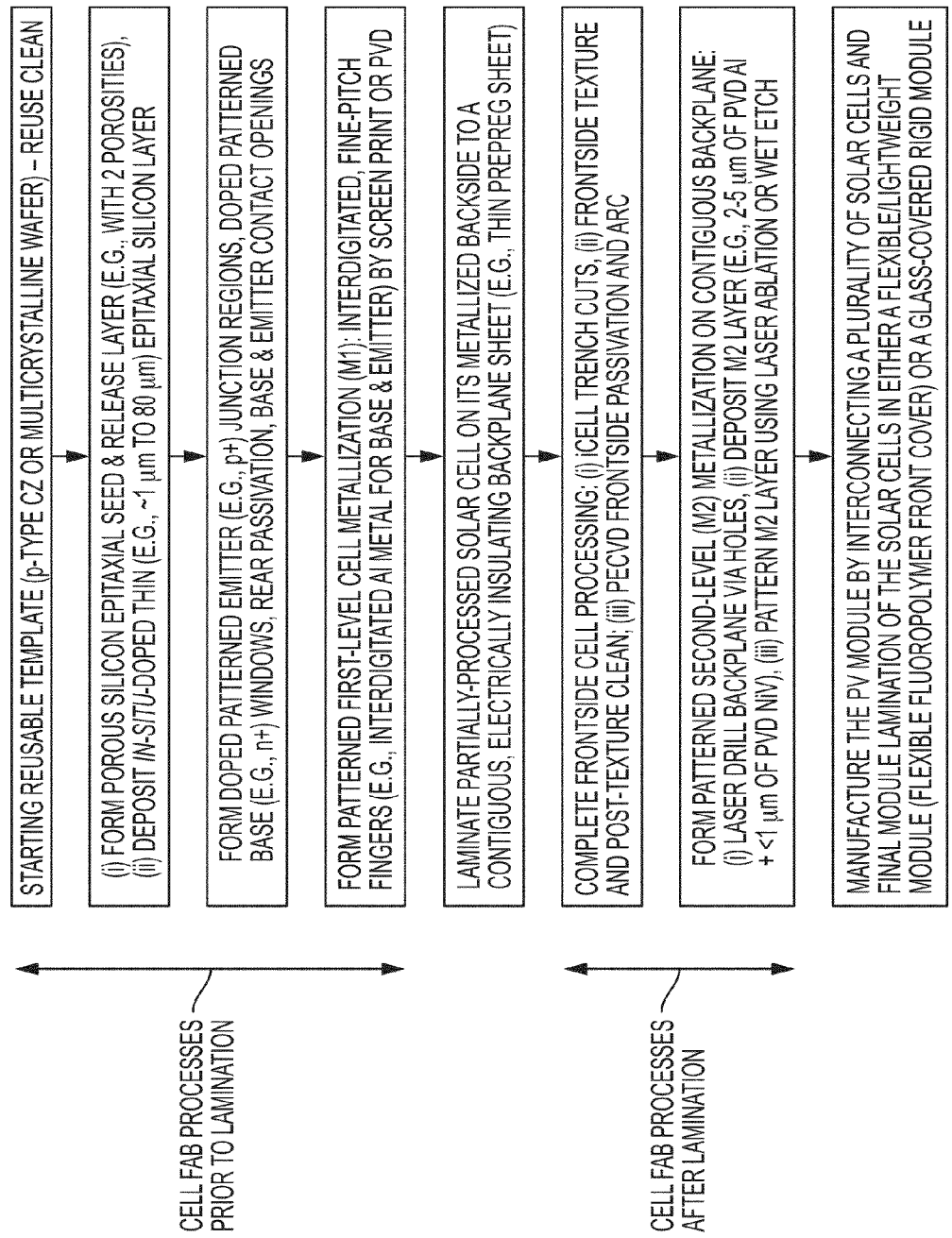

FIG. 5C illustrates an alternative high level solar cell (icell) and module fabrication process flow embodiment using epitaxial silicon and porous silicon lift-off processing as compared to the process flow of FIG. 5A. FIG. 5C also shows a high-level icell process flow for fabrication of backplane-attached back-contact/back-junction (IBC) icells using two layers of metallization: M1 and M2. The first layer or level of patterned cell metallization M1 is formed as essentially the last process step among a plurality of front-end cell fab processes prior to the backplane lamination to the partially processed icell using epitaxial silicon as the solar cell absorber (or a larger continuous backplane attached to a plurality of partially processed epitaxial icells after lift-off release of the individual partially processed icells, when fabricating monolithic modules as described earlier). The front-end cell fab processes outlined in the top 4 boxes of FIG. 5C essentially complete the back-contact/back-junction solar cell backside structure through the patterned M1 layer. Patterned M1 is designed to conform to the icell isles (mini-cells) and comprises a fine-pitch interdigitated metallization pattern as described for the epitaxial silicon icell process flow outlined in FIG. 5A. In FIG. 5C, the fifth box from the top involves attachment or lamination of the backplane layer or sheet to the partially processed epitaxial icell backside (or using a larger continuous backplane sheet to be attached to the backsides of a plurality of partially processed and released icells when making a monolithic module)—this process step is essentially equivalent to the one performed by Tool 12 in FIG. 5A in case of the earlier epitaxial silicon lift-off process flow). In FIG. 5C, the sixth and seventh boxes from the top outline the back-end or post-backplane-attachment (also called post-lamination) cell fab processes to complete the remaining frontside (icell partitioning trenches, texturization, post-texturization cleaning, passivation and ARC) as well as the via holes and second level or layer of patterned metallization M2. The "post-lamination" processes (or the back-end cell fab processes performed after the backplane attachment) outlined in the sixth and seventh boxes of FIG. 5C essentially correspond to the processes performed by Tools 13 through 18 for the epitaxial silicon lift off process flow shown in FIG. 5A. The bottom box in FIG. 5C describes the final assembly of the resulting icells into either flexible, lightweight PV modules or into rigid glass-covered PV modules. If the process flow results in a monolithic module comprising a plurality of icells monolithically interconnected together by the patterned M2 (as described earlier for the epitaxial silicon lift off process flow), the remaining PV module fabrication process outlined in the bottom box of FIG. 5C would be simplified since the plurality of the interconnected icells sharing a larger continuous backplane and the patterned M2 metallization for cell-to-cell interconnections are already electrically interconnected and there is no need for tabbing and/or stringing and/or soldering of the solar cells to one another. The resulting monolithic module can be laminated into either a flexible, lightweight PV module (for instance, using a thin flexible fluoropolymer cover sheet such as ETFE or PFE on the frontside instead of rigid/heavy glass cover sheet) or a rigid, glass-covered PV module.

Figure 5D:
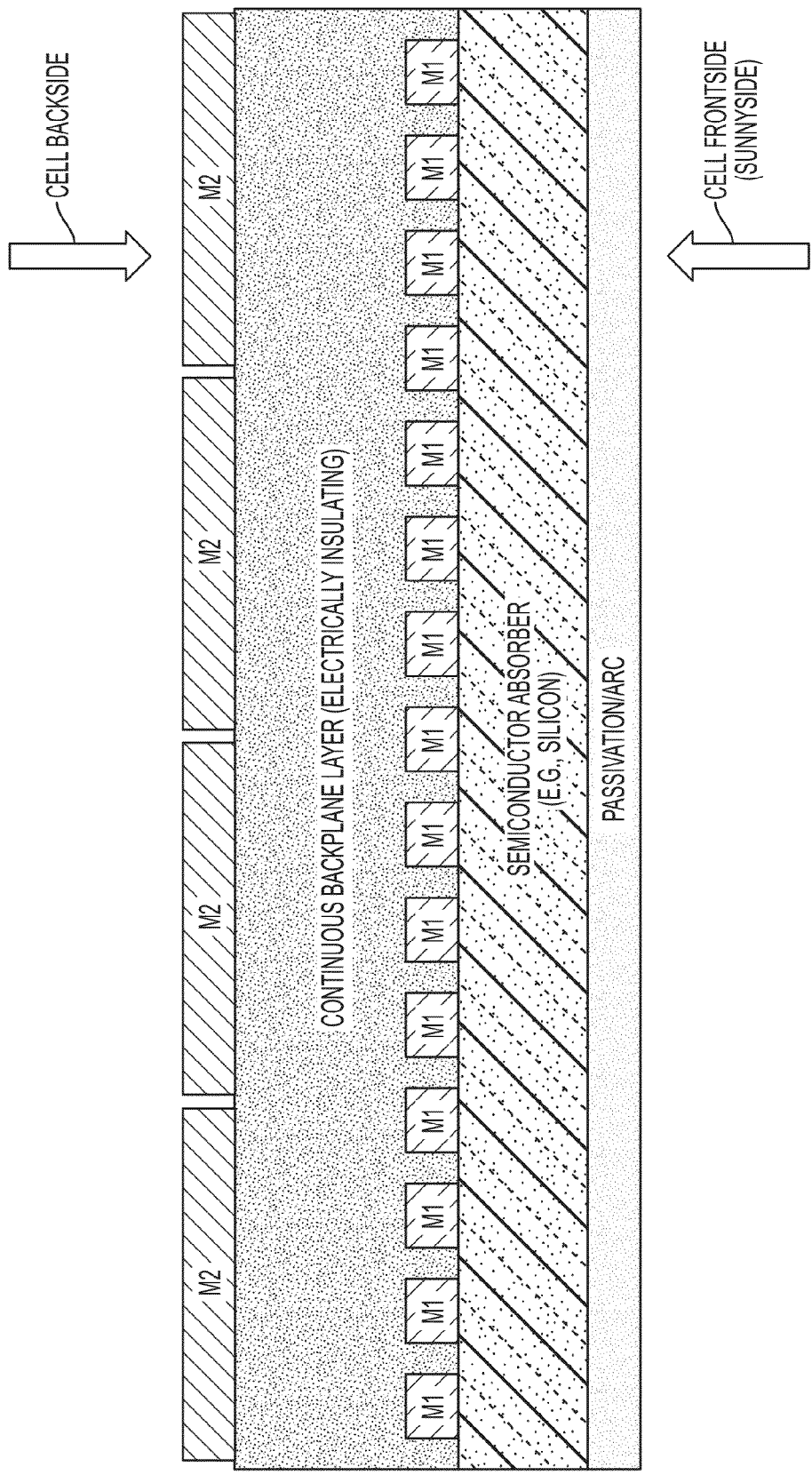
FIGS. 5D and 5E are cross-sectional diagrams showing a backplane-attached solar cell.

FIG. 5D is a high level cross-sectional device diagram showing an expanded and selective simplified view of a mini-cell or isle among a plurality of isles in an icell after solar cell fabrication steps of an interdigitated back-contact (IBC) solar cell embodiment. Detailed doped emitter and base regions, optional front-surface field (FSF) and/or optional back-surface field (BSF) regions, contacts for M1 metallization, and conductive via plugs connecting patterned M1 to patterned M2 through the electrically-insulating continuous backplane layer are not shown.

Figure 5E:
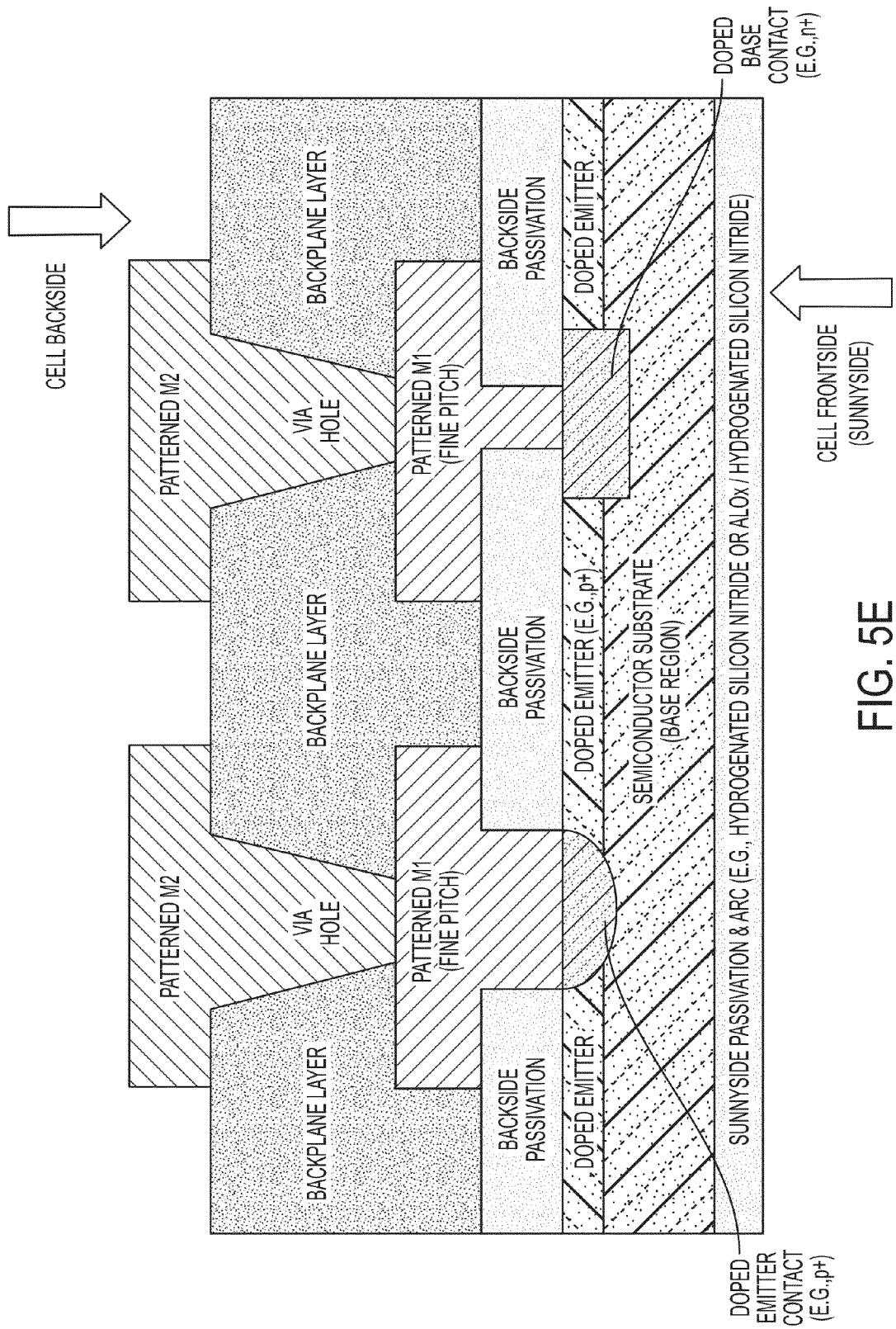

FIG. 5E is a more detailed cross-sectional diagram showing an expanded view of a mini-cell or isle among a plurality of isles in an icell after solar cell fabrication steps of an interdigitated back-contact (IBC) solar cell embodiment. These cross-sectional diagrams are provided as descriptive embodiments to further detail cell architectures which may be used in accordance with the disclosed subject matter.

In practice, the isolation trenches partitioning the main initially continuous semiconductor substrate through the substrate layer thickness (either from a starting crystalline semiconductor wafer or from an epitaxially grown crystalline layer) into a plurality of mini-cells (or isles or sub-cells or tiles) on the continuous supporting backplane layer have average trench width which may be on the order of about 10's of microns (or in the range of about 10 microns to about 100 microns). As described earlier, trench isolation regions partitioning the backplane-attached semiconductor layer into a plurality of mini-cells (or isles or sub-cells or tiles) may be formed by using either pulsed laser ablation/scribing or another technique, for instance, by mechanical dicing/scribing or ultrasonic dicing/scribing or water jet dicing/scribing or another method (the terms scribing, dicing, cutting, and ablation are used interchangeably herein when describing the icell partitioning or isolation trench formation process; moreover, the terms partitioning trenches or isolation trenches are used interchangeably in this document when referring to the trench pattern formed through the semiconductor layer thickness to form a plurality of isles or mini-cells, all supported by and attached to a continuous backplane layer or sheet which is attached to the partially processed semiconductor substrate prior to the partitioning trench formation process). A suitable trench partitioning or isolation formation process such as a pulsed laser scribing or cutting process selectively cuts through the semiconductor layer and effectively stops on the backplane layer or sheet after cutting essentially through the entire thickness of the semiconductor layer without a substantial removal of the backplane material (hence, negligible or relatively small trenching of the backplane layer to maintain the integrity of the continuous backplane sheet). For instance, the partitioning trench formation process, such as a pulsed nanoseconds ablation scribing process, can be performed to form the desired partitioning trench pattern by cutting through the semiconductor layer thickness based on the desired trench pattern, while limiting the backplane sheet material removal to relatively small range between zero and less than a fraction of the backplane layer thickness (e.g., backplane material trenching depth limited to between zero and less than about 20% of the backplane layer thickness). This will ensure the overall mechanical, physical, and electrical integrity of the monolithic icell (or the monolithic module in the case of fabricating monolithic modules using a plurality of icells attached to a shared backplane sheet).

The methods and structures described herein provide for a master monolithic cell (icell) comprising trench-partitioned or trench-isolated isles (also referred to as tiles, pavers, sub-cells, or mini-cells). And while a common master monolithic cell (icell) shape is a square, the master cell (icell) may be chosen to have any desired geometrical shapes and dimensions, for example a full square, pseudo square, rectangle, pseudo-rectangle, parallelogram, hexagon, triangle, any polygon, circle, ellipse, or a combination thereof. The most common shapes used for crystalline silicon solar cells and modules are the full-square and pseudo-square solar cells. Furthermore, the trench-partitioned isles may be formed of various and individually different geometrical shapes and/or sizes (areas and side/diagonal dimensions), or may be uniformly sized and shaped (in other words uniformly sized and shaped isles having the same geometrical shapes and areas as one another). One consideration determining the shapes and sizes of the isles making up the solar cell is the desired degree of backplane-attached solar cell flexibility or bendability and pliability (when using a flexible backplane sheet such as a prepreg sheet) while minimizing or eliminating crack generation or crack propagation in the resulting solar cell comprising the semiconductor absorber layer and in the solar cell metallization structure. In some instances, it may be desired to position relatively smaller isles (for example smaller triangular shaped or square shaped isles) proximate the master cell (icell) edge regions and relatively larger isles (for example square shaped) proximate the master cell (icell) center region (or the region away from the icell edges) since the solar cell edges may be more susceptible to crack formation and propagation during and after cell processing, during module lamination, and also during the field operation of the resulting PV modules. In other instances, and depending the on the isle electrical connection design, the isles (or a subgroup of isles connected in electrical parallel arrangement) may have a uniform shape to produce uniform current under uniform illumination. Importantly, any number of isle shapes and/or sizes may be used dependent on other considerations such as master cell (icell) flexibility/bendability and isle-to-isle electrical interconnection designs to produce the desired icell voltage and current scaling factor.

For a square-shaped or rectangular-shaped master cell (icell) having an array of square-shaped or rectangular-shaped isles attached to a shared continuous backplane, the isles may be an N×N array where N is an integer with N≥2 (for example N×N is greater than or equal to four, or in other words there are at least four isles in an icell). In general, an icell may have as few as 2 isles or subcells (e.g., a square-shaped icell with 2 sub-cells or isles may have two triangular isles). The icell configurations with N×N isles present the advantage of simplicity in terms of the icell processing and interconnection design, as well as good compatibility with full-square and pseudo-square solar cells. Alternatively, the isles may be in an N×M array where N and M are both integers (for example N×M is greater than or equal to 2, in other words there are at least two isles). Using a flexible continuous (or continuous) backplane, the degree of icell flexibility or bendability or pliability may be increased for larger values of N×N or N×M, and/or by using relatively smaller sized isles near the cell edge regions (compared to the isles away from the edge regions). For example, for a 156 mm×156 mm square-shaped or pseudo-square shaped icell, an icell with 4×4=16 isles (e.g., uniform area isles) will be more flexible or bendable than an icell with 3×3=9 isles (e.g., uniform area isles). Improved flexibility/bendability of icells are desirable attributes for flexible, lightweight PV modules. And while the number of isles in any shape may be increased or decreased depending on desired master cell flexibility or bendability or pliability, the removal of semiconductor material to form the partitioning trenches and corresponding increased cell edge area (total trench sidewall areas of the isles or mini-cells) should be limited, for example to no more than about 2% of the master cell (icell) area (the ratio R as discussed earlier in this document), and in some cases to less than 1% of the icell area.

In some instances, it may be desirable to increase cell pliability by shaping isles (tiles, mini-cells), for instance into certain geometrically shaped mini-cells such as triangular-shaped isles (mini-cells). For example, to enhanced cell flexibility or pliability in various bending directions (e.g., along X, Y, and diagonal axes) for a square-shaped or rectangular-shaped master cell (icell), the isles may be an array of triangles, or a combination of squares (and/or rectangles) and triangles (in some embodiments, square-shaped isles proximate the master cell center region and triangular isles proximate the cell edge regions). Importantly, various combinations of isle shapes and arrangements within the master cell (icell) may be formed in accordance with the disclosed subject matter.

FIGS. 6A and 6B are diagrams of backplane-attached solar cell (icell) embodiments showing arrays of uniform square shaped mini-cells (i.e., isles or mini-cells all having essentially the same areas). FIG. 6A is a representative schematic plan view (frontside or sunnyside view) diagram of an icell pattern (shown for square-shaped isles and square-shaped icell) along with uniform-size (equal-size) square-shaped isles for N×N=3×3=9 isles (or sub-cells, mini-cells, tiles). This schematic diagram shows a plurality of isles (shown as 3×3=9 isles) partitioned by trench isolation regions. FIG. 6B is a representative schematic plan view (frontside or sunnyside view) diagram of an icell pattern (shown for square-shaped isles and square-shaped icell) along with uniform-size (equal-size) square-shaped isles for N×N=5×5=25 isles (or sub-cells, mini-cells, tiles). This schematic diagram shows a plurality of isles (shown as 5×5=25 isles) partitioned by trench isolation regions.

FIG. 6A is a schematic diagram of a top or plan view of a 3×3 uniform isled (tiled) master solar cell or icell 30 defined by cell peripheral boundary or edge region 32, having a side length L, and comprising nine (9) uniform square-shaped isles formed from the same original continuous substrate and identified as $I_{11}$ through $I_{33}$ attached to a continuous backplane on the master cell backside (backplane and solar cell backside not shown). Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and often less than or equal to about 100 μm—for instance, a few up to about 100 μm) shown as trench isolation or isle partitioning borders 34. Main cell (or icell) peripheral boundary or edge region 32 has a total peripheral length of 4L; however, the total icell edge boundary length comprising the peripheral dimensions of all the isles comprises cell peripheral boundary 32 (also referred to as cell outer periphery) and trench isolation borders 34. Thus, for an icell comprising N×N isles or mini-cells in a square-shaped isle embodiment, the total icell edge length is N× cell outer periphery. In the representative example of FIG. 6A showing an icell with 3×3=9 isles, N=3, so total cell edge length is 3× cell outer periphery 4L=12L (hence, this icell has a peripheral dimension which is 3 times larger than that of the standard prior art cell shown in FIG. 1). For a square-shaped master cell or icell with dimensions 156 mm×156 mm, square isle side dimensions are approximately 52 mm×52 mm and each isle or sub-cell has an area of 27.04 cm² per isle.

FIG. 6B is a schematic diagram of a top or plan view of a 5×5 uniform isled (tiled) master solar cell or icell 40 defined by cell peripheral boundary or edge region 42, having a side length L, and comprising twenty five (25) uniform square-shaped isles formed from the same original continuous substrate and identified as $I_{11}$ through $I_{55}$ attached to a continuous backplane on the master cell backside (backplane and solar cell backside not shown). Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and often less than or equal to about 100 μm—for instance, a few up to about 100 μm) shown as trench isolation or isle partitioning borders 44. Main cell (or icell) peripheral boundary or edge region 42 has a total peripheral length of 4L; however, the total icell edge boundary length comprising the peripheral dimensions of all the isles comprises cell peripheral boundary 42 (also referred to as cell outer periphery) and trench isolation borders 44. Thus, for an icell comprising N×N isles or mini-cells in a square-shaped isle embodiment, the total icell edge length is N× cell outer periphery. In the representative example of FIG. 6B showing an icell with 5×5=25 isles, N=5, so total cell edge length is 5× cell outer periphery 4L=20L (hence, this icell has a peripheral dimension which is 5 times larger than that of the standard prior art cell shown in FIG. 1). For a square-shaped master cell or icell with dimensions 156 mm×156 mm, square isle side dimensions are approximately 31.2 mm×31.2 mm and each isle or sub-cell has an area of 9.73 cm² per isle. In some instances when balanced with other considerations, it may be desired to keep total cell edge length (cumulative lengths of the sidewall edges of all the isles in an icell) to 24L (for example in a 6×6 array) in order to limit the total icell edge length and sidewall area.

Figure 7B:
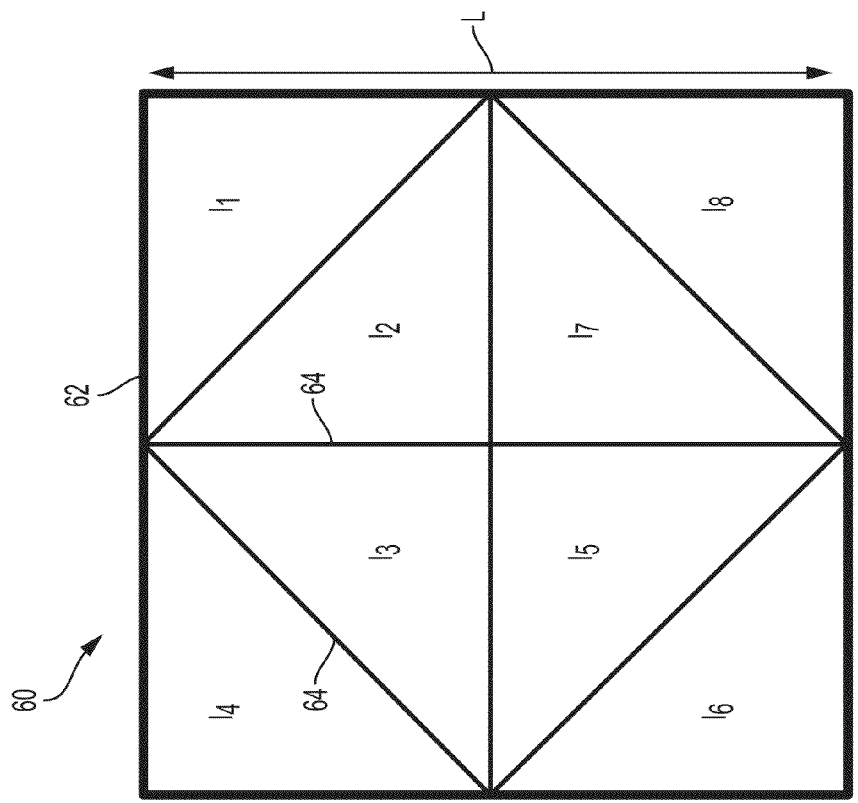
FIGS. 7A and 7B are top view diagrams of embodiments of a triangular-shaped 8 isled square icell.
Figure 7A:
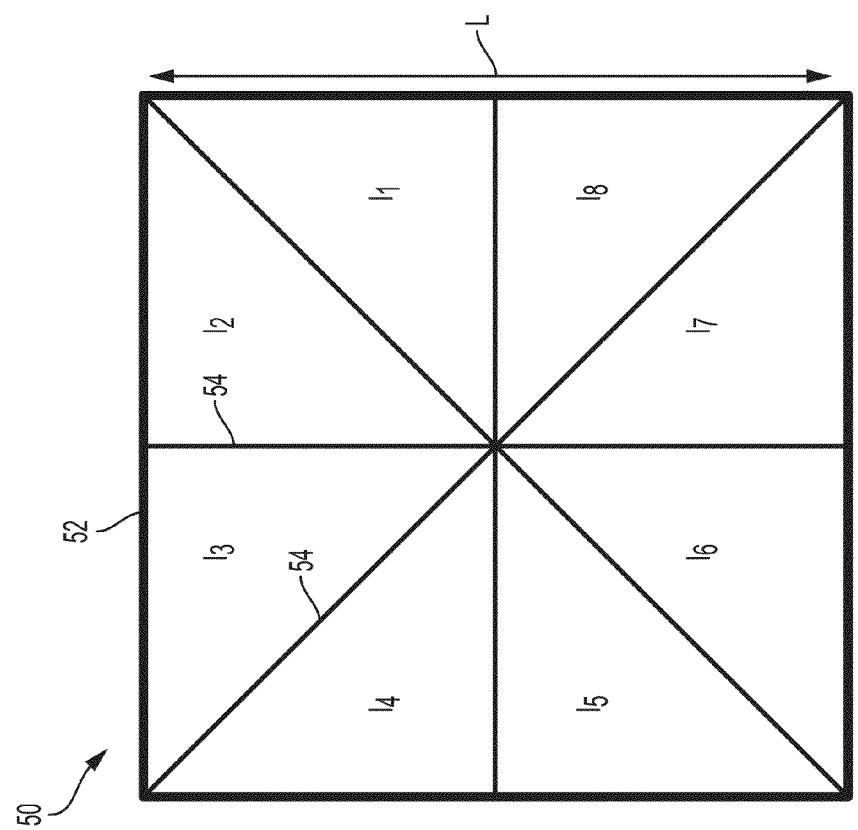
Figure 7C:
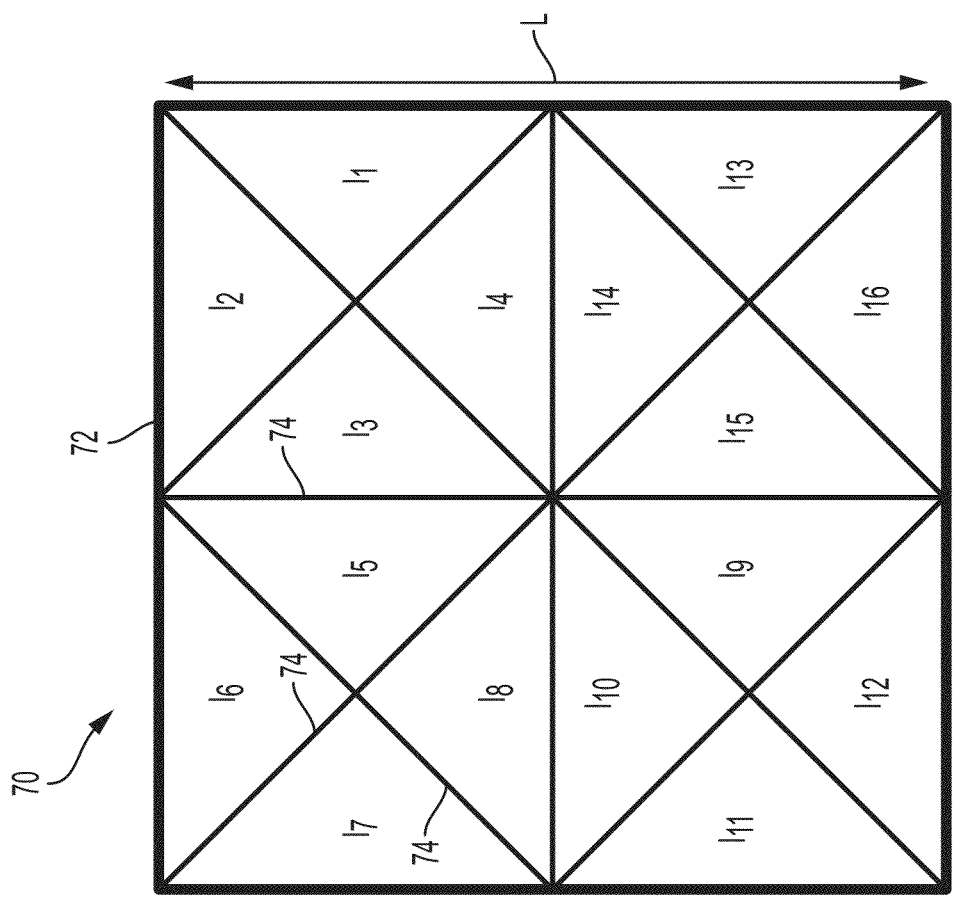
Figure 7E:
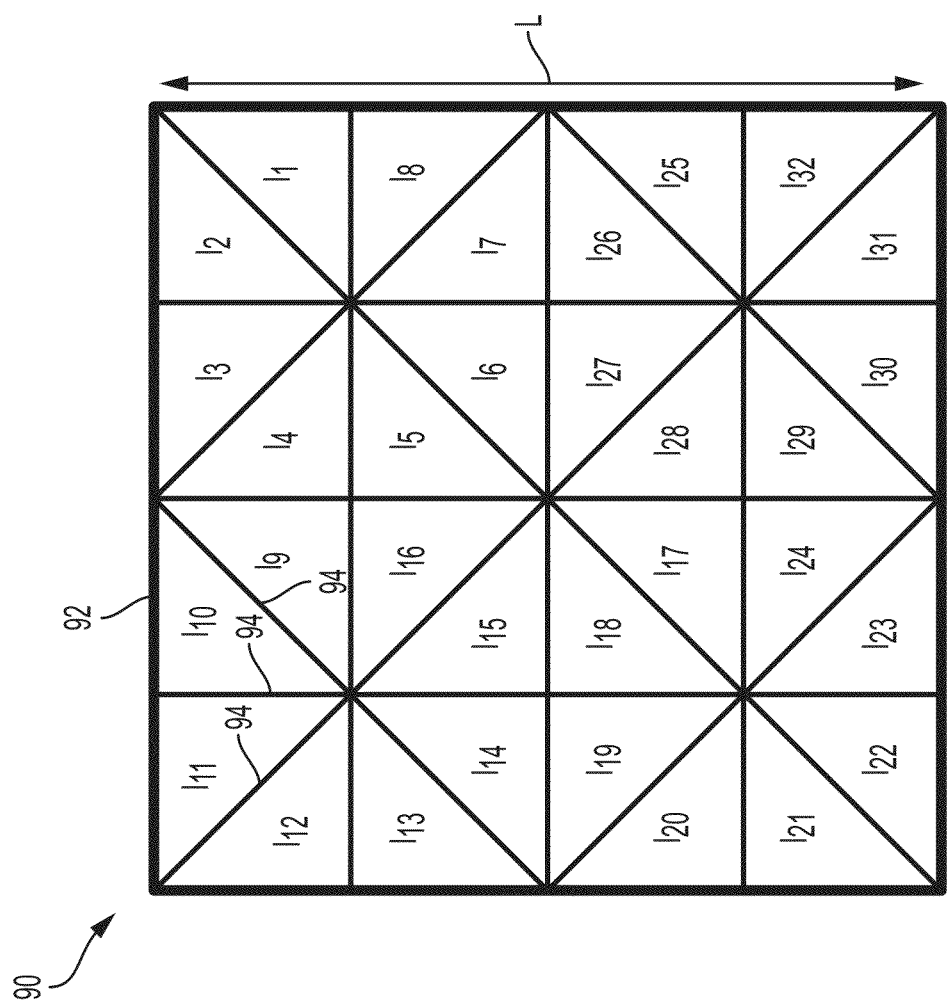

FIGS. 7A and 7E are representative plan view diagrams of solar cell embodiments (icells) with triangular shaped isles or mini-cells. FIG. 7A is a representative schematic plan view (frontside or sunnyside view) diagram of an icell pattern (shown for triangular-shaped isles and square-shaped icell) along with uniform-size (equal-size) triangular-shaped isles (or sub-cells, mini-cells, tiles) with K=2×4=8 triangular isles—a pair of triangular isles per square quadrant of the icell. This schematic diagram shows a plurality of isles (shown as K=2×4=8 isles) partitioned by trench isolation regions. FIG. 7B is a representative schematic plan view (frontside or sunnyside view) diagram of an icell pattern (shown for triangular-shaped isles and square-shaped icell) along with uniform-size (equal-size) triangular-shaped isles (or sub-cells, mini-cells, tiles) with K=2×4=8 triangular isles—a pair of triangular isles per square quadrant of the icell. This schematic diagram shows a plurality of isles (shown as K=2×4=8 isles) partitioned by trench isolation regions. The trench isolation pattern for the icell in FIG. 7B is slightly different than that in FIG. 7A. FIG. 7C is a representative schematic plan view (frontside or sunnyside view) diagram of an icell pattern (shown for triangular-shaped isles and square-shaped icell) along with uniform-size (equal-size) triangular-shaped isles (or sub-cells, mini-cells, tiles) with K=4×4=16 triangular isles—four triangular isles per square quadrant of the icell. This schematic diagram shows a plurality of isles (shown as K=4×4=16 isles) partitioned by trench isolation regions. The number of triangular isles (mini-cells) in this embodiment is twice the number of triangular isles (mini-cells) in the icell embodiments of FIG. 7A and FIG. 7B. FIG. 7D is a representative schematic plan view (frontside or sunnyside view) diagram of an icell pattern (shown for triangular-shaped isles and square-shaped icell) along with uniform-size (equal-size) triangular-shaped isles (or sub-cells, mini-cells, tiles) with K=4×3×3=36 triangular isles—four triangular isles per square quadrant of the icell. This schematic diagram shows a plurality of isles (shown as K=4×3×3=36 isles) partitioned by trench isolation regions. The number of triangular isles (mini-cells) in this embodiment is 4.5 times the number of triangular isles (mini-cells) in the icell embodiments of FIG. 7A and FIG. 7B.

FIG. 7E is a representative schematic plan view (frontside or sunnyside view) diagram of an icell pattern (shown for triangular-shaped isles and square-shaped icell) along with uniform-size (equal-size) triangular-shaped isles (or sub-cells, mini-cells, tiles) with K=2×4×4=32 triangular isles—eight triangular isles per square quadrant of the icell. This schematic diagram shows a plurality of isles (shown as 2×4×4=32 isles) partitioned by trench isolation regions. The number of triangular isles (mini-cells) in this embodiment is 4 times the number of triangular isles (mini-cells) in the icell embodiments of FIG. 7A and FIG. 7B.

FIG. 7A is a diagram of a top view of uniform triangular-shaped isles in an isled master solar cell or icell 50 defined by cell peripheral boundary 52 and having a side length L and comprising eight uniform (equal areas) triangular-shaped isles $I_1$ through $I_8$. Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and often less than or equal to about 100 μm—for instance, a few up to about 100 μm) shown as trench isolation or isle partitioning borders 54. Main cell (or icell) peripheral boundary or edge region 52 has a total peripheral length of 4L; however, the total icell edge boundary length comprising the peripheral dimensions of all the isles comprises cell peripheral boundary 52 (also referred to as cell outer periphery) and trench isolation borders 54. In the representative example of FIG. 7A showing an icell with K=2×4=8 triangular isles, K=8, so total cell edge length is 3.4142× cell outer periphery 4L=13.567L (hence, this icell has a peripheral dimension which is 3.4142 times larger than that of the standard prior art cell shown in FIG. 1). For a square-shaped master cell or icell with dimensions 156 mm×156 mm, triangular isle side dimensions are approximately 78 mm×78 mm (for the two equal right-angle sides of the triangle) and each isle or sub-cell has an area of 30.42 cm² per isle.

FIG. 7B is a diagram of a top view of uniform triangular-shaped isles in an isled master solar cell or icell 60 defined by cell peripheral boundary 62 and having a side length L and comprising an alternative arrangement of eight uniform (equal areas) triangular-shaped isles $I_1$ through $I_8$, as compared to the triangular isles or mini-cells pattern of FIG. 7A. Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and in some cases less than or equal to about 100 μm—for instance, a few up to about 100 μm) shown as trench isolation or isle partitioning borders 64. Main cell (or icell) peripheral boundary or edge region 62 has a total peripheral length of 4L; however, the total icell edge boundary length comprising the peripheral dimensions of all the isles comprises cell peripheral boundary 62 (also referred to as cell outer periphery) and trench isolation borders 64. In the representative example of FIG. 7B showing an icell with K=2×4=8 triangular isles, K=8, so total cell edge length is 3.4142× cell outer periphery 4L=13.567L (hence, this icell has a peripheral dimension which is 3.4142 times larger than that of the standard prior art cell shown in FIG. 1). For a square-shaped master cell or icell with dimensions 156 mm×156 mm, triangular isle side dimensions are approximately 78 mm×78 mm (for the two equal right-angle sides of the triangle) and each isle or sub-cell has an area of 30.42 cm² per isle.

FIG. 7C is a diagram of a top view of uniform triangular-shaped isles in an isled master solar cell or icell 70 defined by cell peripheral boundary 72 and having a side length L and comprising an arrangement of thirty six uniform (equal areas) triangular-shaped isles $I_1$ through $I_{16}$. Each isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and in some cases less than or equal to about 100 μm—for instance, a few up to about 100 μm) shown as trench isolation or isle partitioning borders 74. Main cell (or icell) peripheral boundary or edge region 72 has a total peripheral length of 4L; however, the total icell edge boundary length comprising the peripheral dimensions of all the isles comprises cell peripheral boundary 72 (also referred to as cell outer periphery) and trench isolation borders 74. In the representative example of FIG. 7C showing an icell with K=4×2×2=16 triangular isles, K=16, so total cell edge length is 4.8284× cell outer periphery 4L=19.313L (hence, this icell has a peripheral dimension which is 4.8284 times larger than that of the standard prior art cell shown in FIG. 1). For a square-shaped master cell or icell with dimensions 156 mm×156 mm, each triangular isle or sub-cell in this embodiment has an area of 15.21 cm² per isle.

FIG. 7D is a diagram of a top view of uniform triangular-shaped isles in an isled master solar cell or icell 80 defined by cell peripheral boundary 82 and having a side length L and comprising an arrangement of sixteen uniform (equal areas) triangular-shaped isles $I_1$ through $I_{36}$. Each triangular isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and often less than or equal to about 100 μm—for instance, a few up to about 100 μm) shown as trench isolation or isle partitioning borders 84. Main cell (or icell) peripheral boundary or edge region 82 has a total peripheral length of 4L; however, the total icell edge boundary length comprising the peripheral dimensions of all the isles comprises cell peripheral boundary 82 (also referred to as cell outer periphery) and trench isolation borders 84. In the representative example of FIG. 7D showing an icell with K=4×3×3=36 triangular isles, K=36, so total cell edge length is 7.2426× cell outer periphery 4L=28.970L (hence, this icell has a peripheral dimension which is 7.2426 times larger than that of the standard prior art cell shown in FIG. 1). For a square-shaped master cell or icell with dimensions 156 mm×156 mm, each triangular isle or sub-cell in this embodiment has an area of 6.76 cm² per isle.

FIG. 7E is a diagram of a top view of uniform triangular-shaped isles in an isled master solar cell or icell 90 defined by cell peripheral boundary 92 and having a side length L and comprising an arrangement of thirty two uniform (equal areas) triangular-shaped isles $I_1$ through $I_{32}$. Each triangular isle or sub-cell or mini-cell or tile is defined by an internal isle peripheral boundary (for example, an isolation trench cut through the master cell semiconductor substrate thickness and having a trench width substantially smaller than the isle side dimension, with the trench width no more than 100's of microns and often less than or equal to about 100 μm—for instance, a few up to about 100 μm) shown as trench isolation or isle partitioning borders 94. Main cell (or icell) peripheral boundary or edge region 92 has a total peripheral length of 4L; however, the total icell edge boundary length including the peripheral dimensions of all the isles comprises cell peripheral boundary 92 (also referred to as cell outer periphery) and trench isolation borders 94. In the representative example of FIG. 7E showing an icell with K=2×4×4=32 triangular isles, K=32, so total cell edge length is 6.8284× cell outer periphery 4L=27.313L (hence, this icell has a peripheral dimension which is 6.8284 times larger than that of the standard prior art cell shown in FIG. 1). For a square-shaped master cell or icell with dimensions 156 mm×156 mm, triangular isle side dimensions are approximately 39 mm×39 mm (for the two equal right-angle sides of the triangle) and each triangular isle or sub-cell in this embodiment has an area of 7.605 cm² per isle.

Thus, design of isles or mini-cells may include various geometrical shapes such as squares, triangles, rectangles, trapezoids, polygons, honeycomb hexagonal isles, or many other possible shapes and sizes. The shapes and sizes of isles, as well as the number of isles in an icell may be selected to provide optimal attributes for one or a combination of the following considerations: (i) overall crack elimination or mitigation in the master cell (icell); (ii) enhanced pliability and flexibility/bendability of master cell (icell) without crack generation and/or propagation and without loss of solar cell or module performance (power conversion efficiency); (iii) reduced metallization thickness and conductivity requirements (and hence, reduced metallization material consumption and processing cost) by reducing the master cell (icell) current and increasing the icell voltage (through series connection or a hybrid parallel-series connection of the isles in the monolithic icell, resulting in scaling up the voltage and scaling down the current); and (iv) providing relatively optimum combination of electrical voltage and current ranges in the resulting icell to facilitate and enable implementation of inexpensive distributed embedded electronics components on the icells and/or within the laminated PV modules comprising icells, including but not limited to at least one bypass switch (e.g., a rectifying pn junction diode or Schottkty barrier diode) per icell, maximum-power-point tracking (MPPT) power optimizers (at least a plurality of MPPT power optimizers embedded in each module, with each MPPT power optimizer dedicated to at least 1 to a plurality of series-connected and/or parallel-connected icells), PV module power switching (with remote control on the power line in the installed PV array in order to switch the PV modules on or off as desired), module status (e.g., power delivery and temperature) during operation of the PV module in the field, etc. For example and as described earlier, in some applications and instances when considered along with other requirements, it may be desired to have smaller (for example triangular shaped) isles near the periphery of the master cell (icell) to reduce crack propagation and/or to improve flexibility/bendability of the resulting icells and flexible, lightweight PV modules.

A full-square master cell (icell) having an array of equivalently or uniformly sized N×N square-shaped isles or a plurality of equally sized triangular-shaped isles may be formed to match the photo-generated electrical current among isles or subgroups of isles connected in series. Thus, the square-shaped master cell (icell) may comprise N×N uniform (equally sized in terms of the isle areas) square-shaped or nearly square-shaped isles (with N being an integer: 2, 3, 4, . . . ) or K uniform triangular-shaped isles (with K being an integer, for example an even integer, equal to 4 or larger).

Figure 8:
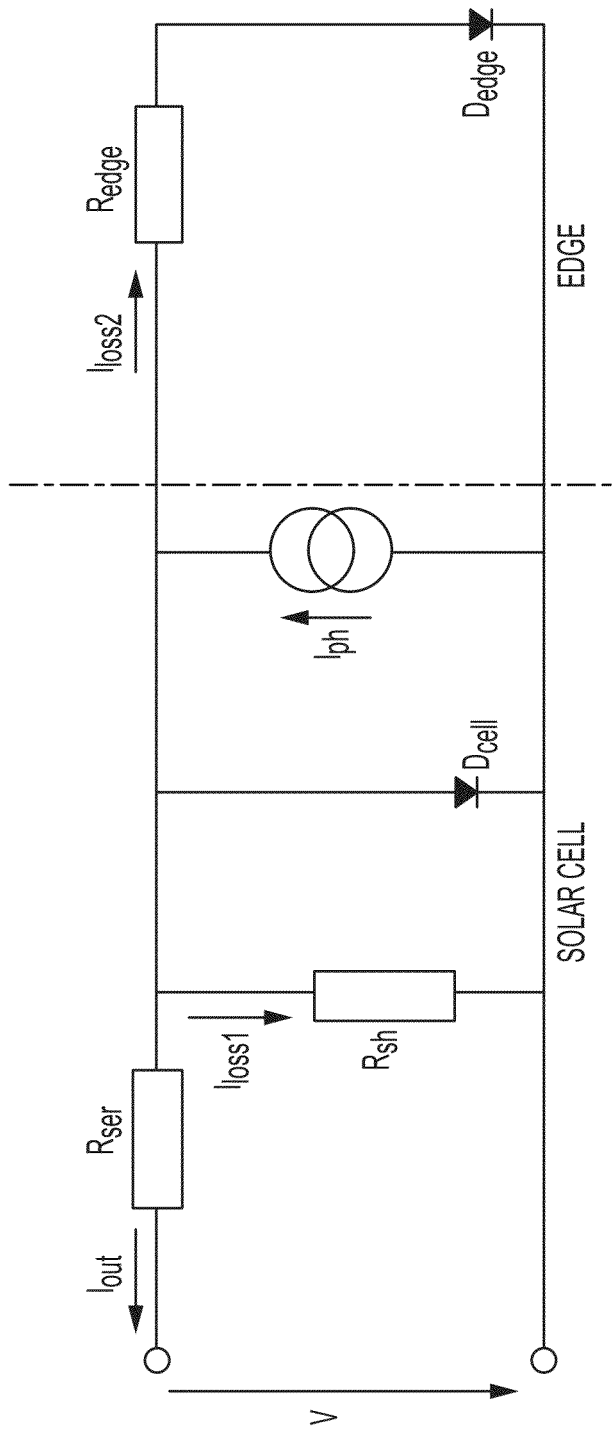
FIG. 8 is a schematic diagram showing an equivalent circuit model of a typical solar cell with edge effects.

FIG. 8 is a schematic circuit diagram showing a simplified equivalent circuit model of a typical solar cell with edge recombination effects (as well as finite series resistance and shunt resistance values, and finite dark current). A realistic solar cell includes parasitic series and shunt resistances as well as edge recombination effects and dark current, all having detrimental impacts on the solar cell performance. An ideal solar cell has a zero series resistance, an infinite shunt resistance, zero dark current, and negligible or zero edge recombination effects. For known conventional crystalline silicon solar cells, a typical ratio of crystalline silicon wafer solar cell edge area to cell active (sunnyside) area is on the order of at least 0.50%.

The increased edge length of the monolithic isled solar cells (icells) described herein may (but not necessarily) increase solar cell edge recombination effects; however, very effective mitigation measures may be used to substantially decrease the edge effects of the mini-cell (isle) boundary trenches. Solar cell edge recombination currents may cause non-linear shunts and linear or super-linear reverse current instead of normal saturation behavior. Thus, it may be desirable to eliminate or minimize $I_{loss2}$ by substantially mitigating or minimizing the edge recombination effects. Edge recombination currents may be substantially reduced and/or eliminated by taking practical and effective measures in the design and during processing of solar cells.

Edge recombination currents are caused by edge regions that are highly disturbed and/or relatively un-passivated, and edge regions which may be in direct contact with the pn junction (i.e., the solar cell pn junction and its depletion region contacting the edge regions). Edge losses occur due to cell damage (e.g., residual edge sidewall damage if not properly removed by an effective process, such as during the texturization wet etch after formation of the icell trenches, as described earlier) and poor or insufficient passivation of the solar cell edge sidewall areas (the main cell peripheral sidewall areas as well as the partitioning trench sidewall areas in the case of icells) and may be further exacerbated when the solar cell pn junction contacts the solar cell edge area (either around the main solar cell peripheral sidewalls and/or the partitioning trench sidewall areas in icells). To mitigate this problem, isle isolation trench formation followed by wet texture (silicon etch) also removing any residual trenching damages in the crystalline semiconductor layer sidewalls, wrap-around passivation (formed during the frontside passivation process) to passivate both the sunnyside/frontside surfaces and sidewalls of the edge regions of all the isles, and/or eliminating pn junction contact with edges of isles substantially reduce or eliminate the edge recombination effects from solar cells (icells). Measures to minimize or eliminate the trench isolation edge recombination currents in monolithic isled (tiled) solar cells (icells) which may be used individually or in combination, include: 1) separate/recess the emitter junction (for instance, the p+n emitter junction when using n-type base) of each isle (or mini-cell or sub-cell or tile) from the trench isolation edge (and from the main icell boundary edges) by a narrow base (e.g., n-type base when using n-type base and p+n emitter junction) rim, the separation may be as small as a one micron and as large as 100's of microns depending on the master cell (icell) size and isle size (and resolution of pattern formation during solar cell processing); 2) use laser scribing to form trench isolation regions from the cell sunnyside before wet etch texture process (to allow for the wet texture etch chemistry to etch off and remove any trenching-induced residual damage in the sidewalls of isles or mini-cells as well as the main boundary sidewalls of the icell; 3) perform wet etch texture which also removes a portion of crystalline silicon (for instance, from a few microns up to about 15 microns of silicon) to remove any process-induced (for instance, pulse-laser-ablation induced or mechanical dicing induced) damaged silicon from trench-partitioned edges (may be performed concurrent with the wet texture processing using either alkaline texture etch and/or acidic texture etch); and, 4) perform passivation/ARC process on the solar cell (icell) sunnyside after icell trench partitioning and wet etch texturing/surface cleaning, for instance by Plasma-Enhanced Chemical-Vapor Deposition (PECVD) and/or another suitable process such as Atomic Layer Deposition (ALD), which would also effectively cover and passivate all the sidewall edge regions, including the main icell peripheral boundary sidewalls as well as the trench sidewalls of all the isles, to substantially reduce or eliminate edge recombination loss effects. These measures will further enhance the substantial benefits of icell embodiments.

The following exemplary solar cell designs and manufacturing processes utilize a multi-layer metallization structure, and specifically two levels (or two layers) of solar cell metallization (i.e., dual layer metallization) which are physically separated by an electrically insulating backplane layer (backplane layer attached to the backside of the solar cell). For example, prior to backplane attachment (for instance, lamination of a thin prepreg sheet), the solar cell base and emitter contact metallization pattern (first layer of patterned metallization or M1) is formed directly on the solar cell backside, for instance using a relatively thin layer of screen printed paste (e.g., paste comprising aluminum or aluminum-silicon alloy) or plasma sputtered or evaporated (PVD) aluminum (or aluminum silicon alloy) material layer (followed by laser ablation or etchant patterning in the case of PVD-formed metal layer). This first patterned layer of metallization (herein also referred to as M1) defines the solar cell contact metallization pattern, such as fine-pitch interdigitated back-contact (IBC) conductor fingers defining the base and emitter metallization regions of the IBC cell. The M1 layer extracts the solar cell electrical power (current and voltage of the solar cell) and transfers the solar cell electrical power to the second patterned level/layer of higher-conductivity solar cell metallization (herein referred to as M2) formed after M1. The second layer or level of patterned metallization (M2) may comprise a relatively inexpensive and high-electrical-conductivity metal layer such as aluminum and/or copper (along with a suitable thin capping layer of NiV or Ni or another suitable capping metal).

As described with reference to the flow outlined in FIG. 4, after attachment or lamination of the backplane to the partially-processed solar cell backside (full attachment or lamination to the solar cell backside on and in around patterned M1 layer and exposed areas of the backside passivation layer), subsequent detachment of the backplane-supported solar cell from the template (in case of solar cells made using epitaxial silicon lift-off processing) OR subsequent optional silicon substrate thinning etch (in case of solar cells made using starting crystalline silicon wafers), completion of the frontside texture (e.g., using a wet alkaline or acidic wet etch texturization process) and frontside passivation and ARC deposition processes, and drilling of the via holes through the backplane layer, the patterned high sheet conductivity M2 layer is formed on the backplane (which forms both the patterned M2 layer as well as the conductive via plugs for the electrical interconnections between the patterned M2 and M1 metallization layers). Via holes (for instance, in the range of hundreds to thousands of via holes on the backplane for each solar cell) are drilled into the backplane (for example by laser drilling). These drilled via holes land on pre-specified regions of patterned M1 for subsequent electrical interconnections between the patterned M2 and M1 layers through conductive via plugs formed in these via holes (plugs may be formed concurrent with and as part of the patterned M2 formation process, or separately). Subsequently, the patterned higher-conductivity metallization layer M2 may be formed (for example, by screen printing, thermal or electron-beam evaporation, plasma sputtering, plating, or a combination thereof—using a relatively inexpensive high-conductivity M2 material comprising aluminum and/or copper). For an interdigitated back-contact (IBC) solar cell (icell) with M1 fine-pitch IBC fingers (for instance, hundreds of interdigitated M1 fingers per icell), the patterned M2 layer may be designed to be substantially orthogonal or perpendicular to the patterned M1 fingers—in other words the patterned M2 rectangular or tapered (e.g., triangular or trapezoidal) fingers are essentially perpendicular to the M1 fingers. Because of this orthogonal transformation of M2 fingers with respect to M1 fingers, the patterned M2 layer may have far fewer IBC fingers than the M1 layer (for instance, by a factor of about 10 to 50 fewer M2 fingers per mini-cell or unit-cell in some instances). Hence, the M2 layer may be formed in a much coarser pattern with much wider IBC fingers (and much larger base-emitter metal finger pitch) than the interdigitated M1 layer. Solar cell busbars may be positioned on the M2 layer, and not on the M1 layer (in other words a busbarless patterned M1 layer), to eliminate electrical shading losses associated with on-cell busbars. As both the base and emitter interconnections and busbars may be positioned on the patterned M2 layer on the solar cell backside backplane, electrical access is provided to both the base and emitter terminals of the solar cell on the backplane from the backside of the solar cell.

The continuous backplane material formed between the patterned M1 and M2 layers may be a thin sheet of an electrically insulating material, for instance, a suitable polymeric material such as an aramid fiber prepreg material, with sufficiently matching coefficient of thermal expansion (CTE) with respect to CTE of the semiconductor layer (e.g., crystalline silicon for crystalline silicon solar cells) to avoid causing excessive thermally induced stresses on the thin silicon layer. Moreover, the backplane layer should meet the solar cell process integration requirements for the backend cell fabrication processes, in particular relatively good chemical resistance during optional wet silicon thinning etch and during wet texturing of the cell frontside, and relatively good thermal stability (for instance, up to about 400° C. thermal stability) during the subsequent deposition of the frontside passivation and ARC layer(s) as well as during the subsequent M2 fabrication process (if applicable). The electrically insulating continuous backplane layer should also meet the module-level lamination processing and long-term PV module reliability requirements. While various suitable polymeric (such as plastics, fluoropolymers, prepregs, etc.) and suitable non-polymeric materials (such as glass, ceramics, etc.) may be used as the electrically insulating backplane material, the desired backplane material choice depends on many considerations including, but not limited to, cost, ease of process integration, relative CTE match to silicon, thermal stability, chemical resistance, reliability, flexibility/pliability, etc.

One suitable material choice for the continuous backplane layer is prepreg sheet (comprising a combination of fibers and resin). Prepreg sheets are used as building blocks of printed circuit boards and may be made from combinations of resins and CTE-reducing fibers or particles. The backplane material may be a relatively inexpensive, low-CTE (typically with CTE <10 ppm/° C., or in some instances with CTE <5 ppm/° C.), thin (usually 50 microns to 250 microns, and in some instances in the range of about 50 to 150 microns) prepreg sheet which is relatively chemically resistant to the optional silicon thinning etch chemistry (e.g., alkaline or acidic silicon etch chemistry) and texturization chemicals (e.g., alkaline or acidic silicon texturization chemistry), and is relatively thermally stable at temperatures up to at least 180° C. (and in some instances to temperatures as high about 400° C. during the back-end solar cell processing). In the case of solar cells fabricated using epitaxial silicon lift-off processing, the prepreg sheet may be attached to the solar cell backside after completion of the solar cell backside processing through the formation of the patterned M1 layer, while still on the reusable template (before the cell lift off release process if applicable) using a thermal-vacuum laminator. Alternatively in the case of solar cells fabricated using crystalline silicon wafers (no epitaxial lift-off processing), the prepreg sheet may be attached to the solar cell wafer backside after completion of the solar cell backside processing through the formation of the patterned M1 layer, again using a thermal-vacuum laminator. Upon applying a combination of heat and pressure, the thin continuous prepreg sheet (for instance, a 50 to 250 micron thick layer of aramid fiber prepreg sheet) is permanently laminated or attached to the backside of the processed solar cell (or a plurality of solar cells in the case of monolithic module embodiment). Then, as applicable in the case of solar cells fabricated using epitaxial silicon lift-off processing, the lift-off release boundary is defined around the periphery of the solar cell (near the reusable template edges), for example by using a pulsed laser scribing tool, and the backplane-laminated solar cell is then lifted off and separated from the reusable template using a mechanical release or lift-off process (the solar cells made on starting crystalline silicon wafers do not use a lift-off release process and directly proceed to the back-end solar cell processing after the backplane attachment/lamination process). Subsequent back-end process steps may include: (i) optional silicon thinning etch in the case of solar cells made on starting crystalline silicon wafers, completion of the wet texture and passivation and ARC deposition processes on the solar cell sunnyside, (ii) completion of formation of the solar cell backplane via holes and high-conductivity second layer metallization (M2) on the backplane-attached solar cell backside (which is formed on the solar cell backplane surface). The high-conductivity metallization for patterned M2 (for example comprising aluminum and/or copper, as opposed to silver in order to reduce the overall solar cell manufacturing and material costs) including interdigitated M2 metal fingers for both the emitter and base polarities is formed on the laminated solar cell backplane comprising the laser-drilled via holes.

As noted previously, the backplane material may be made of a thin (for instance, about 50 to 250 microns in thickness), flexible, and electrically insulating polymeric material sheet such as a relatively inexpensive prepreg material commonly used in printed circuit boards (PCB) and other industrial applications, which meets the overall process integration and reliability requirements. Generally, prepregs are reinforcing materials pre-impregnated with resin and ready to use to produce composite parts (prepregs may be used to produce composites faster and easier than wet lay-up systems). Prepregs may be manufactured by combining reinforcement fibers or fabrics with specially formulated pre-catalyzed resins using equipment designed to ensure consistency. Covered by a flexible backing paper, prepregs may be easily handled and remain flexible/pliable for a certain time period (out-life) at room temperature. Further, prepreg advances have produced materials which do not require refrigeration for storage, prepregs with longer shelf life, and products that cure at lower temperatures. Prepreg laminates may be cured by heating under pressure (heat-pressure lamination). Conventional prepregs are formulated for autoclave curing while low-temperature prepregs may be fully cured by using vacuum bag pressure alone at much lower temperatures.

As disclosed and discussed previously, the monolithically isled cell (icell) designs and fabrication methods disclosed herein may be integrated with known solar cell designs and fabrication process flows, including for back-contact solar cells, without substantially altering or adding manufacturing process steps or tools, and thus without substantially adding to the cost of manufacturing the solar cell. In fact, the manufacturing costs of solar cells and modules may be reduced as a result of the icell innovations (as well as the monolithic module embodiment innovations comprising icells). In one embodiment, the combination of cell designs in conjunction with a continuous backplane and metallization structure (specifically two patterned metallization layers or levels—M1 and M2) provides a back-junction/back-contact solar cell architecture. However, various combinations of the backplane and metallization layers may serve as permanent flexible or semi-flexible or rigid structural support/reinforcement and provide high-conductivity (e.g., comprising aluminum and/or copper metallization material) interconnects for a high-efficiency crystalline silicon solar cell without significantly compromising solar cell power or adding to solar cell manufacturing cost.

Figure 9A:
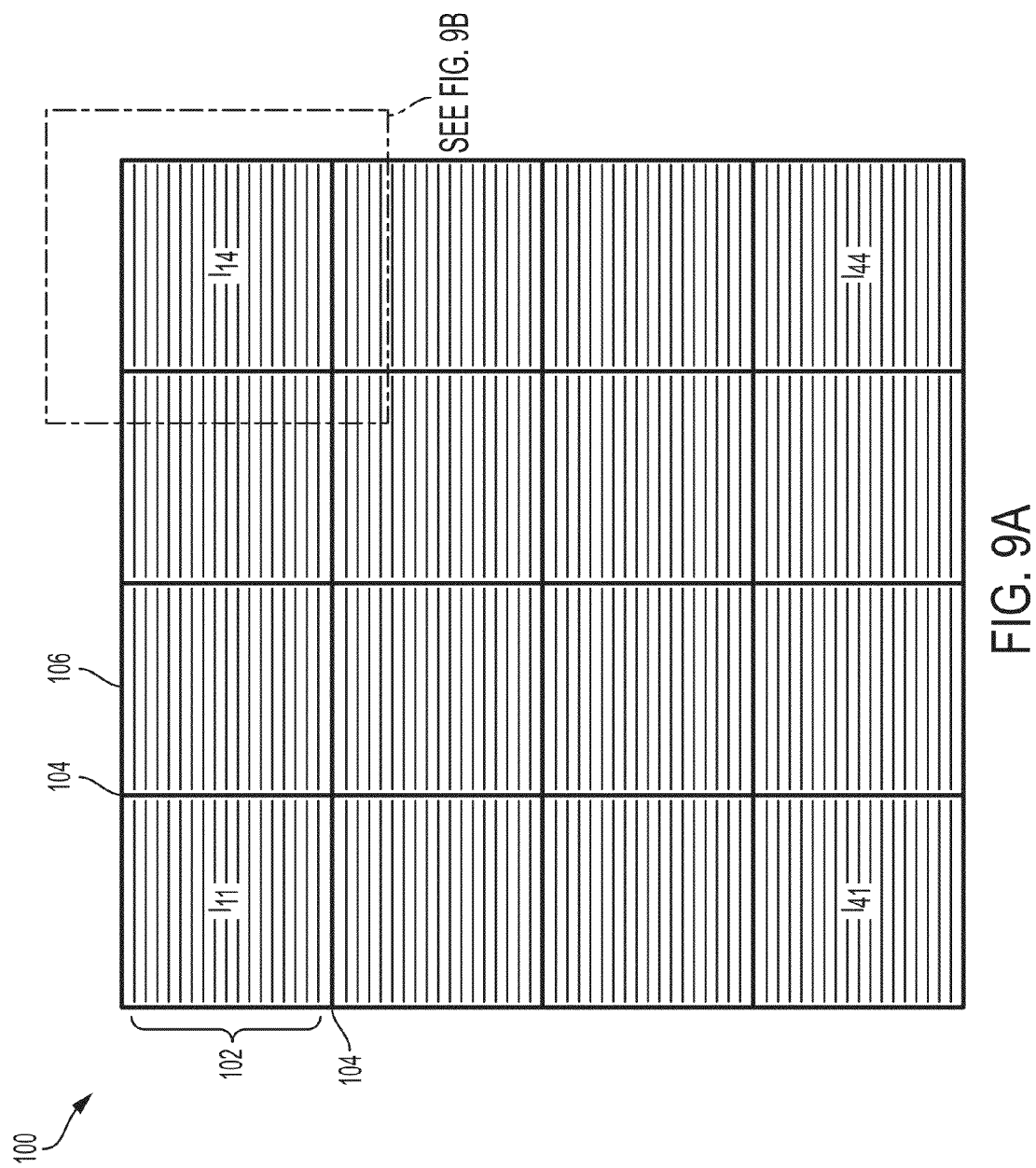
FIG. 9A is a backside view diagram showing a busbarless first metallization layer pattern (M1) formed on a square-shaped 4×4 isled icell and FIG. 9B is an expanded view of a portion of FIG. 9A.
Figure 9B:
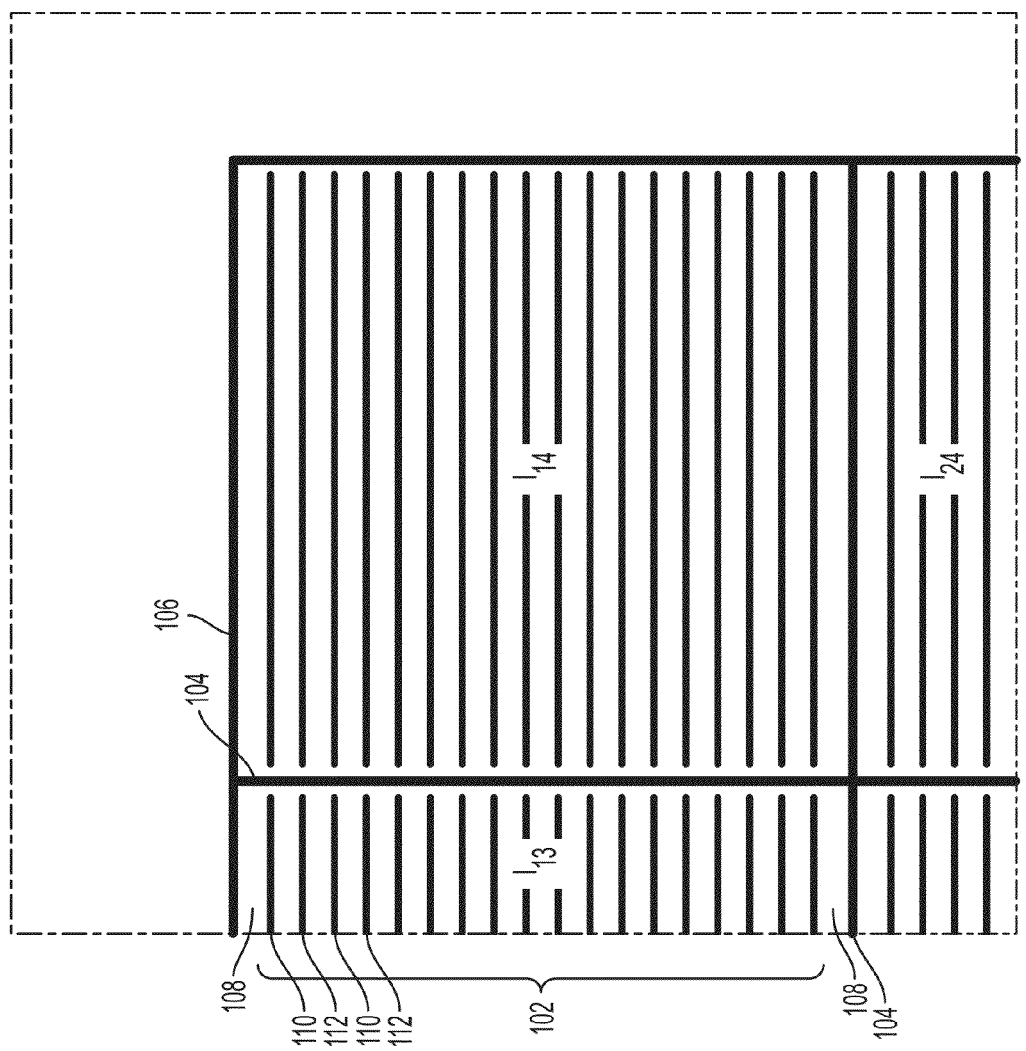

FIG. 9A is a schematic diagram showing a backside plan view of a busbarless first metallization layer pattern (M1) formed on master cell or icell with 4×4 square-shaped isles (this icell M1 pattern rear view corresponds to the frontside view shown in FIG. 2 for an icell with the same 4×4 square-shaped isles arrangement). FIG. 9B is an expanded view of a section of the schematic diagram of FIG. 9A, showing the expanded backside plan view of one of the isles of FIG. 9A (e.g., the isle designated by 114), indicating its island of busbarless first metallization layer pattern (M1) interdigitated base and emitter metal fingers, electrically isolated from the interdigitated base and emitter M1 fingers of the other isles in the icell.

FIG. 9A is a schematic diagram showing a backside plan view of a busbarless first metallization layer pattern (M1), comprising a plurality of islands (corresponding to the plurality—4×4 array in this representative example—of isles in the icell) of patterned fine-pitch interdigitated base and emitter metallization fingers, formed on master cell or icell 100 prior to the backplane attachment or lamination to the epitaxially grown (e.g., on porous silicon on template) or crystalline wafer-based semiconductor substrate. This design corresponds to the icell with a 4×4 array of square-shaped isles shown in FIG. 2. FIG. 9B is an expanded backside view of a solar cell isle from FIG. 9A with its patterned M1 metallization layer forming the fine-pitch busbarless interdigitated base and emitter metallization fingers (for instance, for the back junction/back-contact or IBC icell or master cell). Consistent with the icell embodiment as described previously with reference to FIG. 2, partially-processed master cell or icell 100 (processed through the first layer or level of patterned metal M1) is defined by cell peripheral boundary 106 and, in this representative embodiment, comprises 4×4=16 uniform (equal isle areas) square-shaped isles $I_{11}$ through $I_{44}$ to be subsequently defined (after the backplane attachment or lamination to the solar cell backside) by formation of the partitioning trench isolation borders, shown as borders 104 projected towards this backside view from frontside of the solar cell where the partitioning trenches will be formed. Note that the partitioning trenches will be formed from the sunnyside of the semiconductor substrate on the opposite side of the backplane. In FIG. 9A and FIG. 9B, the isle-partitioning borders 104 also define the M1 metallization islands (plurality of islands of interdigitated base and emitter metallization fingers formed by patterned M1) for the isles forming the icell (array of 4×4 isles in this embodiment). The 4×4 islands of interdigitated M1 fingers may be physically separated (i.e., the interdigitated fingers do not cross or violate the partitioning borders 104) and electrically isolated from each other. The entire plurality of patterned M1 islands (4×4 array of M1 islands in this embodiment, comprising a relatively high conductivity and inexpensive metal capable of making good ohmic contacts to both n-type and p-type silicon, such as aluminum) are formed concurrently on the backside of the solar cell by a suitable process such as screen printing of a suitable paste (aluminum or aluminum-silicon alloy paste) or PVD and post-PVD patterning (by pulsed laser ablation patterning or patterned etching). The isles or sub-cells or mini-cells, are monolithically formed (from the same initially continuous semiconductor layer) trench partitioned and isolated islands of a semiconductor layer (for example, an epitaxially grown silicon layer or a silicon layer from a starting crystalline silicon wafer)) on a shared continuous or continuous backplane layer/sheet (backplane not shown here but will be attached or laminated to the solar cell backside comprising the backside passivation and patterned on-cell M1 layers). The plurality of islands (4×4=16 in this embodiment) of patterned M1 interdigitated metallization fingers 102 are formed on the solar cell backside corresponding to and consistent with the icell pattern of trench-partitioned semiconductor isles on the solar cell frontside, with each island of interdigitated base and emitter metal fingers corresponding to the M1 metallization for each isle. The interdigitated base and emitter metal fingers on each M1 islands are shown without cell busbars on the M1 pattern (shown as alternating emitter M1 metal fingers 110 and base M1 metal fingers 112 formed on solar cell substrate backside 108, prior to the backplane attachment)—thus, there are no on-cell busbars. As shown in FIG. 9A and FIG. 9B, the patterned interdigitated M1 metallization fingers for each M1 island (corresponding to each trench-partitioned isle for the resulting icell) are physically and electrically isolated from the patterned interdigitated M1 metallization fingers of the other neighboring islands. Mostly but not necessarily, the electrical interconnections among various trench-partitioned isles of an icell are made through the second patterned metallization layer M2 after completion of the backplane attachment to the partially-processed solar cell backside and towards the end of the back-end processing of the solar cell. Some embodiments may utilize the patterned M1 layer to also interconnect the adjacent or neighboring trench-partitioned isles, for instance, in electrical parallel and/or series connections. In some instances, if applicable and desired, M1 metallization layer may be formed on the solar cell substrate backside 108, such as in the case of solar cell being made from an epitaxially grown silicon substrate, while the partially-processed epitaxial solar cell is still attached to its supporting crystalline silicon template structure on the cell sunnyside. This was described earlier in conjunction with the epitaxial silicon solar cell fabrication process flows.

FIG. 10A is a schematic diagram showing a backside plan view of a busbarless first metallization layer pattern (M1) formed on master cell or icell with 3×3 square-shaped isles (this icell M1 pattern rear view corresponds to the frontside view shown in FIG. 6A for an icell with the same 3×3 square-shaped isles arrangement). FIG. 10B is a schematic diagram showing a backside plan view of a busbarless first metallization layer pattern (M1) formed on master cell or icell with 5×5 square-shaped isles (this icell M1 pattern rear view corresponds to the frontside view shown in FIG. 6B for an icell with the same 5×5 square-shaped isles arrangement).

FIGS. 10A and 10B are a schematic diagrams showing a backside plan views of a busbarless first metallization layer pattern (M1), comprising a plurality of M1 metal pattern islands (corresponding to the 3×3=9 array in FIG. 10A and 5×5=25 array in FIG. 10B in these representative examples of isles in the icell) of patterned fine-pitch interdigitated base and emitter metallization fingers, formed on master cell or icell 120 in FIG. 10A and 130 in FIG. 10B prior to the backplane attachment or lamination to the epitaxially grown (on template) or crystalline wafer-based semiconductor substrate. These designs correspond to the icells with a 3×3 array of isles shown in FIG. 6A and the icells with a 5×5 array of isles shown in FIG. 6B). In FIG. 10A, consistent with the icell embodiment as described previously with reference to FIG. 6A, partially-processed master cell or icell 120 (processed through the first layer or level of patterned metal M1) is defined by cell peripheral boundary 126 and, in this representative embodiment, comprises 3×3=9 uniform (equal isle areas) square-shaped isles $I_{11}$ through $I_{33}$ to be subsequently defined (after the backplane attachment or lamination to the solar cell backside) by formation of the partitioning trench isolation borders, shown as borders 124 projected towards this backside view from the frontside of the solar cell where the partitioning trenches will be formed through the semiconductor layer. Note that the partitioning trenches will be formed from the sunnyside of the semiconductor substrate on the opposite side of the backplane. In FIG. 10A, the partitioning borders 124 also define the M1 metallization islands (plurality of islands of interdigitated base and emitter metallization fingers) for the isles forming the icell (3×3 isles in this embodiment). The 3×3 islands of interdigitated M1 fingers may be physically separated (i.e., the interdigitated fingers do not cross or violate the partitioning borders 124) and electrically isolated from each other. The entire plurality of patterned M1 islands (3×3 array of M1 islands in this embodiment, comprising a relatively high conductivity and inexpensive metal capable of making good ohmic contacts to both n-type and p-type silicon, such as aluminum) are formed concurrently on the backside of the solar cell by a suitable process such as screen printing of a suitable paste (such as a paste comprising aluminum or aluminum-silicon alloy) or PVD and post-PVD patterning (by pulsed laser ablation patterning or patterned etching). The isles or sub-cells or minicells, are monolithically formed (from the same initially continuous semiconductor layer) trench partitioned and isolated islands of a semiconductor layer (for example, an epitaxially grown silicon layer or a silicon layer from a starting crystalline silicon wafer) on a shared continuous or continuous backplane layer/sheet (backplane not shown here but will be attached or laminated to the solar cell backside comprising the backside passivation and patterned on-cell M1 layers). The plurality of islands (3×3=9 in this embodiment) of patterned M1 interdigitated metallization fingers 122 are formed on the solar cell backside corresponding to and consistent with the icell pattern of trench-partitioned semiconductor isles on the solar cell frontside, with each island of interdigitated base and emitter metal fingers corresponding to the metallization region for each isle. The interdigitated base and emitter metal fingers on each M1 islands are shown without cell busbars on the M1 pattern (shown as alternating emitter and base M1 metal lines 122 formed on solar cell substrate backside, prior to the backplane attachment)—thus, there is no on-cell busbar. As shown in FIG. 10A, the patterned interdigitated M1 metallization fingers for each M1 island (corresponding to each trench-partitioned isle for the resulting icell) are physically and electrically isolated from the patterned interdigitated M1 metallization fingers of the other neighboring islands. In some instances the electrical interconnections among various trench-partitioned isles of an icell are made through the second patterned metallization layer M2 after completion of the backplane attachment to the solar cell backside and towards the end of the back-end processing of the solar cell. Some embodiments may utilize the patterned M1 layer to also interconnect some adjacent or neighboring trench-partitioned isles, for instance, in electrical parallel and/or connections. In some instances, if applicable and desired, M1 metallization layer may be formed on the solar cell substrate backside, such as in the case of solar cell being made from an epitaxially grown silicon substrate, while the partially-processed epitaxial solar cell is still attached to its supporting crystalline silicon template structure on the cell sunnyside. This was described earlier in conjunction with the epitaxial silicon solar cell fabrication process flows.

In FIG. 10B, consistent with the icell embodiment as described previously with reference to FIG. 6B, partially-processed master cell or icell 130 (processed through the first layer or level of patterned metal M1) is defined by cell peripheral boundary 136 and, in this representative embodiment, comprises 5×5=25 uniform (equal isle areas) square-shaped isles $I_{11}$ through $I_{55}$ to be subsequently defined (after the backplane attachment or lamination to the solar cell backside) by formation of the partitioning trench isolation borders, shown as borders 134 projected towards this backside view from the frontside of the solar cell where the partitioning trenches will be formed. Note that the partitioning trenches will be formed from the sunnyside of the semiconductor substrate on the opposite side of the backplane. In FIG. 10B, the partitioning borders 134 also define the M1 metallization islands (plurality of islands of interdigitated base and emitter metallization fingers) for the isles forming the icell (5×5=25 isles in this embodiment). The 5×5=25 islands of interdigitated M1 fingers may be physically separated (i.e., the interdigitated fingers do not cross or violate the partitioning borders 134) and electrically isolated from each other. The entire plurality of patterned M1 islands (5×5=25 array of M1 islands in this embodiment, comprising a relatively high conductivity and inexpensive metal capable of making good ohmic contacts to both n-type and p-type silicon, such as aluminum) are formed concurrently on the backside of the solar cell by a suitable process such as screen printing of a suitable paste (such as comprising aluminum or aluminum-silicon alloy) or PVD and post-PVD patterning (by pulsed laser ablation patterning or patterned etching). The isles or sub-cells or minicells, are monolithically formed (from the same initially continuous semiconductor layer) trench partitioned and isolated islands of a semiconductor layer (for example, an epitaxially grown silicon layer or a silicon layer from a starting crystalline silicon wafer) on a shared continuous or continuous backplane layer/sheet (backplane not shown here but will be attached or laminated to the solar cell backside comprising the backside passivation and patterned on-cell M1 layers). The plurality of islands (5×5=25 in this embodiment) of patterned M1 interdigitated metallization fingers 132 are formed on the solar cell backside corresponding to and consistent with the icell pattern of trench-partitioned semiconductor isles on the solar cell frontside, with each island of interdigitated base and emitter metal fingers corresponding to the M1 metallization region for each isle. The interdigitated base and emitter metal fingers on each M1 islands are shown without cell busbars on the M1 pattern (shown as alternating emitter and base M1 metal lines 132 formed on solar cell substrate backside, prior to the backplane attachment)—thus, there are no on-cell busbars (to prevent or minimize electrical shading losses). As shown in FIG. 10B, the patterned interdigitated M1 metallization fingers for each M1 island (corresponding to each trench-partitioned isle for the resulting icell) are physically and electrically isolated from the patterned interdigitated M1 metallization fingers of the other neighboring islands. The electrical interconnections among various trench-partitioned isles of an icell may be made through the second patterned metallization layer M2 after completion of the backplane attachment to the solar cell backside and towards the end of the back-end processing of the solar cell. Some embodiments may utilize the patterned M1 layer to also interconnect the adjacent or neighboring trench-partitioned isles, for instance, in electrical parallel connection. In some instances, if applicable and desired, M1 metallization layer may be formed on the solar cell substrate backside, such as in the case of solar cell being made from an epitaxially grown silicon substrate, while the partially-processed epitaxial solar cell is still attached to its supporting crystalline silicon template structure on the cell sunnyside. This was described earlier in conjunction with the epitaxial silicon solar cell fabrication process flows.

Figure 11A:
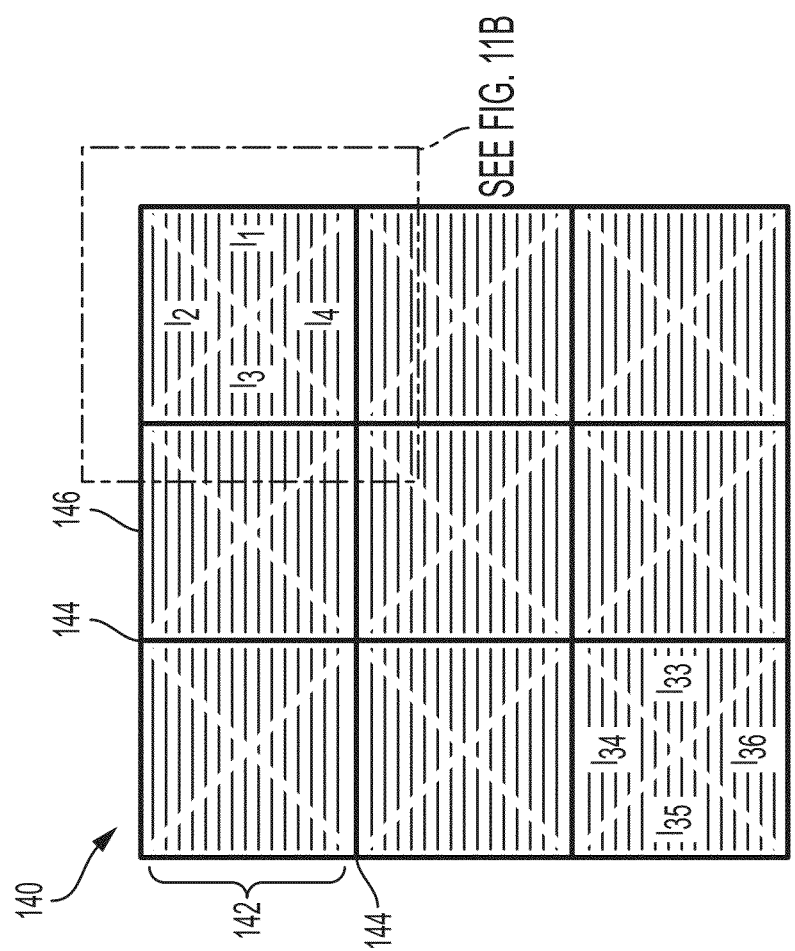
FIG. 11A is a backside view diagram showing a busbarless first metallization layer pattern (M1) formed on a triangular-shaped 36 isled icell and FIG. 11B is an expanded view of a portion of FIG. 11A.
Figure 11B:
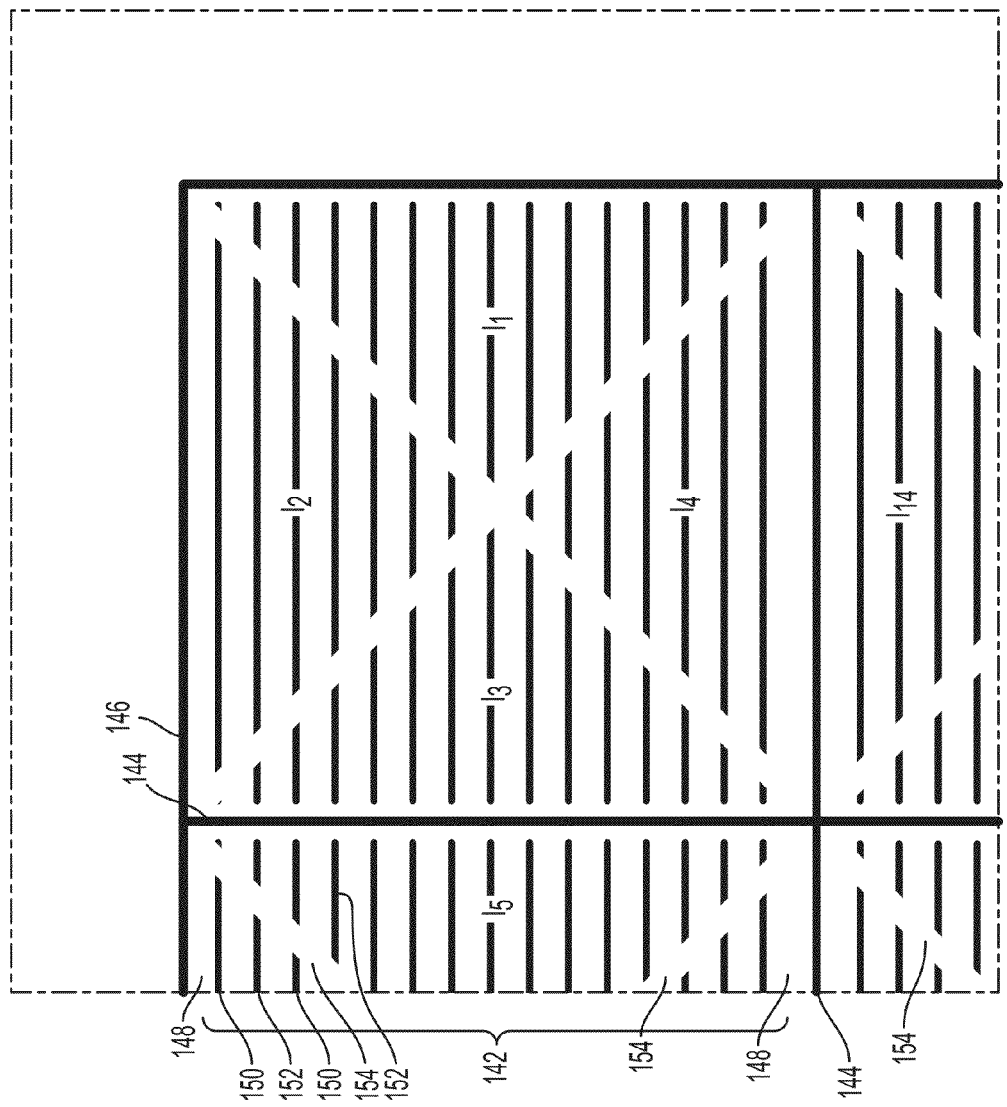

FIG. 11A is a schematic diagram showing a backside plan view of a busbarless first metallization layer pattern (M1) formed on master cell or icell with 4×3×3=36 triangular-shaped isles (this icell M1 pattern rear view corresponds to the frontside view shown in FIG. 7D for an icell with the same 4×3×3=36 triangular-shaped isles arrangement). FIG. 11B is an expanded view of a section of the schematic diagram of FIG. 11A, showing the expanded backside plan view of a group of triangular isles of FIG. 11A (e.g., the isles designated by $I_1, I_2, I_3, I_4$), indicating their triangular-shaped island of busbarless first metallization layer pattern (M1) interdigitated base and emitter metal fingers, electrically isolated from each other and the interdigitated base and emitter M1 fingers of the other isles in the icell.

FIG. 11A is a schematic diagram showing a backside plan view of a busbarless first metallization layer pattern (M1), comprising a plurality of islands (corresponding to the plurality—4×3×3=36 array of triangular isles in the icell in this representative example) of patterned fine-pitch interdigitated base and emitter metallization fingers, formed on master cell or icell 140 prior to the backplane attachment or lamination to the epitaxially grown (on template) or crystalline wafer-based semiconductor substrate. This design corresponds to the icell with 4×3×3 array of isles shown in FIG. 7D. FIG. 11B is an expanded backside view of a solar cell isle from FIG. 11A with its patterned M1 metallization layer forming the fine-pitch busbarless interdigitated base and emitter metallization fingers (for the back junction/back-contact or IBC solar cell). Consistent with the icell embodiment as described previously with reference to FIG. 7D, partially-processed master cell or icell 140 (processed through the first layer or level of patterned metal M1) is defined by master cell or icell peripheral boundary 146 and, in this representative embodiment, comprises 4×3×3=36 uniform (equal isle areas) triangular-shaped isles $I_1$ through $I_{36}$ to be subsequently defined (after the backplane attachment or lamination to the solar cell backside) by formation of the partitioning trench isolation borders through the semiconductor layer, shown as various border lines 144 and 154 (shown as dark axial—horizontal and vertical—lines, and white diagonal border lines, separating the triangular islands of interdigitated M1 metal fingers) projected towards this backside view from the frontside of the solar cell semiconductor substrate where the partitioning trenches will be formed. Note that the partitioning trenches will be formed from the sunnyside of the semiconductor substrate on the opposite side of the backplane. In FIG. 11A and FIG. 11B, the horizontal and vertical (also called axial herein) partitioning borders 144 and triangular pattern partitioning diagonal or angled borders 154 (shown as horizontal and vertical or axial dark lines as well as diagonal white lines—dark lines and white lines simply distinguish between the axial X and Y direction isle-partitioning borders vs. diagonal direction isle-partitioning borders) also define the M1 metallization islands (plurality of triangular-shaped islands of interdigitated base and emitter metallization fingers) for the triangular isles forming the icell (4×3×3=36 isles in this embodiment). The 4×3×3=36 islands of interdigitated M1 fingers may be physically separated (i.e., the interdigitated fingers do not cross the partitioning borders 144 and 154) and electrically isolated from each other. The entire plurality of patterned M1 islands (4×3×3=36 array of M1 islands in this embodiment, comprising a relatively high conductivity and inexpensive metal capable of making good ohmic contacts to both n-type and p-type silicon, such as aluminum) are formed concurrently on the backside of the solar cell by a suitable process such as screen printing of a suitable paste (such as a paste comprising aluminum or aluminum-silicon alloy) or PVD and post-PVD patterning (by pulsed laser ablation patterning or patterned etching). The isles or sub-cells or mini-cells, are monolithically formed (from the same initially continuous semiconductor layer) trench partitioned and isolated islands of a semiconductor layer (for example, an epitaxially grown silicon layer on porous silicon on template or a silicon layer from a starting crystalline silicon wafer) on a shared continuous or continuous backplane layer/sheet (backplane not shown here but will be attached or laminated to the solar cell backside comprising the backside passivation and patterned on-cell M1 layers). The plurality of islands (4×3×3=36 in this embodiment) of patterned M1 interdigitated metallization fingers 142 are formed on the solar cell backside corresponding to and consistent with the icell pattern of trench-partitioned semiconductor isles on the solar cell frontside, with each island of interdigitated base and emitter metal fingers corresponding to the M1 metallization for each isle. The interdigitated base and emitter metal fingers on each M1 island are shown without cell busbars on the M1 pattern (shown as alternating emitter M1 fingers 150 and base M1 fingers 152 formed on solar cell substrate backside 148, prior to the backplane attachment)—thus, there are no on-cell busbars (in order to avoid or eliminate electrical shading losses). As shown in FIG. 11A and FIG. 11B, the patterned interdigitated M1 metallization fingers for each triangular-shaped M1 island (corresponding to each trench-partitioned triangular-shaped isle for the resulting icell) are physically and electrically isolated from the patterned interdigitated M1 metallization fingers of the other neighboring islands. The electrical interconnections among various trench-partitioned isles of an icell are made through the second patterned metallization layer M2 after completion of the backplane attachment to the solar cell backside and towards the end of the back-end processing of the solar cell. Some embodiments may utilize the patterned M1 layer to also interconnect the adjacent or neighboring trench-partitioned isles, for instance, in electrical parallel and/or series connections. In some instances, if applicable and desired, M1 metallization layer may be formed on the solar cell substrate backside, such as in the case of solar cell being made from an epitaxially grown silicon substrate, while the partially-processed epitaxial solar cell is still attached to its supporting crystalline silicon template structure on the cell sunnyside. This was described earlier in conjunction with the epitaxial silicon solar cell fabrication process flows. In an icell embodiment with a plurality of triangular isles such as that shown in FIGS. 11A and 11B, a set of four triangular isles forming a square (for example isle group $I_1$ through $I_4$ forming a square and isle group $I_{33}$ through $I_{36}$ forming another square) may be electrically connected in parallel using second patterned metallization layer M2 (which is not shown here) and the entire set of square regions (3×3 square regions in this embodiment, with each square region comprising 4 triangular isles) may then be electrically connected in series (e.g., 3×3=9 square regions to be connected in electrical series), or if desired, in a hybrid parallel-series arrangement. Thus, while the number of triangular isles is 4×3×3=36, the number of subgroups (S) connected in series (for a series-connected arrangement of groups of 4 triangular isles) is 3×3=9—in other words 9 square-shaped subgroups of 4 triangles, such as $I_1$, $I_2$, $I_3$, and $I_4$ forming a square (P=4 or 4 triangular isles confined within a square connected in electrical parallel by M2 and the 9 square regions each comprising 4 parallel-connected triangular isles, all connected in electrical series).

Representative M2 Metallization Embodiments

Figure 12A:
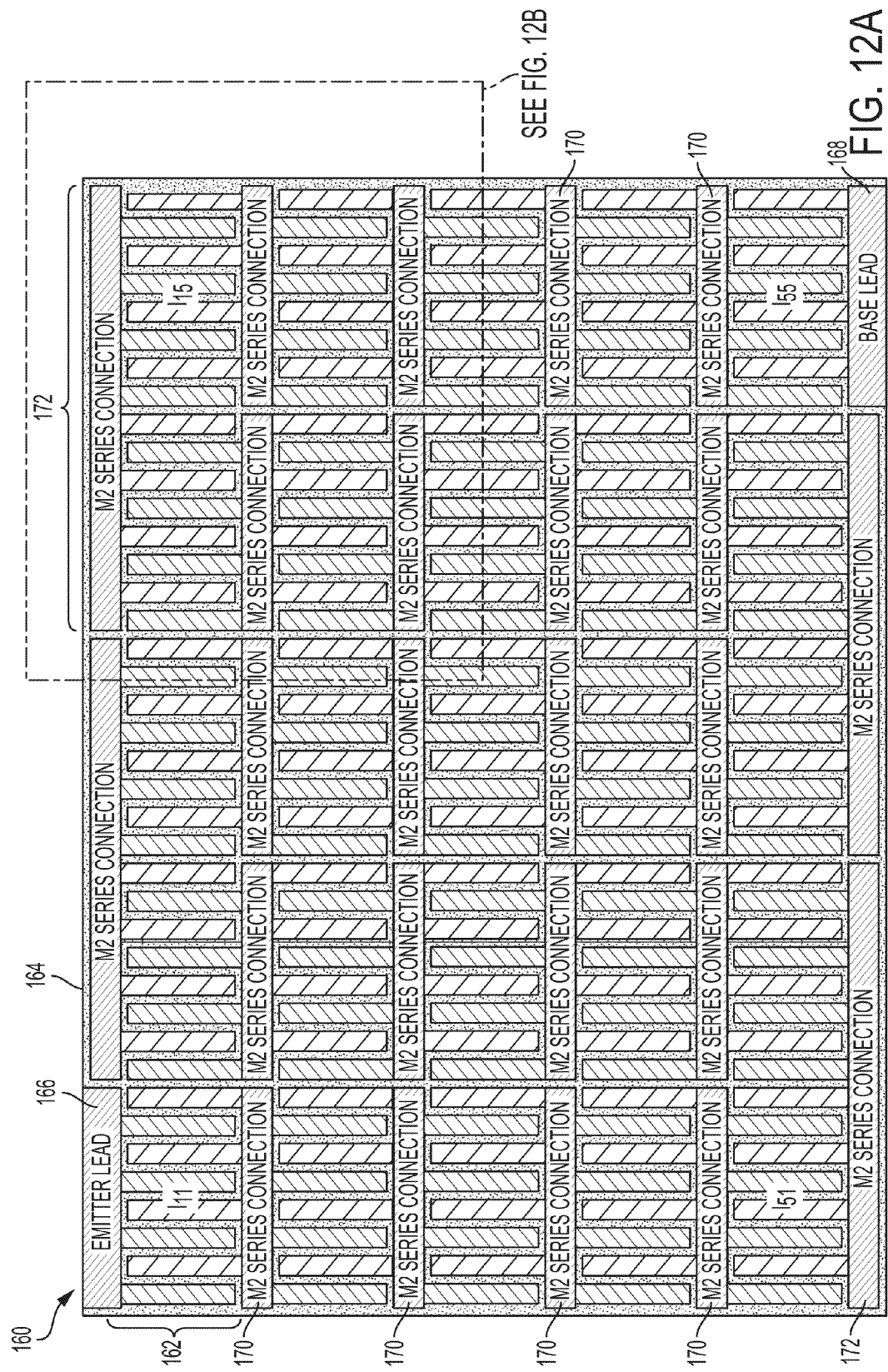
FIG. 12A is a backside view diagram showing a second metallization layer pattern (M2) formed on a square-shaped 5×5 isled icell and FIG. 12B is an expanded view of a portion of FIG. 12A.
Figure 12B:
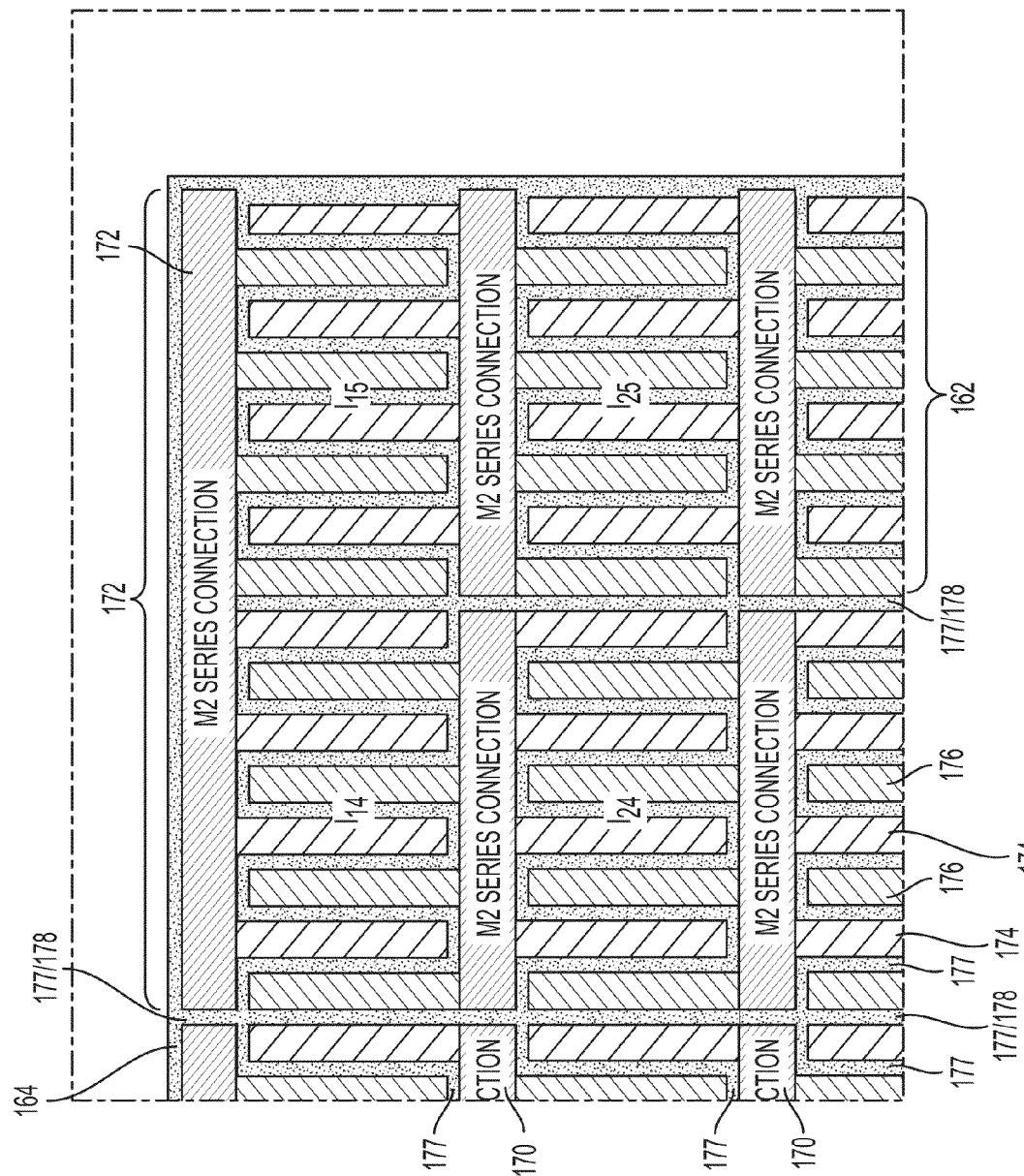

FIG. 12A is a schematic diagram showing a backside plan view of a second and final metallization layer pattern (M2) formed on master cell or icell backside for an icell with an array of 5×5 square-shaped isles (this M2 pattern applies to the solar cell design shown in FIG. 6B on which M1 is formed as shown in FIG. 10B). The M2 pattern shown here provides an arrangement to interconnect the array of 5×5=25 isles in electrical series in the icell. Patterned M2 layer is shown with substantially rectangular fingers (number of M2 fingers<<number of M1 fingers). FIG. 12B is an expanded view of a section of M2 structure in the schematic diagram of FIG. 12A showing the expanded backside plan view of the M2 pattern for a few of the series-connected isles within one quadrant region of FIG. 12A (e.g., including the M2 pattern for the isles designated by $I_{14}$, $I_{15}$, $I_{24}$, $I_{25}$, indicating the interdigitated base and emitter M2 metal fingers.

FIG. 12A is a schematic diagram showing a backside plan view of a second metallization layer pattern (M2) formed on master cell or icell 160 (similar to the solar cell shown in FIG. 6B comprising a 5×5=25 array of square-shaped isles, on which patterned M1 is as shown in FIG. 10B). FIG. 12B is an expanded view of the M2 metallization layer pattern in a few of the isles within a quadrant of the solar cell of FIG. 12A. In FIGS. 12A and 12B, and as described previously with reference to FIGS. 6B and 10B, master cell or icell 160 is defined by solar cell peripheral boundary 164 and comprises 5×5=25 uniform square shaped isles $I_1$ through $I_{55}$ defined by semiconductor-layer-partitioning trench isolation borders. Patterned M2 metallization layer 162 is formed on the continuous backplane layer 177 attached or laminated to the backside of the solar cell after formation of the patterned M1 layer. The patterned M1 and M2 layers are separated from each other by the backplane layer 177 and interconnected together through the conductive via plugs as described earlier. Patterned M2 metallization layer 162 shown in FIGS. 12A and 12B comprises substantially rectangular interdigitated emitter and base metal fingers which connect to the underlying patterned M1 layer through a plurality of conductive via plugs (formed by the M2 metallization process through the laser-drilled via holes through the backplane layer). As shown, the patterned M2 interdigitated rectangular fingers (M2 emitter fingers 176 and M2 base fingers 174) are may be patterned such that they are substantially perpendicular or orthogonal to the underlying patterned M1 interdigitated base and emitter fingers, hence, allowing for substantially smaller number of M2 base and emitter fingers as compared to the number of M1 base and emitter fingers. The isles in each column comprising a group of 5 isles in this embodiment (the master cell or icell comprising a 5×5 array of mini-cells or isles) are connected in electrical series by M2 series connections 170 (base M2 metal of each isle connected to the emitter M2 metal of its adjacent isle and emitter M2 metal of each isle connected to the base M2 metal of its adjacent isle in the same column and when transitioning from the end of one column to the beginning of its adjacent column; the base M2 busbar of one corner isle and the emitter M2 busbar of another diagonally opposite corner isle serve as the icell base and emitter busbars for icell to icell interconnections either through extensions of M2 in monolithic module embodiments or through tabbing/stringing/and/or soldering of the solar cells together when not using Monolithic Module embodiment). In order to complete the patterned M2 electrical series interconnections of the array of 5×5 isles arranged in 5 columns, the isle columns are electrically interconnected using the patterned M2 layer, specifically by lateral M2 layer jumpers or lateral connectors 172 positioned, alternatively, at the top and bottom of the isle columns—thus, the 5×5=25 isles in this icell are all interconnected in electrical series using the patterned M2 layer, with the series connections starting with the top left corner isle in icell 160 of FIG. 12A and continuing down the first column of isles, then connecting the first leftmost column in series to the second column using a bottom M2 jumper or lateral connector 172, with the series connections continuing up the second column of isles, then connecting the second column in series to the third column using a top M2 jumper or lateral connector 172, with the series connections continuing down the third column of isles, then connecting the third column in series to the fourth column using a bottom M2 jumper or lateral connector 172, with the series connections continuing up the fourth column of isles, then connecting the fourth column in series to the fifth column using a top M2 jumper or lateral connector 172, and finally with the series connections continuing down the fifth column of isles. In this icell with an array of 5×5 series-connected isles (all isles interconnection and final icell metallization by the patterned M2 layer), emitter lead or busbar 166 (emitter terminal) for isle $I_{11}$ (top left corner isle) and base lead or busbar 168 (base terminal) for isle $I_{55}$ (bottom right corner isle) serve as the main busbars of the icell 160. As shown, the adjacent columns of patterned M2 layer corresponding to the adjacent columns of isles (5 isles per column in this embodiment) are separated by M2 column electrical isolation gap regions 178 (i.e., no M2 metal in these isolation regions), exposing backplane layer 177. The M2 column electrical isolation gap regions 178 are formed concurrently along with formation of all the M2-level patterned base and emitter fingers as well as emitter lead or busbar 166 (emitter terminal) and base lead or busbar 168 (base terminal) as part of monolithically-fabricated patterned M2 metallization layer. M2 series connections 170 between adjacent isles in columns electrically connect the M2 base fingers 174 from isle $I_{11}$ to the M2 emitter fingers 176 of isle $I_{21}$. The M2 base fingers 174 of isle $I_{21}$ are electrically connected to the M2 emitter fingers 176 of isle $I_{31}$ and so on vertically to isle $I_{51}$, hence, completing the electrical series connections of the isles in the first column. M2 series connection lateral jumper 172 electrically connects the M2 base fingers 174 of isle $I_{51}$ (in column 1) to M2 emitter fingers 176 of isle $I_{52}$ (in column 2).

Each mini-cell or isle may be connected in series to at least one of the other isles in the array, with all the isles in the array of 5×5 isles connected in electrical series, such as that shown in FIG. 12A, which is herein referred to as an all-series connection. However, parallel and hybrid parallel-series mini-cell connection patterns may also be used, depending on the applications and requirements.

As shown in FIG. 12A, each isle (or each sub-group of M1 parallel connected isles) has a corresponding M2 unit cell design of interdigitated rectangular fingers formed on and orthogonal to the underlying interdigitated M1 finger unit cell for that isle—$I_{11}$ in FIG. 6B corresponding to $I_{11}$ in FIG. 10B corresponding to $I_{11}$ in FIG. 12A. In some instances, it may be desired to pattern the M2 fingers parallel to the underlying interdigitated M2 fingers.

Figure 13:
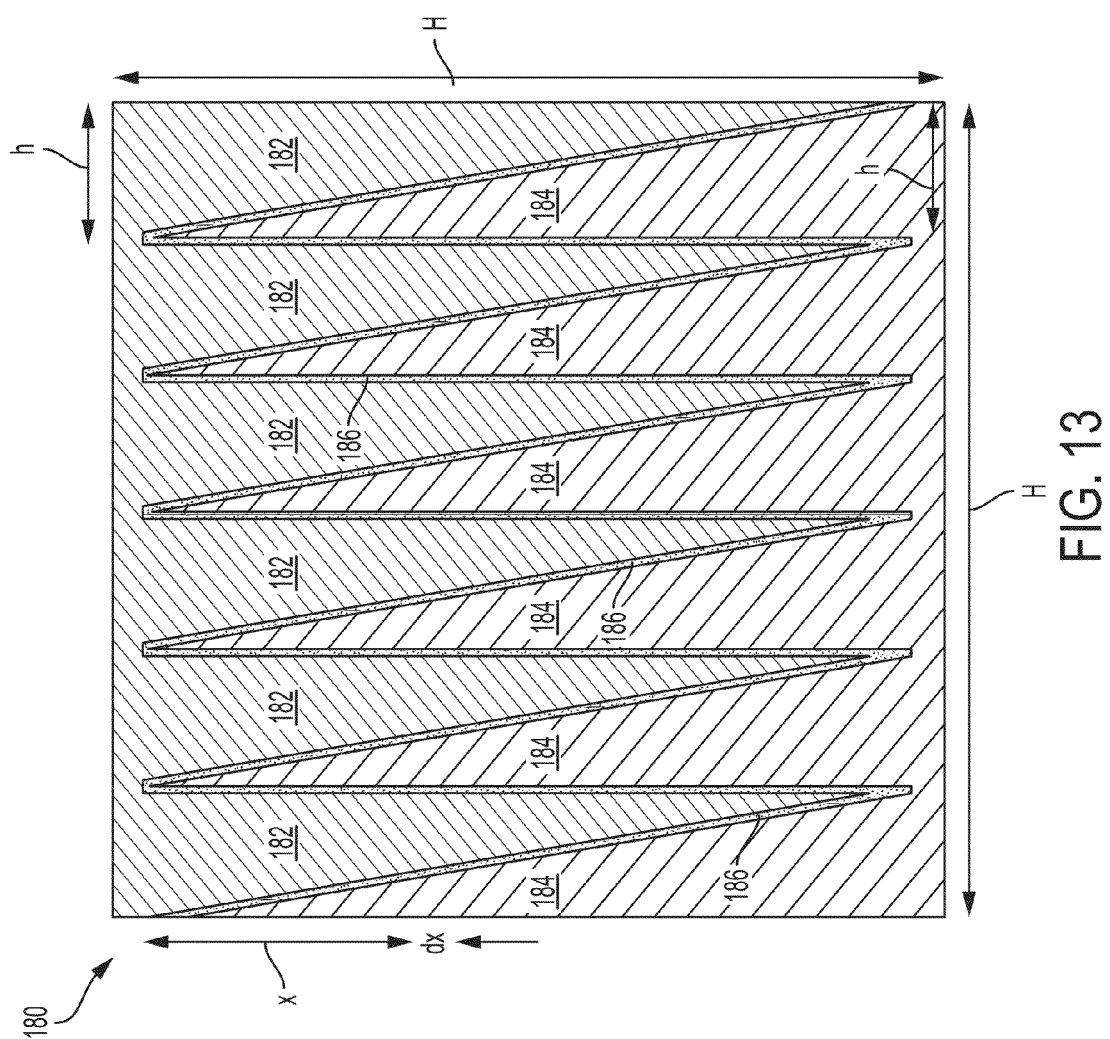
FIG. 13 is a backside view diagram showing a second metallization layer pattern (M2) unit cell having interdigitated tapered base and emitter fingers.

Additionally and alternatively, the metal fingers comprising the M2 unit cell design for icells may be tapered, for instance, triangular or trapezoidal shaped, as shown in FIG. 13. FIG. 13 is a schematic diagram showing a backside plan view of a second metallization layer pattern (M2) unit cell having a plurality of interdigitated tapered/right-angle triangular base and emitter fingers. This example of an M2 unit cell design, located over each series-connected square-shaped isle or sub-group of M1-parallel-connected isles, shows F=6 pairs of base and emitter M2 metal fingers per isle or sub-group of M1-parallel-connected isles.

FIG. 13 is a schematic diagram showing a backside plan view of a second metallization layer pattern (M2) unit cell 180 having, for instance, six pairs of tapered/right-angle triangular fingers—M2 tapered base fingers 184 (all attached to M2 base busbar) and M2 tapered emitter fingers 182 (all attached to M2 emitter busbar) separated by electrical isolation gaps 186 formed during M2 patterning. The word tapered is used herein to describe M2 fingers which are wider at the isle busbar connection and narrower as the fingers extend from the busbar towards the other end of isle. In some instances, a tapered M2 finger design may reduce ohmic losses and reduce M2 layer thickness requirements by about 30% as compared to rectangular M2 fingers—thus allowing for a thinner M2 layer for given allowable metallization ohmic losses. Tapered base and emitter M2 fingers (tapered away from corresponding isle M2 busbar) may be shaped as nearly triangular (right-angle, equilateral, or other desired triangular shape) or nearly trapezoidal. Example dimensional considerations for designing a square shaped M2 unit cell with tapered fingers for a master cell or icell with side dimension of L (corresponding to square-shaped icell area of about L×L) and N×N=S isles (S isles connected in electrical series by the patterned M2 metallization layer), and F pairs of M2 fingers per isle (or per sub-group of M1-parallel-connected isles): L=H×N; H=F×h; Isle Area=$H^2$; F=Number of M2 Base and Emitter Finger Pairs (F=6 in FIG. 13)—wherein: H is the side dimension of the M2 pattern per series-connected isle (or isle subgroup), h is the base width of the triangular M2 fingers, and F is the number of pairs of base and emitter M2 fingers per isle (or isle subgroup). The area of each series-connected isle (or subgroup of isles) is $H^2$.

FIG. 13 is a diagram showing a backside view of a second metallization unit cell layer pattern (M2) formed on master cell isle 180 (concurrently and monolithically along with the patterned M2 for all the other isles in the icell), having triangular-tapered interdigitated base fingers 184 and emitter fingers 182 defined and electrically isolated by isolation metallization electrical isolation gap 186 (formed as part of patterned M2 formation). The M2 metallization pattern shown in FIG. 13 may be positioned, for example, orthogonal or perpendicular to the patterned M1 fingers, on each individual isle (such as each isle connected in series with the other isles in the icell) or on a sub-group of M1-parallel-connected isles. Tapered fingers may further reduce M2 thickness requirements (typically by about 30% with respect to rectangular fingers) and allow for a thinner M2 metallization layer (due to the reduced electrical sheet conductance requirements).

FIG. 14A is a schematic diagram showing a backside plan view of a second metallization layer pattern (M2) formed on the backside of an icell (similar to the cell shown in FIG. 2 on which patterned M1 is formed as shown in FIG. 9A). This shows an icell M2 pattern to make electrical series connections of the 4×4=16 array of square-shaped isles. Patterned M2 fingers use triangular base and emitter metal fingers (number of M2 fingers is less than the number of M1 fingers per isle). In some instances M2 fingers may be orthogonal or perpendicular to the M1 fingers. M2 fingers can be much wider and coarser pitch than M1 fingers.

Figure 14B:
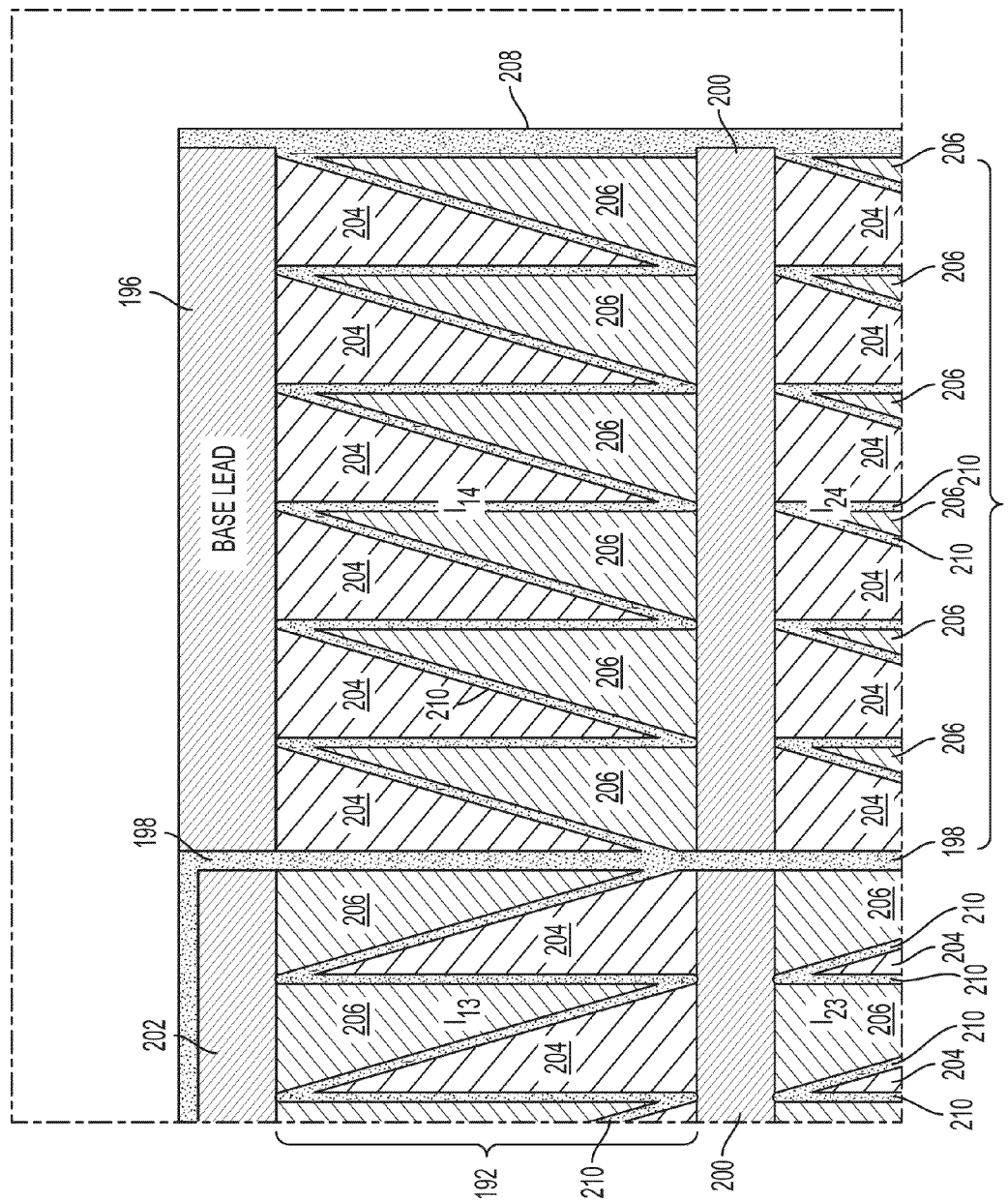

FIG. 14B is a schematic diagram showing an expanded backside plan view of a portion of the solar cell from FIG. 14A, with a patterned M2 metallization layer, specifically showing full view of isle $I_{14}$ along with partial views of isles $I_{13}$, $I_{23}$, and $I_{24}$.

FIG. 14A is a diagram showing a backside plan view of a second metallization layer pattern (M2) formed on master cell or icell 190 (similar to the cell shown in FIG. 2 on which patterned M1 is formed as shown in FIG. 9A). FIG. 14B is an expanded schematic plan view of a portion of the solar cell from FIG. 14A, with a patterned M2 metallization layer, specifically showing full view of isle $I_{14}$ along with partial views of isles $I_{13}$, $I_{23}$, and $I_{24}$. In FIGS. 14A and 14B, and as described previously with reference to FIGS. 2 and 9A, master cell or icell 190 is defined by a cell peripheral boundary 208 and comprises 4×4=16 uniform (equal area) square shaped isles $I_{11}$ through $I_{44}$ defined by partitioning trench isolation borders. Patterned M2 unit cell metallization layer 192 is formed on the backplane layer attached to the solar cell backside comprising the patterned M1 layer, and on the backside of each isle in the icell, as tapered (e.g., triangular shaped as shown) interdigitated emitter and base metal fingers which are electrically interconnected to the underlying M1 layer through a plurality of conductive via plugs. As shown, the patterned M2 interdigitated triangular fingers (M2 emitter fingers 206 and M2 base fingers 204 which are electrically isolated in the patterned M2 layer by isolation gaps 210) are patterned substantially orthogonal or perpendicular to the underlying M1 interdigitated fingers allowing for substantially fewer M2 fingers as compared to the number of M1 fingers for each isle. Each isle in a column (the master cell comprising a 4×4=16 array of mini-cells as shown in FIG. 14A) connected in series by M2 series connections 200 and isle columns are interconnected by M2 lateral jumpers 202 positioned, alternatively, at the top and bottom of the isle columns—thus the array of 4×4=16 isles are connected in electrical series from emitter lead 194 (emitter terminal or busbar for the icell) to base lead 196 (base terminal or busbar for the icell). As shown, each isle column is separated by M2 column isolation regions 198, also formed as part of the patterned M2 formation process. M2 series connections 200 electrically connect the M2 base fingers 204 from isle $I_{11}$ to the M2 emitter fingers 206 of isle $I_{21}$. The M2 base fingers 204 of isle $I_{21}$ are electrically connected to the M2 emitter fingers 206 of isle $I_{31}$ and so on vertically to isle $I_{41}$. M2 series connection lateral jumper 202 electrically connects the M2 base fingers 204 of isle $I_{41}$ (in column 1) to M2 emitter fingers 206 of isle $I_{42}$ (in column 2).

FIG. 15A is a schematic diagram showing a backside plan view of a second metallization layer pattern (M2) formed on a master cell with 3×3=9 series-connected isles or sub-groups of M1-parallel-connected isles (similar to the cell shown in FIG. 6A on which patterned M1 is formed as shown in FIG. 10A). Patterned M2 fingers use triangular base and emitter metal fingers (number of M2 fingers is less than the number of M1 fingers per isle). In some instances, M2 fingers may be orthogonal or perpendicular to the M1 fingers. M2 fingers can be much wider and coarser pitch than M1 fingers.

FIG. 15A is a diagram showing a backside plan view of a second metallization layer pattern (M2) formed on master cell or icell 220 (similar to the cell shown in FIG. 6A on which patterned M1 is formed as shown in FIG. 10A). The M2 pattern shown may be formed for 3×3=9 series-connected isles (or sub-groups of M1-parallel-connected isles) on a master cell providing increased voltage and decreased current as compared to a prior art single isle master cell (such as that shown in FIG. 1). In other words, the M2 metallization pattern may scale up the solar cell voltage ($V_{mp}$ and $V_{oc}$) by a factor of nine and scale down the solar cell current ($I_{mp}$ and $I_{sc}$) by a factor of nine as compared to a prior art single isle master cell. In FIG. 15A, and as described previously with reference to FIGS. 6A and 10A, icell or master cell 220 is defined by a cell peripheral boundary 238 and comprises 3×3=9 uniform (equal area) square shaped isles $I_{11}$ through $I_{33}$ defined by partitioning trench isolation borders. Patterned M2 unit cell metallization layer 222 is formed on the continuous electrically insulating backplane attached to the solar cell backside after formation of the patterned M1 layer, on the backside of each isle as tapered (e.g., triangular shaped) interdigitated emitter and base M2 metal fingers which are electrically connected to the underlying patterned M1 layer fingers through a plurality of conductive via plugs formed through the backplane. As shown, the patterned M2 interdigitated triangular fingers (M2 emitter fingers 232 and M2 base fingers 234 which are electrically isolated by isolation gaps formed during the patterned M2 formation process) are patterned substantially orthogonal or perpendicular to the underlying patterned M1 interdigitated fingers allowing for substantially fewer M2 fingers as compared to the number of M1 fingers for each isle. Each isle in a column (the master cell comprising a 3×3=9 array of mini-cells or isles in this embodiment) connected in series by M2 series connections 230 and isle columns are connected by lateral jumpers 228 positioned, alternatively, at the top and bottom of the isle columns—thus each isle is connected in series from emitter lead or busbar 224 (emitter terminal) to base lead or busbar 226 (base terminal). As shown, each isle column is separated by M2 column isolation regions 236 formed during the patterned M2 formation process. M2 series connections 230 electrically connect the M2 base fingers 234 from isle $I_{11}$ to the M2 emitter fingers 232 of isle $I_{21}$. The M2 base fingers 234 of isle $I_{21}$ are electrically connected to the M2 emitter fingers 232 of isle $I_{31}$. M2 series connection lateral jumper 228 electrically connects the M2 base fingers 234 of isle $I_{31}$ (in column 1) to M2 emitter fingers 232 of isle $I_{32}$ (in column 2).

Figure 15B:
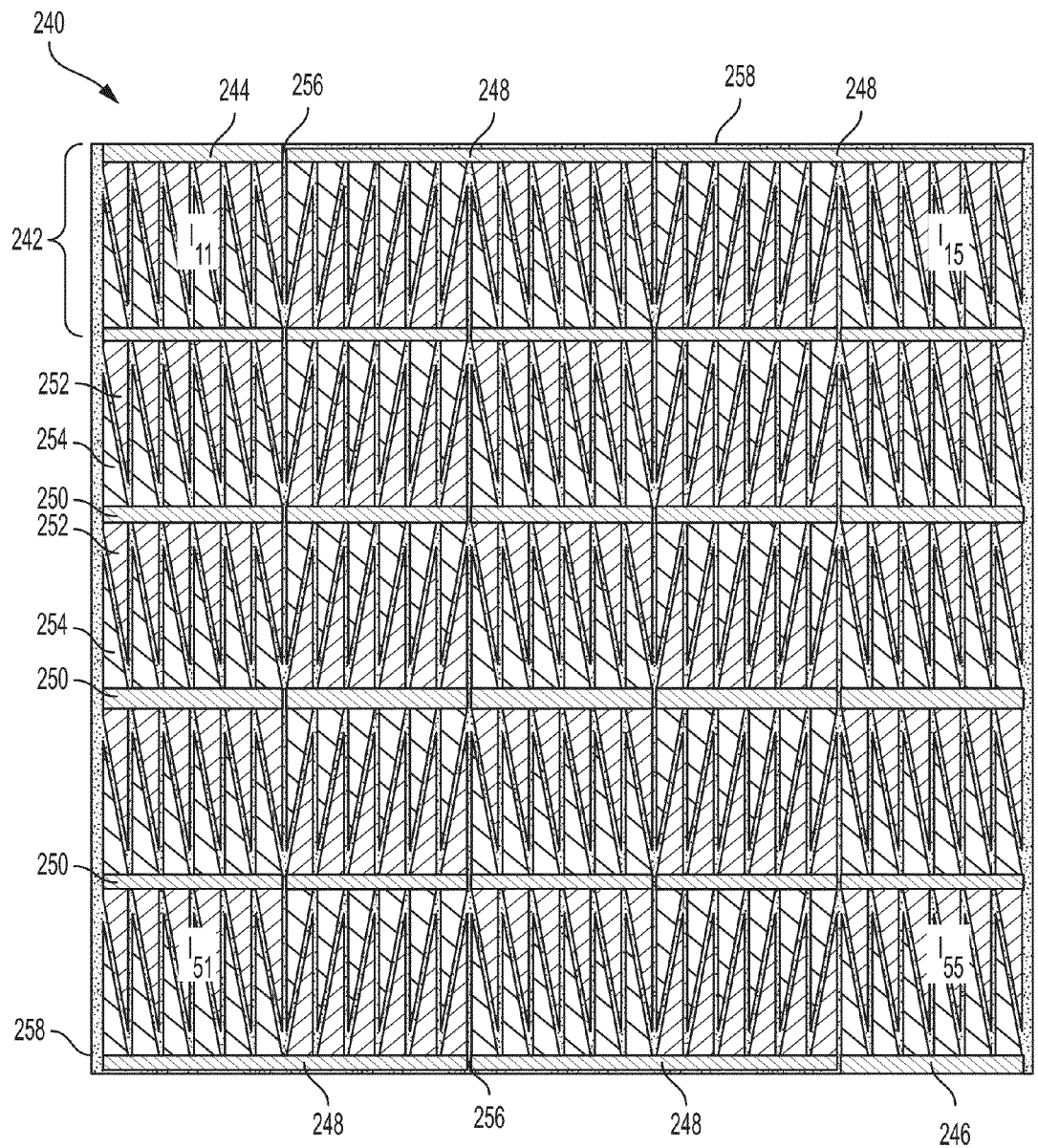

FIG. 15B is a schematic diagram showing a backside plan view of a second metallization layer pattern (M2) formed on a master cell with 5×5=25 series-connected isles or subgroups of M1-parallel-connected isles (similar to the cell shown in FIG. 6B on which patterned M1 is formed as shown in FIG. 10B). Patterned M2 fingers use triangular base and emitter metal fingers (number of M2 fingers is less than the number of M1 fingers per isle). In some instances M2 fingers may be orthogonal or perpendicular to the M1 fingers. M2 fingers can be much wider and coarser pitch than M1 fingers FIG. 15B is a diagram showing a backside plan view of a second metallization layer pattern (M2) deposited on icell or master cell 240 (similar to the cell shown in FIG. 6B on which M1 is deposited as shown in FIG. 10B). The M2 pattern shown may be formed for 5×5=25 series connected isles on a master cell providing increased solar cell voltage and decreased solar cell current as compared to a prior art isle master cell. In other words, the M2 metallization pattern may scale up the voltage ($V_{mp}$ and $V_{oc}$) by a factor of 25 and scale down the current ($I_{mp}$ and $I_{sc}$) by a factor of 25 as compared to a prior art single isle master cell. In FIG. 15B, and as described previously with reference to FIGS. 6B and 10B, icell or master cell 240 is defined by a cell peripheral boundary 258 and comprises 25 uniform square shaped isles $I_{11}$ through $I_{55}$ defined by trench isolation borders. Patterned M2 unit cell metallization layer 242 is formed on the electrically insulating continuous backplane attached to the solar cell backside after formation of the patterned M1 layer, on the backside of each isle as tapered (triangular shaped) interdigitated emitter and base metal fingers which are electrically interconnected to the underlying M1 layer through a plurality of conductive via plugs through the backplane layer. As shown, the M2 interdigitated triangular fingers (M2 emitter fingers 252 and M2 base fingers 254 which are electrically isolated by isolation gaps) are patterned substantially orthogonal or perpendicular to the underlying patterned M1 interdigitated fingers allowing for substantially fewer M2 fingers as compared to the number of M1 fingers. Each isle in a column (the master cell comprising a 5×5=25 array of mini-cells in this embodiment) connected in series by M2 series connections 250 and isle columns are connected by lateral jumpers 248 positioned, alternatively, at the top and bottom of the isle columns—thus each isle is connected in series from emitter lead or busbar 244 (emitter terminal) to base lead or busbar 246 (base terminal). As shown, each isle column is separated by M2 column isolation regions 256. M2 series connections 250 electrically connect the M2 base fingers 254 from isle $I_{11}$ to the M2 emitter fingers 252 of isle $I_{21}$. The M2 base fingers 254 of isle $I_{21}$ are electrically connected to the M2 emitter fingers 252 of isle $I_{31}$ and so on vertically to isle $I_{51}$. M2 series connection lateral jumper 248 electrically connects the M2 base fingers 254 of isle $I_{51}$ (in column 1) to M2 emitter fingers 252 of isle $I_{52}$ (in column 2).

The M1 and M2 unit cell patterns disclosed herein may be designed for square or pseudo-square shaped isles, triangular isles, or various other geometric shaped isles and any combination thereof. In other words, the isle design and interconnection pattern may dictate patterned M1 and M2 designs.

The required electrical conductivity for M2 (or the overall thickness of patterned M2 metal for a given M2 material such as Al or Cu) is less for a master cell having S isles (or S subgroups of isles) connected in electrical series (or hybrid-parallel-series) as compared to a master cell comprising a single isle because of the reduced cell current and increased cell voltage of an icell with a current and voltage scaling factor of S. Generally, the larger the value of S—in other words the number of series connected sub-cells or isles—the smaller the M2 thickness requirement as cell current is reduced and cell voltage increased by a factor of S (number of series connected isles or sub-groups of isles in the icell). For example, copper M2 layer thickness for an IBC solar cell may be decreased from the thickness range of about 20 to over 80 microns for a non-tiled solar cell (for instance, 156 mm×156 mm IBC solar cells) such as that shown in FIG. 1 to less than approximately 20 microns, and in some instances less than 10 microns to as low as about 1 micron to 5 microns, for a tiled master cell with series-connected isles (hence, scaling up the voltage and scaling down the current for the icell by the factor S).

The monolithically tiled solar cell or icell structures and fabrication methods disclosed herein provide for substantially reduced metallization sheet conductance and thickness requirements which in turn can reduce metal consumption, process cost, fabrication process equipment cost, and corresponding capital expenditures. Further hazardous waste byproducts from particular cell fabrication processes, such as that produced during metal plating (for example copper plating), may be reduced or eliminated due to reduced and relaxed metallization sheet conductance and thickness requirements (hence, the capability to eliminate dependency on thick metal plating, by replacing it with a much simpler and lower cost metallization process such as evaporation, plasma sputtering, and/or screen printing). A thinner and simpler M2 metallization pattern may reduce solar cell semiconductor layer microcracks and improve the overall solar cell and module manufacturing yields—for example due to substantially reduced tensilary/mechanical stresses of the thinner patterned M2 metallization and elimination of dependency on metal plating processing (such as copper plating) and associated handling, edge sealing, and plating electrical contacting requirements. For applications requiring flexible or bendable solar cells and PV modules, the thinner M2 metallization layer enabled by the icell innovative aspects also enable improved flexibility and bendability of the solar cells and flexible, lightweight PV modules without increasing the risk of solar cell microcracks or breakage. Copper plating process used to form the relatively thick (e.g., about 30 to 80 microns) copper metallization for prior art interdigitated back-contact (IBC) solar cells may degrade the manufacturing yield due to the intrusive nature of copper plating process (requiring one-sided plating, preventing exposure of the IBC solar cell frontside to the plating chemistry) and risk of mechanical breakage of the cells due to handling as well as clamping/sealing and declamping/unsealing of the solar cells during and after the plating process. For example, copper plating processing of solar cells with pre-existing microcracks may plate copper along the silicon microcracks causing hard shunts or soft shunts, resulting in yield or performance degradation. In one embodiment, the elimination of copper plating processing due to substantially reduced M2 sheet conductance (or M2 metal thickness) requirements eliminates the need for special M1 designs allowing for the patterned M2 layer to be recessed or offset from the edge of the solar cell to accommodate edge-sealed copper plating—in other words the laxed M2 sheet conductance requirements of the isled master cells or icells enable replacing thick copper plating process with a dry non-plating process to form the patterned M2 layer, hence eliminating the need for clamping or sealing of the frontside of the cells to eliminate exposure to plating processing. Therefore, the underlying patterned M1 fingers may be extended nearly end-to-end between the edges or partitioning borders of the isles. Further, eliminating the dependency on copper plating metallization allows for all-dry cell metallization processing (for instance, using screen printing or PVD)—thus substantially reducing cell fabrication complexity.

And in some metallization embodiments when using a metallization material other than copper (e.g., aluminum), projected long-term field reliability of the solar cells and PV modules may be improved since in solar cells using copper metallization, copper seeping to sensitive solar cell surface areas (even though not causing soft or hard solar cell shunts) may cause long-term reliability issues due to copper diffusion into the semiconductor substrate and degradation of minority carrier lifetime (and efficiency).

Thinner solar cell metallization enabled by the icell reduces solar cell bow and mechanical stress, for example on backplane-laminated solar cells disclosed herein, as compared to known solar cells using relatively thick (typically in the range of about 30 to 80 microns for IBC solar cells) plated metal, often plated copper. The reduction of M2 metal thickness in a dual level metallization structure (in one example from at least 30 to 80 microns to less than approximately 5 microns) results in enhanced solar cell and PV module flexibility/pliability without crack generation and without PV module performance degradation as a result of PV module flexing or bending. Additionally, reduction of M2 metal thickness and mass substantially reduces or eliminates mechanical stresses, such as patterned metallization stresses on the sensitive solar cell semiconductor absorber—thus, minimizing microcrack generation and yield degradation during subsequent solar cell and module processing, such as during test and sort, module lamination (which may use lamination pressure and heat), and field operation of the installed PV modules. For example, patterned M2 may be made of a relatively inexpensive, high-conductivity metal such as copper (bulk resistivity 1.68 $\mu\Omega\cdot$cm) or aluminum (bulk resistivity 2.82 $\mu\Omega\cdot$cm). For example, copper has a linear CTE of about 17 ppm/° C. and crystalline silicon has a linear CTE of approximately 2.7 ppm/° C. Thus, there is an approximate CTE difference of 14 ppm/° C. between copper and crystalline silicon, and a 140° C. module lamination process would cause a dimensional mismatch of 0.25 mm or 250 µm for a 156 mm×156 mm solar cell (in other words thick plated copper expands about 250 microns more from side to side as compared to silicon) resulting in very large tensile stress on silicon during the module lamination process. Monolithic mini-cells or isles having a patterned thin M2 metallization pattern in accordance with the disclosed subject matter (for example with a layer thickness less than approximately 10 microns, and in some instances less than 5 microns) substantially reduces or eliminates this mode of crack generation and propagation and resulting yield degradation.

If desired, in order to eliminate the need for plating processing, such as a copper plating process (as well as the cost, added process complexity, thermal/mechanical stresses, and potential fabrication yield losses associated with metal plating process), the number of series-connected sub-cells or isles (S) may be chosen such that the required low-resistivity or high-conductivity metal (for example inexpensive high-conductivity metals such as copper and/or aluminum, although another high-conductivity metal such as silver may also be used) thickness is sufficiently small in order to use a relatively low-cost metal deposition process, such as plasma sputtering or evaporation (Physical-Vapor Deposition or PVD processes), particularly in instances where the M2 thickness (such as the copper or aluminum thickness) is reduced to less than about 10 microns and in some instances less than approximately 5 microns. Alternatively, another inexpensive metallization process such as screen printing may be used instead of copper plating.

Further, in one embodiment, M2 may be patterned to be substantially orthogonal or perpendicular to M1 and the number of M2 fingers (such as tapered fingers) may be much less than the number of M1 fingers, for example by a factor in the range of about 5 to 50. And in some instances, M2 fingers designed in tapered finger shapes such as triangular or trapezoidal shapes, as compared to rectangular shaped fingers, will further reduce the M2 metal thickness requirement (typically by about 30%).

Partitioning the main/master cell into an array of isles or sub-cells (such as an array of N×N square or pseudo-square shaped or K triangular-shaped or a combination thereof) and interconnecting those isles in electrical series or a hybrid combination of electrical parallel and electrical series reduces the overall master cell current for each isle or mini-cell—for example by a factor of N×N=$N^2$ if all the square-shaped isles are connected in electrical series, or by a factor of K if all the triangular-shaped isles are connected in series. And while the main/master cell or icell has a maximum-power (mp) current of $I_{mp}$, and a maximum-power voltage of $V_{mp}$, each series-connected isle (or sub-groups of isles connected in parallel and then in series) will have a maximum-power current of $I_{mp}/N^2$ (assuming $N^2$ isles connected in series) and a maximum-power voltage of $V_{mp}$ (no change in voltage for the isle). Designing the first and second metallization layer patterns, M1 and M2 respectively, such that the isles on a shared continuous or continuous backplane are connected in electrical series results in a main/master cell or icell with a maximum-power current of $I_{mp}/N^2$ and a maximum power voltage of $N^2 \times V_{mp}$ or a cell (icell) maximum power of $P_{mp}=I_{mp} \times V_{mp}$ (the same maximum power as a master cell without mini-cell partitioning).

Thus, a monolithically isled master cell or icell architecture reduces ohmic losses due to reduced solar cell current and allows for thinner solar cell metallization structure generally and a much thinner M2 layer if applicable or desired. Further, reduced current and increased voltage of the master cell or icell allows for relatively inexpensive, high-efficiency, maximum-power-point-tracking (MPPT) power optimizer electronics to be directly embedded into the PV module and/or integrated on the solar cell backplane.

Assume a main/master cell or icell with S square-shaped or pseudo-square shaped pattern of isles (where S is an integer and assume S=N×N) or P triangular isles (where P is an integer, for example 2 or 4) with each adjacent set of P trench-isolated triangular isles forming a square-shaped sub-group of isles. Each adjacent set of P triangular isles forming a square-shaped sub-group may be connected in electrical parallel and the set of S sub-groups are connected in electrical series. The resulting main cell will have a maximum-power current of $I_{mp}/S$ and a maximum power voltage of $S \times V_{mp}$. In practice, the reduced current and increased voltage of the isles may also allow for a relatively inexpensive, high-efficiency, maximum-power-point-tracking (MPPT) power optimizer electronics to be directly embedded into the PV module and/or integrated on the solar cell backplane. Moreover, the innovative aspects of an icell also enable distributed shade management based on implementation of inexpensive bypass diodes (e.g., pn junction diodes or Schottky diodes) into the module, for instance, one bypass diode embedded with each solar cell prior to the final PV module lamination.

In a metallization embodiment, the M1 metallization layer may be a busbarless, fine-pitch (base-to-base pitch in the range of approximately about 200 μm to 2 mm, and more specifically in the range of about 500 μm to 1,500 μm) interdigitated Al and/or Al/Si metal finger pattern (formed by screen printing or PVD and post-PVD patterning) contained within each isle. For each isle, the M1 fingers may be slightly recessed from the partitioning trench isolation edges (for example recessed or offset from the isle trench isolation edges by approximately 50 μm to 100's μm). In other words, the M1 fingers for each isle in the master cell are electrically isolated and physically separated from each other (the M1 pattern corresponding to a particular isle may be referred to herein as an M1 unit cell).

The electrical interconnection configuration of the isles (all series, hybrid parallel-series, or all parallel) may be defined by the M2 pattern design wherein M1 serves as an on-cell contact metallization for all of the master cell isles and M2 provides high-conductivity metallization and electrical interconnection of the isles within the icell or master cell.

An M2 design (for example an M2 pattern using rectangular or tapered interdigitated M2 base and emitter fingers) may provide all-series, hybrid parallel-series, or all-parallel electrical interconnections of the isles in the icell. In some instances, as noted above, M2 designs which provide all-series or hybrid parallel-series electrical connections of the isles may be used to scale up the main/master cell voltage and scale down the main/master cell current (for instance, by a factor of S, S being the number of series connected isles or sub-groups of isles). Increasing cell voltage while decreasing cell current relaxes/decreases metallization conductivity requirements and allows for thinner metallization and lower metal sheet conductance, thus reducing or mitigating process costs, process complexity, fab equipment and facilities costs (e.g., because of elimination of the need for copper plating for cell metallization), cracks, reliability concerns, and overall yield loss associated with relatively thick metallization processing, such as relatively thick metallization formed using copper plating.

Moreover, the enhanced-voltage/reduced-current main/master solar cell or icell provides for the integration of a relatively inexpensive, high-performance, high-efficiency maximum-power-point-tracking (MPPT) power optimizer electronics embedded within each module and associated with each icell and/or each isle—thus providing enhanced power and energy harvest capability across a master cell having shaded, partially shaded, and unshaded isles. Similarly, each icell or even each isle within each icell may have its own inexpensive bypass diode (pn junction diode or Schottky barrier diode) in order to provide distributed shade management capability for enhanced solar cell protection and power harvest under shading and partial shading conditions. An all-parallel electrical connection of isles provided by an all-parallel M2 pattern, as compared to all-series or hybrid parallel-series connection, also provides some of the numerous advantages of a monolithically isled solar cell as described above, particularly the increased flexibility and bendability of the resulting icells and PV modules.

For example, in the case of using PVD aluminum for M2 (such as a sub-5 μm thick M2 layer providing all-series or hybrid parallel-series connections in an icell), a metal stack may be PVD Al (main metal) capped with a relatively thin layer of Ni or NiV (e.g., formed by plasma sputtering), optionally followed by Sn (e.g., formed by plasma sputtering) to provide M2 solderability. The aluminum layer may be deposited using an electron-beam or thermal evaporation process.

Assume there are S square-shaped isles connected in electrical series. Each "isle" to be connected in electrical series may comprise a subgroup of smaller isles, such as triangular isles, connected in electrical parallel. For an N×N array of square-shaped isles connected in series: $S=N\times N=N^2$.

Further, assume the M2 finger pattern is substantially orthogonal or perpendicular to the M1 pattern—this allows the number of M2 fingers to be substantially smaller than the number of M1 fingers (by about a factor of 5× to about 50×). For instance, a 156 mm×156 mm cell (without tiling or isles) with a base-to-base M1 metal pitch of 750 microns may have about 416 M1 fingers and approximately 8 to 40 M2 orthogonal fingers.

Similarly, a large factor reduction in the M1 to M2 finger ratio may apply to the M2 metal finger count for each isle sub-cell (the M2 pattern corresponding to a particular isle may be referred to herein as an M2 unit cell). For instance, for an S=3×3 isle master cell design, each isle may have about 140 M1 fingers (running over a distance of about 52 mm in each isle) and an M2 finger count of 12 (for example with the M2 base and emitter metal fingers having combined width or pitch of about 6.5 mm, much larger than the M1 pitch of about 750 microns). And, in some instances the M2 layer may provide a relatively large cell coverage ratio (close to 100%)—in one instance the deposited M2 layer (for example deposited by PVD) is patterned using pulsed nanoseconds laser ablation creating a finger-to-finger isolation gap less than approximately 100 μm thick.

Guidelines for M2 Thickness in a Dual Level Metallization Structure for a Given Metal—Aluminum or Copper.

Assume, for master cell area=$L\times L=L^2$, $I_{mp}$ is the master cell maximum-power-point (MPP) current (base or emitter current) extracted from the entire M1 layer under the STC conditions. At the maximum-power-point operation of the solar cell, the entire current extracted from cell contact metallization level M1 and flowing through conductive M2-M1 via plugs is $I_{mp}$ for base and $I_{mp}$ for emitter ($2I_{mp}$ without current direction consideration).

Also, assume $P_{mp}$ and $V_{mp}$ are the maximum-power-point (MPP) power and voltage of the cell, respectively. Then: $P_{mp}=V_{mp}\times I_{mp}$; the total electrical cell current per unit area extracted from M1 (including both base and emitter currents, irrespective of flow direction)=$2I_{mp}/L^2$, as half of the cell area produces $I_{mp}$ base current and half of the cell area produces $I_{mp}$ emitter current; and MPP power of each isle (or sub-cell) connected in series=$P_{mp}/S$, where S is the number of series-connected isles or sub-groups of isles (for example: $S=N\times N=N^2$).

Now, in a triangular M2 finger embodiment, assume $I_f$ is the current collected by each individual M2 triangular finger from the underlying M1 fingers for the triangular area covered by the M2 finger, then: $I_f=I_{mp}/(F\cdot S)$ where F is the number of pairs of M2 triangular fingers per isle; in a base or emitter triangular finger on a series-connected isle, the finger current as a function of x may be expressed as $I(x)$=Integral from 0 to x of $\{[2I_{mp}/L^2]\cdot[(x/H)\cdot h]\}\cdot dx$ where $H=L/N$ (for $S=N\times N$) and $h=H/F=L/(N\cdot F)$; thus, $I(x)$=Integral from 0 to x of $\{[2I_{mp}/L^2]\cdot[(x/F)]\}\cdot dx$=Integral from 0 to x of $\{[2I_{mp}/(FL^2)]\cdot x\cdot dx\}$; thus, $I(x)=[2I_{mp}/(FL^2)]\cdot(1/2)x^2=[I_{mp}/(FL^2)]\cdot x^2$; and the total current per finger may be expressed as $I_f=[I_{mp}/(FL^2)]\cdot H^2=[I_{mp}/(FL^2)]\cdot(L/N)^2=[I_{mp}/(FN^2)]=I_{mp}/(F\cdot S)$.

Further, assuming M2 resistivity ρ, thickness t, and M2 sheet resistance $R_s=\rho/t$, the power loss per M2 Finger per isle $P_{lf}$ (in other words power loss per M2 finger per M2 unit cell) may be expressed as: $P_{lf}$=Integral from 0 to H of $\{\{(\rho\cdot dx)/[(t\cdot x\cdot h)/H]\}\cdot[I_{mp}/(FL^2)]^2\cdot x^4\}$; thus, $P_{lf}=[(\rho\cdot H)/(t\cdot h)]\cdot[I_{mp}/(FL^2)]^2\cdot(1/4)\cdot H^4=[(\rho\cdot H)/(t\cdot h)]\cdot[I_{mp}/(FL^2)]^2\cdot(1/4)\cdot(L/N)^4$; and as $h=H/F$ and $H/h=F$, then $P_{lf}=(\rho\cdot F/t)\cdot[I_{mp}/(FL^2)]^2\cdot(1/4)\cdot(L/N)^4$; thus, power loss per finger $P_{lf}=(\rho/t)\cdot F\cdot I_{mp}^2\cdot(1/F^2L^4)\cdot(1/4)\cdot L^4\cdot(1/N^4)=(\rho/t)\cdot I_{mp}^2\cdot[1/(4\cdot F\cdot N^4)]$; as there are 2F fingers per isle, the total M2 power loss per isle ($P_{M2isle}$) at the MPP condition may be expressed as $P_{M2isle}=(\rho/t)\cdot I_{mp}^2\cdot[1/(4\cdot F\cdot N^4)]\cdot 2\cdot F=(\rho/t)\cdot I_{mp}^2\cdot[1/(2N^4)]$; as may be a total of $N\times N=N^2$ isles, total M2 power loss at MPP may be expressed as $P_{M2loss}=(\rho/t)\cdot I_{mp}^2\cdot[1/(2N^4)]\cdot N^2=(\rho/t)\cdot I_{mp}^2\cdot[1/(2N^2)]$; thus, $P_{M2loss}=(\rho/t)\cdot I_{mp}^2\cdot[1/(2N^2)]$.

Now, as an example assuming approximately 22.5% mean solar cell efficiency $P_{mp}=5.50$ Wp, and assume $V_{mp}=0.59$ V, $I_{mp}=9.3$. M2 metal layer thickness requirements for aluminum and copper—assuming a total maximum M2 allowable relative ohmic loss factor k of 0.01, 0.005, or 0.0025 (as a fraction of $P_{mp}$ for the cell), Power Loss Factor=$k=(P_{M2loss}/P_{mp})$, K (in allowable maximum M2 loss)=$(\rho/t)\cdot(I_{mp}^2/P_{mp})\cdot[1/(2\cdot N^2)]$—the required M2 metal thickness based on an allowable k at t may be expressed as $t=(\rho/k)\cdot(I_{mp}^2/P_{mp})\cdot[1/(2\cdot N^2)]$ where k is the maximum allowable loss as a fraction of $P_{mp}$.

Table 1 below tabulates the calculated required M2 thickness for copper or aluminum M2 metallization for various allowable loss factors (k) and various N value master cell embodiments having series-connected N×N array of isles ($S=N\times N$) with the N value between 1 (for example cell with a single isle—i.e., no partitioning trenches) up to 6 (for example for S=36 series connected isles) based on the expressions defined above and assuming the following: $\rho=1.68\mu\Omega\cdot$cm for copper metallization, $\rho=2.82$ $\mu\Omega\cdot$cm for aluminum metallization, $P_{mp}=5.5$ W, $I_{mp}=9.3$ A, and allowable loss factors k of 0.01, 0.005, or 0.0025.

TABLE 1

| N | t (um) for k = 0.01, Cu | t (um) for k = 0.005, Cu | t (um) for k = 0.0025, Cu | t (um) for k = 0.01, Al | t (um) for k = 0.005, Al | t (um) for k = 0.0025, Al |
|---|---|---|---|---|---|---|
| 1 | 13.21 | 26.42 | 52.84 | 22.17 | 44.35 | 88.69 |
| 2 | 3.30 | 6.60 | 13.21 | 5.54 | 11.09 | 22.17 |

TABLE 1-continued

| N | t (um) for k = 0.01, Cu | t (um) for k = 0.005, Cu | t (um) for k = 0.0025, Cu | t (um) for k = 0.01, Al | t (um) for k = 0.005, Al | t (um) for k = 0.0025, Al |
|---|---|---|---|---|---|---|
| 3 | 1.47 | 2.94 | 5.87 | 2.46 | 4.93 | 9.85 |
| 4 | 0.83 | 1.65 | 3.30 | 1.39 | 2.77 | 5.54 |
| 5 | 0.53 | 1.06 | 2.11 | 0.89 | 1.77 | 3.55 |
| 6 | 0.37 | 0.73 | 1.47 | 0.62 | 1.23 | 2.46 |

Thus, patterned M2 metal layer thickness (for instance, when formed using PVD such as evaporation or sputtering) may be limited to less than approximately 5 µm, and in some instances M2 PVD metal layer thickness limited to less than approximately 3 µm, providing numerous economical (for example, reduced PVD material cost and processing simplification) as well as fabrication advantages.

In some instances, electron-beam evaporation or thermal evaporation or DC Magnetron Plasma Sputtering (a Physical-Vapor Deposition or PVD process) may be used to deposit a high-quality M2 metal layer with near-bulk material resistivity (for example with metal resistivity close to the bulk resistivity values of 1.68µΩ·cm for copper or 2.82 µΩ·cm for aluminum) using high-throughput, in-line, evaporation and/or plasma sputtering tools commercially available for high-productivity solar PV applications. For example, an in-line evaporation and/or DC magnetron plasma sputtering (PVD) tool for aluminum M2 sputter deposition may have the following stations: (i) Argon plasma sputter etch to clean laser-drilled through-backplane vias, for low M2-M1 via plug contact resistance and for improved metal adhesion to the backplane; (ii) electron-beam evaporation or thermal evaporation or DC magnetron sputtering of pure aluminum, M2 layer thickness may be based on loss factor design rules, for instance, 3 to 5 microns of aluminum; (iii) DC magnetron sputtering of a thin, for example a layer thickness in the range of approximately 0.05 µm to 0.25 µm, of NiV or Ni capping layer; and (iv) DC magnetron sputtering of Sn, a Sn alloy, or alternative suitable solder material, with a layer thickness of approximately 0.5 µm to several µm.

Alternatively, an in-line DC magnetron plasma sputtering (PVD) tool for copper M2 sputter deposition may have the following stations: (i) Argon plasma sputter etch to clean M1 contact areas exposed through laser-drilled backplane via holes, for low M2-M1 via plug contact resistance and improved M2 adhesion to the backplane; (ii) DC magnetron sputtering of a thin, for example a layer thickness in the range approximately 0.05 µm to 0.25 µm, of NiV or Ni as a diffusion barrier and adhesion layer; (iii) DC magnetron sputtering of pure copper, copper thickness may be based on loss factor design rules; and (iv) DC magnetron sputtering of Sn, a Sn alloy, or alternative suitable solder material, with a layer thickness of approximately 0.5 µm to several µm.

In some embodiments, N may be chosen in order to meet particular design criteria for a given desired loss factor k and corresponding maximum allowable M2 thickness value. And by keeping the M2 copper or aluminum thickness less than about 5 µm, M2 may be easily patterned using pulsed laser ablation.

And while DC magnetron plasma sputtering of aluminum or copper, as well as any applicable barrier and/or capping layers, followed by laser ablation patterning may be used to form the M2 metal layer, alternative M2 metal layer formation methods include, but are not limited to: PVD aluminum or copper (as well as any applicable barrier and/or capping layers) followed by wet patterning (screen print mask, wet etch metal/strip mask); screen print high-conductivity, low-temperature-cure metal paste such as high-conductivity silver paste, copper paste, aluminum paste, etc.

Using aluminum as compared to copper for M2 may allow the cell fabrication line and the resulting cell to be free of copper and in some instances cell fabrication using all dry processing. Thus, improving risk mitigation in cell fabrication (due to inherent complications involved in copper processing such as with copper plating) and for the cell modules in the field as the long-term reliability concerns of copper contamination and lifetime degradation are eliminated. Moreover, the M2-M1 contact (the metallization in the via holes, or via plugs) may be an aluminum-to-aluminum contact thus eliminating the need for a diffusion barrier layer between M2 and M1. Further, an M2 Sn/NiV/Al stack or another suitable metal stack comprising aluminum as the main M2 conductor metal may allow for pulsed laser ablation patterning, thus providing all-dry cell backend metallization process and increasing cell yield.

In some embodiments, a monolithic isled master cell or icell may integrate a monolithically-integrated bypass switch (MIBS) with each icell and/or with each isle in the icell to provide high-performance lightweight, thin-format, flexible, high-efficiency (e.g., greater than 20%) solar modules with distributed shade management—for example a pn junction diode, such as a rim pn junction diode, formed around the periphery of each isle. Alternatively, the MIBS device may be a metal-contact Schottky diode, such as a rim Schottky diode formed around the periphery of each isle made of, for example, an aluminum or aluminum-silicon alloy Schottky contact on n-type silicon. The pn junction MIBS diode pattern may be one of many possible pattern designs. For instance, in one MIBS diode pattern the rim diode p+ emitter region is a continuous closed-loop band sandwiched between (or surrounded by) the n-type base regions.

While standard rigid glass modules (for instance, using copper-plated cells and discrete shade management components) may be used to reduce module manufacturing costs for isled solar cells (icells), further weight and cost reductions may be achieved by incorporating MIBS, eliminating copper plating and the discrete bypass diode components. MIBS integration benefits for a monolithic isled master cell include materials cost reductions combined with substantial manufacturing risk mitigation and higher manufacturing yield due to process simplification (no plating, much reduced cracks) and enhanced overall projected reliability (for example by eliminating the discrete components from cells). Thus, a monolithic isled MIBS integrated master cell module may reduce the weight, reduce the volume/size (and thickness), and increase power density (W/kg) of the module by significant factors—further reducing installed system Balance of System (BOS) costs.

A monolithic isled MIBS integrated master cell module may provide some or all of the following advantages: distributed MIBS shade management without external components; a relatively small average module weight per unit area, for instance, on the order of approximately 1.2 kg/m$^2$ (~0.25 lb/ft$^2$), which may be at least 10× lighter than the standard rigid c-Si modules; module power density of approximately 155 W/kg (~70 W/lb), which is at least 10× higher than the standard rigid c-Si modules; high-efficiency (greater than 20%) lightweight flexible modules for various applications; module shipping weight and volume (per MW shipped) reductions by approximately 10× and 40×, respectively; reduced overall BOS cost, enabling a lower installed PV system cost compared to installed PV system costs using standard rigid c-Si modules; and reduced BOS and miscellaneous costs relating to shipping and handling, labor, mounting hardware, and wiring costs.

MIBS formation may be integrated and performed concurrent with partitioning trench isolation formation processing. If a rim diode design is utilized, the monolithically integrated bypass switch (MIBS) rim may also provide the additional benefit of mitigating or eliminating the generation and/or propagation of micro-cracks in the solar cell during and/or after fabrication of the solar cells.

A full-periphery through-silicon partitioning trench separating and isolating the rim bypass diode from the isles may have, for example, an isolation width in the range of a few microns up to about 100 microns depending on the laser beam diameter (or capability of the trenching process if using a process other than laser trenching) and semiconductor layer thickness. A typical trench isolation width formed by pulsed nanoseconds (ns) laser scribing may be around 20 to 50 microns although the trench isolation width may be smaller. While pulsed laser ablation or scribing is an effective and proven method to form the trench isolation regions, it should be noted that other non-mechanical and mechanical scribing techniques may also be used instead of laser scribing to form the trench isolation regions for all trench formation processing. Alternative non-laser methods include plasma scribing, ultrasonic or acoustic drilling/scribing, water jet drilling/scribing, or other mechanical scribing methods.

FIG. 16A is a schematic diagram showing a sunnyside view of isled master cell with a plurality of isles (example shows 4×4 isles) and monolithically-integrated bypass switch or MIBS devices integrated with the isles. This is an embodiment of MIBS using full-periphery bypass diodes isolated from the solar cells using full-periphery isolation trenches for an icell sharing a continuous backplane.

FIG. 16A is a schematic diagram showing a sunnyside plan view of isled MIBS (Monolithically Integrated Bypass Switch) master cell 270 (icell embodiment shown with 4×4 array of square-shaped isles) with a plurality of full-periphery closed loop MIBS bypass diodes, for example MIBS bypass diode 272 electrically isolated from isle $I_{11}$ by isle partitioning isolation trench 274. Each isle ($I_{11}$ through $I_{44}$) is isolated by full-periphery partitioning trenches (either formed by laser ablation/scribing or scribed by another suitable technique as described above), such as cell isolation trenches 276, to form an icell with a 4×4 array of isles (a solar cell comprising a plurality of mini-cells or isles) sharing a shared continuous backplane and formed from a common originally continuous and subsequently partitioned solar cell semiconductor substrate.

FIG. 16A shows the sunnyside view of the MIBS-enabled solar cell (icell) with mini-cells or isles and full-periphery closed-loop rim diodes (either pn junction diodes or Schottky barrier diodes). Each mini-cell isle $I_{11}$ through $I_{44}$ has a corresponding full periphery isolation trench (276) and full-periphery MIBS rim diode (such as MIBS bypass diode 272 and periphery isolation trench 274 for cell $I_{11}$)—thus each mini cell or isle has a corresponding MIBS rim diode, or in other words there is one MIBS rim diode per isle or mini cell.

The isles or mini-cells may be electrically connected in series through the cell metallization pattern design although other connections such as parallel or a hybrid combination of series and parallel are also possible.

As a representative example, FIG. 16A shows a 4×4 array of equally sized and shaped mini-cells and each mini-cell having a corresponding full-periphery closed-loop rim diode. In general, this architecture may use N×N array of mini-cells and corresponding full-periphery closed-loop rim diodes with N being an integer equal to or greater than two to form mini-cell array. And while FIG. 16A shows a symmetrical N×N mini-cell array for a full-square-shaped solar cell, the mini-cell or isle array design may have an asymmetrical array of N×M mini-cells. The mini-cells or isles may be square-shaped (when N=M for a square-shaped master cell) or rectangular (when N is not equal to M and/or the master cell is rectangular instead of square shaped), or various other geometrical shapes.

Further, the mini-cells of a master cell (again, a master cell refers to an array of mini-cells or isles sharing a common continuous backplane and all originating from the same original solar cell semiconductor substrate subsequently partitioned into the plurality of mini-cell or isle regions by partitioning trenches) may optionally have substantially equal areas although this is not required. The semiconductor layers for the array of isles or mini-cells are electrically isolated from each other using partitioning trench isolation formed by a suitable scribing technique such as laser scribing or plasma scribing. Moreover, each mini-cell or isle of semiconductor substrate is partitioned and isolated from its corresponding full-periphery closed-loop MIBS diode semiconductor substrate using trench isolation. All the trench isolation regions on the master cell may be formed during the same manufacturing process step, for example using a single laser-scribe process step during the cell fabrication process flow.

Figure 16B:
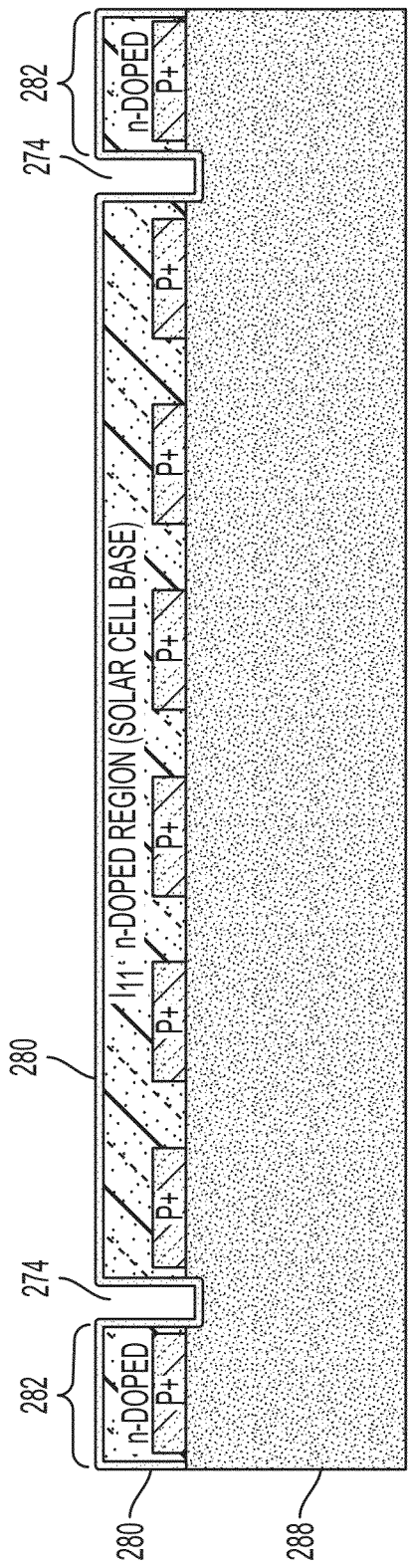
FIGS. 16B and 16C are cross-sectional diagrams detailing MIBS rim or full-periphery diode solar cell embodiments of the back-contact/back-junction solar cell for one isle (or unit cell such as $I_{11}$ in FIG. 16A)
Figure 16C:
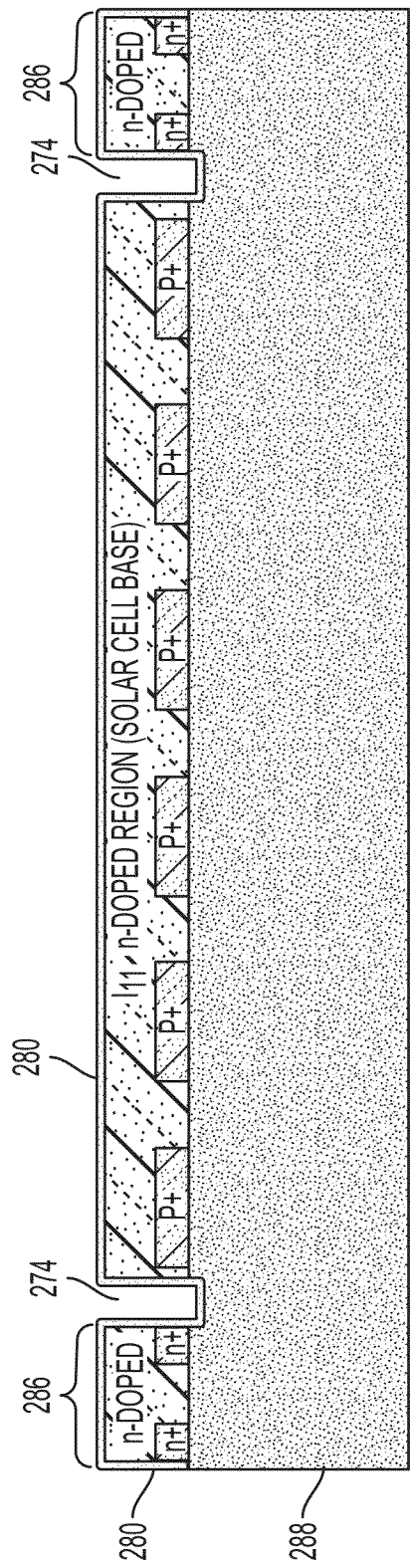

FIGS. 16B and 16C are cross-sectional diagrams detailing MIBS rim or full-periphery diode solar cell embodiments of the back-contact/back-junction solar cell for one isle (or unit cell such as $I_{11}$ in FIG. 16A) on a shared continuous backplane 288 after completion of manufacturing processes to form a MIBS-enabled back-contact/back-junction isled master cell such as that shown in FIG. 16A, including frontside passivation and ARC coating on the textured surface of the solar cell (and MIBS device) shown as passivation/ARC coating layer 280 in the solar cell in the MIBS device. The solar cell isle and MIBS structural details such as the patterned M1 and M2 metallization layers are not shown here. FIG. 16B shows a MIBS implementation using a pn junction peripheral rim diode bypass switch. Trench-isolated MIBS rim pn junction diode region 282 (isolated from isle $I_{11}$ by corresponding isolation trench 274) comprises an n-doped (e.g., phosphorus doped) region and a p+ doped (e.g., heavily boron doped) region and is used as a pn junction diode bypass switch. MIBS rim pn junction diode region 282 may be a full peripheral rim diode, for example with a width in the range of about 200 to 600 microns (smaller or larger dimensions are also possible as described earlier). The MIBS rim diode and solar cell relative dimensions are not shown to scale. In one fabrication embodiment, FIG. 16B shows a backplane-laminated (or backplane-attached) MIBS-enabled solar cell after completion of manufacturing processes for a MIBS-enabled back-contact/back-junction (IBC) solar cell comprising completion of back-contact/back-junction cell processing through patterned first-level metallization or M1 (for example made of screen printed or PVD aluminum or aluminum-silicon alloy or another suitable metal comprising nickel, etc.), backplane lamination, epitaxial silicon lift-off release and separation from a crystalline silicon reusable template (if using an epitaxial silicon lift-off process to form the substrate—this process not applicable when using a starting crystalline silicon wafer), formation of trench isolation regions (e.g., by pulsed laser scribing or cutting) to define the MIBS rim diode border, optional silicon etch, texture and post-texture clean, passivation and ARC deposition (e.g., by PECVD or a combination of ALD and PECVD), and fabrication of the final patterned second-level metal or M2 (along with the conductive via plugs) on the backplane.

As can be seen in FIG. 16B, the process used to form the p+ emitter regions (field emitter regions and/or heavily doped emitter contact regions) of the solar cell may also be used to form p+ junction doping for the MIBS pn junction formation. The patterned M1 metal (not shown), for example made of aluminum or an aluminum alloy such as aluminum with some silicon addition, not only provides the contact metallization or the first-level metallization for the solar cell but also creates metallization contacts (to both the p+ region and the n-type substrate region through n+ doped contact windows) for the MIBS pn junction diode. The n-doped silicon region of the MIBS pn junction diode is formed from the same n-type silicon substrate which also serves as the base region of the solar cell (e.g., from the n-type silicon wafer when using starting n-type crystalline silicon wafers without epitaxy, or from in-situ-doped n-type crystalline silicon layer formed by epitaxial deposition when using epitaxial silicon lift-off processing to form the solar cell and MIBS substrate)—the substrate bulk region doping may also be referred to as the background doping of the substrate. The patterned M1 and M2 metallization structures complete the required monolithic solar cell and MIBS pn junction diode electrical interconnections and also ensure the MIBS diode terminals are properly interconnected to the respective solar cell base and emitter terminals to provide cell-level integrated shade management and continual solar cell protection against shading. As can be seen in FIG. 16B, the sidewall edges and the top surface of the MIBS pn junction diode are also passivated using the same passivation layer(s) and processes used to passivate the sunny-side and edges of the solar cell, passivation/ARC coating layer(s) 280. FIG. 16B does not show some details of the solar cell and MIBS structure such as the patterned M1 and M2 metallization, rear side passivation layer, M1 contact holes, M1-M2 via holes through the backplane, and the n+ doped contact windows for n-type substrate M1 connections in the MIBS device structures.

FIG. 16C shows a MIBS implementation using a peripheral Schottky rim diode bypass switch. Isolated Schottky rim diode bypass switch region 286 (isolated from isle $I_{11}$ by corresponding isolation trench 274) comprises an n-doped region and an inner and outer n+ region and is used as a Schottky diode bypass switch. Schottky rim diode bypass switch region 286 may be a full peripheral rim diode with a width in the range of 200 to 600 microns (this dimension may be chosen to be larger or smaller than this range).

In one fabrication embodiment, FIG. 16C shows a backplane-laminated or backplane-attached MIBS-enabled solar cell after completion of manufacturing processes for the MIBS-enabled back-contact/back-junction isled master cell comprising completion of the back-contact/back-junction cell processing through a patterned first-level metallization or M1 (for example made of a suitable conductor which can serve as both an effective ohmic contact on heavily doped silicon as well as an effective Schottky barrier contact on lightly doped silicon, such as aluminum or aluminum-silicon alloy), backplane lamination, epitaxial silicon lift-off release and separation from a crystalline silicon reusable template when using an epitaxial lift off silicon substrate (this process not applicable or required when using starting crystalline silicon wafers instead of epitaxial lift off substrates), formation of the trench isolation (e.g., by pulsed laser scribing or cutting) to define MIBS rim Schottky diode border, optional silicon thinning etch, texture and post-texture clean, formation of passivation and ARC (e.g., by PECVD or a combination of PECVD with another process such as ALD), and fabrication of a final patterned second-level metal or M2 on the backplane (in conjunction with the conductive M1-M2 via plugs).

As can be seen in FIG. 16C, the n-type silicon substrate also used as the base region of the solar cell (for instance formed through in-situ-doped epitaxial deposition when using epitaxial lift off processing, or from a starting n-type crystalline silicon wafer when not using epitaxial lift off processing) is also used as the n-type silicon substrate region for the MIBS Schottky diode. The M1 metal (not shown), for example made of aluminum or a suitable aluminum alloy such as aluminum with some silicon addition, not only makes the M1 ohmic contact metallization for the solar cell (for both base region through n+ doped contact openings and emitter contact region through p+ doped contact openings of the solar cell), but also creates the metallization contacts for the MIBS Schottky diode (both the non-ohmic Schottky barrier contact on the lightly doped n-type silicon substrate region and the ohmic contact to n-type silicon through heavily doped n+ doped regions). The lightly doped n-type silicon substrate region of the MIBS diode is from the same n-type substrate used for the solar cell and serving as its base region (e.g., the n-type substrate may be formed by in-situ-doped n-type epitaxial silicon deposition when using epitaxial silicon lift-off processing, or from a starting n-type crystalline silicon wafer when not using epitaxial silicon lift off processing). The heavily doped n+ diffusion doping of the n-type silicon region for the MIBS Schottky diode ohmic contacts to the n-type silicon substrate may be formed at the same time and using the same process also used for producing the heavily doped n+ doped base contact regions for the solar cell (in preparation for the subsequent patterned M1 metallization). The combination of patterned M1 and M2 metallization structures complete the solar cell and MIBS Schottky diode electrical interconnections and ensure the MIBS diode terminals are properly connected to the solar cell terminals to provide cell-level integrated shade management and solar cell protection. As can be seen FIG. 16C, the sidewall edges and the top surface of the MIBS Schottky diode are also passivated using the same passivation and ARC layer(s) and process(es) used to form the passivation and ARC layer(s) on the sunny-side and edges of the solar cell—note passivation/ARC coating layer(s) 280. Again, FIG. 16C does not show some structural details of the solar cell structure, including but not limited to the patterned M1 and M2 metallization layers.

The monolithically isled solar cells, and optionally MIBS embodiments, disclosed herein employ trench isolation in conjunction with a shared backplane substrate to establish partitioning and electrical isolation between the semiconductor substrate regions (isles) and also optionally for the MIBS device and adjacent isles or solar cell region. One method to create the trench isolation regions is pulsed (such as pulsed nanoseconds) laser scribing. Below is a summary of key considerations and laser attributes for using a laser scribing process to form the trench isolation regions which partition and electrically isolate substrate region(s).

Pulsed laser scribing for trench isolation formation may use a pulsed nanoseconds (ns) laser source at a suitable wavelength (e.g., green, or infrared or another suitable wavelength to ablate the semiconductor layer with relatively good selectivity to cut through the semiconductor substrate layer with respect to the backplane material) commonly used and proven for scribing and cutting through silicon. The laser source may have a flat-top (also known as top-hat) or a non-flat-top (e.g., Gaussian) laser beam profile. It is possible to use a pulsed laser source wavelength which is highly absorptive in silicon but can partially or fully transmit through the backplane (hence, cut through the semiconductor layer without substantially removing the backplane material after the through-semiconductor layer laser cutting is complete and the beam reaches the backplane sheet). For instance, a pulsed nanoseconds IR or green laser beam which may effectively cut through the silicon substrate layer and partially transmit through the backplane material (hence, removing little to negligible amount of backplane material during the trench isolation cut) may be used.

The pulsed laser beam diameter and other properties of the pulsed nanoseconds laser source may be chosen such that the isolation scribe width is in the range of a few microns up to 10's of microns as a width much larger than about 100 microns would be rather excessive and result in unnecessary waste of precious silicon substrate area and some reduction of the total-area efficiency of the solar cells and modules. Thus, it is beneficial to minimize the trench isolation areas as compared to the highly desirable solar cell area. In practice, pulsed nanoseconds laser cutting can produce trench isolation regions with width in the desirable range of about 20 microns up to about 60 microns. For instance, for a 156 mm×156 mm solar cell, a trench isolation width of 30 microns corresponds to an area ratio of 0.077% for the trench isolation area as a fraction of the cell area. This represents a rather negligible area compared to the solar cell area, in other words, this small ratio provides negligible waste of solar cell area and ensures negligible loss of total-area solar cell and module efficiency.

Pulsed nanoseconds (ns) laser scribing or cutting to form trench isolation may be performed immediately after the backplane lamination process when using starting crystalline silicon wafers to fabricate the solar cells (and in the case of solar cells using epitaxial silicon lift-off processing, after completion of the backplane lamination process and subsequent lift-off release of the laminated cell from the reusable template and after or before pulsed laser trimming of the solar cell) in a back-contact/back-junction solar cell fabrication process as described herein. In the case of solar cells fabricated using epitaxial silicon lift-off processing, the trench isolation scribing or cutting process may optionally use the same pulsed laser tool and source used for pre-release scribing of the epitaxial silicon layer to define the lift-off release boundary and/or used for post-release trimming of the laminated solar cell. Thus, no additional laser process tool may be needed in order to form the trench isolation regions.

Pulsed nanoseconds (ns) laser scribing to form trench isolation may also be used to partition the isles and define the fully isolated MIBS rim diode region outside an isolated solar cell island surrounded by and defined by the rim. Alternatively, the pulsed ns laser scribing process may form other designs of the MIBS diode, such as in a multiple MIBS diode island design as well as many other possible MIBS pattern designs.

Pulsed laser scribing may be used to cut through the thin (such as sub-200 microns and more particularly sub-100 microns) silicon substrate layer (from the sunny side) and substantially stop on the backplane material sheet. If desired and/or required, a simple real-time in-situ laser scribe process end-pointing, such as using reflectance monitoring, may be used for process control and endpointing to minimize trenching or material removal in the backplane sheet while enabling complete through-semiconductor-layer laser cut.

The sidewalls of the solar cell and the MIBS rim diode regions may be subsequently wet etched (for instance, as part of the solar cell sunny-side wet etch/texture process), post-texture cleaned, and passivated (by deposition of the passivation and ARC layer) during the remaining solar cell fabrication process steps.

The MIBS diode may be a pn junction diode used as the MIBS bypass device or shade management switch. A pn junction MIBS diode fabrication process to produce a MIBS-enabled solar cell of may have the following, among others, attributes and benefits:

In some solar cell processing designs, there may be essentially no change (or minimal change) to the main solar cell fabrication process flow to implement MIBS (for example a back-junction/back-contact crystalline silicon solar cell fabrication using either crystalline silicon starting wafers or epitaxial silicon and porous silicon/lift-off processing in conjunction with a reusable crystalline silicon template, and an electrically insulating backplane). Thus, there may be essentially no added processing cost to implement MIBS along with the solar cells (icells) disclosed herein.

In a back-contact/back-junction epitaxial silicon lift-off cell process, following the completion of the on-template cell processing involving most of the back-contact, back junction cell process steps, the following processes may be performed (provided as an example of various possible process flows): (i) backplane lamination to the solar cell backside; (ii) pre-release trench scribe (for example using a pulsed nanoseconds laser scribe tool or alternatively using another scribing tool such as plasma scribe) of the thin epitaxial silicon substrate to define the epitaxial silicon lift-off release boundary; (iii) mechanical lift-off release of the backplane-supported cell and its detachment from the reusable crystalline silicon template; (iv) laser trim (for example using a pulsed nanoseconds laser source) of the backplane-laminated cell for precision trim and to establish the final desired dimensions for the solar cell in conjunction with its associated MIBS; (v) pulsed nanoseconds laser scribing (or plasma scribing or another suitable scribing technique) on the sunny-side of the solar cell to form the trench isolation region(s) and to define the inner solar cell island(s) and the peripheral rim diode(s) regions, this step providing the isles and corresponding MIBS regions; (vi) and, subsequent cell processing such as sunny-side texture and post-texture clean followed by additional cell process steps such as PECVD sunny-side passivation and anti-reflection coating (ARC) layer deposition and final cell metallization including patterned second level metallization if applicable. When using a starting crystalline silicon wafer instead of epitaxial silicon lift-off processing, the process flow is fairly similar to the flow described above, except that there is no reusable template, porous silicon, epitaxial silicon, or release process. In the process flow described above for the solar cells made using epitaxial silicon lift-off processing, the trench isolation scribing process and tool may be essentially the same as the process and tool used for pre-release trench scribe and/or the post-release precision trim of the backplane-laminated solar cell and MIBS substrate.

The laser scribed trench isolation process may be performed (for example using a pulsed nanoseconds laser source) to create complete through-semiconductor trench(es) within the semiconductor layer through the entire thickness of the crystalline silicon layer and substantially stopping at the backplane—thus forming the electrically isolated n-type silicon rim region for the MIBS diode and the n-type silicon island region for the solar cell assuming an n-type base and p+ emitter solar cell (a common doping type for a back-contact/back-junction IBC solar cell).

In an all-series-connected cell, an M2 cell metallization design which results in sufficiently low or negligible ohmic losses should be used due to the current flow on lateral M2 connectors between the adjacent series-connected columns. Lateral M2 jumpers or connectors (which may be formed in conjunction with the patterned M2 layer) are used to interconnect the adjacent columns of an icell in electrical series.

Figure 17:
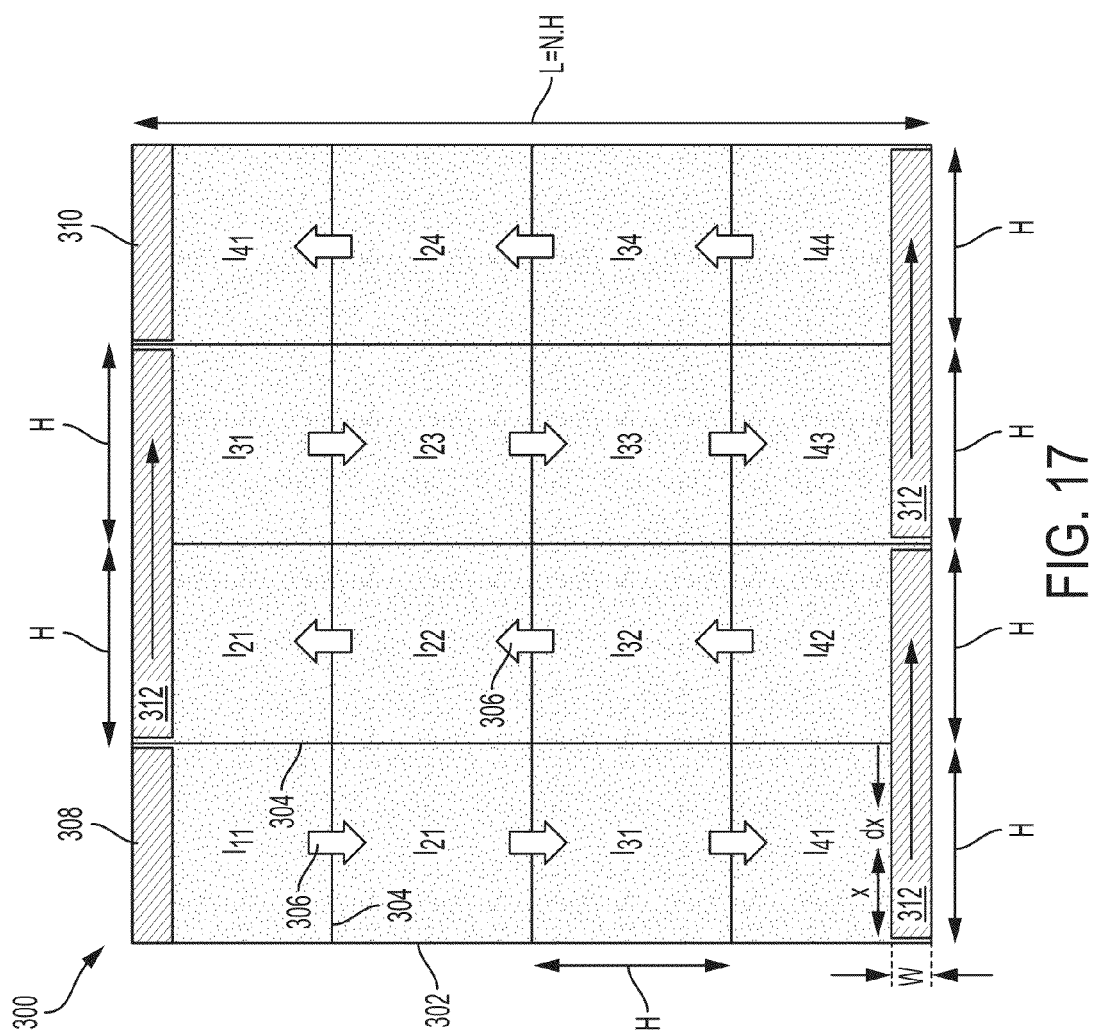
FIG. 17 is a schematic diagram showing an all-series electrically connected icell.

As shown in FIG. 17, all-series-connected icell or master cell 300 has an N×N array (N rows and N columns, shown as 4×4 in this representative example) of electrical series-connected isles $I_{11}$ through $I_{44}$ (isles defined by outer cell boundary 302 and electrical isolation trenches 304) from emitter busbar 308 to base busbar 310, each isle in a column electrically connected by M2 series connections 306 (simply shown as arrows) and each column in series electrically connected by lateral M2 jumpers 312. Master cell 300 has N columns (in this embodiment N=4) and N−1 lateral M2 jumpers 312 (N−1=3) each with a length of 2H and width of W. A lateral M2 jumper half-segment has a length of H (with H being the side dimension of each square-shaped isle) and width of W. M2 metallization pattern is not shown in FIG. 17; however, an M2 unit cell such as that shown in FIG. 13 may correspond to each isle ($I_{11}$ through $I_{44}$).

Assuming an M2 metal layer thickness of t and a resistivity of $\rho$ (or a sheet resistance of $\rho/t$). And assuming the master square cell has a side dimension of L=N·H, an area of $L^2$, a maximum power of $P_{mp}$, and a non-isled (non-tiled) maximum-power-point (MPP) current of $I_{mp}$ (in other words the MPP for a single isle cell—for an isled master cell with all-series-connected isles, the MPP current is scaled down by $N^2$). And assuming for an isled master cell having N×N series-connected isles, assume $P_s$ is the ohmic power loss per half-segment of a lateral M2 jumper, and Pi is the total ohmic power loss for all the lateral M2 jumper segments, thus $P_T$=2(N−1)·$P_s$. The inter-columnar current flow ohmic losses in an all-series connected N×N master cell may be calculated as follows: $P_s$=Integral from 0 to H of {[($\rho$·dx)·(W·t)]·[($I_{mp}/N^2$)·(x/H)]$^2$}; thus $P_s$=[$\rho$/(W·t)]·[$I_{mp}/(N^2·H)$]$^2$·{Integral from 0 to H of [$x^2$·dx]}; thus $P_s$=[$\rho$/(W·t)]·[$I_{mp}/(N_2·H)$]$^2$·($H^3$/3)=(1/3)·[($\rho$·H)/(W·t)]·($I_{mp}/N^2$)$^2$; since $P_T$=2(N−1)·$P_s$ then $P_T$=[2(N−1)/3]·[($\rho$·H)/(W·t)]·($I_{mp}/N^2$)$^2$ and since H=L/N then $P_T$=[2(N−1)/3]·[($\rho$·L)/(N·W·t)]·($I_{mp}/N^2$)$^2$; thus $P_T$=[2(N−1)/(3·$N^5$)]·[($\rho$·L)/(W·t)]·$I_{mp}^2$. The total lateral M2 jumper power loss factor (ratio) is defined as $k_j$=$P_T/P_{mp}$.

Now, assuming a solar cell having approximately 22.5% mean cell efficiency and $P_{mp}$=5.50 Wp and assuming $V_{mp}$=0.59 V, $I_{mp}$=9.3 A, M2 metal thickness requirements for aluminum and copper may be calculated as describe herein assuming an allowable maximum total lateral M2 jumper power loss factor (ratio) of 0.01, 0.005, or 0.0025 (as a fraction of $P_{mp}$ for the cell). Power Loss Factor=$k_j$=($P_T/P_{mp}$) and $K_j$ (in allowable maximum M2 loss)=[2(N−1)/(3·$N^5$)]·[($\rho$·L)/(W·t)]·($I_{mp}^2/P_{mp}$).

Thus, required lateral M2 jumper width W and/or the M2 metal thickness t based on an allowable $k_j$ may be expressed as W·t=[2(N−1)/(3·$N^5$)]·($\rho$·L)·($I_{mp}^2/P_{mp}$)/$k_j$ where $k_j$ is the maximum allowable total lateral M2 jumper ohmic loss as a fraction of $P_{mp}$.

Tables 2 through 7 below show calculated M2 lateral jumper W·t and W values for aluminum with bulk resistivity of $\rho$=2.82μΩ·cm (Tables 2 through 4) and copper with bulk resistivity of $\rho$=1.68μΩ·cm (Tables 5 through 7) for various allowable loss factors ($k_j$) and the N value between 3 and 5, and L=156 mm.

TABLE 2

Calculated W · t Values (in $cm^2$) With Aluminum M2 Metallization.

| N and $k_j$ Values | N = 3 | N = 4 | N = 5 |
|---|---|---|---|
| $k_j$ = 0.0025 | 1.52E−03 $cm^2$ | 5.40E−04 $cm^2$ | 2.36E−04 $cm^2$ |
| $k_j$ = 0.0050 | 7.59E−04 $cm^2$ | 2.70E−04 $cm^2$ | 1.18E−04 $cm^2$ |
| $k_j$ = 0.0100 | 3.80E−04 $cm^2$ | 1.35E−04 $cm^2$ | 5.90E−05 $cm^2$ |

TABLE 3

Calculated W Values (in cm) With Aluminum M2 Metallization and t = 3 μm Al.

| N and $k_j$ Values | N = 3 | N = 4 | N = 5 |
|---|---|---|---|
| $k_j$ = 0.0025 | 5.061 cm | 1.802 cm | 0.787 cm |
| $k_j$ = 0.0050 | 2.531 cm | 0.901 cm | 0.394 cm |
| $k_j$ = 0.0100 | 1.265 cm | 0.450 cm | 0.197 cm |

TABLE 4

Calculated W Values (in cm) With Aluminum M2 Metallization and t = 5 μm Al.

| N and $k_j$ Values | N = 3 | N = 4 | N = 5 |
|---|---|---|---|
| $k_j$ = 0.0025 | 3.037 cm | 1.081 cm | 0.472 cm |
| $k_j$ = 0.0050 | 1.518 cm | 0.540 cm | 0.236 cm |
| $k_j$ = 0.0100 | 0.759 cm | 0.270 cm | 0.118 cm |

TABLE 5

Calculated W · t Values (in $cm^2$) With Copper M2 Metallization.

| N and $k_j$ Values | N = 3 | N = 4 | N = 5 |
|---|---|---|---|
| $k_j$ = 0.0025 | 9.05E−04 $cm^2$ | 3.22E−04 $cm^2$ | 1.41E−04 $cm^2$ |
| $k_j$ = 0.0050 | 4.52E−04 $cm^2$ | 1.61E−04 $cm^2$ | 7.03E−05 $cm^2$ |
| $k_j$ = 0.0100 | 2.26E−04 $cm^2$ | 8.05E−05 $cm^2$ | 3.52E−05 $cm^2$ |

TABLE 6

Calculated W Values (in cm) With Copper M2 Metallization and t = 3 μm Cu.

| N and $k_j$ Values | N = 3 | N = 4 | N = 5 |
|---|---|---|---|
| $k_j$ = 0.0025 | 3.015 cm | 1.073 cm | 0.469 cm |
| $k_j$ = 0.0050 | 1.508 cm | 0.537 cm | 0.234 cm |
| $k_j$ = 0.0100 | 0.754 cm | 0.268 cm | 0.117 cm |

TABLE 7

Calculated W Values (in cm) With Copper M2 Metallization and t = 5 μm Cu.

| N and $k_j$ Values | N = 3 | N = 4 | N = 5 |
|---|---|---|---|
| $k_j$ = 0.0025 | 1.809 cm | 0.644 cm | 0.281 cm |
| $k_j$ = 0.0050 | 0.905 cm | 0.322 cm | 0.141 cm |
| $k_j$ = 0.0100 | 0.452 cm | 0.161 cm | 0.070 cm |

Based on the exemplary calculations above, the following regarding ohmic losses of M2 lateral jumpers between adjacent isle columns may be concluded:

Practical and optimum M2 designs with sufficient lateral M2 jumper width can be provided in order to limit the total lateral M2 jumper ohmic power loss to less than about 1% (or as low as less than 0.5%) relative, without a need for soldering external copper ribbon tabs on the lateral M2 jumpers between the isle columns;

For a given M2 metal thickness, the total lateral M2 jumper ohmic power loss is reduced for higher values of N and/or lower resistivity metal;

For either aluminum or copper M2 metallization in an isled cell design with N=4, the M2 jumper width may be limited to less than 1 cm for M2 metal thickness of either 3 µm or 5 µm (or any width approximately in this range) while maintaining the maximum total lateral M2 jumper power loss to no more than about 0.50% relative ohmic losses—corresponding to approximately 0.1% absolute cell efficiency loss due to the M2 jumpers; and The ability to limit the maximum lateral M2 jumper ohmic losses to well below 1% relative while using an M2 metal (aluminum or copper) thickness of no more than 5 µm, or 3 µm, with lateral jumper width of less than 1 cm provides for the formation of high-performance, low-loss M2 metallization without a need for externally soldered copper ribbon tabs on the lateral M2 jumpers. Thus, enabling the production of low-cost, reliable isled cells without a need for an excessively large value of N. In other words N=4 is sufficient (in an N×N=4×4 icell design) and in some instances N=5 may be more advantageous since it provides even lower losses.

As noted, isles (designed in any shape) may be electrically connected in an all-series, an all-parallel, or a hybrid series-parallel M2 interconnection design. The M2 interconnection pattern should maintain the benefits of substantially reduced $R \cdot I^2$ ohmic losses in the cell, module, and system due to the scaled up the voltage and scaled down the current of the master cell.

The following exemplary embodiments are provided to illustrate high cell efficiency (for example approximately 22% cell efficiency) interconnection designs for an evaporated aluminum M2 pattern having a layer thickness of less than approximately 5 µm compatible with both full-square and pseudo-square substrate formats. Specifically, designs describing a master cell having a 4×4 array of monolithic trench isolated isles having a hybrid parallel-series isle connection design and having an all-series isle connection design with a master cell voltage of approximately close to 5 V and a current of approximately close to 1 A are provided.

It is important to note that although the isle designs are described generally as square shaped, the isles may be formed in any geometric shape in accordance with the disclosed subject matter. And in most instances, it is desirable to eliminate area-related current mismatches between the series-connected isles—in other words, to design and pattern the array of isles symmetrically to maintain equivalent area between isles or subgroups of isles connected in parallel.

Further, the M2 interconnection designs disclosed herein provide relatively optimum-range current-voltage parametrics for integration of inexpensive, embedded, high-performance distributed MPPT power optimizer and/or shade management electronics components assuming a master cell maximum-power voltage ($V_{mp}$) in the range of approximately ~5 V to 10 V and a master cell maximum-power current ($I_{mp}$) in the range of approximately ~0.5 A to 1 A.

Additionally, the M2 interconnections provided herein are capable of supporting various installed PV arrays, such as 600 VDC and 1,000 VDC PV systems for maximum system-level efficiency in residential and commercial rooftop as well as ground-mount utility-scale applications.

The following parametric assumptions are provided for a master cell or icell having an efficiency of approximately 22% with a 4×4 array of isles connected in parallel (referred to herein as all-parallel): Cell Power=5.35 $W_p$ (assumes full-square 156 mm×156 mm master cell); $V_{oc}$=685 mV, and $V_{mp}$=575 mV, then $V_{mp}/V_{oc}$=0.84 or 84%; $I_{oc}$=9.90 A, and $I_{mp}$=9.30 A, then $V_{mp}/V_{oc}$=0.94 or 94%; and fill factor= $(V_{mp} \times I_{mp}/V_{oc} \times I_{oc})$=0.79 Or 79%.

In an all-series 4×4 master cell (assuming a full-square 156 mm×156 mm master cell) referred to herein as a 1×16S (1 by 16 Series) design, an example of which is shown in FIG. 18A, the following may be assumed: $V_{oc}$=685 mV×16=10.96 V and $I_{oc}$=9.90 A/16=0.619 A; $V_{mp}$=575 mV×16=9.20 V, and $I_{mp}$=9.30 A/16=0.581 A. Further, for a 60-cell module using the 1×16 all-series master cell design, module parametrics may be assumed to be: Module $V_{oc}$=10.96 V×60=657.6 V and Module $V_{mp}$=9.20V×60=552.0V; and $I_{oc}$=0.619 A, and $I_{mp}$=0.581 A.

In a hybrid parallel-series (HPS) 4×4 master cell with 8 series pairs of isles (assuming full-square 156 mm×156 mm master cell)—referred to herein as a 2×8HPS (2 by 8 Hybrid Parallel Series) design, an example of which is shown in FIG. 18B, the following may be assumed: $V_{oc}$=685 mV×8=5.48 V and $I_{oc}$=9.90 A/8=1.238 A; $V_{mp}$=575 mV×8=4.60 V, and $I_{mp}$=9.30 A/8=1.163 A. Further, for a 60-cell module using the 2×8 hybrid master cell design, module parametrics may be assumed to be: Module $V_{oc}$=5.48 V×60=328.8 V, and Module $V_{mp}$=4.60 V×60=276.0 V; and $I_{oc}$=1.238 A, and $I_{mp}$=1.163 A.

Figure 18C:
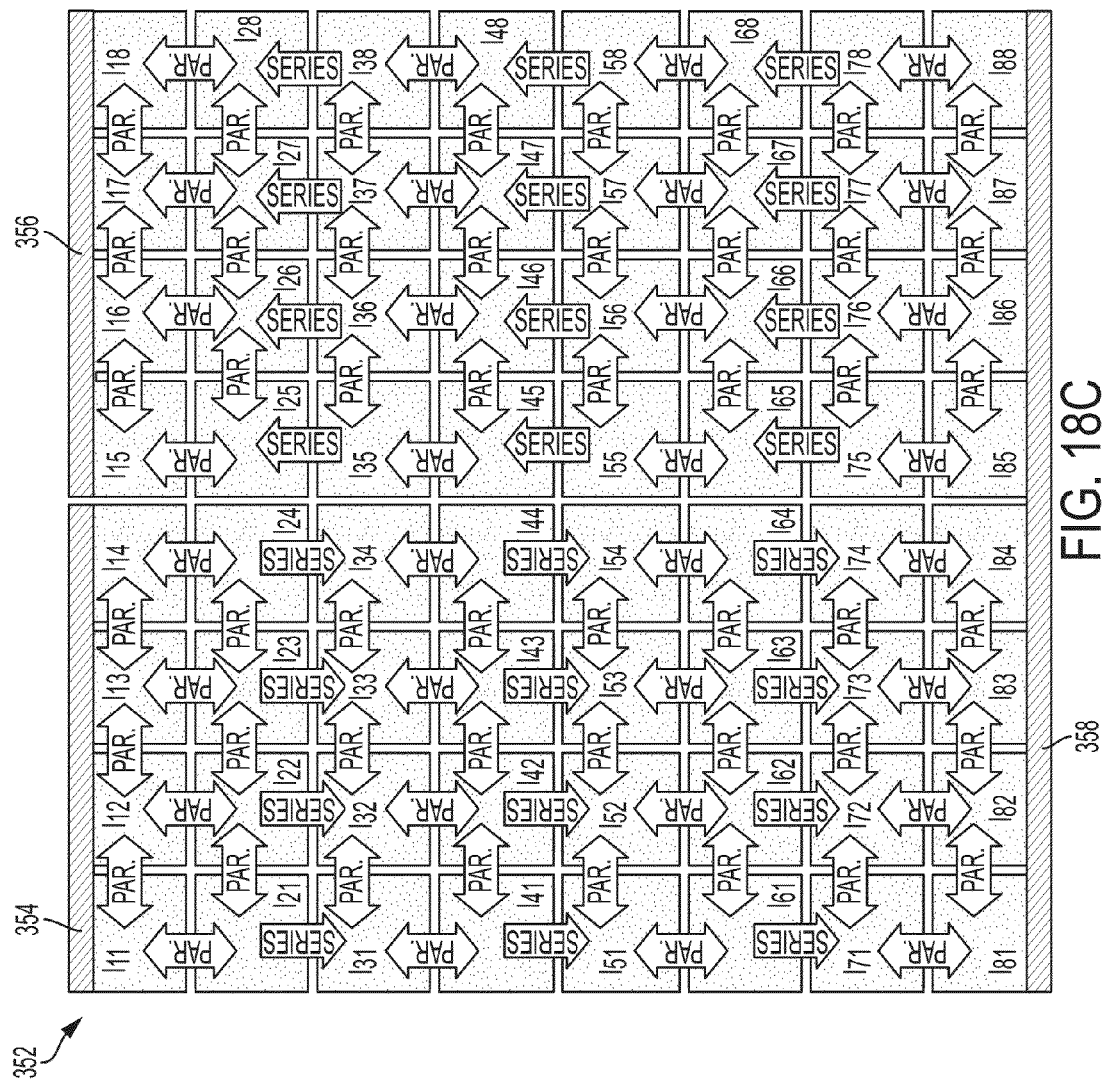
FIG. 18C is a schematic diagram showing an icell having a hybrid parallel-series electrically connected 8×8 array of isles (referred to as 8×8HPS design)

FIGS. 18A, 18B, and 18C are schematic diagrams for a full square master cell or icell showing an all-series (1×16) master cell configuration (4×4 array of isles) referred to herein as a 1×16S design (FIG. 18A), a hybrid parallel-series (2×8) master cell or icell configuration (4×4 array of isles) referred to herein as a 2×8HPS design (FIG. 18B), and a hybrid parallel-series (8×8) master cell or icell configuration (8×8 array of isles) referred to herein as a 8×8HPS design (FIG. 18C).

As shown in FIG. 18A, all-series master cell or icell configuration 1×16S 320 has an 4×4 array of electrical series-connected isles $I_{11}$ through $I_{44}$ from emitter busbar 322 to base busbar 324, each isle in a column electrically connected by M2 series connections 328 and each column in series electrically connected by lateral M2 jumpers 326.

As shown in FIG. 18B, hybrid parallel-series master cell configuration 2×8HPS 340 has a 4×4 array of electrical series and parallel connected isles $I_{11}$ through $I_{44}$ from emitter busbar 342 to base busbar 344, adjacent isles in a column connected in parallel by M2 parallel connections 350 and each isle in a column electrically connected by M2 series connections 348 and combined parallel connected adjacent isles electrically connected in series by lateral M2 jumpers 346. In some applications, the 2×8HPS design of FIG. 18B may be particularly suitable for a master cell having a thin silicon absorber layer (for example having a thickness in the range of about a few microns up to 100 microns).

As shown in FIG. 18C, hybrid parallel-series master cell configuration 8×8HPS 352 has an 8×8 array of electrical series and parallel connected isles $I_{11}$ through $I_{88}$ from emitter busbar 354 to base busbar 356, adjacent isles in a column connected in parallel by M2 parallel connections and isles in a column electrically connected by M2 series connections and combined parallel connected adjacent isles electrically connected in series by lateral M2 jumper 358. In some applications, the 8×8HPS design of FIG. 18C may be particularly suitable for a master cell having a somewhat thicker silicon absorber layer (for example having a silicon thickness in the range of about 50 to 150 microns). This is due to the fact that this 8×8HPS design provides a higher degree of flexibility/bendability and hence can be suitable for a wide range of silicon thicknesses (even accommodating thicker silicon for flexible crack-free solar cells). The 2×8HPS solar cell of FIG. 18B and 8×8HPS solar cell of FIG. 18C provide the same current and voltage scaling factor of 8.

Figures 19A, 19B:
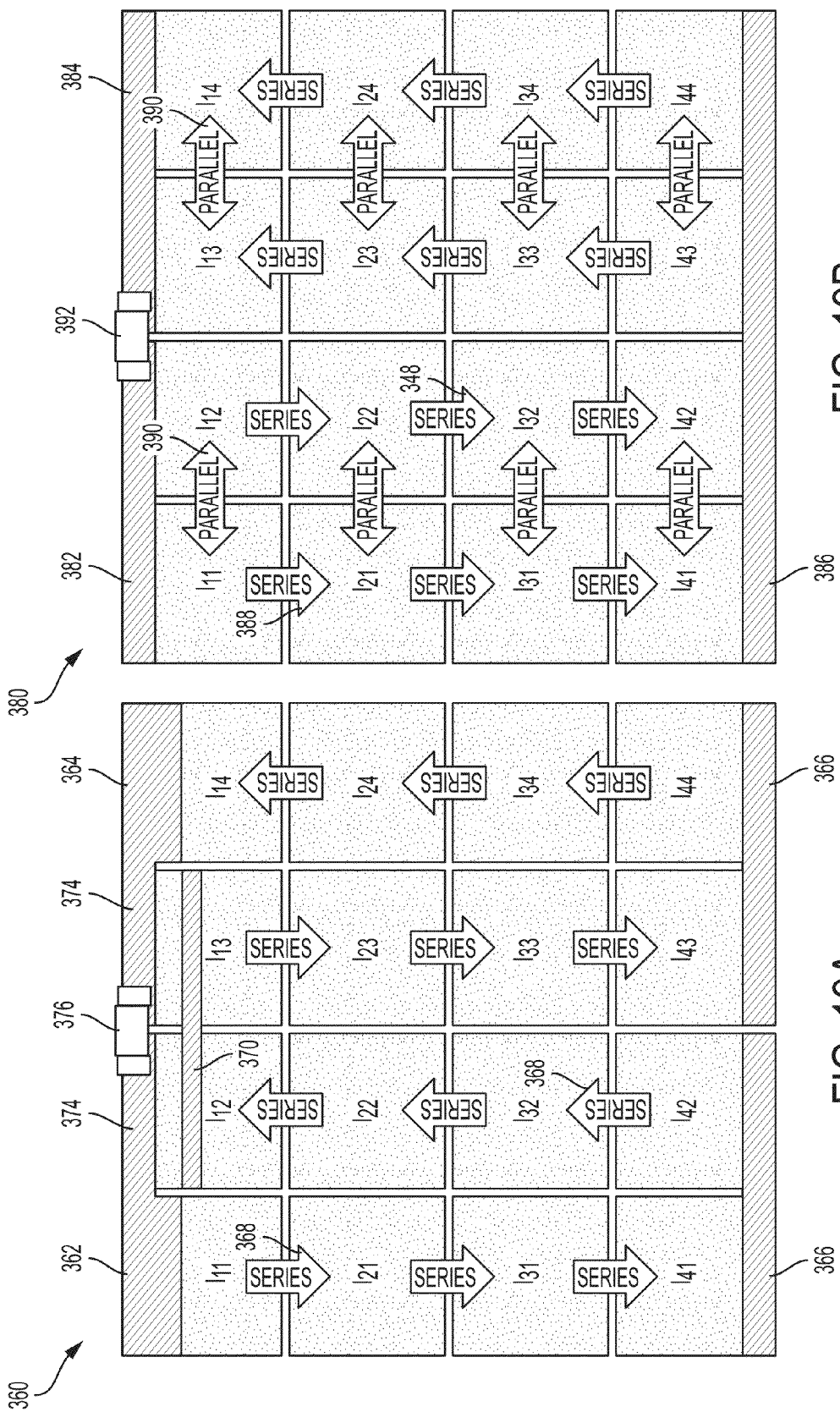
FIGS. 19A, 19B, and 19C show the position of a shade management switch on the icells of FIGS. 18A, 18B, and 18C, respectively.
Figure 19C:
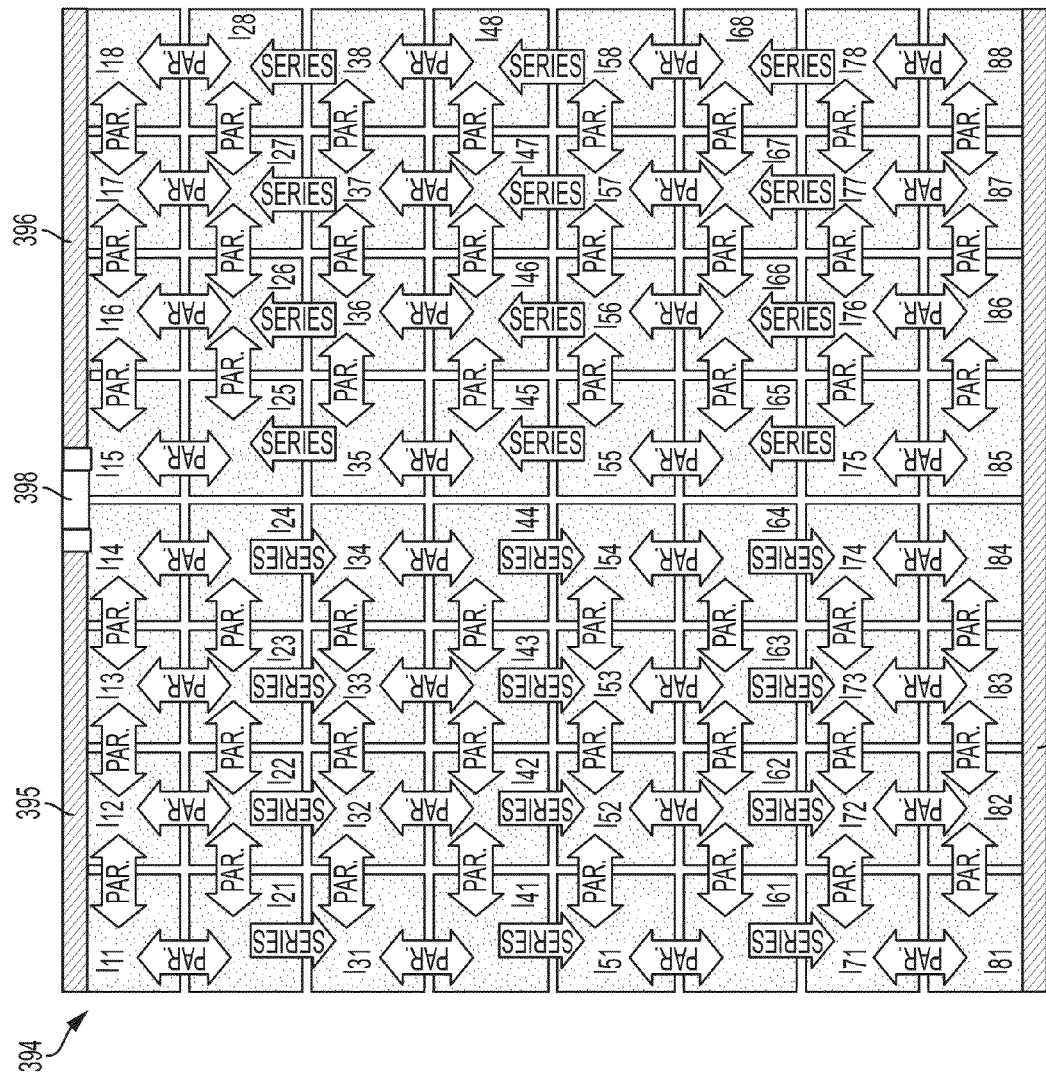

FIGS. 19A, 19B, and 19C are diagrams showing example placement/position of a relatively small shade management bypass switch (e.g., either a pn junction diode or a Schottky barrier diode) on the M2 interconnection designs of the master cells shown in FIGS. 18A, 18B, and 18C, respectively.

As shown in FIG. 19A, all-series master cell configuration 1×16S 360 has a 4×4 array of electrical series-connected isles $I_{11}$ through $I_{44}$ from emitter busbar 362 to base busbar 364, each isle in a column electrically connected by M2 series connections 368 and each column in series electrically connected by lateral M2 jumpers 366. Lateral M2 jumper 370 has been offset from the master cell peripheral edge for direct placement and connection of a relatively small-package bypass switch 376 to emitter busbar 362 and base busbar 364. Busbar extensions 374 connect emitter busbar 362 and base busbar 364 to bypass switch 376.

As shown in FIG. 19B, hybrid parallel-series master cell configuration 2×8HPS 380 has a 4×4 array of electrical series and parallel connected isles $I_{11}$ through $I_{44}$ from emitter busbar 382 to base busbar 384, adjacent isles in a column connected in parallel by M2 parallel connections 390 and each isle in a column electrically connected by M2 series connections 388 and combined parallel connected adjacent isles electrically connected in series by lateral M2 jumpers 386. Bypass switch 392 is positioned between and directly connected to emitter busbar 382 and base busbar 384.

As shown in FIG. 19C, hybrid parallel-series master cell configuration 8×8HPS 394 has an 8×8 array of electrical series and parallel connected isles $I_{11}$ through $I_{88}$ from emitter busbar 395 to base busbar 396, adjacent isles in a column connected in parallel by M2 parallel connections and isles in a column electrically connected by M2 series connections and combined parallel connected adjacent isles electrically connected in series by lateral M2 jumper 397. Bypass switch 398 is positioned between and directly connected to emitter busbar 395 and base busbar 396.

Figure 20:
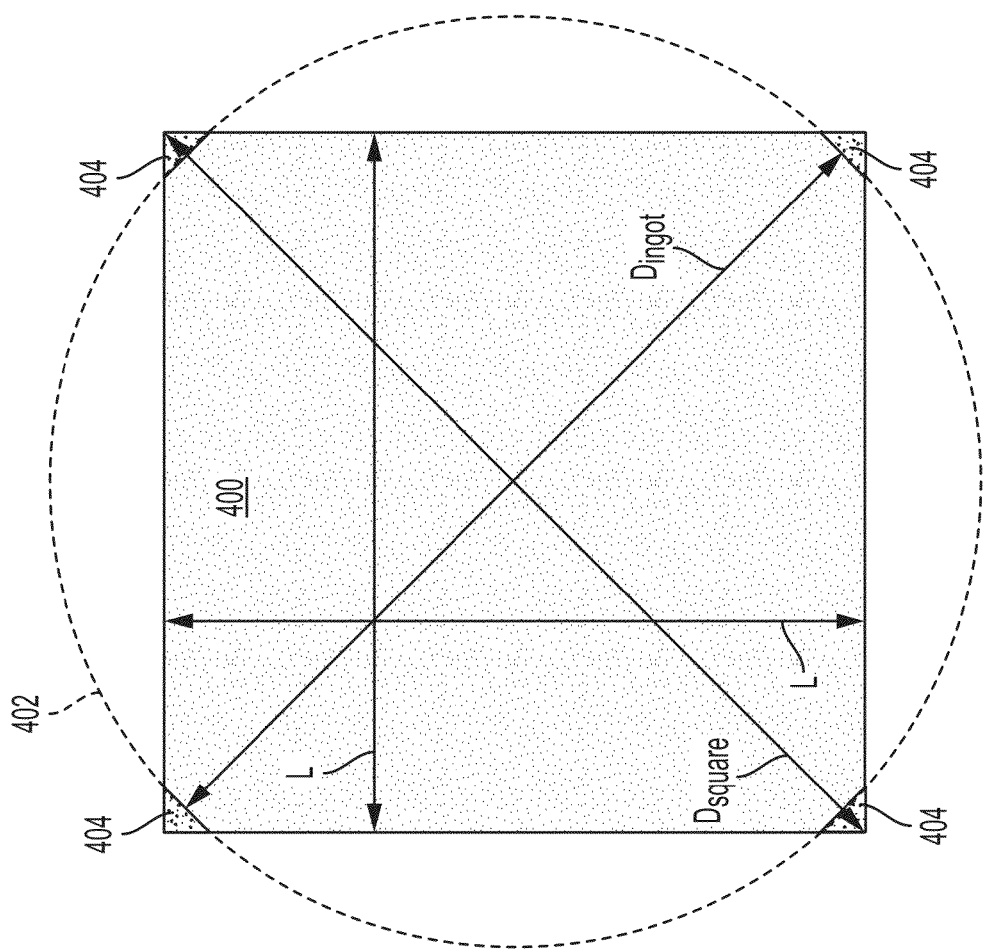
FIG. 20 is a top view diagram of a pseudo-square shaped master cell substrate.

In practice, monocrystalline semiconductor wafers (particularly CZ and FZ monocrystalline silicon wafers) are often fabricated from a cylindrical ingot and most often commercially available in a circular shape. To maximize semiconductor material usage and minimize waste, a master cell may be formed as a pseudo-square solar cell—as shown in FIG. 20. FIG. 20 is a schematic diagram showing a top view of a pseudo-square shaped master cell substrate fabricated from a cylindrical ingot (shown by cylindrical ingot periphery).

Thus, to maintain symmetry and equivalently sized (equal series-connected isle areas) series connected isles or subgroups of isles, isles within a pseudo-square shaped master cell may be individually designed in various shapes and configurations.

FIG. 20 is a diagram showing a top view of a pseudo-square shaped master cell substrate 400 fabricated from a cylindrical ingot (shown by cylindrical ingot periphery 402). Excluded corners 404 have area a' per corner and have been removed/excluded from the pseudo-square master cell substrate design in order to minimize the ingot waste while providing a nearly (but not full) square wafer for solar cell fabrication.

In practice and used as exemplary design dimensions herein, pseudo-square master cell substrate 400 may have dimensions of 156 mm by 156 mm (L=156 mm) with a diagonal dimension of 220 mm ($D_{square}$=220 mm) formed from a cylindrical ingot having a final polished ingot diameter of 200 mm ($D_{ingot}$=200 mm). Assuming the dimensions described above, a full-square substrate will have an area ($A_{sq}$)=$L^2$=156 mm×156 mm=243.36 $cm^2$. And a pseudo-square substrate will have an area ($A_{psq}$)=$A_{sq}$−4a' where a'≈($D_{square}$−$D_{ingot}$)$^2$/4, then a' (220 mm-200 mm)$^2$/4≈1 $cm^2$ and $A_{psq}$≈243.36−4×1 $cm^2$=239.36 $cm^2$. Thus when L=156 mm, standard pseudo-square wafers have a cell area of 239.36 $cm^2$ as compared to standard 156 mm×156 mm square wafers having cell area of 243.36 $cm^2$—resulting in approximately 1.64% less area (4/243.36).

Figure 21:
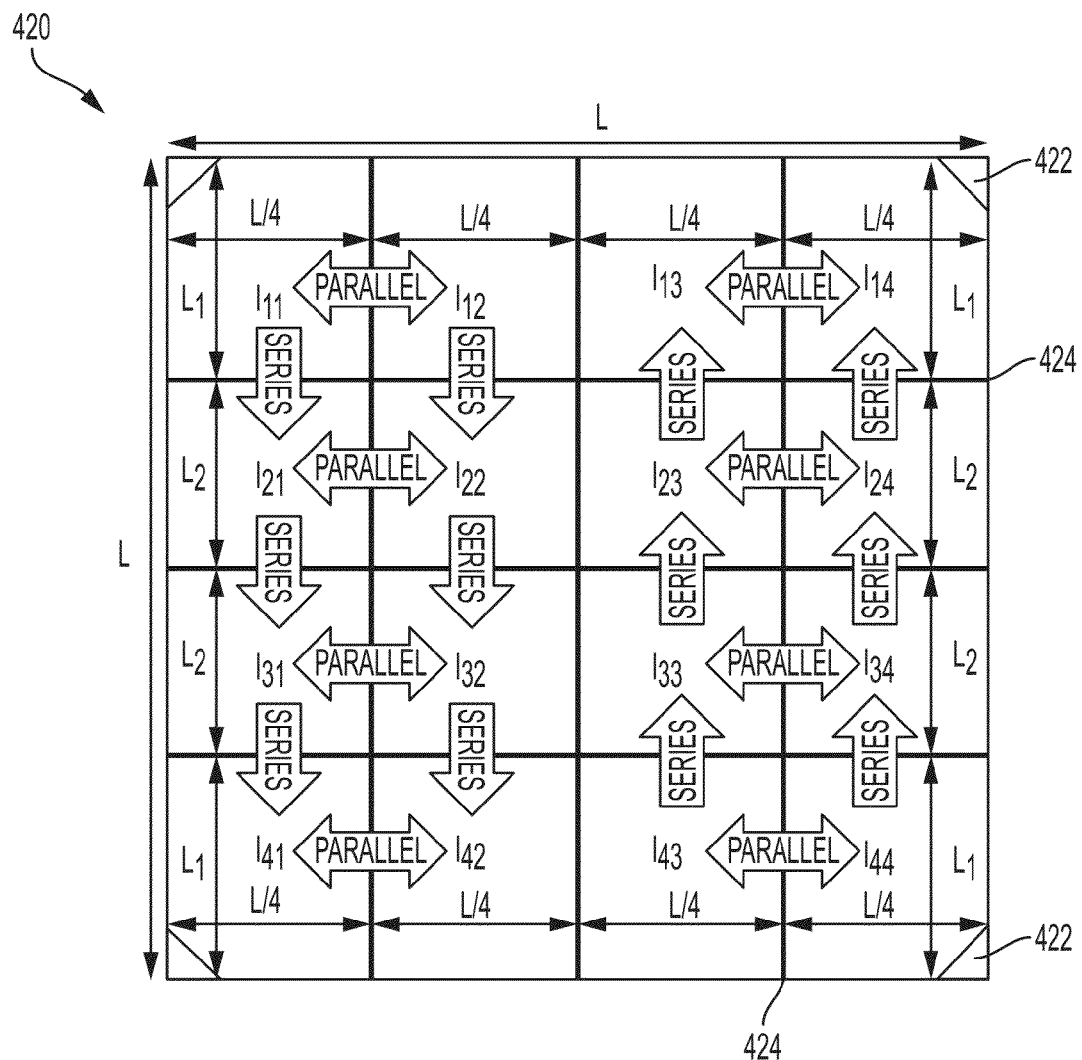
FIG. 21 is a schematic diagram showing a pseudo square-shaped icell having a hybrid parallel-series electrical connection.

FIG. 21 is a diagram of a hybrid parallel-series pseudo-square master cell configuration 2×8HPS 420 having a 4×4 array of electrical series and parallel connected isles $I_{11}$ through $I_{44}$ (isles defined by isolation trenches 424) from emitter busbar to base busbar similar to the cell shown in FIG. 18B (emitter busbar, base busbar, and lateral M2 jumpers not shown in FIG. 21). Similar to the pseudo-square master cell shown in FIG. 20, pseudo-square master cell 420 has a side length L (for instance, 156 mm for a 156 mm×156 mm pseudo-square icell) and is missing corners 422 each having area a'.

The following dimensions are provided as exemplary to fully balance the master cell current of pseudo-square master cell configuration 2×8HPS 420; however, as noted previously the isle design principles disclosed herein may be applicable to various cell shapes and dimensions. As shown master cell 420 is horizontally and vertically symmetrical (resulting in eight pairs of parallel connected isles) and the dimensional expressions following are for one quadrant (for example $I_{11}$, $I_{21}$, $I_{12}$, and $I_{22}$). Each set of isles connected in series may be designed or sized to have an equivalent area (and a corresponding equivalent voltage and current)—in other words the area of $I_{11}$+$I_{12}$=$I_{21}$+$I_{22}$.

For L=156 mm, $L_1$ and $L_2$ may then be calculated as follows, resulting in a fully current-balanced master cell: [(L/4)·$L_1$−a']+(L/4)·$L_1$=2·(L/4)·$L_2$ and $L_1$+$L_2$=L/2. Thus for L=15.6 cm (or L/4=3.9 cm) and a'=1 $cm^2$: 3.9 $L_1$−1+3.9 $L_1$=2×3.9 $L_2$ and $L_1$+$L_2$=15.6/2. Then $L_1$−$L_2$=0.1282 cm and $L_1$+$L_2$=7.8 cm. Resulting in $L_1$=3.964 cm and $L_2$=3.836 cm.

Figure 22:
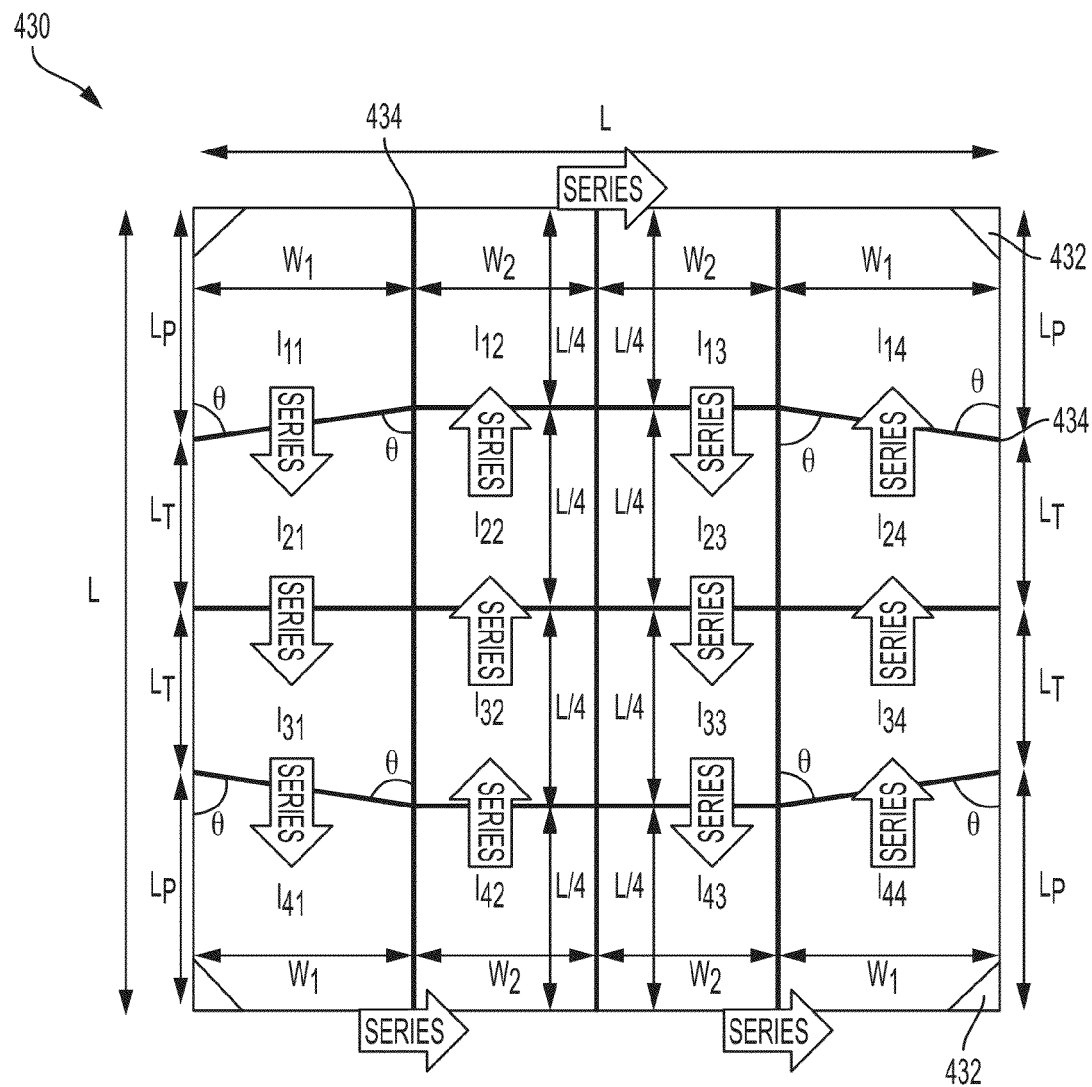
FIG. 22 is a schematic diagram showing a pseudo square-shaped icell having an all-series electrical connection.

FIG. 22 is a diagram of an all-series pseudo-square master cell configuration 1×16S 430 having a 4×4 array of electrical series connected isles $I_{11}$ through $I_{44}$ (isles defined by isolation trenches 434) from emitter busbar to base busbar similar to the cell shown in FIG. 18A (emitter busbar, base busbar, and lateral M2 jumpers not shown in FIG. 22). Similar to the pseudo-square master cell shown in FIG. 20, pseudo-square master cell 420 has a side length L (for example 156 mm for a 156 mm 156 mm pseudo square solar cell) and is missing corners 422 each having area a'.

The following dimensions are provided as exemplary to fully balance the master cell current of pseudo-square master cell configuration 1×16S 430 having a side length L (156 mm) with continuous isolation trenches defining each isle—in other words the guideline described provides for equal area isles. In some instances, continuous isolation trenches (trench isolation lines formed continuous with common intersection points) may be desired to maximize master cell flexibility for processing simplicity during scribing and to minimize crack generation and propagation. As shown in FIG. 22, all trench isolation line intersections have right angles, except for those specified otherwise.

In the isle design of FIG. 22, isles in the second and third columns ($I_{12}$, $I_{22}$, $I_{32}$, $I_{42}$, $I_{13}$, $I_{23}$, $I_{33}$, and $I_{43}$) are rectangular, each having an area $(L/4) \cdot W_2$. Isles in the first and fourth columns are non-rectangular: isles $I_{21}$, $I_{31}$, $I_{24}$, and $I_{34}$ are trapezoidal; and corner isles $I_{11}$, $I_{41}$, $I_{14}$, and $I_{44}$ are polygons. The three vertical scribe lines (isolation trenches) and the central horizontal scribe line (isolation trench) are straight lines running from edge to edge of the master cell. The two outside horizontal scribe lines (isolation trenches)—in other words the top and bottom scribe lines—are straight and horizontal between the two middle columns (columns 2 and 3) and sloped by angle θ as the lines extend to the first and fourth columns. Thus, master cell 430 is horizontally and vertically symmetrical (resulting in 16 connected isles each having an equivalent area and four symmetrical quadrants). The dimensional expressions following are for one quadrant (for example $I_{11}$, $I_{21}$, $I_{12}$, and $I_{22}$). Each set of isles connected in series is designed to have an equivalent area (and a corresponding equivalent voltage and current)—in other words the area of $I_{11} = I_{22} = I_{21} = I_{22}$.

For a master cell side dimension L (156 mm) the isle dimensions of master cell 430, may be calculated as follows: the area of isle $I_{12}$ (same rectangular shape and area as isles $I_{22}$, $I_{32}$, $I_{42}$, $I_{13}$, $I_{23}$, $I_{33}$, $I_{43}$)=$A_{rectangle}=W_2 \cdot (L/4)$; the area of isle $I_{11}$ (same polygonal shape and area as Isles $I_{41}$, $I_{14}$, $I_{44}$)=$A_{corner}=W_1 \cdot (L/4)+[W_1^2/\tan(\theta)]/2-a'$; the area of isle $I_{21}$ (same trapezoidal shape and area as isles $I_{31}$, $I_{24}$, $I_{34}$)= $A_{trapezoid}=W_1 \cdot (L/4)-[W_1^2/\tan(\theta)]/2$. And $A_{rectangle}=A_{corner}=A_{trapezoid}=(L^2-4 \cdot a')/16$, thus $W_2 \cdot (L/4)= W_1 \cdot (L/4)+[W_1^2/\tan(\theta)]/2-a'=W_1 \cdot (L/4)-[W_1^2/\tan(\theta)]/2= (L^2-4 \cdot a')/16=(15.6$ cm$\times 15.6$ cm$-4.0$ cm$^2)/16=14.96$ cm$^2$. Each isle has an area of 14.96 cm$^2$.

Then $W_2 \cdot (L/4)=14.96$ cm$^2$, $W_2 \cdot L=59.84$ cm$^2$, $W_2=59.84/15.6$ cm, thus $W_2=3.836$ cm. And $W_1 \cdot (L/4)+[W_1^2/\tan(\theta)]/2-a=14.96$ cm2, $W1 \cdot L+2[W_1^2/\tan(\theta)]=63.84$ cm$^2$, $W_1 \cdot (L/4)-[W_1^2/\tan(\theta)]/2=14.96$ cm2, and $W1 \cdot L-2[W_1^2/\tan(\theta)]=59.84$ cm$^2$. Therefore: $2W_1 \cdot L=63.84+59.84$ cm$^2=123.68$ cm$^2$, $W_1=123.68/(2\times 15.6)$ cm, thus $W_1=3.964$ cm. And $4[W_1^2/\tan(\theta)]=63.84-59.84$ cm$^2$, $4[3.964^2/\tan(\theta)]=4.00$ cm$^2$, $\tan(\theta)= 15.7133$, thus $\theta=86.36°$. And $L_T=L/4-W_1/\tan(\theta)=15.6/4-3.964/15.7133$, $L_T=3.9-0.252$ cm, thus $L_T=3.648$ cm.

Thus, in the exemplary embodiment providing dimensions and angles for current matching in the 1×16S all-series 4×4 pseudo-square substrate master cell of FIG. 22: each isle area=14.96 cm$^2$, Polygonal Isles (4 Corners): Isles $I_{11}$, $I_{41}$, $I_{14}$, and $I_{44}$; Trapezoidal Isles (4): Isles $I_{21}$, $I_{31}$, $I_{24}$, and $I_{34}$; Rectangular Isles (8 Middle): $I_{12}$, $I_{22}$, $I_{32}$, $I_{42}$, $I_{13}$, $I_{23}$, $I_{33}$, $I_{43}$; L/4=39.00 mm; $W_2$=38.36 mm; $W_1$=39.64 mm; $L_T$=36.48 mm; $L_p$=41.52 mm; and $\theta$=86.36°.

Monolithically Isled Master Cell Interconnections in PV Modules.

The isled master cells disclosed herein may be connected in electrical series, parallel, or hybrid parallel-series arrangements in PV modules. These interconnections may be performed using Monolithic Module embodiments described earlier (for example when a plurality of icells are attached to a continuous backplane layer and all the icell to icell electrical interconnections are performed using the patterned M2 layer). Master cell interconnection design choice in the module (series, hybrid parallel series, or even parallel) may be based on the master cell maximum-power-point (MPP) current and voltage ($I_{mp}$ and $V_{mp}$), the number of master cells in the module, as well as the desired MPP current and voltage of the module. Often, standard crystalline Si modules are made of 60 cells arranged in 6 columns, with 10 cells in each column (6×10) although other module configurations including 6×12=72 cells may be used based on the requirements for module power, module format, safety, BOS (e.g., wiring) cost, etc.

One exemplary module configuration embodiment for master cell interconnects (assuming N is at least 3) in a module of 6×10 (or more) master cells is a hybrid parallel-series configuration. Depending on the specific application and market, master cell interconnections may be optimized using a hybrid parallel-series design to provide the desired maximum module MPP current or the desired maximum module MPP current. And while an all-parallel configuration is possible, in some instances an all-parallel configuration may result in an excessively large module current resulting in significant ohmic losses. Further, while an all-series configuration is possible, in some instances an all-series configuration may result in an excessively high (for example larger than several hundred volts) module voltage (module $V_{mp}$) which may cause safety concerns and/or may demand higher wiring costs due to the dielectric insulation requirements.

Figure 23B:
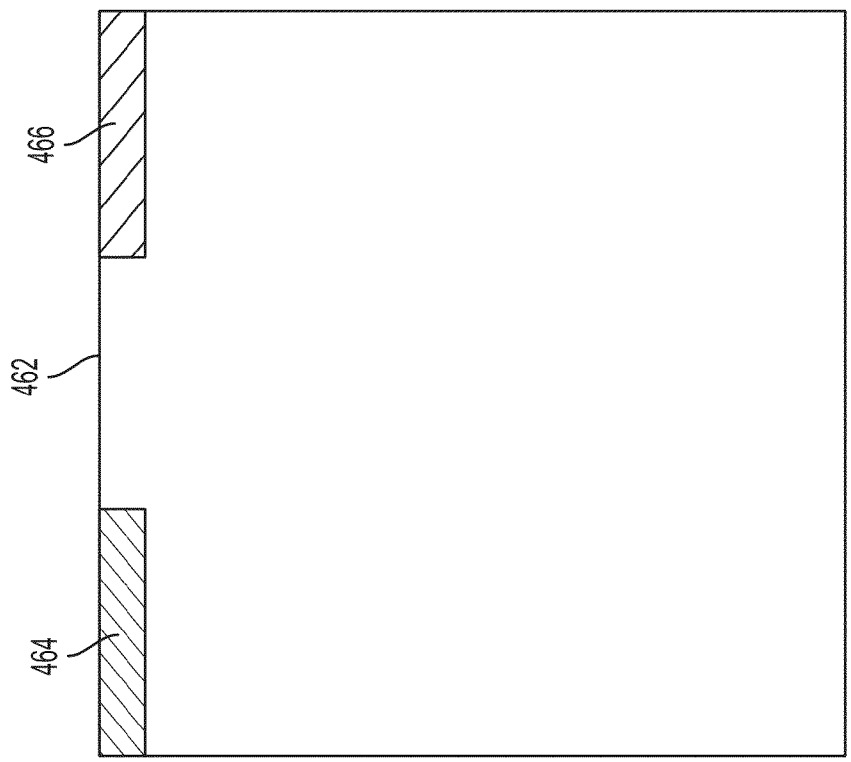
FIGS. 23A and 23B are schematic diagrams showing a master cell overview and the relative position of emitter and base busbars depending on the number of isles and M2 interconnection design.
Figure 23A:
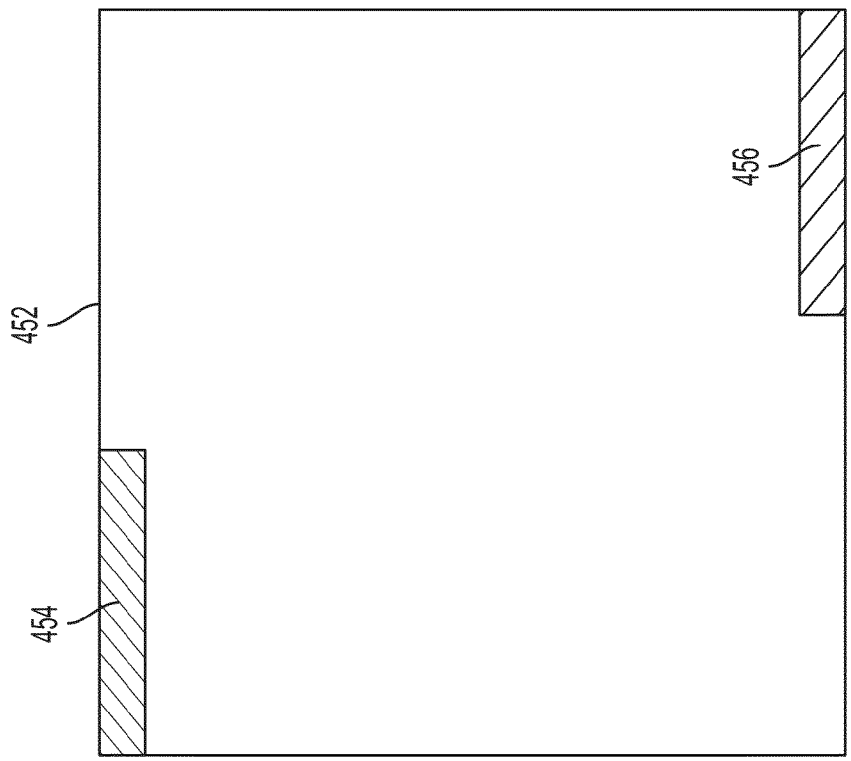

FIGS. 23A and 23B are diagrams showing a master cell or icell overview highlighting the position of the emitter and base busbars as dependent on the number of isles (odd or even number of isles), as well as M2 interconnection design. Both master cell 452 in FIG. 23A and master cell 462 in FIG. 23B have an array of S=N×N isles (or N×N subgroups of parallel-connected isles)—individual isles not shown. In master cell 452 N is an odd integer and in master cell 462 N is an even integer. As can be seen in FIG. 23A, master cell 452, when N is an odd integer and the isles (or subgroup of parallel-connected isles) are connected in electrical series, the master cell emitter and base busbars are positioned opposite the cell diagonal in two opposite quadrants—shown as emitter busbar 454 and base busbar 456 in FIG. 23A (for example, see the master cells shown in FIGS. 15A and 15B). In master cell 462 N is an even integer and the isles (or subgroup of parallel-connected isles) are connected in electrical series, the master cell emitter and base busbars are positioned on the two opposite corners on the same side of the square cell—shown as emitter busbar 464 and base busbar 466 in FIG. 23B (for example, see the master cells shown in FIG. 14A).

FIGS. 24 through 27 are diagrams depicting various 60 cell module connection designs for master cells designs having both an even and odd number of series connected isles (or subgroups of parallel-connected isles), such as those shown in of FIGS. 23A (N is odd) and 23B (N is even). The diagrams of FIGS. 24 through 27 are top module views (showing the frontside of the master cell) showing emitter busbars and base busbars for each master cell although the busbars are actually positioned on the backsides of the master cells. In other words, the emitter and base busbars and module interconnections are shown as visible through the master cell frontside to emphasize various cell-to-cell interconnection designs. Each of these representative modules may be made as a monolithic module by attaching or laminating a plurality of icells (e.g., 60 icells in a 6×10 arrangement as shown in these embodiments) to a continuous backplane sheet after completion of the solar cell backside processing through the patterned M1 layer and then performing the remaining post-backplane-lamination back-end solar cell processing on the continuous multi-cell backplane substrate through completion of the patterned M2 layer on the large continuous backplane sheet comprising the plurality of icells. This approach will result in interconnections of the icells to one another according to a desired electrical interconnection arrangement (all series or hybrid parallel-series) using the monolithic patterned M2 metallization layer. This results in a monolithic module, eliminating the need for tabbing and/or stringing and/or soldering of the solar cells to each other for module assembly (since patterned M2 already completes the cell-to-cell interconnections based on the monolithic module embodiment). Of course, each of these representative modules may also be made without the monolithic module embodiments disclosed herein by conventional tabbing and/or stringing and/or soldering of the solar cells to each other for module assembly.

Figure 24:
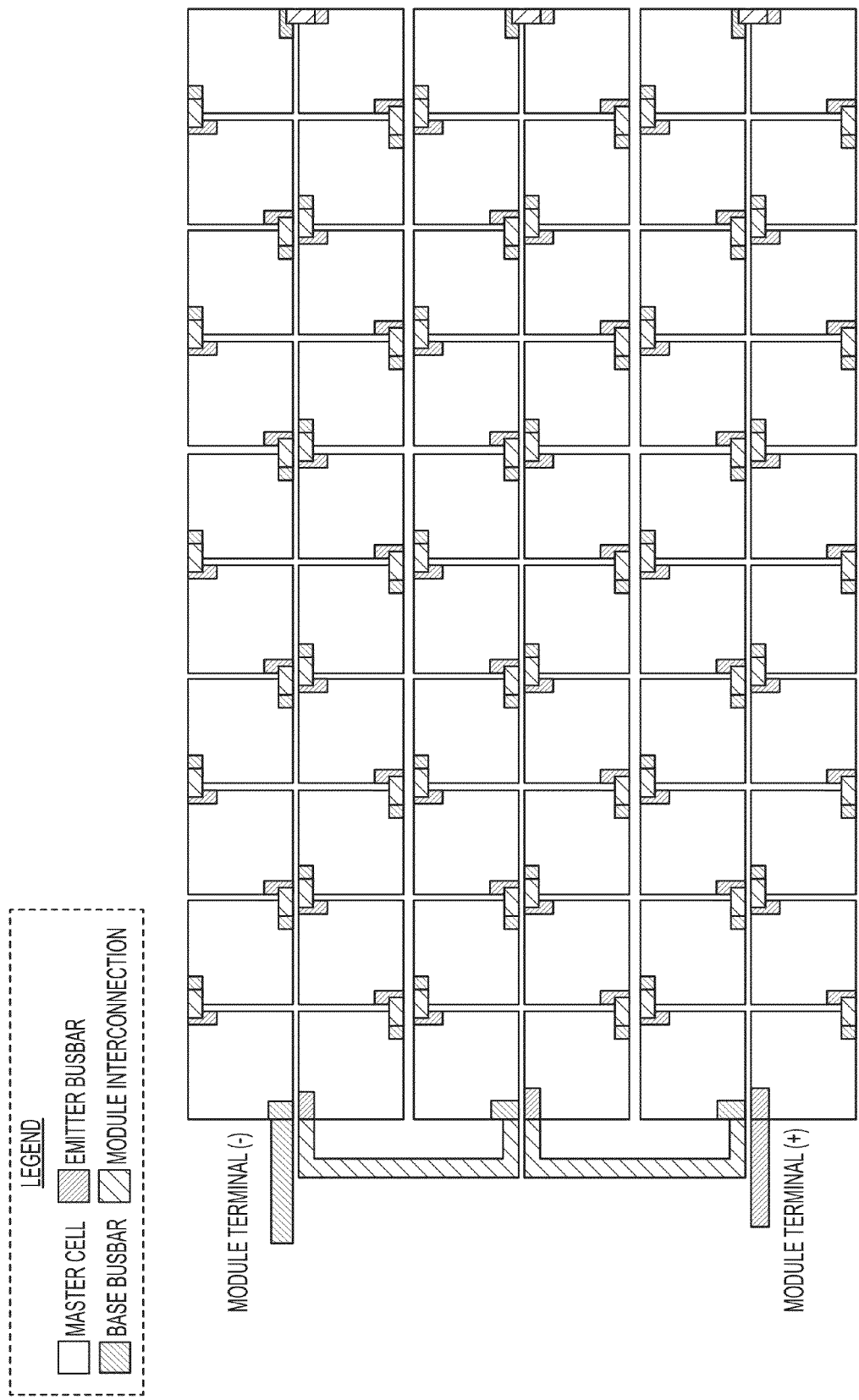
FIGS. 24 through 27 are schematic diagrams depicting 60-cell module connection designs.

FIG. 24 is an example of a module interconnection design (which is made using the patterned M2 layer if using monolithic module embodiments disclosed herein) for master cells or icells with emitter and base busbars positioned on opposite diagonal corners of the master cell (i.e., N is an odd number) and all icells connected in electrical series (all-series). Module voltage and current for 60 master cells connected in electrical series as shown in FIG. 24 may be calculated as follows: module voltage=60× master cell voltage. Thus, for N=4 and S=16: master cell voltage $V_{mp} \approx 16 \times 0.59 \approx 9.4$ V; module $V_{mp} = 60 \times 9.4 = 564$ V; and module $I_{mp} \approx 9.3$ A/16$\approx$0.58 A.

Figure 25:
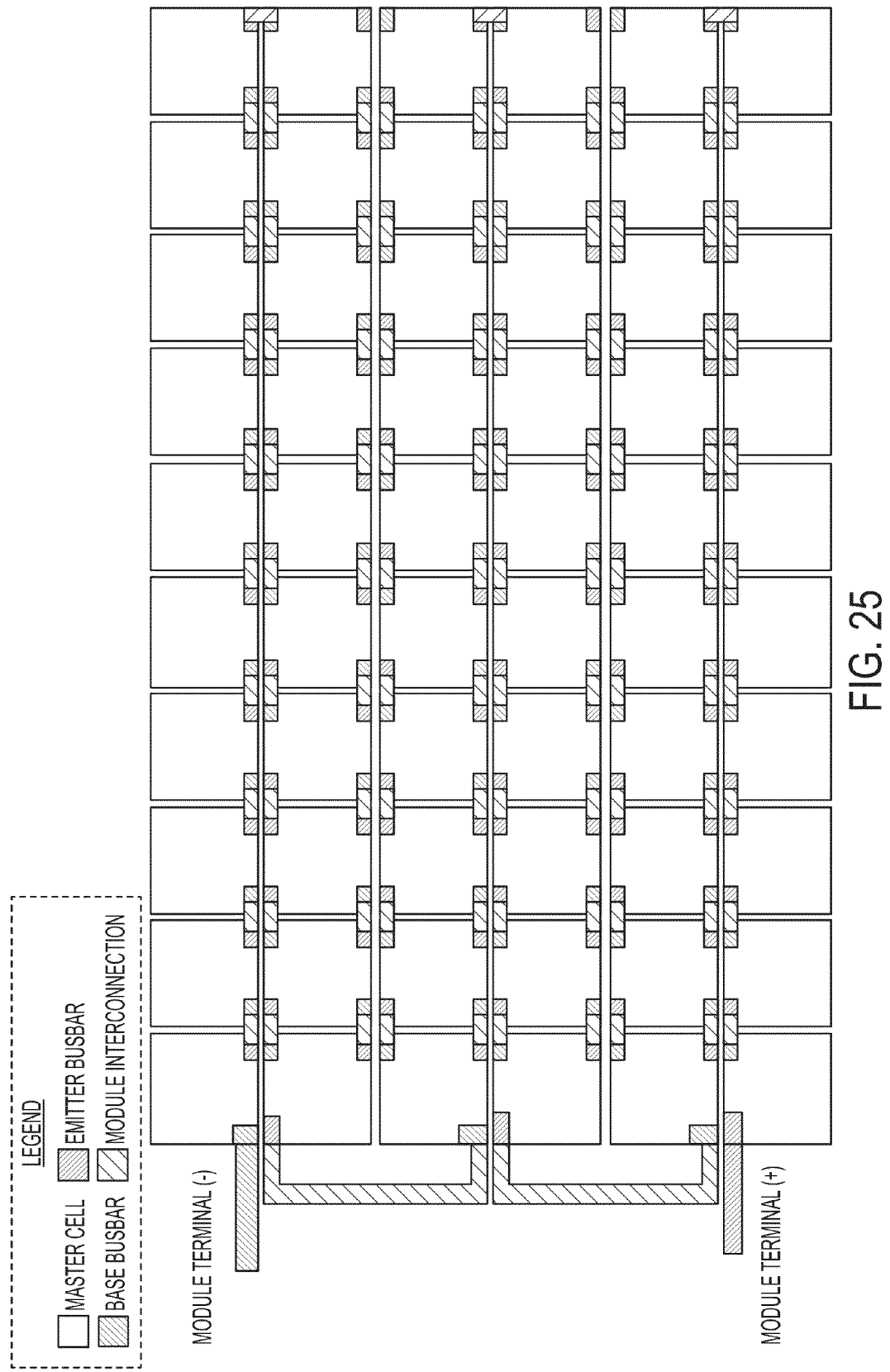

FIG. 25 is an example of a module interconnection design (which is made using the patterned M2 layer if using monolithic module embodiments disclosed herein) for master cells with emitter and base busbars positioned on corners on the same side of the master cell (N is an even number) and all cells connected in electrical series (all-series). For N=4 and S=16, module voltage and current may be calculated as described for FIG. 24.

Figure 26:
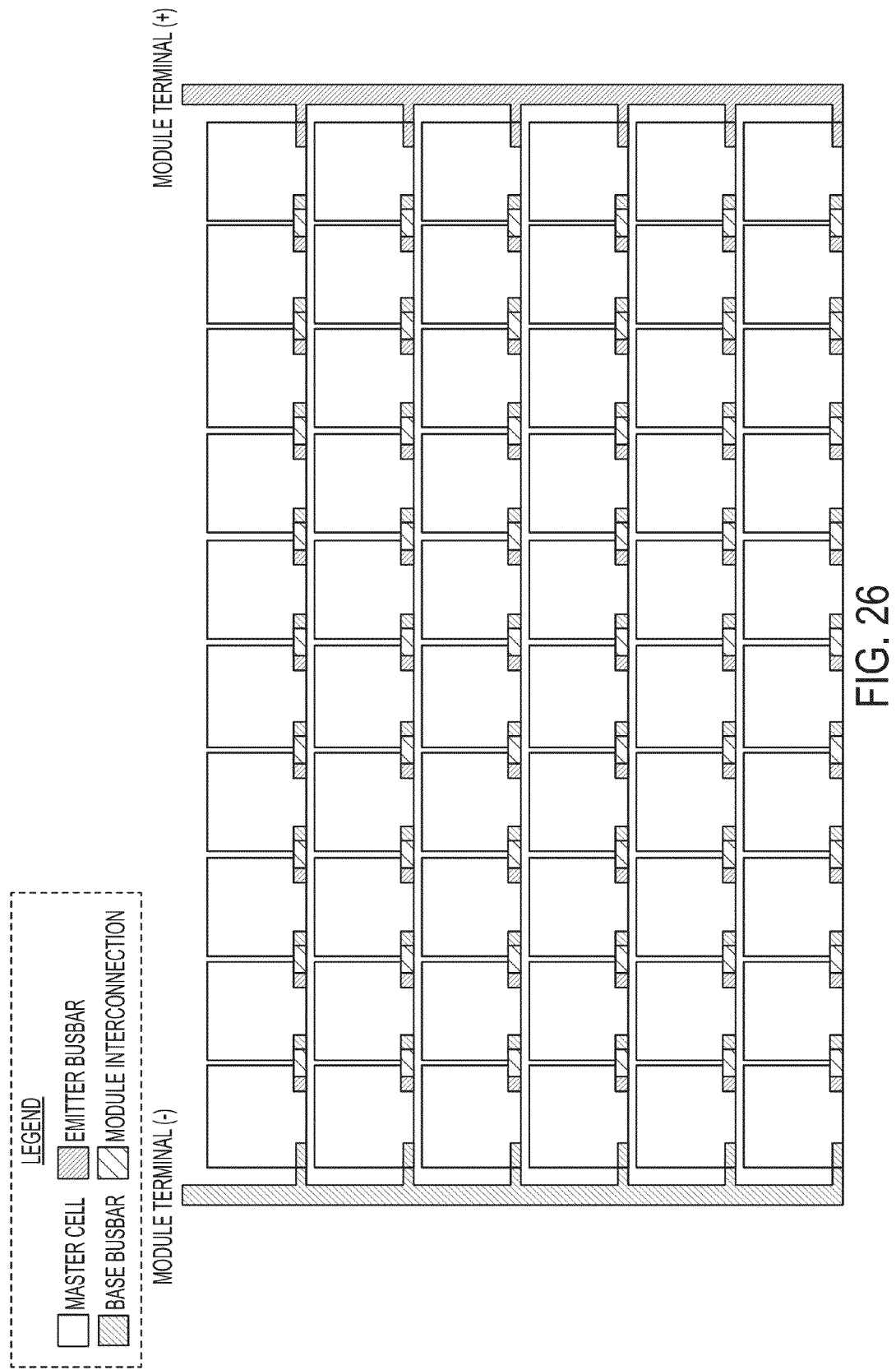

FIG. 26 is an example of a module interconnection design (which is made using the patterned M2 layer if using monolithic module embodiments disclosed herein) for master cells with emitter and base busbars positioned on corners on the same side of the master cell (N is an even number) and the cells connected in electrical hybrid parallel-series. In this embodiment each master cell in a row of 10 master cells is connected in series and the 6 rows of 10 master cells are connected in parallel. In the hybrid parallel-series module interconnection embodiment shown in FIG. 26: module voltage=10× master cell voltage. Thus, for N=4 and S=16: master cell voltage $V_{mp} \approx 16 \times 0.59 \approx 9.4$ V and module voltage $V_{mp} = 10 \times 9.4 = 94$ V.

Figure 27:
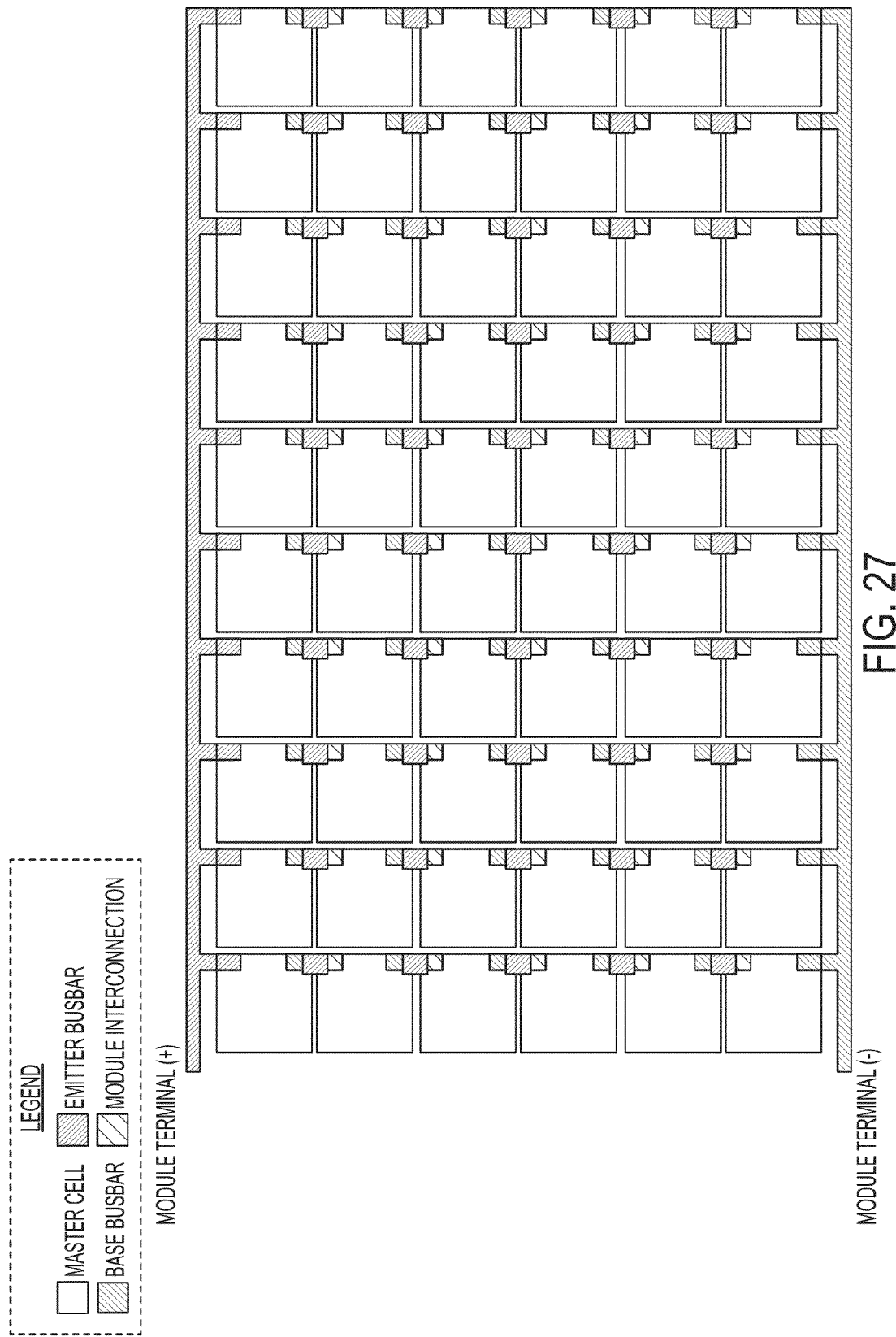

FIG. 27 is an alternative example of a module interconnection design (which is made using the patterned M2 layer if using monolithic module embodiments disclosed herein) for master cells with emitter and base busbars positioned on corners on the same side of the master cell (N is even number) and the cells connected in electrical hybrid parallel-series. In this embodiment each master cell in a column of 6 master cells is connected in series and the 10 columns of 6 master cells are connected in parallel. In the hybrid parallel-series module interconnection embodiment shown in FIG. 27: module voltage=6× master cell voltage. Thus, for N=4 and S=16: master cell voltage $V_{mp} \approx 16 \times 0.59 \approx 9.4$ V; module voltage $V_{mp} = 6 \times 9.4 = 56.4$ V; and module current $I_{mp} \approx (9.3$ A/16$) \times 10 \approx 5.81$ A.

In some instances, the monolithically isled architecture disclosed herein may integrate an embedded module-level or a cell-level DC-to-DC (or DC-to-AC) power optimizer which may be mounted directly on the master cell backplane prior to final module lamination or embedded within the module laminate. The MPPT Power optimizer may be a high-conversion-efficiency (for example greater than 97% efficiency) monolithic or hybrid chip (possibly including some discrete components comprising at least an inductor and a capacitor) which converts cell DC output to either DC or AC output at a specified voltage or constant current (range). For example, a cell-level MPPT power optimizer chip may be used to produce AC cells while performing maximum-power-point tracking (MPPT), by converting master cell DC voltage and current ($V_{mp}$ and $I_{mp}$) to AC voltage and current.

And if the master cells in a module are connected in all-series, the cell-level embedded MPPT may be set to produce a pre-specified fixed output current in each master cell under all illumination conditions while performing the MPPT power optimization function. This may ensure that all the master cells connected in series are current-matched. Similarly, if the master cells in the module are connected in a hybrid parallel-series arrangement, the cell-level embedded MPPT may be set to produce a pre-specified fixed output current in each master cell to provide a pre-specified parallel-string voltage under all illumination conditions while performing the MPPT power optimization function (and providing a pre-specified string voltage). This may ensure that all master cells or icells connected in series in each series string are current-matched while the parallel strings are also voltage matched.

Figure 28B:
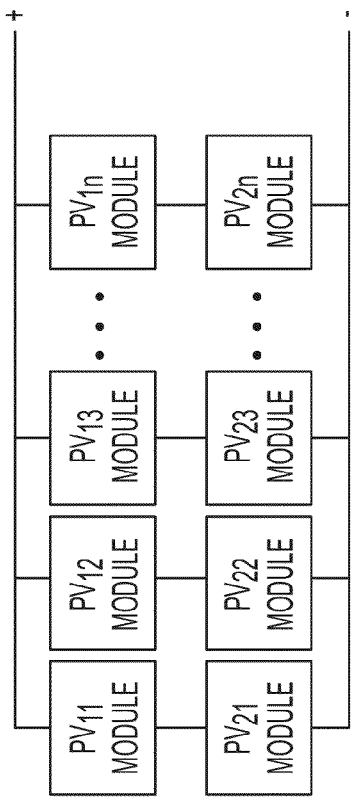
FIGS. 28A and 28B are schematic diagrams showing module connections for 600 VDC PV systems using 60-cell PV modules comprising all-series icells as compared to hybrid parallel-series icells.
Figure 28A:
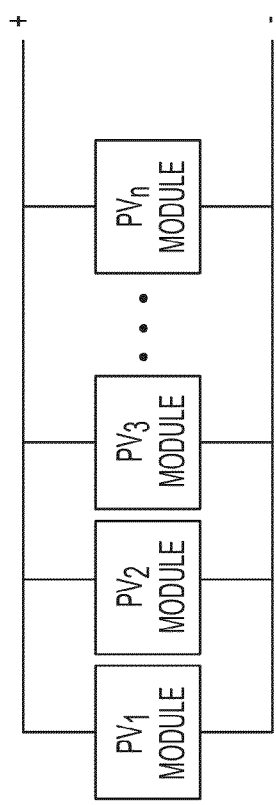
Figure 29B:
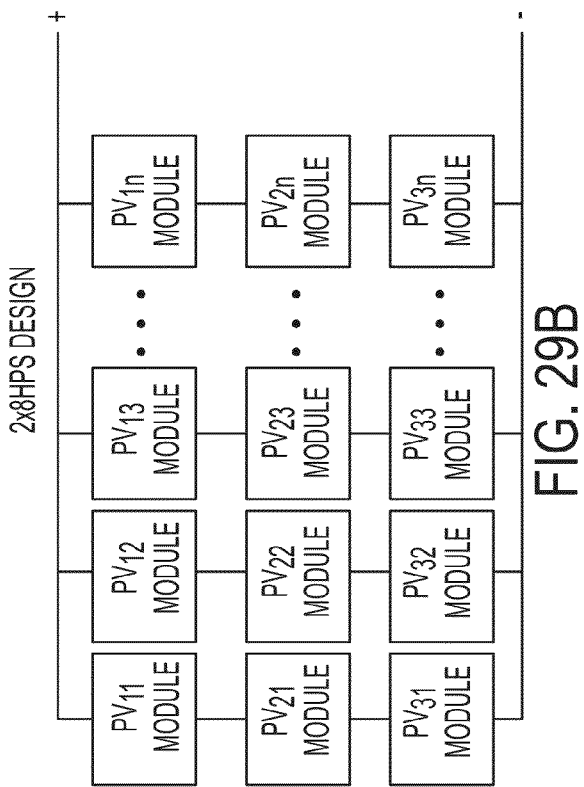
FIGS. 29A and 29B are schematic diagrams showing module connections for 1000 VDC PV systems using 60-cell PV modules comprising all-series icells as compared to hybrid parallel-series icells.
Figure 29A:
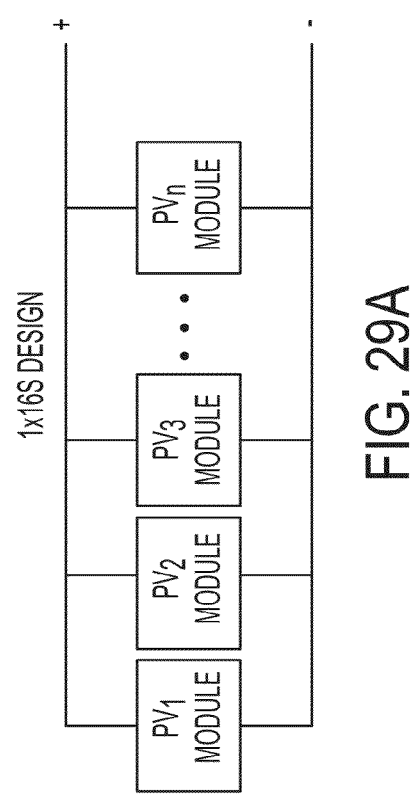

FIGS. 28A and 28B are diagrams showing some representative examples of module interconnections embodiments for a 600 VDC PV system. FIG. 28A shows example of module interconnections for a 1×16S (all-series) module design (60-cell modules) where $V_{oc}$=657.6 V and $V_{mp}$=552.0 V and FIG. 28B shows module interconnection embodiments for a 2×8HPS (hybrid parallel-series) design (60-cell modules) where $V_{oc}$=657.6 V and $V_{mp}$=552.0 V. FIGS. 29A and 29B are schematic diagrams showing module interconnections for a 1000 VDC PV system. FIG. 29A shows module interconnections for a 1×16S (all-series) design (60-cell modules) where $V_{oc}$=657.6 V and $V_{mp}$552.0 V and FIG. 29B shows module interconnections for a 2×8HPS (hybrid parallel-series) design (60-cell modules) where $V_{oc}$=986.4 V and $V_{mp}$828.0 V. Thus, $V_{os}$ and $V_{mp}$ are increased in 2×8HPS design for a 1000 VDV PV system as compared to a 2×8HPS design for a 600 VDV PV system or a 1×16S design for 600 or 1000 VDV PV systems.

Thus, in some specific embodiments, a 2×8 Hybrid Parallel-Series (2×8HPS) interconnection design may be chosen for the following advantages:

Enable the use of pseudo-square crystalline silicon wafers to fabricate icells while maintaining important advantages of an all-series master cell (for example such as master cell flexibility due to straight bidirectional trench isolation scribe lines and an M2 metal layer with a thickness less than approximately 5 μm if applicable);

Current match/balance in pseudo-square crystalline silicon wafers, for example achieved by using $L_1$=3.964 cm, $L_2$=3.836 cm as shown (for 156 mm×156 mm wafers); Also compatible with full-square master cell substrates, for example with $L_1$=$L_2$=3.9 cm as shown;

Providing efficient PV system arrangement for both 600 VDC and 1,000 VDC systems (as well as other system voltages) with reduced BOS cost and higher system efficiency. In some instances, a 1000 VDC PV system may have higher system-level efficiency and lower BOS costs as compared to a 600 VDC system. (It has been noted, due to higher efficiency and lower BOS cost, a higher string voltage (1,000 VDC vs. 600 VDC) may provide an economic value of approximately $0.10/W for an installed PV system). If desired, the module voltages can be set (e.g., lowered compared to an all-series module arrangement) by interconnections of the icells within the module according to a hybrid parallel-series configuration.

Integration of low-cost distributed shade-management (similar to a 1×16S design);
Integration of low-cost remote module ON/OFF (similar to a 1×16S design);
Integration of low-cost distributed cell-level MPPT (similar to a 1×16S design); and
May be considered more tolerant of master cell isle parametrics variations as compared to a 1×16S design.

The benefits of the innovative aspects disclosed herein include but are not limited to: (i) reduced solar cell manufacturing (fab) process equipment and facilities capital expenditures (CAPEX); (ii) substantially reduced hazardous waste byproducts in the solar cell fab; (iii) reduced solar cell microcracks and/or breakage (for instance, due to elimination of the need for copper plating and its associated handling, sealing, and contacting requirements) and enhanced overall manufacturing yield; (iv) improved projected long-term PV module field reliability; (v) reduced bow and mechanical stress for backplane-laminated solar cells due to elimination of the need for thick (typically 10's of microns for IBC solar cells) electroplated copper on the backside.

In operation, the disclosed subject matter provides monolithically isled master cells (icells) which may provide any combination of the following advantages: enhanced flexibility and crack mitigation; reduced cell bow and improved planarity; scaled-up voltage and scaled-down current, resulting in reduced $RI^2$ ohmic losses; a reduction in cell metallization thickness (as much as 10×) may allow for the elimination of copper plating if desired which may reduce cell metallization cost (for example ≤5 μm Al); the elimination of thick metallization, such as thick-copper, reduces stress effects (and resulting cracks) during module lamination; distributed cell parametrics at test and sort; reduced current allows for an inexpensive shade-management switch; allows for the use of an inexpensive, high-efficiency (>98%) MPPT DC-DC buck converter; and, a fully plating-free solar cell.

The present application relates to cost-effective, high-efficiency solar cells and related modules, their device structure and methods for manufacture. More specifically, the disclosed subject matter relates to solar cell structures and manufacturing methods using wire-sawn, standard thickness (e.g., 125 mm×125 mm or 156 mm×156 mm or larger-area silicon wafers with starting thicknesses in the range of about 120 to about 250 microns) starting crystalline silicon wafers which may be thinned in conjunction with a supporting backplane (such as a flexible polymeric backplane which is permanently attached to the thin silicon cell absorber). The semiconductor absorber layer may be segmented using a monolithic fabrication process to provide multiples of the standard operating voltage of standard monolithic silicon cells while scaling down the solar cell current for a given solar cell power as described above.

The disclosed subject matter addresses limitations of known methods relating to the use of bulk wafers and thin-film solar cell fabrication challenges and provides the combination of low-cost and high efficiency inter-digitated back contact (IBC) solar cells made using starting crystalline silicon wafers.

Medium grade minority carrier lifetime n-type wafers may be chosen, for example with starting minority carrier lifetimes on the order of about ≥100 μs or more and manufactured using Czochralski (CZ) ingot growth, continuous or quasi-continuous CZ growth, or other methods which address the inherent n-type doping concentration gradient across n-type silicon ingots. Alternatively quasi-monocrystalline cast n-type silicon ingots or even multicrystalline silicon material may be chosen dependent on material quality and other process integration requirements. It is to be noted that some of the subsequent processes, such as texturing, require suitable adjustment depending on the starting material choice, for instance alkaline texture for monocrystalline compared to acidic texture for multicrystalline material (although both acidic and alkaline textures may be used for any type of starting crystalline silicon material).

It is also to be noted that while n-type (typically phosphorus doped) starting crystalline wafers are provided for descriptive purposes, the fundamental concepts presented herein adhere to and may be applied by one skilled in the art to p-type silicon wafers. It is further to be noted that the fundamental concepts presented apply to bulk wire-sawn wafer-based absorber cells but may also be transferred to absorber cells generated using kerfless techniques such as those using porous silicon on a reusable template as a release layer system followed by epitaxial or otherwise chemical vapor deposited film growth with subsequent release with subsequent reuse of the template. The structures and methods disclosed herein are also applicable to other so-called kerfless wafer methods such as those using high-dose hydrogen ion (proton) implantation and subsequent exfoliation or laser splitting or mechanical stress induced exfoliation of thin silicon substrates from thicker reusable starting substrates.

Various solar cell processing steps may be applied to the wafers, particularly back side processing steps, including the patterned formation of base contact and emitter diffusions (the formation of emitter and base contact regions) and the application of a patterned thin first metal layer (M1). Such base contact and emitter diffusions, be it in a selective or non-selective emitter structure, may be formed, for instance, using laser ablation of doped dielectrics and subsequent drive-in. These patterned regions, formed by local removal of doped dielectric layers, may also be generated by the application of etching paste by means of printing such as screen printing. Alternatively, patterned regions of different dopant level or polarity may also be created by the local application of dopant pastes, with subsequent thermal drive-in steps. Combinations of such above patterning methods are also readily deducible.

Subsequently, a low cost backplane (such as a low-cost prepreg or polymeric material) having an expansion coefficient (CTE) relatively matched to the solar cell absorber material (for example crystalline silicon) is laminated to the backside of the processed wafer. The crystalline silicon wafer may then be thinned (for example using either a chemical wet etch or alternatively using a dry etch process) to the desired absorber thickness range providing an optimal balance between value-add optical absorption and minority carrier lifetime. Providing a thin silicon (e.g. 20 μm to 90 μm thick) absorber and handling and processing capabilities for such thin silicon absorber cells through an automated or partially automated solar cell production line at high mechanical yield is key to achieving low-cost, high efficiency solar cells and makes the structures and processes disclosed herein very attractive for low-cost, high-volume production.

Further, the silicon substrate attached to a backplane may be segmented by forming trench isolation regions, for example using pulsed laser cuts to electrically isolate individual silicon islands or segments (isles, sub-cells, or mini-cells) as described in detail above, thus enabling monolithic solar cell fabrication.

FIG. 30 illustrates such a cell structure. FIG. 30 is a diagram of solar cell 500 having a 4×4 array of sub-cells 502 $I_{11}$ through $I_{44}$ defined and electrically isolated by trenches 504 and which is reinforced by contiguous monolithic backplane sheet 506 (for example an electrically insulating, low-cost, flexible material such as a prepreg sheet or any suitable polymeric sheet). The isles are physically segmented and therefore electrically segmentable sub-cell active absorber units which may be referred to as isles or sub-cells—in other words the group of monolithically integrated sub-cells/isles form the main/master cell having a common backplane used for all the sub-cells.

After further processing steps such as wet chemical texturing etch (e.g., alkaline texture) and front side passivation layer deposition (for example using PECVD), access or via holes are drilled (for example using laser drilling) through the backplane to access the embedded cell terminals. Using a patterned second layer metal structure (M2) on the backside of the backplane, the segmented sub-cells may be electrically interconnected in parallel, in series or in a combination thereof, depending on various considerations including the desired master cell (also referred to as icell) current and voltage values. Thus, the monolithic master cell itself, held together by the backplane to e.g. a 156 mm×156 mm square or pseudo-square form factor can provide operating voltages that are scaled-up a multiple of the standard voltage range a traditional silicon solar cell may generate, for instance N-times 0.6-0.7 V.

At the same time, the current output of same cell is divided by the same factor N (with N being an integer). With this high voltage and low current design the requirements for the total metal thickness of the solar cell are reduced drastically due to the much decreased ohmic $I^2R$ loss and further savings in metallization costs can be realized. Further as a result, the challenging introduction of metal (e.g., copper) plating for solar cell metallization is not necessary.

In addition, these scaled-up voltage scaled-down current solar cells also allow for improved economical novel solutions for module power harvesting and energy yield optimization. This is owed in part to the fact that the individual cell operating current and voltage may be selected to be in the same ranges as the cost optimized current and voltage values for low cost commercial individual switches.

Further savings may also be realized within the module metallization as the individual module output current may be reduced and module output voltage may be increased thus reducing the thickness and electrical sheet conductance requirements for final cell metallization accordingly.

It is to be noted that throughout this disclosure the manufacturing methods and resulting structures, wherever they are not explicitly linked to the use of bulk crystalline silicon wafers that may be thinned to a suitable thickness (after backplane lamination), may also be extended to structures that are manufactured by deposition and subsequent release from reusable templates (or alternatively by exfoliation of thin silicon layers from reusable thicker wafers after treatment of the reusable wafer by a suitable technique such as laser splitting or MeV-scale hydrogen ion implantation or thick metal plating for stress-induced exfoliation). In the epitaxial deposition process, the active silicon absorber layer, rather than being generated from a starting bulk wafer, may be generated from a layer of in-situ-doped (typically doped with phosphorus for n-type silicon) crystalline silicon which is deposited using a chemical vapor deposition (CVD) process such as epitaxy on a reusable mono- or multi- or quasi-monocrystalline template with a sacrificial layer or layer structure of, for instance, porous silicon, which is then subsequently partially processed on one side, for example to form patterned base contacts and emitter junction structures and a patterned first metal layer (such as by screen printing of a suitable metal paste such as aluminum-containing paste, or by PVD and laser ablation patterning), which is then subsequently laminated to a backplane, exfoliated by a release process and then finished off with the same isle segmenting (trench isolation) cuts, frontside texturing, passivation, backside via drill and a patterned second layer metal.

To better understand the advantages of thin silicon from a device point-of-view, particularly for back-contact/back-junction solar cells, consider the following.

Figure 31:
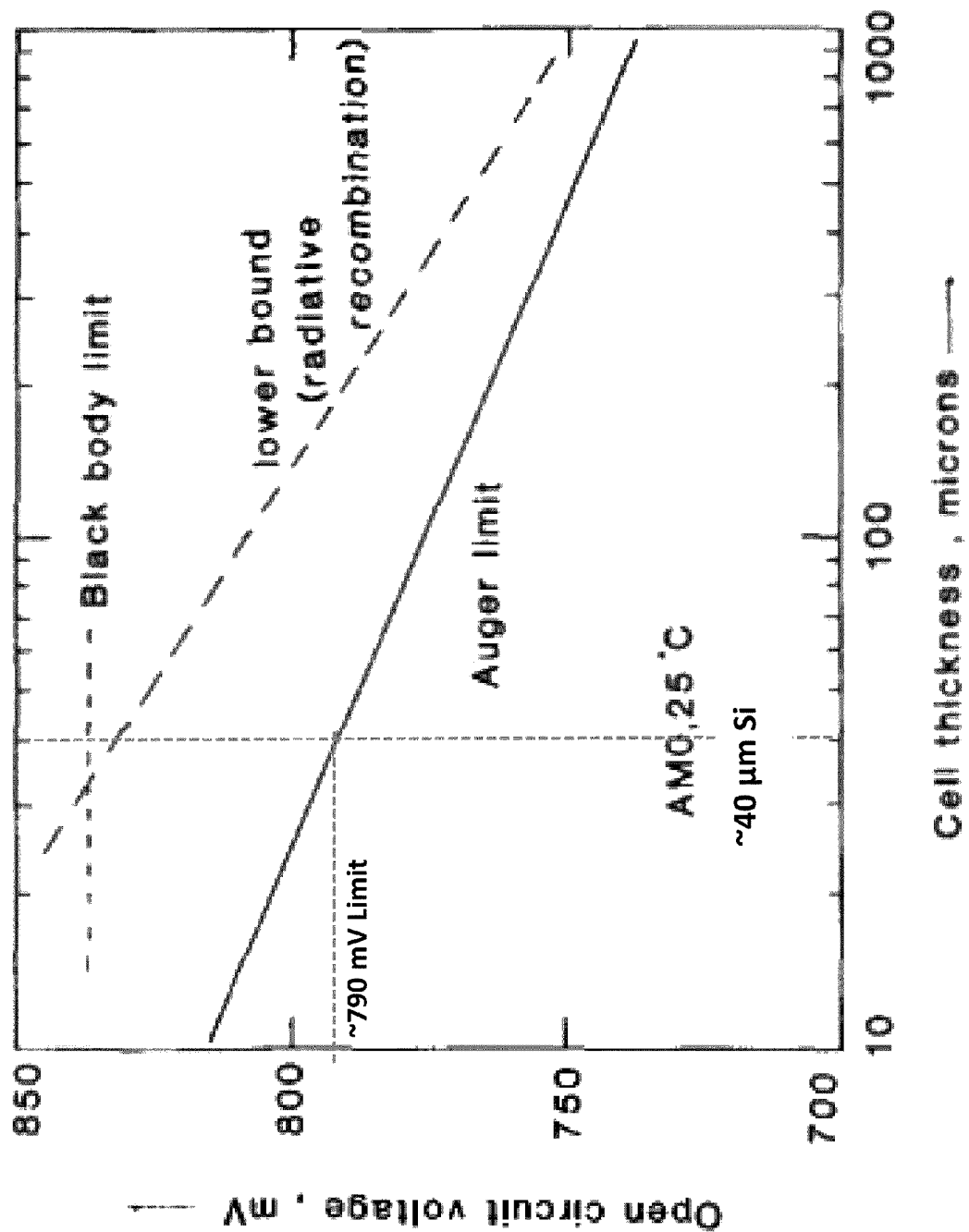
FIG. 31 is a graph of cell thickness vs open circuit voltage.

A substantial advantage of thin absorber layers are the higher solar cell open-circuit voltage or $V_{oc}$ limits when reducing the cell thickness. Thinner absorber layers are enabled by the presented cell structures and process flows described herein. FIG. 31 is a graph showing that the attainable $V_{oc}$ limit increases with reduced cell thickness. (published by M. Green of UNSW "Limits on the Open-Circuit Voltage and Efficiency of Silicon Solar Cells Imposed by Intrinsic Auger Processes."). Auger recombination imposes limits on $V_{oc}$ and efficiency of Si solar cells. The open-circuit voltage or $V_{oc}$ limit increases from about 750 mV for $W_{si}$=300 μm to about 800 mV for $W_{si}$=20 The $V_{oc}$ limits for larger $L_{eff}/W_{si}$ ratios are larger, therefore, thinner silicon absorber ultimately enables a higher efficiency (and a lower temperature coefficient of power or efficiency).

Looking at ultimate performance limits for silicon based absorbers it is necessary to look at bulk minority carrier lifetime, Surface Recombination Velocity (SRV), and effective minority carrier lifetime. Bulk recombination lifetime has several contributors. $1/t_b = 1/t_{radiative} + 1/t_{Auger} + 1/t_{defects}$. Silicon lifetime is dominated by defects (SRH) and band-to-band Auger recombination. In Auger recombination, the minority carrier (hole for n-type silicon) recombines with an electron, transmitting its energy to a 3rd charge (an electron in the CB or a hole in the VB), or lattice phonons. Auger recombination is dominant at a background doping concentration of around $N_d$>1×10$^{17}$ cm$^{-3}$ in high-quality crystalline Si the effective lifetime ($t_{eff}$) depends on bulk lifetime $t_b$, effective surface recombination velocity $S_{eff}$, and the silicon absorber thickness ($W_{si}$). For small $S_{eff}$ ($S_{eff}$<$D_h$/4W where $D_h$ is the diffusivity of holes in Si): $1/t_{eff}$>>$1/t_b$+$2S_{eff}/W_{si}$, which is highly desirable with thin Si solar cells.

For large $S_{eff}$: $1/t_{eff}$>>$1/t_b$+$(\pi/W_{si})2 \cdot D_h$. This is highly undesirable, since: $t_{eff}$>>0.14 μs for $W_{si}$=40 μm, which may be too low to enable fabrication of high-efficiency solar cells. Therefore, for thin-silicon-absorber IBC solar cells, it is very important to achieve high-quality surface passivation with very low $S_{eff}$.

In some cases, high-efficiency, thin-silicon IBC solar cell design rules may require the effective minority carrier diffusion length $L_{eff}=\sqrt{D_h \cdot t_{eff}}$ to be a relatively large multiple of the silicon absorber thickness $W_{si}$ for achieving highest $V_{oc}$ (≥700 mV) and $J_{sc}$ (≥40 mA/cm$^2$) values. In order to achieve both high open-circuit voltage and short-circuit current density, $L_{eff}$≥15. $W_{si}$. Therefore, for an approximately 40 μm thick Si absorber, an $L_{eff}$≥600 μm is desirable; for a hole diffusivity of $D_h$>>12 cm$^2$/s, this condition amounts to a requirement of effective minority carrier lifetime $t_{eff}$≥300 μs.

Further, high-efficiency thin Si absorber solar cells often demand the highest-quality surface passivation (particularly the front-surface passivation for IBC cells): $S_{eff}$≤5 cm/s for front-surface passivation in thin-silicon IBC solar cells.

Figure 32:
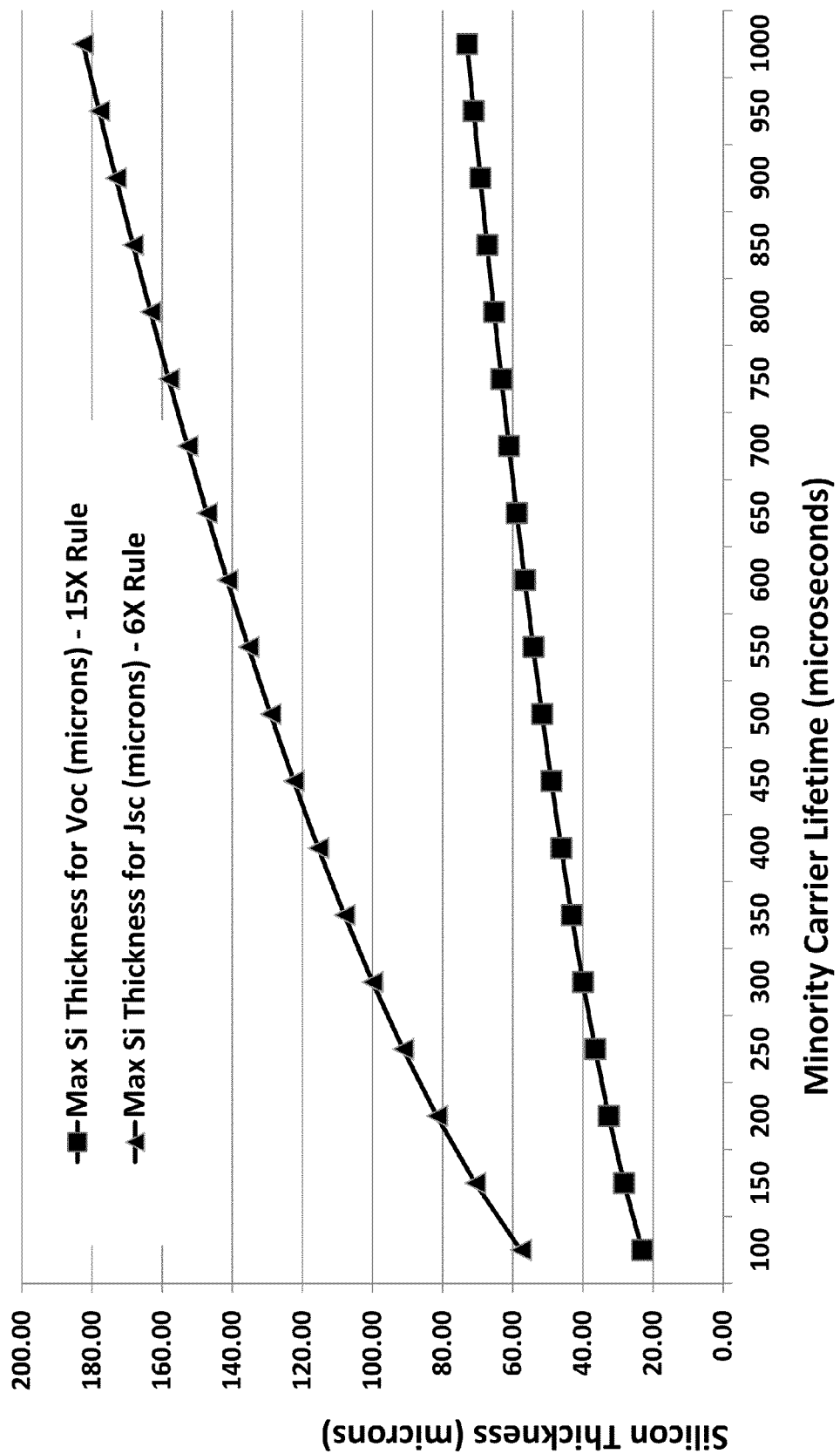
FIG. 32 is a graph of minority carrier lifetime vs silicon thickness.

FIG. 32 is a graph illustrating the silicon absorber effective minority carrier lifetime requirement (x-axis) versus final cell absorber thickness requirements (y-axis) for high-efficiency solar cells, showing the requirements for high performance of $V_{oc}$ and $J_{sc}$. It can be seen that the high $V_{oc}$ requirement places more stringent demand on the maximum allowable silicon thickness and/or minimum required minority carrier lifetime (as compared to the high $J_{sc}$ requirement).

The post-etch and texture processes thin silicon thickness depicted show the thickness and lifetime requirements based on certain $J_{sc}$ and $V_{oc}$ design rules (for example, the effective minority carrier diffusion length in the absorber being at least ~6× the absorber thickness to meet the high $J_{sc}$ requirement and ~15× the absorber thickness to meet the high $V_{oc}$ requirement).

The starting material for the thin-semiconductor-absorber solar cell structures may be pseudo-square or full-square, n-type monocast (also called quasi-mono or cast mono) silicon or n-type CZ silicon wafers (for instance produced by wire saw from CZ-grown mono-crystalline ingots or cast crystalline bricks) or depending on the material quality also multicrystalline silicon or upgraded metallurgical grade silicon. When CZ silicon is used growing methods that enable a tighter distribution of dopant concentration and resistivity, such as using a continuous CZ (CCZ) or quasi-continuous CZ growth of silicon ingots, may be selected.

Wafer size may be at least 156 mm×156 mm or larger and the starting average wafer thickness may be in the range of approximately 80 μm to 250 μm. Thinner and/or lower cost wafers may be utilized as long as manufacturing yield is not compromised by reduced mechanical yield due to enhanced wafer breakage during and after cell processing. And wafer bulk minority carrier lifetime may be at least 100 μs and in some instances several hundreds of μs—carrier lifetimes obtainable using inexpensive n-type CZ wafers.

The solar cell fabrication process may be started by single-sided in-line or batch immersion Saw Damage Removal (SDR), which is a wet etch process, optionally followed by a chemical polishing step to smooth out surface asperities. Such polishing steps may be performed single sided or double sided, for instance using chilled or room temperature mixtures containing hydrofluoric acid (HF) and nitric acid ($HNO_3$) or alternatively using alkaline etch processes such as hot potassium hydroxide at concentrations above 15%, etches may be followed up by a metal removal etch such as with HCl, HF or HCl/HF combinations and then completed with an HF containing clean to remove the native oxide and to leave the surface hydrophobic and hydrogen terminated.

Depending on the choice of starting wafer source, it may be advantageous to manufacture at this early stage in the process flow a back surface field or back surface doping layer which lowers the overall sheet resistance of the base which is otherwise typically governed by the wafer resistivity and its thickness. However, as standard CZ growth of n-type ingots is typically accompanied with a large gradient of dopant due to dopant segregation and thus a large variation in wafer resistivity across an ingot (from seed end to tail end), it may be advantageous to have a tighter range of base sheet resistance by utilizing additional doping on the back surface of the wafer. Provided herein are several different embodiments for achieving such an increased doping area. It is to be noted that newer ingot fabrication methods, such as continuous or quasi-continuous CZ growth, are currently addressing and reducing the aforementioned ingot doping gradient, and therefore alleviating or obsoleting the need for said additional doping within the solar cell base region.

Subsequently, a large part of the solar cell backside processing may be performed, namely the patterned formation of emitter and base contact diffusions, for example using a combination of dielectric deposition steps such as doped glass depositions using atmospheric pressure chemical vapor deposition (APCVD) and/or plasma-enhanced chemical-vapor deposition (PECVD), subsequent damage-free or low-damage laser patterning, for example using pulsed nanosecond, picosecond or femtosecond laser ablation patterning and thermal (e.g., batch tube or in-line furnace) drive-in for emitter junction (and doped base and emitter contact diffusion regions, as required) formation—in other words, generally the formation of emitter and base contact regions.

Laser beams for such processes may be homogenized to a spatial top hat profile for best uniformity or be Gaussian or have intermediate intensity distribution shapes. Backside dielectric depositions may consist of doped or undoped silicon-oxide glasses such as boron-silicate glass (BSG), phosphorus-silicate glass (PSG) or undoped-silicate glass (USG) or of other dielectrics such as aluminum oxide or silicon nitride, doped or undoped, or a combination thereof.

Further, a patterned first metal layer may be applied to the backside of the cell, for example a metal consisting of an aluminum or aluminum containing alloy (such as a screen-printable paste or inkjet-printing ink comprising aluminum-silicon) paste. The first metal layer may be annealed particularly if it consists of a screen, ink jet or otherwise printed paste. Alternatively, physical vapor deposition (PVD) such as DC magnetron plasma sputtering and/or evaporation of one or more metallic materials (such as aluminum or aluminum-silicon alloy) may be applied to form the first metal level, followed by patterning of the PVD layer, for instance through the use of pulsed picoseconds or nanoseconds laser ablation of PVD metal on top of the dielectric glass, where required. This forms the contact metallization layer on the solar cell. The emitter and base structure as well as the patterned first-level relatively thin metal layer (for instance with a sheet resistance in the range of about 0.01 Ω/square to 0.5 Ω/square), may be formed and patterned as a busbar-less interdigitated back contact (IBC) base and emitter metallization (Metal-1 or M1 metal layer) scheme. M1 geometry should be to provide for the possibility for subsequent segmentation and thereby physical and electrical separation of the underlying silicon into isles after the subsequent backplane lamination or attachment.

For backplane lamination or attachment, a flexible thin backplane (such as a suitable prepreg or polymeric material in the thickness range of about 50 μm to 200 μm) may be laminated to the IBC M1 metal side. The backplane sheet may be substantially the same size and shape as the wafer (or slightly larger if desired for cell edge protection). The backplane serves several important functions including as a permanent support to provide high yield thin silicon cell manufacturing and support the segmentation of the silicon wafer/into a plurality of physically and electrically segmented cells on one cohesive backplane. The solar cell design referred to herein as 'iCell' or 'island cells' including embedded electronics.

The backplane supported silicon wafer may then be thinned down to an optimal thickness (for example in the range of approximately 80 μm to as thin as a few microns depending on the specific application for the resulting solar cell) using a wet (such as with hot KOH or TMAH or with mixtures containing HF and $HNO_3$) or dry (plasma or reactive ion etch RIE) silicon etching process. Alternatively, abrasive processes such as grinding or lapping or chemical-mechanical polishing (CMP) may be used to reduce the silicon thickness. Other methods such as laser splitting or MeV-range hydrogen ion implantation followed by thin silicon cleavage/exfoliation may be used and the separated substrate may be reused to make additional solar cells depending on the starting wafer thickness.

The iCell (isled solar cell) structure may then be formed through pulsed ns or ps (or fs) laser ablation, ultrasonic drilling, or mechanical sawing of the silicon wafer to form silicon isolation trenches and create sub-cells or isles (all supported by the common backplane). Cutting or scribing processes may be tuned such that the trench goes all the way through silicon to the backplane, or that the trench ends with a thin layer of silicon still remaining which is then removed during a subsequent final wet etch and/or wet texturing process (which may also remove sidewall damage caused by the cutting process).

Subsequently, remaining cell process steps may be carried out including, for example, the aforementioned sunnyside texture (for improved light trapping), followed by post-texture cleaning.

The following description and corresponding process flows teach several embodiments for fabricating an optional front surface field at this point in cell manufacture process, all of which use processes that are essentially "low temperature" in the sense that they are compatible with a backplane that can only withstand extended thermal processing at temperatures up to around the 300° C. range.

Then front side passivation and anti-reflective coating (ARC) layer deposition may performed (for example by PECVD followed by drilling vias into the backplane to access the buried M1 layer) followed by the backside final patterned solar cell metallization (second level metallization: Metal-2 or M2) process for isle/subcell interconnection. M2 deposition may be performed as a patterning process (for instance, PVD with in-situ shadow masking) or as a blanket process with subsequent patterning (for instance, using blanket PVD of aluminum with a suitable capping layer such as an optional nickel or nickel-vanadium, which may further comprise an optional top cap of tin (Sn) or other solderable surface material, and a subsequent pulsed laser ablation to pattern the M2 metal).

And while the examples and descriptions provided herein utilize crystalline silicon, other crystalline semiconductor materials may be utilized as well, such as gallium arsenide (GaAs) or combinations, for instance of silicon with GaAs, optionally with a germanium (Ge) or silicon-germanium ($Si_{1-x} Ge_x$) buffer layer between the Si and the GaAs. Further, while the examples provided are back contact cells, the inventive concepts disclosed herein may be extended and readily adopted to other cell designs, such as non-IBC back-contact cells, or front contact cells, and may be especially applicable as a technological simplification choice when integrating GaAs into the Si process.

While alternative variations and embodiments of solar cell structures in accordance with the disclosed subject matter, exemplary embodiments are provided in the cross-sectional diagrams of FIGS. 5D and 5E.

The structure of FIGS. 5D and 5E is an interdigitated back-contact/back-junction crystalline semiconductor solar cell comprising a thin (for example having a thickness sub-100 μm in the range of a few microns up to approximately 100 microns) crystalline silicon layer formed by optionally etching back a thicker CZ or monocast (quasi-mono) silicon layer using wet or dry etching or by abrasive thickness reduction such as grinding or lapping (or alternatively using a starting thin sub-130 μm wafer, without a need for dedicated silicon thinning etch back process).

It is to be noted that thinning/etching back the silicon after backplane lamination (other than any silicon thickness reduction as a result of the texturing process) may not be required in some instances if a wafer with suitably high lifetime and/or sufficiently reduced starting thickness is used. Such a structure optionally allows for completing the front surface processing, including texture and passivation to a point prior to lamination. This has the potential advantage that high temperature processes to form a doped front-surface field (FSF) layer (using phosphorus diffusion or phosphorus ion implantation and thermal anneal activation, or another technique) and to passivate the front surface, with relatively high thermal budgets which are not compatible with a flexible polymer containing backplane, may be carried out prior to the lamination. For instance, a diffused front surface field (from diffused phosphosilicate glass: PSG, $POCl_3$ or implanted phosphorus as precursors) may then be employed. The use of the backplane enables the physical segmentation of the cells into isles/sub-cells for icell fabrication and with it the high voltage-low current solar cell architecture which in turn removes the need for a thick metallization scheme and the need for thick metal (such as copper/nickel/tin) plating process and associated technological risks, such as contamination of the active silicon with copper. Elimination of plating also reduces the overall solar cell manufacturing cost and capex. Backside passivation may include a material stack such as a phosphosilicate glass on a borosilicate glass.

The sunny side of the thin-silicon solar cell comprises a light-trapping texture (formed by wet etch texturing and/or dry laser or plasma texturing) and a subsequent PECVD process to form the passivation and anti-reflection coating (ARC) layer(s).

The back-contact/back-junction solar cell of FIGS. 5D and 5E comprises semiconductor absorber layer having a first level metal (M1) made using a suitable (low-cost and high electrical conductivity) metal layer such as aluminum or aluminum-silicon alloy forming an interdigitated back-contact (IBC) emitter and base metal finger pattern, for example a busbar-less IBC finger pattern (fine pattern pitch). Lack of busbars on M1 may eliminate efficiency losses due to busbar-induced electrical shading. Based on the two-level metallization scheme here, M1 serves as the contact metallization layer (with fine-pitch interdigitated base and emitter metal fingers) while M2 provides the higher sheet conductivity interconnect layer to extract the solar cell power with minimal ohmic losses.

The backside of the thin-silicon solar cell is a thin backplane sheet, for example between 50 and 200 um thick, and may be a flexible polymeric laminated sheet containing fibers, such as a prepreg sheet. The backplane sheet is relatively thermal-expansion-matched (or CTE matched) to silicon in terms of the respective coefficients of thermal expansion (CTE) to mitigate cell breakage during thermal processing.

The interdigitated back-contact/back-junction solar cell comprises a patterned second level metal (M2) which may have a thickness in the range of approximately 1 to 55 um, in some instances having a coarser pitch (and hence less fingers) as compared to M1 and a substantially orthogonal pattern with respect to M1. Patterned M2 is electrically connected to patterned M1 through pre-specified M1-M2 conductive via plugs formed in the backplane. M2 may be any conductive material or material stack including materials such as aluminum, copper, or aluminum with Al/Zn or NiV.

FIG. 5E provides a high level cross-sectional diagram representation of the final solar cell structure for the back contact/back junction thin silicon solar cell, comprising a thin semiconductor (e.g. sub-100 μm crystalline silicon) cell absorber which is formed by etching back a thicker starting silicon wafer, a passivation and anti-reflection coating (ARC) on a textured surface on the sunny side, for example a stack comprised of amorphous silicon (a-Si) and silicon nitride or one of aluminum oxide and silicon nitride; a backplane, for example a laminated flexible polymeric sheet such as prepreg, an interdigitated M1 pattern, for instance, busbarless thin aluminum metal fingers on the cell backside; a patterned orthogonal second level metal, shown here for M2 using patterned metal comprising aluminum and/or copper, where the M2 PVD metal is less than about 10 microns in thickness and in some instances having a thickness in the range of between about 1 and 5 um thick.

Each of the sub-cells or isles in the monolithic icell may include a set of mini bus bars of at least one per polarity through which the connections to adjacent sub-cells are made, in parallel or in series. The emitter and base diffusion regions as well as the IBC metallization pattern may be arranged in an advanced geometry to minimize electrical shading underneath the mini bus bars.

Various process flow options are provided herein to illustrate the capabilities of various aspects of the disclosed processes and structures.

A starting material of n-type crystalline silicon may be selected from monocrystalline silicon (Czochralski or CZ), monocast (also called cast-mono or quasi-mono or seeded cast mono), or cast multicrystalline silicon. The starting wafer size may be a full-square (or full rectangle), pseudo-square (or pseudo rectangle) or other geometrical shapes (e.g., hexagonal, other polygonal shaped, etc.) with areas at least 150 $cm^2$ and in some instances at least 240 $cm^2$. The starting wafer thickness may be less than approximately 250 μm and optionally having the thinnest thickness allowing for the combination of lowest starting wafer cost and high fab yield to enable negligible breakage.

On the patterned and diffused interdigitated backside region, which is covered with a suitable low surface recombination enabling dielectric which includes patterned contact openings to the underlying silicon, a first metal (M1) solar cell contact metallization may be formed directly on the silicon contact regions, where the metal extent may be larger than the silicon contact opening. This first metal (M1) layer may be formed for example, using one of the following methods: screen printing of a paste, inkjet printing of an ink, aerosol jet printing of an ink, or physical-vapor deposition (plasma sputtering, thermal evaporation, electron-beam evaporation, ion beam deposition, or thermal/arc spray deposition). PVD of M1 may require a patterning step such as selective laser ablation of metal after deposition unless the PVD process deposits a patterned M1 layer such as by using an in-situ shadow mask.

The backplane may be a sheet or plate, for example a flexible thin polymeric or composite epoxy resin with fiber content (such as prepreg) sheet laminated to the cell backside after completion of patterned M1. The backplane may also be applied by screen printing, spray coating, or alternative deposition method.

A silicon etch back (wafer thinning) may be performed for example by wet etch or dry etch (plasma or RIE) or alternatively using a suitable grinding or lapping process. This wafer thinning may be economically carried out using hot concentrated KOH (or NaOH) for example with concentrations of KOH above 15% (and as high as 45%) and with temperatures of 90° C. or higher (in some instances, depending on the process controllability, as high as 150° C.).

A second metal layer (M2) on the backplane may be formed for example by a PVD method (e.g., plasma sputtering and/or thermal evaporation, e-beam evaporation, thermal spray, or arc spray) and pulsed laser ablation patterning (for instance using pulsed nanoseconds laser ablation), or by screen printing of a high-conductivity paste comprising aluminum and/or copper or by PVD through an in-situ shadow mask. The latter is feasible as the pattern size and alignment requirements for M2 are substantially coarser than those for M1 (in some instances due to the substantially orthogonal alignment of M2 with respect to M1).

The thin silicon n-type base parasitic resistance may be reduced by either an optional doped front-surface field (FSF) formed by laser doping of phosphorus (or arsenic, antimony, or indium) or by laser activation of implanted phosphorus, arsenic, or antimony on the textured surface, or by formation of a blanket phosphorus buried layer adjacent to the emitter by either phosphorus (e.g., $POCl_3$) diffusion or phosphorus ion implantation with a subsequent shared anneal.

The following paragraphs provide various embodiments of process flows including a general approach as well as examples of individual flow embodiments.

Figure 33:
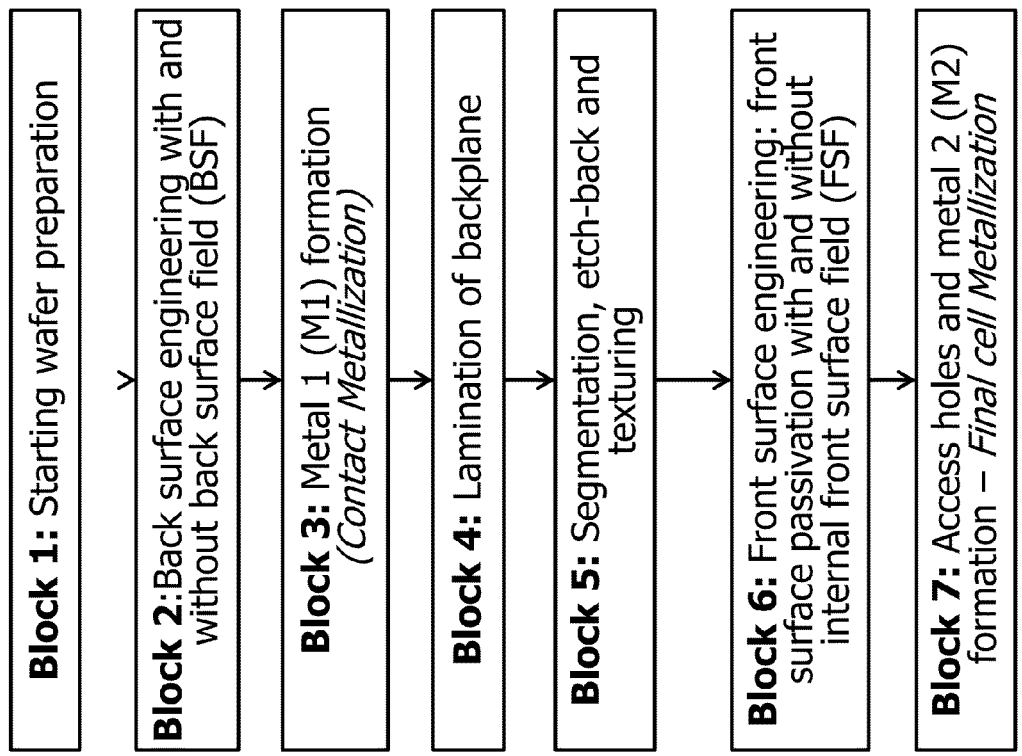
FIG. 33 is a process flow diagram illustrating high-level solar cell building blocks.

For clarity the process flows provided may be divided into seven building blocks, and each building block may contain more than one process tool and more than one unit fabrication process. FIG. 33 is a process flow diagram illustrating high-level solar cell building blocks.

As shown in FIG. 33, the first building block includes starting wafer inspection, selection, and preparation. The second block includes back surface engineering, with and without the addition of a doped back surface field (BSF) during this process sequence. The third block is first level metal (M1) formation (also known as contact metallization). The fourth block is lamination of the backplane to attach the permanent reinforcement backplane. The fifth block includes wafer segmentation into sub-cell units or isles for the formation of the overall monolithic icell architecture, the etch-back, texturing and post texture cleaning. The sixth block includes front-surface engineering, including the front-surface passivation, with and without the addition of an internal front-surface field (FSF). The seventh block consists of generating access to the buried back side as well as the second-level metal (M2) formation and an optional final anneal (which may be done in situ during the M2 PVD process).

Each of these building blocks may contain a variety of process flow embodiments, various examples of which will be described. Different process route options or embodiments within each building block may be combined with different process route options or embodiments of other building blocks. As there are a multitude of combinations possible, the disclosed subject matter includes the broadest scope of all such combinations, even when the given examples do not cover all possible process flow combinations.

Expanding Block 1 in FIG. 33: the starting wafers may first receive an optional inspection followed by an optional pre-clean, followed by saw damage removal (SDR), for instance, using an alkaline chemistry such as hot KOH or NaOH, or acidic chemistry such as HF/HNO3. Following this the wafers may optionally receive a chemical polishing etch, either single or double sided, for instance, using highly concentrated mixtures of HF and HNO3, in some instances chilled. This polishing etch is followed by a short KOH etch to remove etching stains such as porous silicon from the surface. Afterwards, wafers receive a metal removal clean, for instance, using HCl or mixtures of HCl with HF, or ozonated HF, optionally followed by a final HF dip to render the surface hydrophobic and remove the native silicon dioxide (and to make the crystalline silicon surface hydrogen terminated as a result of dilute HF dip treatment).

Next, expanding on Block 2 of FIG. 33, back surface engineering with and without the addition of a back surface field (BSF) or improved back surface base electrical sheet conductivity enhancement (to reduce the parasitic base resistance and its detrimental impact on the solar cell fill factor). This aggregate block of processes consists of several process steps. It may start with an optional back surface electrical conduction enhancement designed to overcome a large resistivity spread or variations among starting wafers across ingots and among ingots. Such resistivity spreads may result in excess base resistance and therefore non-optimal (reduced) solar cell fill factor, or in the case of a high doping to insufficient minority carrier lifetime of those starting wafers which are on the lower scale of the bulk resistivity (or higher background doping concentrations). However, there are ingot growth methods available that provide tight enough resistivity specifications and spread to not require back surface conduction enhancement, such as continuous CZ ingot growth techniques. Example flows utilizing ingots and wafers with a tight resistivity specification are depicted in FIGS. 34A through 34D. In cases where a back surface conduction enhancement is desired, several representative embodiments are presented. The first embodiment is shown in the example flows in FIGS. 35A through 35D and provides the introduction of an n-type dopant such as phosphorus by means of POCl3 thermal furnace doping, in conjunction with a thermal drive-in step, and by a subsequent wet etch (HF dip) removal of the remaining phosphorus doped glass (phosphor-silicate glass or PSG) from the surface. A second embodiment is shown in the example flows in FIGS. 36A through 36D and provides an ion implantation step of n-type dopant species such as phosphorus (P), arsenic (As), antimony (Sb), or indium (In). This implant (such as phosphorus implant) is then thermally annealed as part of a later furnace anneal step described below and which serves several purposes.

Following saw damage removal step (process Block 1) or for alternative embodiments following the back surface electrical sheet conduction enhancement steps, an atmospheric pressure chemical vapor deposition (known as APCVD), or alternatively PECVD, of a first layer of boron-doped glass (such as BSG) is performed. The BSG layer may have a comparatively low boron concentration to enable the formation of a selectively lighter-doped emitter with a comparatively higher sheet resistance across the cell, and is subsequently patterned, for example using a pulsed picoseconds (ps) or femtoseconds (fs) laser or alternative laser capable of ablating the BSG dielectric at minimal to no damage to the underlying silicon. Wherever the BSG is removed during ablation, a higher boron-doped emitter (to be utilized for low-resistance emitter contact regions) will be formed in further processing. Subsequently a second layer of BSG, which may have a comparatively higher concentration of boron, is deposited by APCVD (or alternatively PECVD) and which may serve as a precursor for the selective emitter contact.

Subsequently, an additional patterning step using a pulsed picoseconds or femtoseconds laser may be employed removing BSG in regions where the n+ doped base contact regions should be formed. A layer of phosphosilicate glass (PSG) may then be deposited (by either APCVD or PECVD) which serves as the precursor for the phosphorus doped base contact regions (with n+ doping for low base contact resistance).

The evolving solar cell structure then undergoes a high temperature furnace anneal which drives in the patterned p-type and n-type diffused regions into the structure backside. This anneal may be performed in an inert and/or oxidizing ambient or a stepwise mixture of inert and oxidizing ambient and at temperatures above 800° C., more specifically between 850 and 1100° C. Additional steps such as gettering, for instance in temperature ranges around 550° C. to 650° C., or even forming gas anneals, typically carried out in temperature range of 400° C. to 500° C. (e.g. at 450° C.) may also be integrated into the above annealing step. In cases where the back surface had previously received an implanted dopant, as mentioned above, for instance, using phosphorus and arsenic, then this thermal anneal step also serves to anneal, activate and diffuse the implant region.

It is, however, also possible and may be advantageous to push and pull the furnace at a relatively high temperature so that faster heat-up and cool-down rates can be established which serves to arrest oxygen precipitation from the wafer material and may also improve furnace process throughput. Example pushing and pulling temperatures are chosen such that the boats are pushed and pulled at temperatures above 600° C., and in some instances at or above 800° C. to 850° C. Such high temperature pushing and pulling of the furnace boats may be implemented instead of or in conjunction with the lower temperature gettering and FGA depicted in most flow embodiment examples.

Subsequent to the furnace anneal a laser, for example a pulsed picoseconds or femtoseconds laser is employed to open the contacts to the respective emitter and base contact regions for subsequent M1 contact metallization process. Optionally, an additional anneal, for instance in an inert non-oxidizing ambient, may then be performed to reduce potential damage from the laser contact opening step.

It is to be noted that above described ablation processes to locally remove dielectric such as doped glasses using a laser to generate the desired pattern may also be achieved by means of using a suitable etchant paste. For a unit process of such etchant paste, the etching paste is applied locally, for instance using screen printing. Depending on the nature of the etchant paste (for instance containing or not containing hydrofluoric acid) the etching mechanism may require a thermal activation (for such pastes not based on hydrofluoric acid). This activation may be achieved, for instance, in a belt or roller furnace and is part of the etch dimension and depth control. Subsequent to etching, the etching paste may be removed by means of a cleaning and rinsing step, for instance using light alkaline solutions, followed by DI water rinsing and optional metal removal steps such as a short HCl containing wet clean.

Interdigitated back contact structure with local diffusions of different concentration and opposite polarity may also be formed using dopant paste, applied for instance using screen printing, with subsequent thermal drive-in. This replaces the deposition and subsequent patterning of dielectric dopant precursors such as doped glasses. Combinations of the above processes are also readily derivable.

Block 3 of FIG. 33 includes the first level metallization (M1 or solar cell contact metallization) formation. For M1, two distinctly different path examples or process embodiments are provided. First, the application of patterned first level metal M1 in the form of screen, stencil, inkjet or otherwise printing a paste or ink, in one printing step or optionally in more than one coat, with optional drying steps in between, followed by a main curing process, which in turn may consist of several curing steps in one curing tool such as a tube furnace or an in-line furnace, to first drive out or burn off binder from a paste, followed by a resistivity reduction sintering step. Suitable pastes may be made of aluminum, aluminum alloyed with silicon and/or germanium, as well as nickel, silver, or other conductive materials. Process examples printing the M1 layer are depicted in FIGS. 34A through 36D and FIGS. 38A through 41B. Alternatively, the first level metal may be deposited in a blanket mode, for instance using PVD (such as DC magnetron plasma sputtering), of for example aluminum, aluminum alloyed with silicon and/or germanium, as well as nickel (Ni) or nickel-vanadium (NiV). After the PVD deposition, the blanket metal layer is patterned, for instance using a pulsed nanoseconds, picoseconds, or femtoseconds laser to ablate metal between the terminals or anywhere else where it is not desired. Illustration of an example of such a process flow is depicted in FIG. 42. Combinations of printing and PVD are also feasible, as well as the addition of conductive dots such as paste or ink dots in regions where additional thickness and/or an alternate metal is desired.

Further, there are embodiments to the second and third process blocks provided below. For example: the selective emitter design (comprising less heavily doped main field emitter and more heavily doped emitter contact regions) previously presented utilizes a dual layer BSG deposition and a pulsed picoseconds or femtoseconds laser patterning step may also utilize a single BSG layer to generate the lightly doped emitter region and a selective pulsed nanoseconds laser drive-in and alloying step for the highly doped part of the emitter (using p++ doping from subsequent M1 aluminum layer) which serves directly as an emitter contact. For such a process the first BSG patterning and the second BSG deposition processes are omitted. Instead, the first level metal (in this case aluminum or an alloy of aluminum with silicon and/or germanium) is driven in (serving as p-type heavy emitter contact doping) subsequent to deposition by using a pulsed nanosecond laser which melts the surface of M1 layer, for instance Al and creating a eutectic Al—Si melt, and alloys it with the underlying silicon. The deposited M1, for instance Al, may be deposited and patterned using PVD with a subsequent laser ablation for patterning or may be formed using a screen printing or inkjet printing (or another printing) process using a frit-less aluminum-containing paste. In the case of the PVD with subsequent laser ablation pulsed laser ablation may be used for patterning in the same tool or same step as the laser emitter contact alloying—in other words using two different laser processes in the same tool.

Alternatively to laser based contact opening of the emitter and base regions for the subsequent M1 metallization at the end of the second processing block, a suitable M1 paste with a frit or other etching component may be used, which, upon thermal processing, locally etches through the dielectric and makes contact to emitter and base regions without the need of a laser based contact area dielectric ablation. The M1 paste containing frit may also be split into a dual print paste with different pastes for the different polarity regions (emitter and base) and which may be thermally annealed at the same time or in two different steps, depending on the optimum annealing conditions for high quality ohmic contact while retaining reasonably low contact recombination for both polarities.

After the back surface engineering and first level metal (M1 or contact metallization) formation described above, the wafer is ready for the fourth process block, Block 4 in FIG. 33, laminating a backplane, for example a flexible backplane, onto the structured wafer backside. While the backplane may be made of a variety of materials, it may be advantageous that the backplane adheres to several requirements depending on the solar cell fabrication method and resulting cell use: 1) the backplane may have a close thermal expansion coefficient match to the underlying patterned silicon stack; 2) the backplane may have flexibility; 3) the backplane may be chemically resistant to subsequent wet and dry processing steps such as silicon etching and texturing (unless all wet processing is performed prior to the lamination process), and; 4) the backplane should withstand the thermal budgets of the subsequent passivation dielectric anneal and second level metal deposition processes and allow for sufficiently high temperature processing (e.g., up to approximately 300 or even 400° C.).

The lamination process may be a vacuum lamination process to avoid formation of bubbles at the interface between the backplane sheet and the silicon layer with the structured M1-metallized backside. Sufficient pressure should be exerted (between 10 and 400 psi or in some instances more specifically between 50 and 250 psi) during the lamination to enable the flow of resin from the prepreg backplane laminate which in turn planarizes the laminated cell structure. The size of the prepreg may be chosen to closely match that of the cell to be laminated while slight over- or undersizing may bear advantages for subsequent processing. The backplane sheet may have a thickness in the range of about 50 microns to 250 microns. After the lamination, an optional edge trim may be performed, for example using a pulsed nanosecond laser.

The fifth process block Block 5 in FIG. 33, pertains to the optional segmentation of the wafer into sub-cells (isles) to form an icell (or isled master cell), silicon thinning for example using wet or dry chemical etching or abrasive methods, and texturing and post texture cleaning After the lamination is complete, the wafer backside structure is laminated to the backplane and the backplane itself protects the buried backside structures from subsequent processes. Subsequently, the wafer may be: 1) thinned—to enable the use of lower lifetime wafers for making highly efficient back-contact solar cells with thinned absorbers; 2) the absorber material segmented into electrically isolated (via trench isolation) monolithically-integrated individual sub-cells (isles) which are later electrically interconnected in series or in parallel or in a combination of parallel and series; 3) textured on the front surface, for example to form random pyramidal structures on the front surface, followed by cleaning of the textured surface prior to the PECVD passivation process.

Figure 37A:
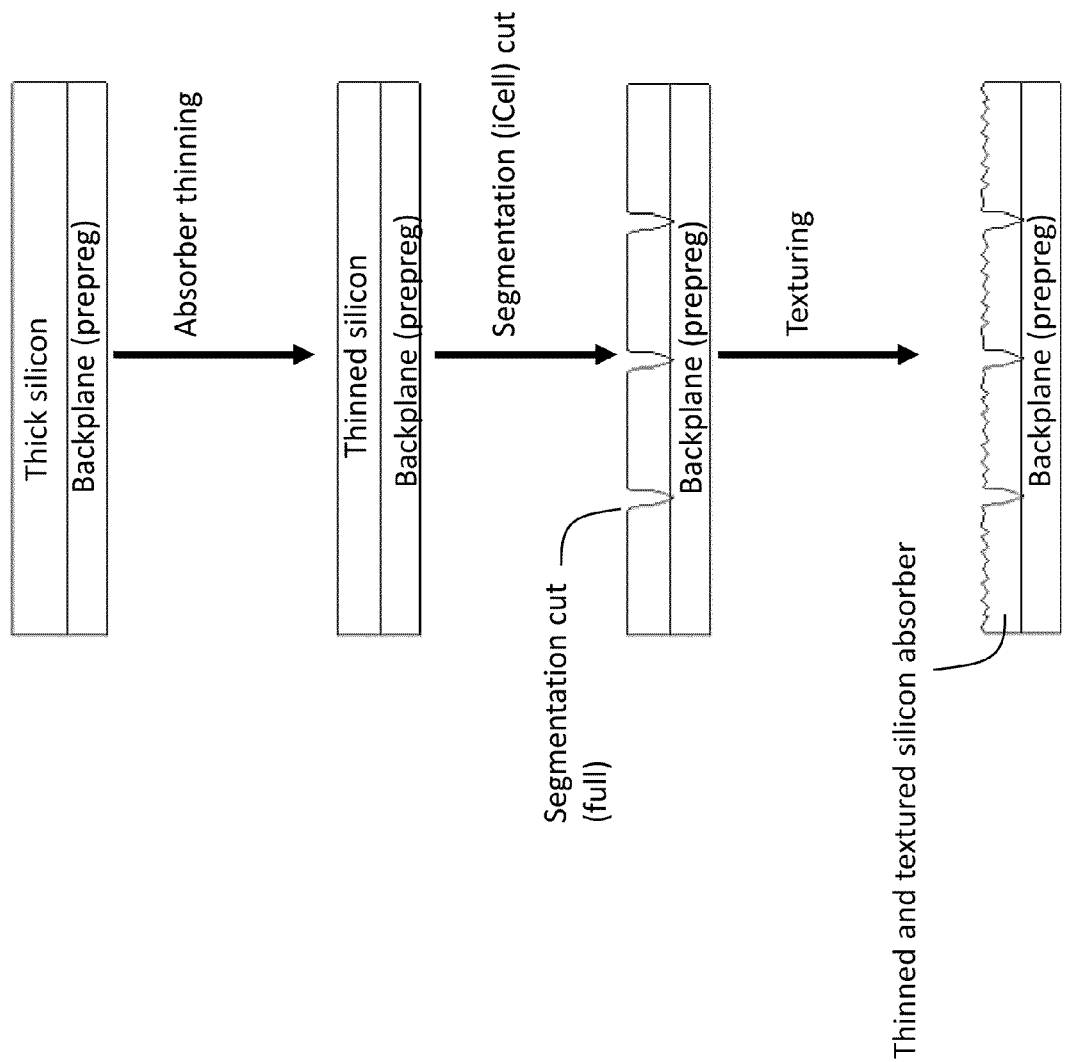
FIG. 37A illustrates cross-sectional diagrams showing a process comprising a wafer thinning step prior to wafer segmentation.
Figure 37B:
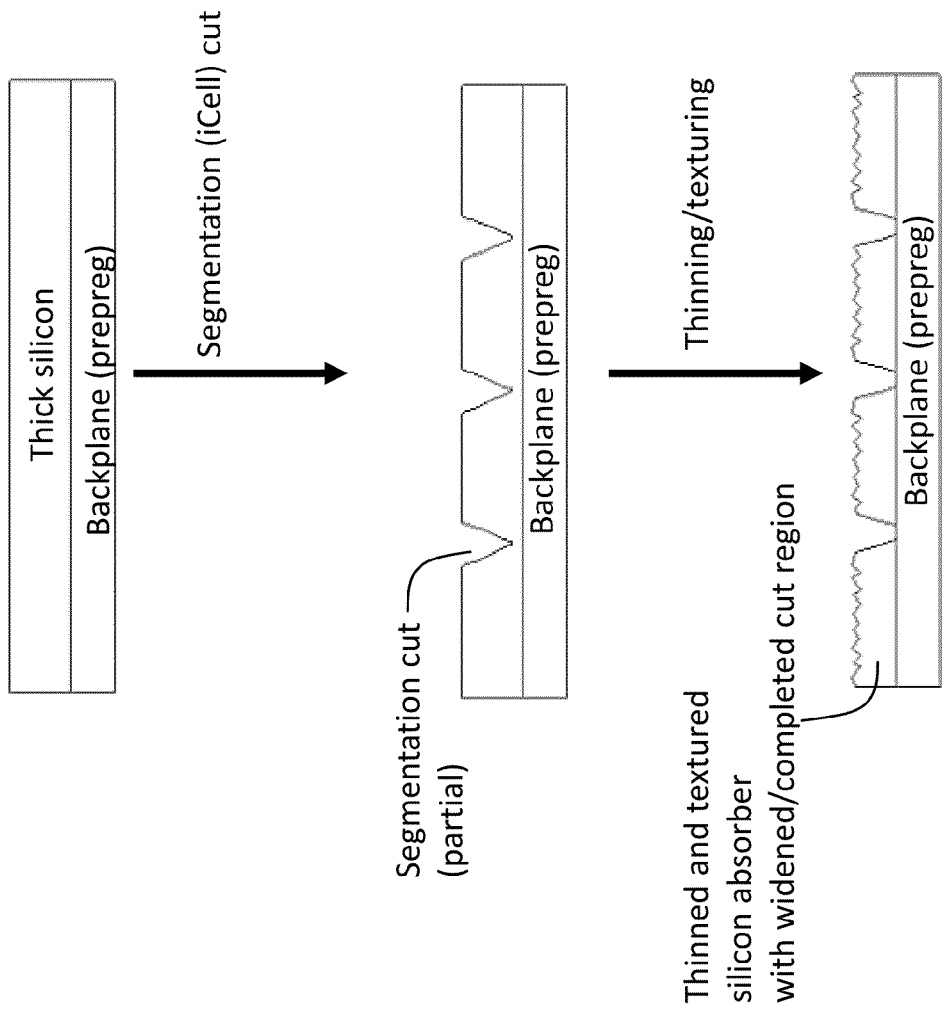
FIG. 37B illustrates cross-sectional diagrams showing a process comprising partial wafer segmentation prior to wafer thinning and following wafer thinning and texturing.
Figure 38A:
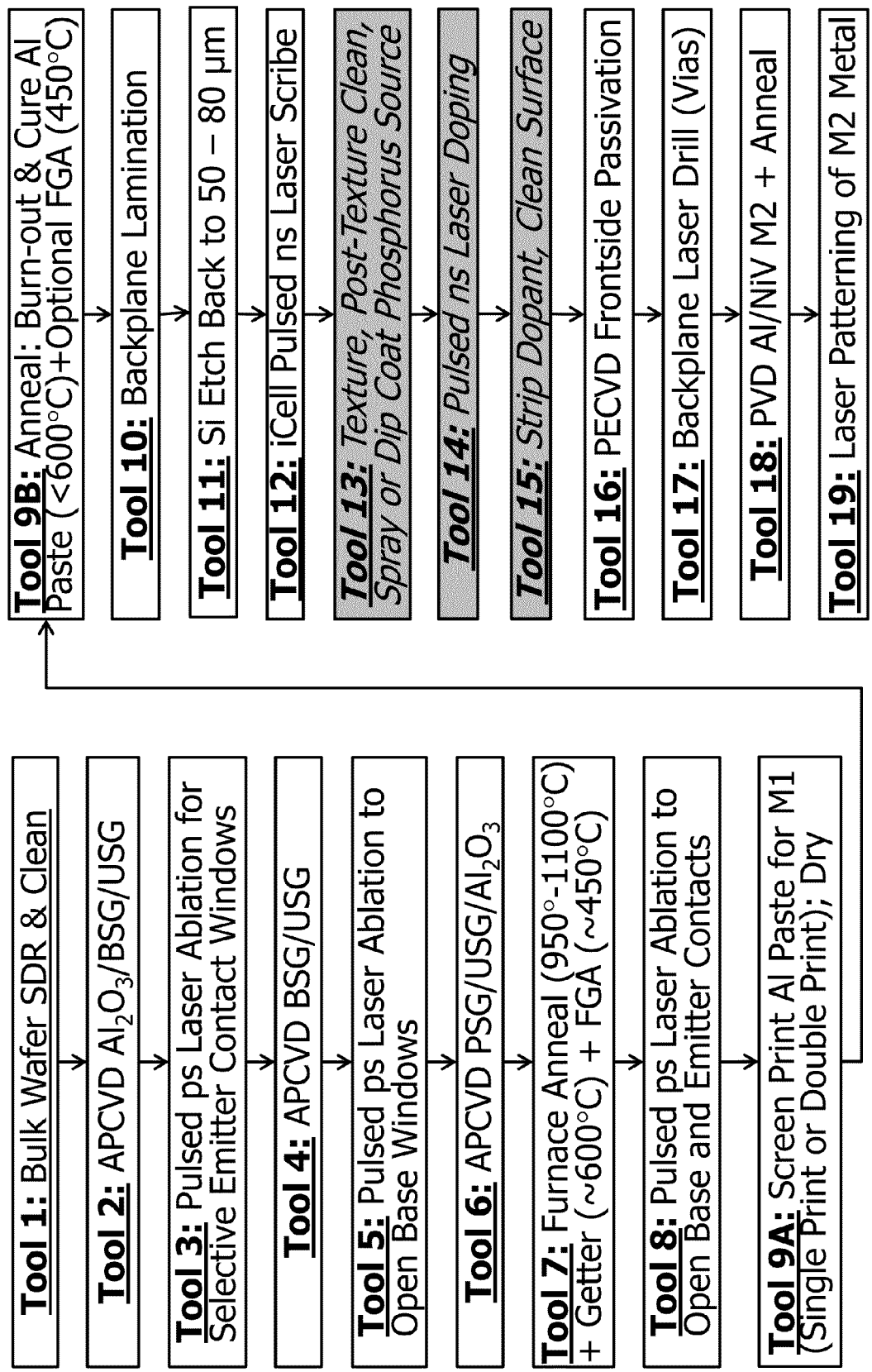
FIGS. 38A through 38D are process flow embodiments for the manufacture of interdigitated back contact solar cells with laser-doped FSF.
Figure 38B:
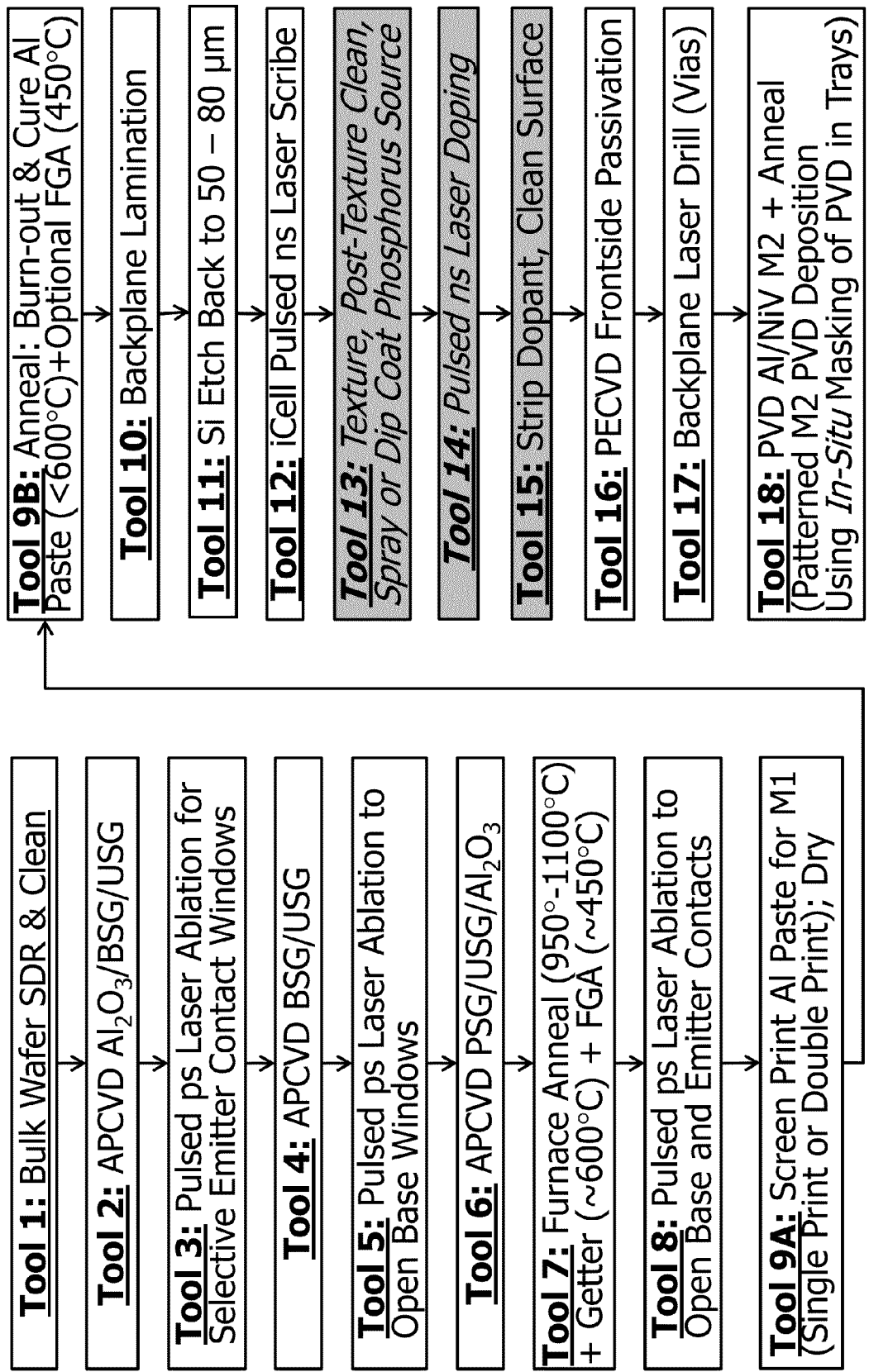
Figure 38C:
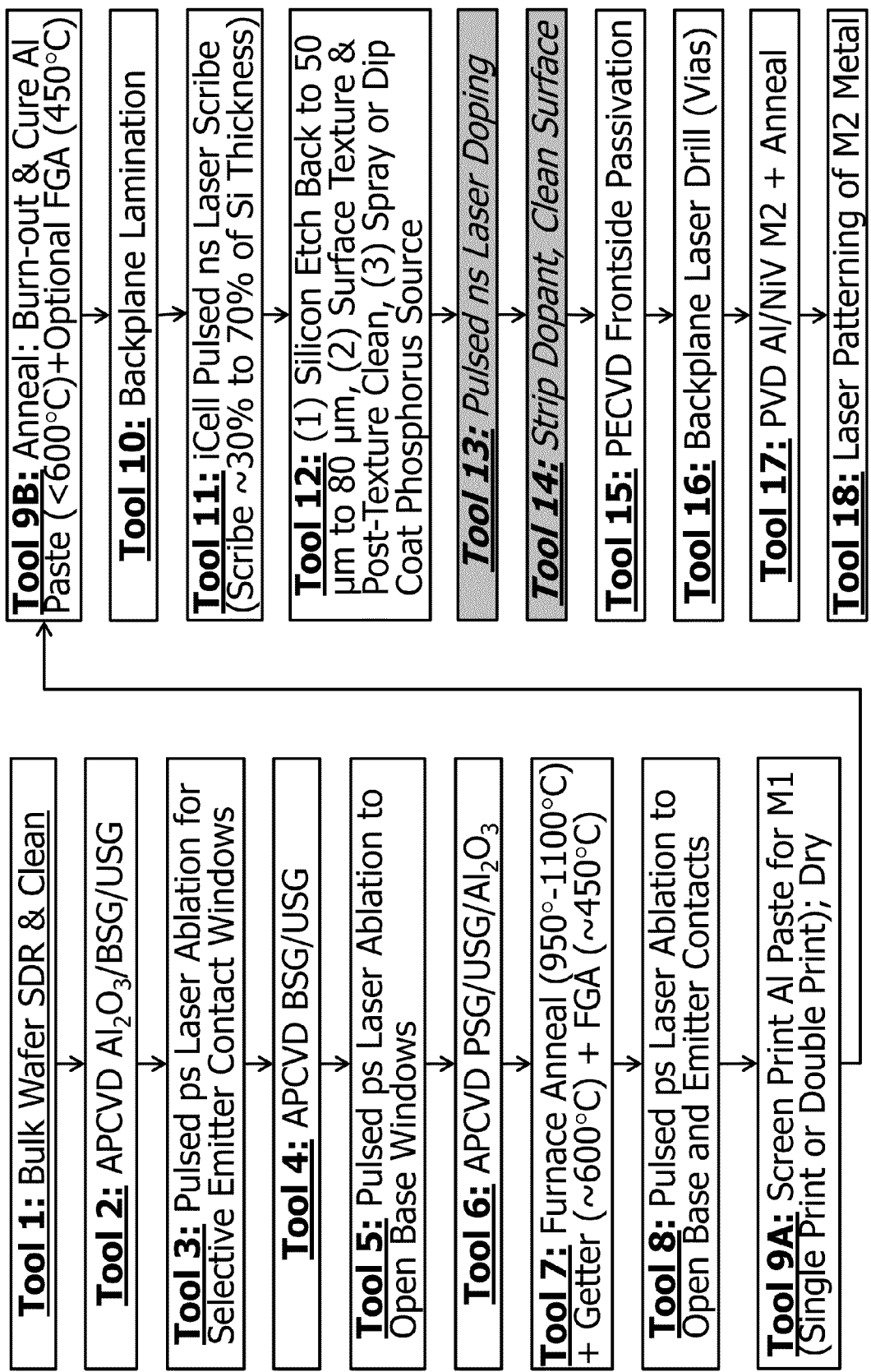
Figure 38D:
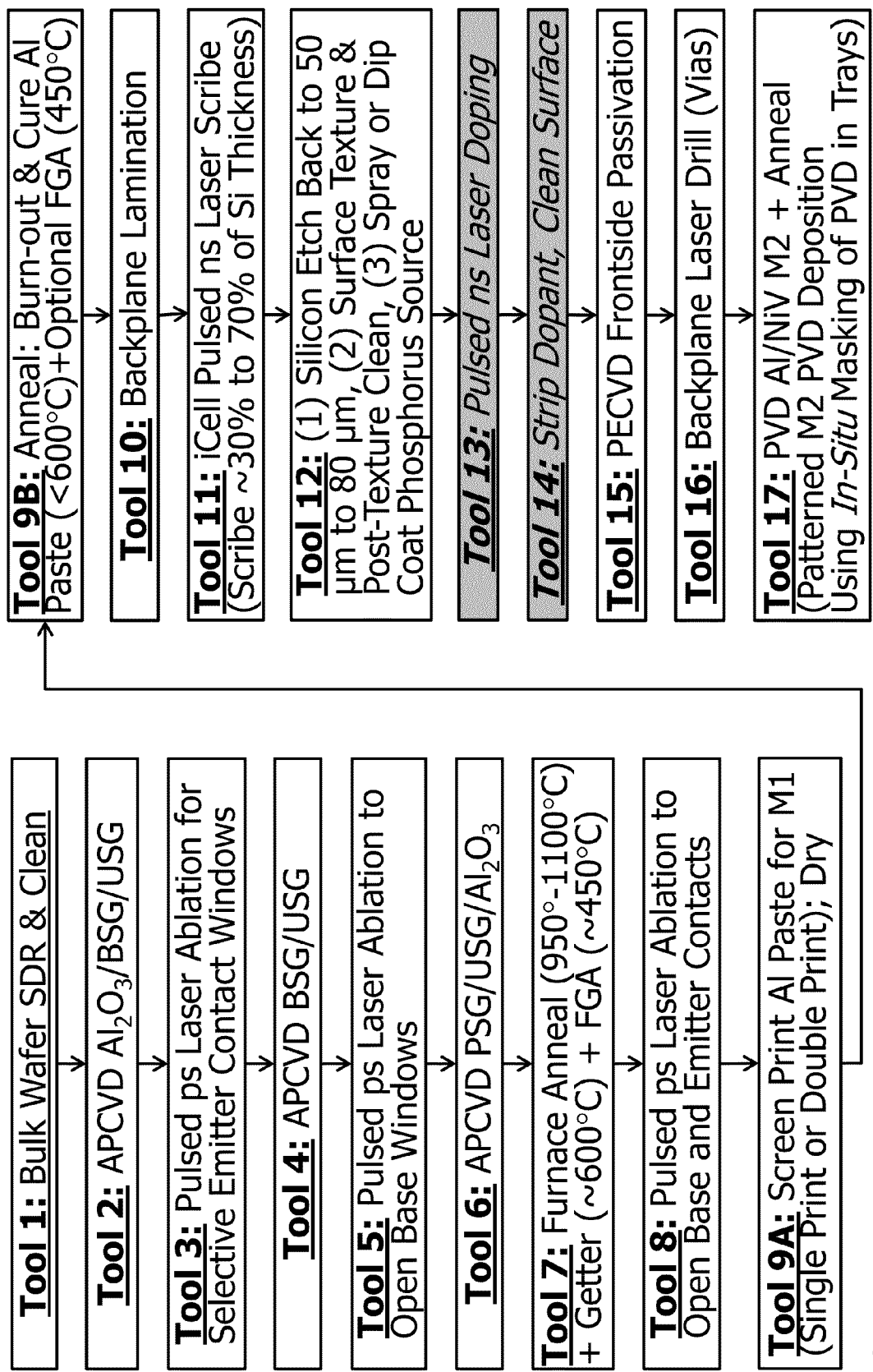
Figure 39A:
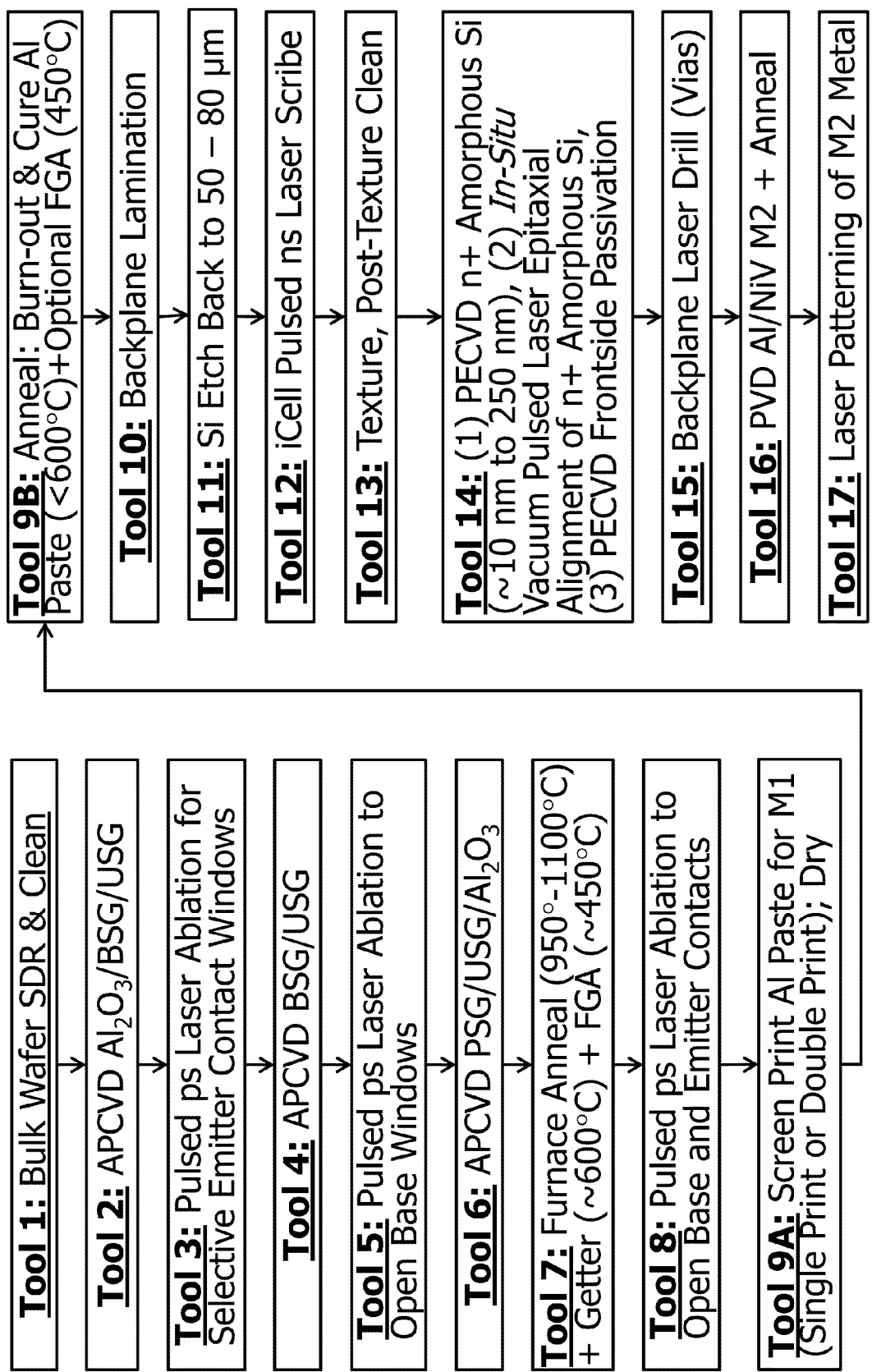
FIGS. 39A through 39D are process flow embodiments for the manufacture of interdigitated back contact solar cells with pulsed laser FSF.
Figure 39B:
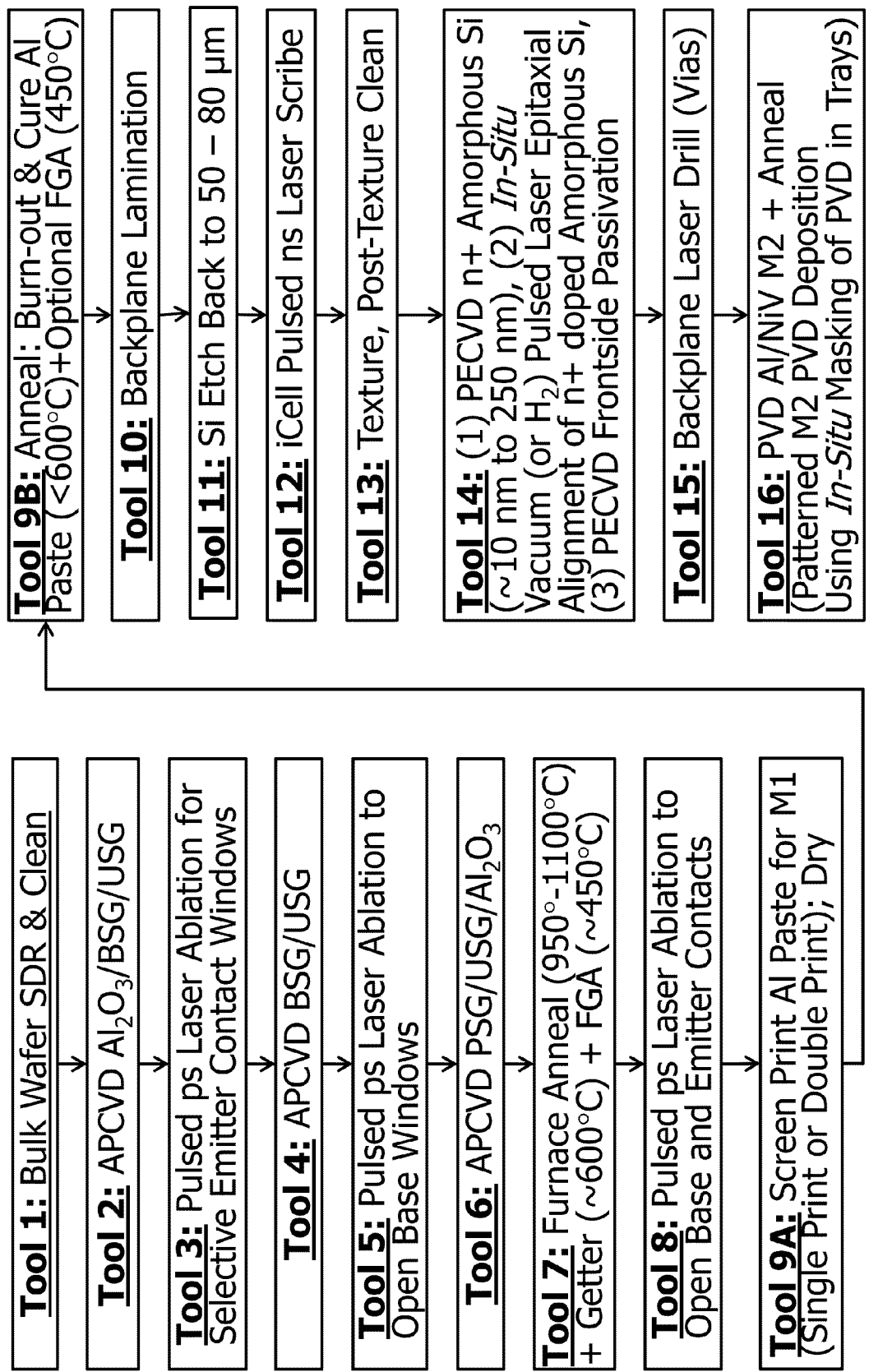
Figure 39C:
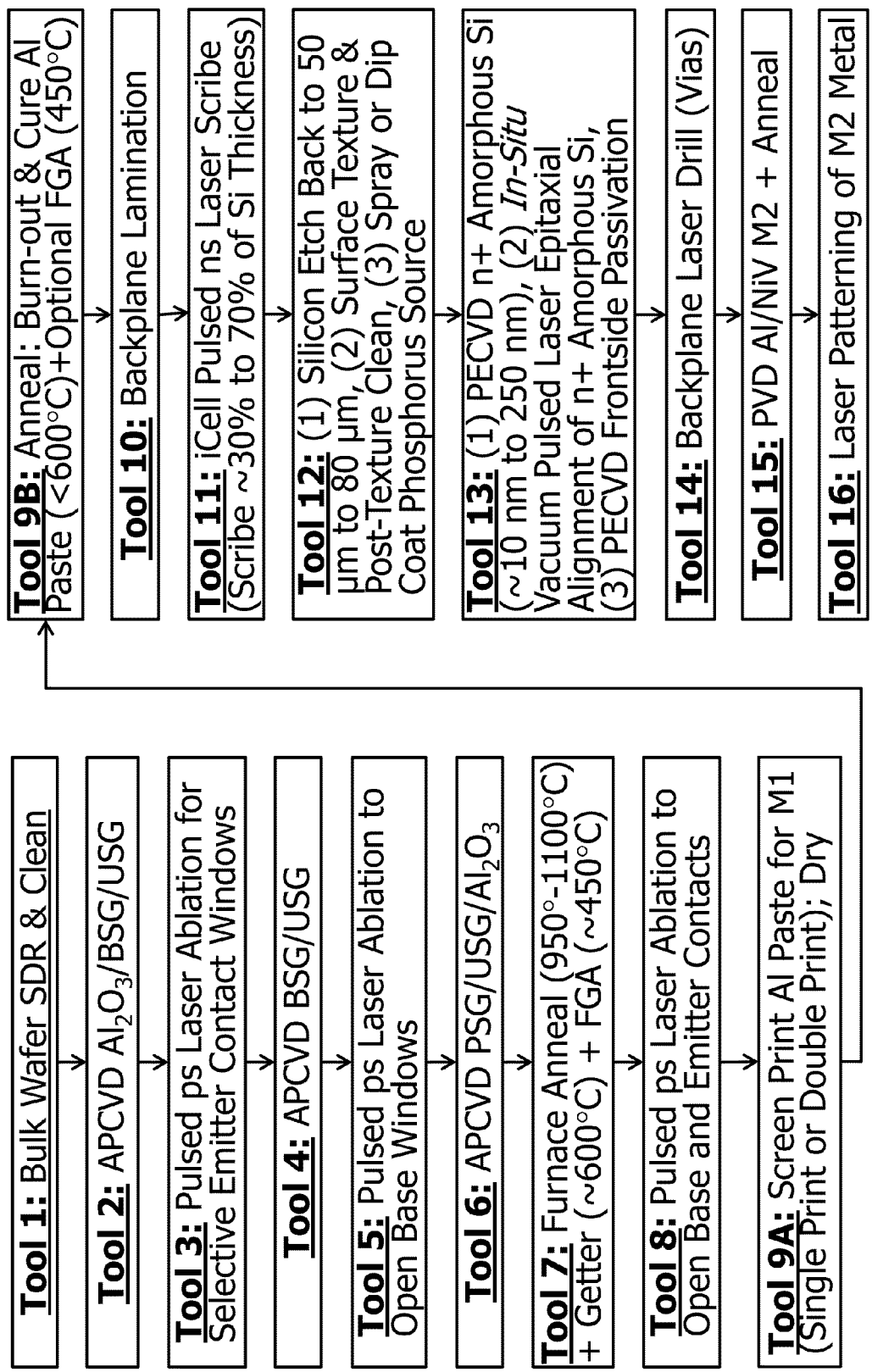
Figure 39D:
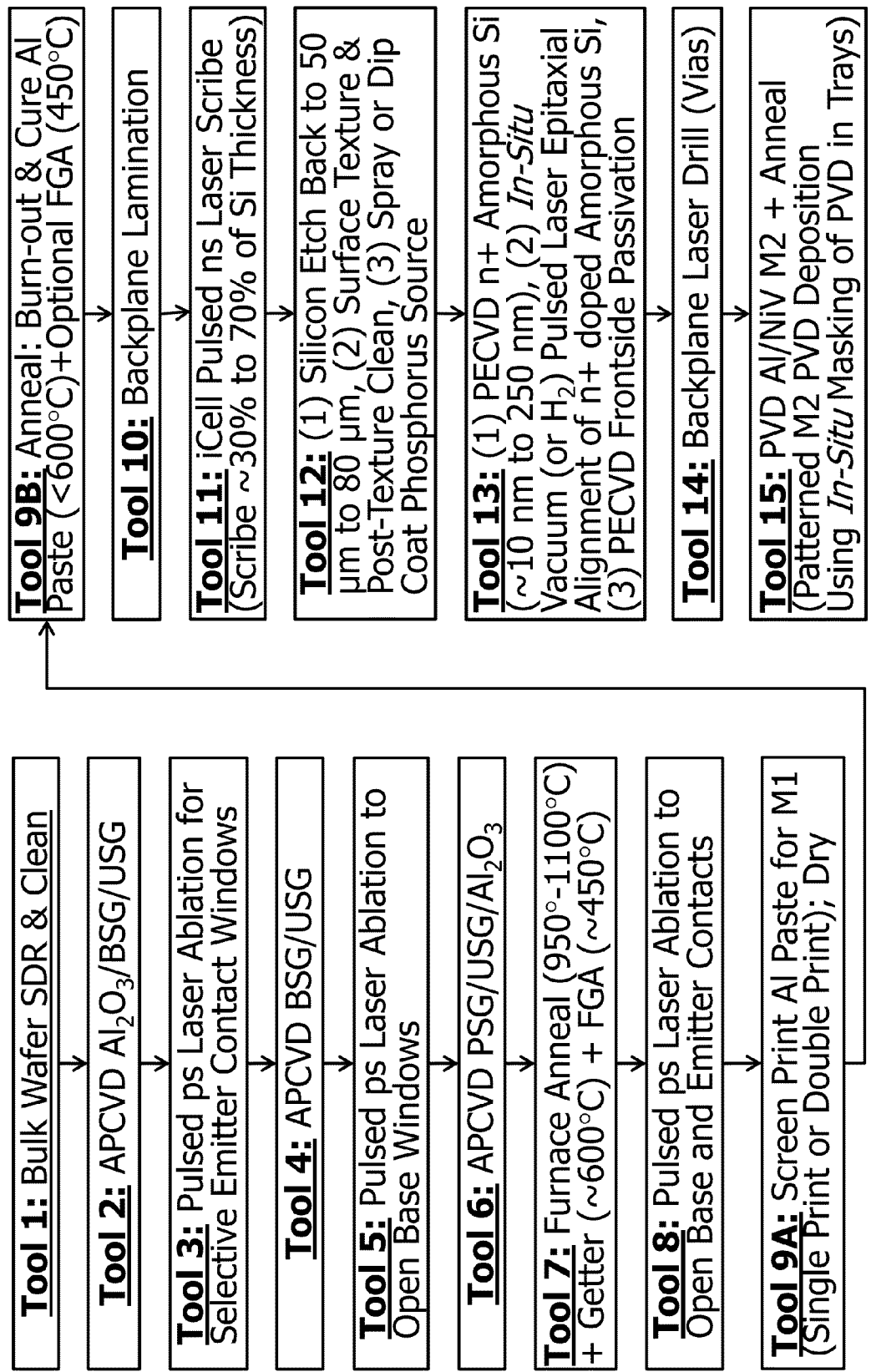
Figure 40A:
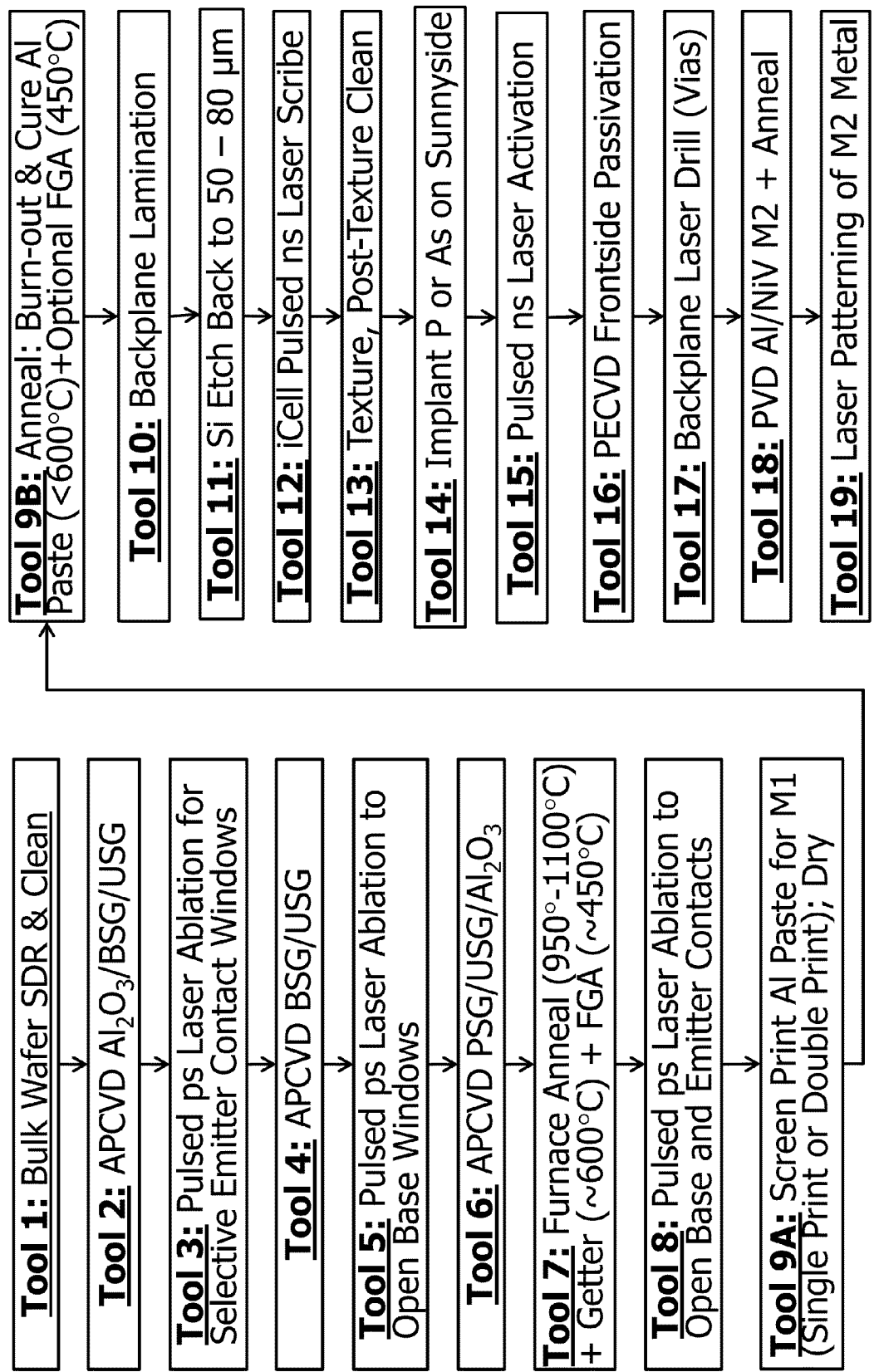
FIGS. 40A through 40D are process flow embodiments for the manufacture of interdigitated back contact solar cells with ion implantation FSF.
Figure 40B:
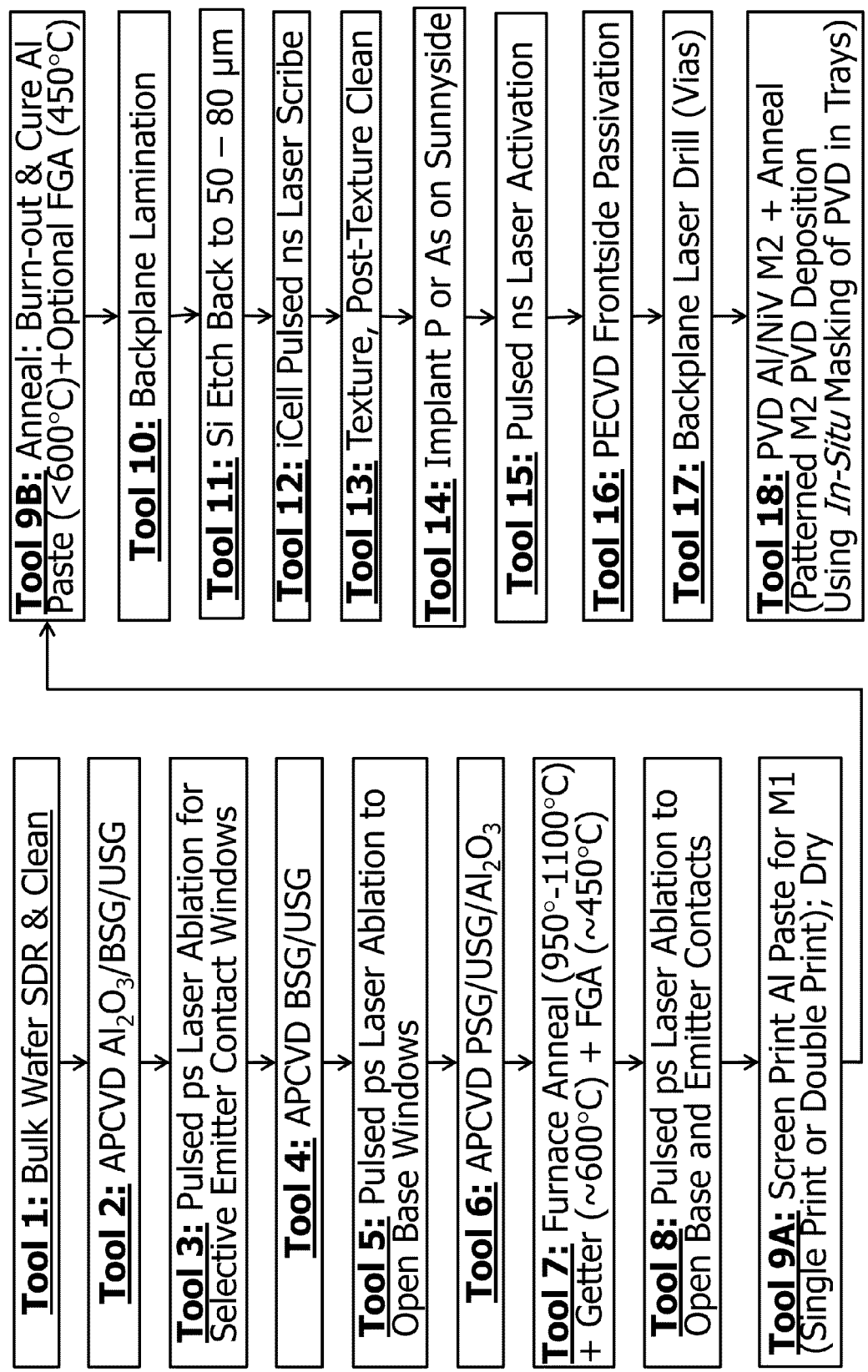
Figure 40C:
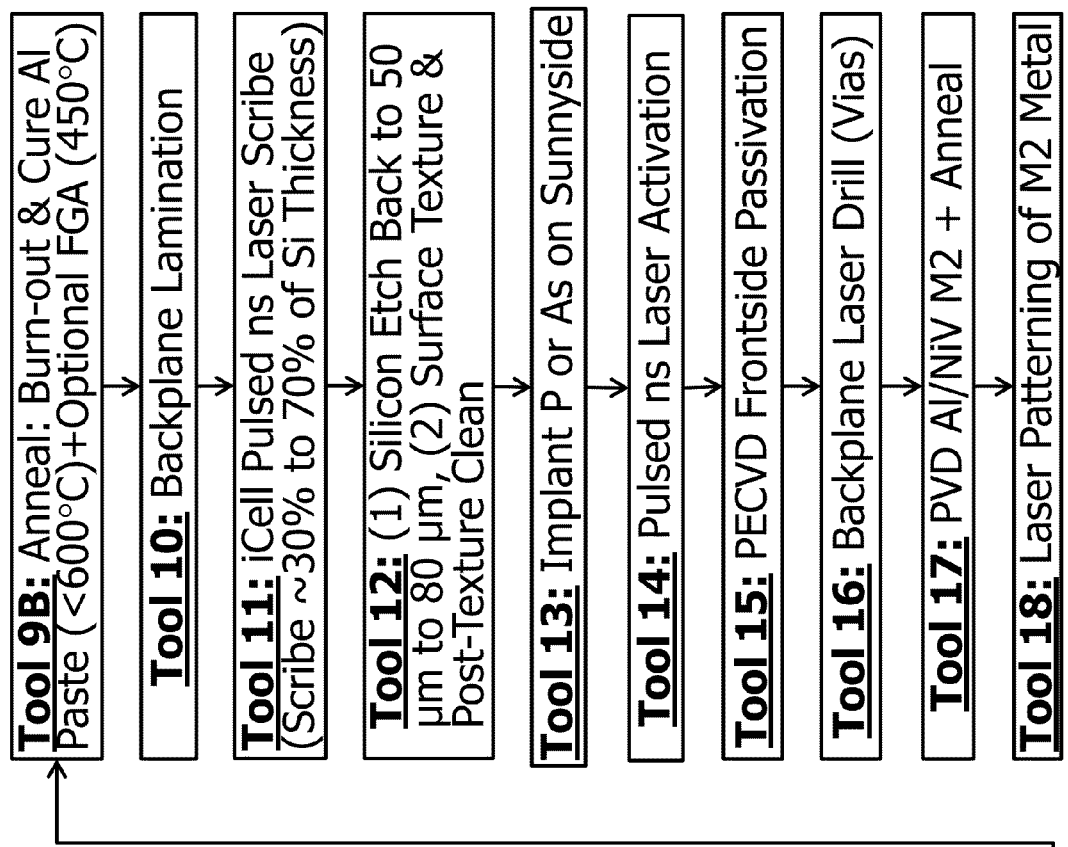
Figure 40D:
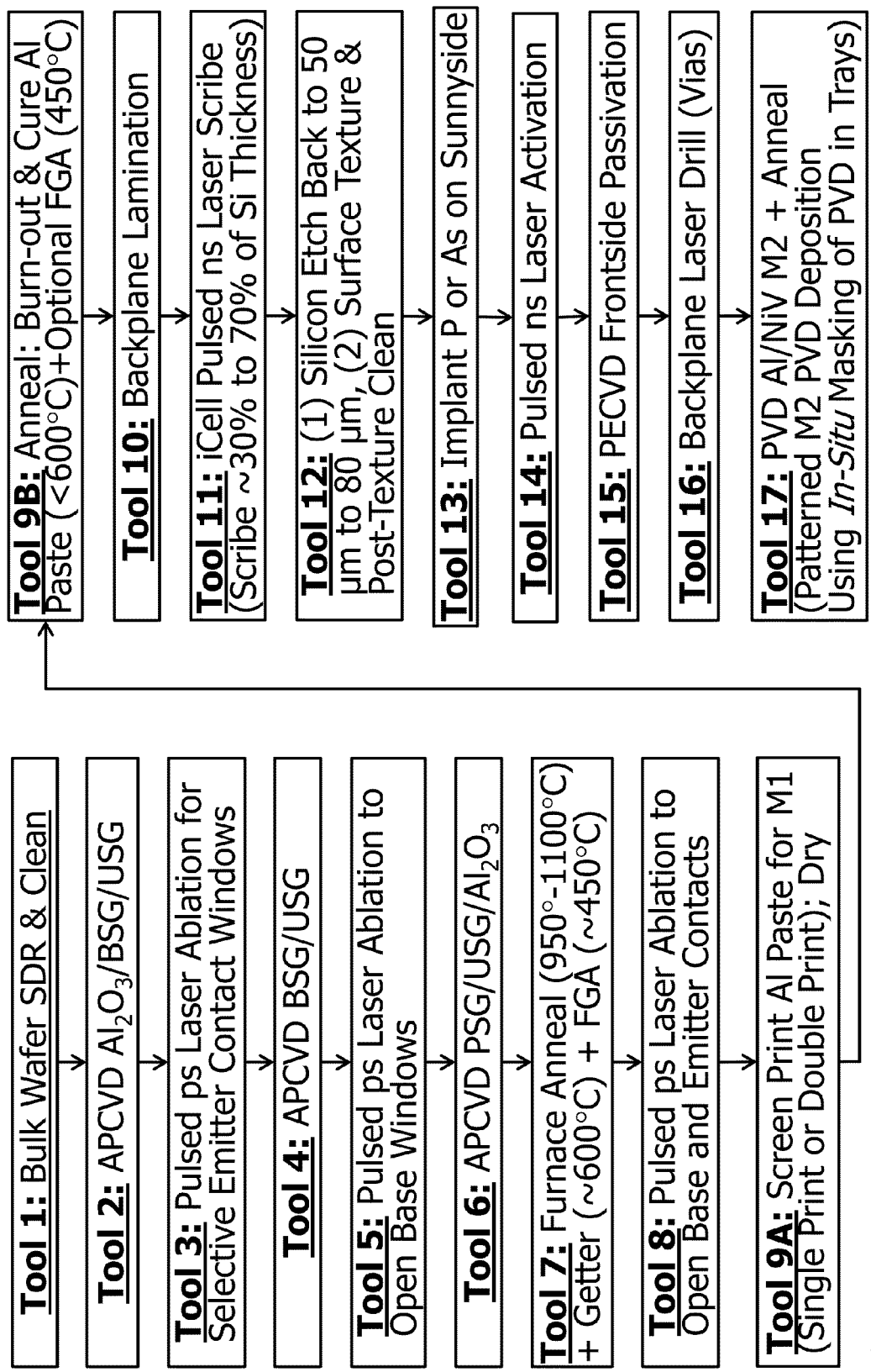

Various different embodiments are possible to achieve the above result of a thinned, segmented, textured array of individual cells on the backplane. The cross-sectional diagrams of FIGS. 37A and 37B illustrate different process sequences as well as the structures during and at the end of the sequences. FIG. 37A illustrates cross-sectional diagrams showing a process comprising a wafer thinning step prior to wafer segmentation (for example using laser trench formation) and FIG. 37B illustrates cross-sectional diagrams showing a process comprising partial wafer segmentation (for example using laser trench formation) prior to wafer thinning and following wafer thinning and texturing.

In one embodiment the segments/isles are first formed with a pulsed laser isolation trench either fully through the complete absorber layer or partially through the absorber layer (for instance a trench depth suitable such that a subsequent absorber layer removal/thinning by etching and texturing etches far enough to effectively and reproducibly form the trench-isolated sub-cells/isles. In yet another embodiment, the absorber layer (e.g. the silicon wafer) is first thinned to its final thickness (plus the silicon that is to be textured later), then segmented either fully through the remaining thinned absorber layer or almost completely such that the subsequent texturing process is sufficient to separate the individual sub-cells or isles. A third embodiment utilizes a combination between the two above sequences where in a first step most of the thinning etch is performed, followed by complete or almost complete trench-isolated segmentation, followed by further etching and sunnyside texturing.

In a fourth embodiment, the isolation cut is performed after thinning and texturing are both completed. This embodiment may include two additional options. In one option, after the segmentation cut the wafer surface goes directly into passivation. This has the advantage of reducing the overall number of wet process steps. Another option is perform a slight cleanup step to remove debris and potential damage from the laser step. Such cleanup steps may consist of a short immersion in an alkaline chemistry such as the texture chemistry itself, followed by suitable post texture clean, or by mild debris removals such as megasonic cleans.

It is important to note that the trench isolation segmentation process itself should leave the backplane material relatively intact to retain structural integrity of the cell such that the cell sandwich may be processed using a typical cell form factor, such as 156 mm×156 mm square or pseudo square with the respective automated equipment that can handle such standard sizes.

In the case of a prepreg backplane and a silicon absorber it may be advantageous to cut the absorber with a laser source using a laser wavelength with good absorption in silicon while having with poor absorption in prepreg (i.e., being transmitted and/or reflected by the prepreg with little absorption)—a concept which holds for other backplane/absorber material combinations as well. Many prepregs do not absorb strongly in the infrared (IR) wavelength so cutting with IR enhances the relative selectivity of silicon cutting versus prepreg cutting. Cutting or scribing using IR lasers is also comparatively cheap, as capex (capital expenditure) and maintenance for IR lasers (e.g. pulsed nanosecond lasers) are typically lower as compared to UV lasers. However, cutting quality for UV lasers tends to be better than for IR lasers and the extent of the heat affected damage zone near the cut is smaller for UV lasers. In each case these factors should be weighed in order to make the optimal laser source selection for the trench isolation process.

In addition, isolation trenches may be formed using water jet guided lasers, such as water jet guided green or IR lasers. Water jet guided laser cuts may exhibit cutting regions with lower damage while retaining the absorption and therefore selectivity advantage of the lower wavelength laser or lasers. Other segmentation methods to generate a monolithic backplane-attached icell solar structure include buried focused laser beams for splitting where the focus may be placed within the material and temperature gradient and with it internal vapor pressure induced material splitting is the result. Such induced splitting may be assisted by splitting from a laser source which is closely traced and followed by a cooling source such as a water or dry ice jet. Dicing methods, such as diamond wheel saw cutting, may also be employed for the segmentation, but tend to be more expensive. When employed, such dicing cuts the silicon just inside the prepreg to form the separation.

The silicon wafer thinning itself may be performed using a high etch rate wet etch solution, such as for instance concentrated KOH or other hydroxides such as NaOH, TMAH, NH4OH or LiOH, using relatively high temperatures of 80° C. and above (in some instances up to approximately 145° C.). Alternative wet chemistries such as mixtures containing at least HF and HNO3 with optional additive such as acetic, phosphoric or sulfuric acid may be used but are typically more expensive. This acidic etching is performed at room temperature or below and in solutions that allow for chilling to remove heat generated from the exothermic etching reaction.

In order to fully utilize the etching chemistry, particularly but not solely for the case of alkaline etching, flocculating agents may be introduced during the process to help flocculate out the reaction product of potassium silicate (in the case of a silicon etch) and a KOH etchant or hexafluorosilicilic acid (in the case of an HF/HNO3 based etchant chemistry) and which then support a mechanical separation of reaction product, for instance either by sedimenting bed or centrifugal demixing. An alternative method for removing byproduct out of solution is by thermally cycling the solution (i.e. cooling it down to reduce the solubility and removing the components that fall out of solution, such as silicate, and reheating). By separating the silicate, byproduct may be separated from the etchant and thus the bath lifetime of the etchant extended as the balance of the spent etchant such as KOH or NaOH may be spiked back into the bath, either from solid bricks or flakes of KOH (or other hydroxides) or from highly concentrated aqueous solution.

Yet another option for silicon thinning by etching is the use of plasmas, such as halogen containing plasmas for silicon etching. Also, a high etch rate molecule radical etch is envisioned. Other options for silicon wafer thinning include mechanical grinding or lapping down the silicon. In some instances, grinded silicon is potentially more readily separable for recovery and recycling.

After the sunnyside (frontside) texturing, a surface cleaning process such as those containing HCl, HF or HNO3 or ozonated HF followed by a final dilute HF etch treatment is carried out and an optional final HF containing step may leave the surface without a native oxide.

It is to be noted that when performing a segmentation cut prior to silicon thinning (for example by laser), the presented process flows depict a cut of approximately 30-70% of the thickness with the subsequent etch extending the depth of the cut to the prepreg boundary to complete the isolation. The initial segmentation cut may also be a complete cut (and not to rely on the etching to provide the full segmentation isolation) as shown in the process flow of FIG. 43.

Block 6 of FIG. 33 includes solar cell front surface engineering including front surface passivation application with or without an additional doped front surface field (FSF). For implementation of doped front surface fields a variety of embodiments are provided which all have a dopant source, for n-type absorber cells typically containing phosphorus, arsenic or antimony or indium dopant and a drive-in and/or dopant activation mechanism, such as pulsed nanoseconds laser annealing or pulsed nanoseconds laser doping. The dopant sources may be provided by various methods, including ion implantation, predeposition of material layers containing dopants, predeposition of sprays containing dopants, plasma immersion ion implantation—for instance using PH3, or gas immersion laser doping (GILD). Process flow embodiments that implement doped front surface fields (FSF) are outlined in FIGS. 38A-38D, 39A-39D, 40A-40D, and 41A-41B. In such methods it may be advantageous to have an effectively low temperature drive-in mechanism, such as a pulsed nanoseconds laser annealing or melting, or melting in a dopant ambient (GILD), so that the heat is concentrated to the front of the solar cell and the backplane does not receive excessive heat and remains relatively unheated and unaffected by the frontside pulsed laser processing. For laser sources, pulses sources, such as pulsed nanoseconds lasers, may be used for formation of doped FSF. In order to overcome topographical challenges such as the random pyramid textured surface, anneal may be performed using a pulsed nanoseconds (with pulse length in the range of about 10 ns up to 100's of ns) green laser that can distribute the heat into the top few microns of absorber, or a pulsed UV laser which, from a heat dissipation point of view, will deliver most of the heat in the pyramid tips. Top hat or flat-top homogenized laser beams may also be used.

Various options for front surface passivation layers there are also various options, from silicon nitride to stacks of amorphous silicon (a-Si) with silicon nitride, or specifically intrinsic a-Si, followed by n-doped a-Si, followed by silicon nitride. Instead of silicon nitride, oxide nitride or oxynitrides with fixed or variable oxygen content may also be used.

Instead of a-Si, the initial layer may also contain some fraction of oxygen to become an amorphous silicon-oxide (also possible with sub-stoichiometric content of oxygen), or amorphous silicon-carbon with a relatively small portion of carbon. Another alternative to a-Si is aluminum oxide ($Al_2O_3$) which is capable to produce very low surface recombination velocity on both p- and n-type silicon (for example $Al_2O_3$ deposition using methods such as ALD, PECVD, or APCVD) and which is also readily combined with silicon nitride, where silicon nitride is deposited after as a second layer. When silicon nitride is used, the stoichiometric ratio between nitrogen and silicon may be fixed or variable throughout the film to enable optimized optical and electrical performance, where optimized optical performance is achieved at low or zero absorption in the film and the correct effective film thickness and refractive index and best electrical performance may be achieved with sufficient hydrogen content and relatively large fixed positive charge density (in the case of n-based cells).

The seventh building block Block 7 of FIG. 33 involves the formation of access holes (vias) to make contact to the buried metal 1 (M1) layer and the deposition and structuring of metal 2 (M2). Metal 2 (M2) forms the final high-conductivity solar cell metallization, isle to isle interconnection, with the cell busbars.

Forming via holes to interconnect M2 and M1 at this stage in cell fabrication has an inherent advantage that during the preceding wet process steps, such as etch-back, texturing and post texture cleaning, the buried M1 layer has been protected by the laminated backplane. Via holes may be drilled using lasers such as pulsed $CO_2$ lasers, or pulsed UV lasers. In some instances, vias may be positioned on an optionally widened M1 layer finger in order to have more forgiving alignment tolerances. Alignment of the vias to underlying interdigitated M1 fingers, as well as alignment of the trench isolation segmentation cuts to the structures on the backside of the absorber wafer, may utilize infrared illumination of alignment marks which have sufficient transmission through the silicon absorber layer as well as through the backplane.

After formation of the via holes in the backplane with via holes landing on the designated portions of M1 interdigitated fingers, the structure is ready for the M2 deposition and patterning, which may be preceded by a pre-deposition in-situ sputter etch clean (for instance using argon, oxygen or other plasmas or ions) to etch off poorly conductive surface layers such as aluminum oxide or carbon residue on top of the M1 contact and to promote M2 adhesion on the backplane surface.

Such a process may be performed in a vacuum PVD system comprising vacuum-integrated plasma sputtering and evaporation process capabilities. Subsequently, and preferably without breaking vacuum, the M2 layer can be deposited. The M2 layer may be depositing using, for example, PVD such as aluminum evaporation (by thermal or electron-beam evaporation of aluminum) or plasma sputtering, optionally followed by at least one capping layer that serves as adhesion, anti-oxidant and contacting layer, such as a thin (having a thickness in the range of approximately 100 nm to 500 nm) nickel or nickel-vanadium layer and an optional tin (Sn) or other solderable material coat.

Subsequent to or as a result of the inherent heating during PVD deposition of M2, the cell may be annealed to further improve surface passivation properties with reduced surface recombination velocities and reduce cell metallization contact and via resistances. M2 may then be subsequently patterned, for instance using pulsed laser ablation, to separate emitter from base contact regions while establishing (and leaving intact) the suitable pre-designed interconnections (serial, parallel or combinations) between the individual isles or sub-cells. The patterned M2 may also comprise the final solar cell busbars. Alternatively to PVD (plasma sputtering and/or evaporation) of M2, other deposition techniques such as screen or ink jet printing, or thermal spray coating, or arc plasma spray coating, or plating may be employed.

The following detailed process flows for the manufacture of back contact solar cells are provided as exemplary embodiments highlighting various key aspects of the disclosed subject matter. Various aspects of each flow may be removed or combined and the flows provided should not be construed in a limiting sense. Note that while these process flows are directed towards isled master cells (icells) they may also be applied to the formation of back contact solar cells not utilizing a monolithically isled solar cell structure. And while certain distinctive elements of each process flow are highlight, all follow the general building blocks provided in FIG. 33 and share number of common elements, including:

Saw Damage Removal (SDR), Tool 1, which also reduces the silicon wafer thickness and its overall surface roughness on both sides of the wafer. SDR may be either double-sided or single-sided etch tool (batch or in-line design).

A patterned screen-printed M1 paste (for example using a suitable high-conductivity fritless paste comprising aluminum). Patterned M2 formed by PVD (plasma sputtering, and/or evaporation, and/or another suitable PVD method such as arc or thermal spray) followed by pulsed laser ablation patterning of the deposited metal layer; while M2 is shown with PVD AL/NiV, other material options are possible, including: Al/Ni, Al/Zn, Cu/Ni, Cu/Zn, etc. If desired, PVD copper may be used as the main M2 conductor instead of aluminum.

Figure 34A:
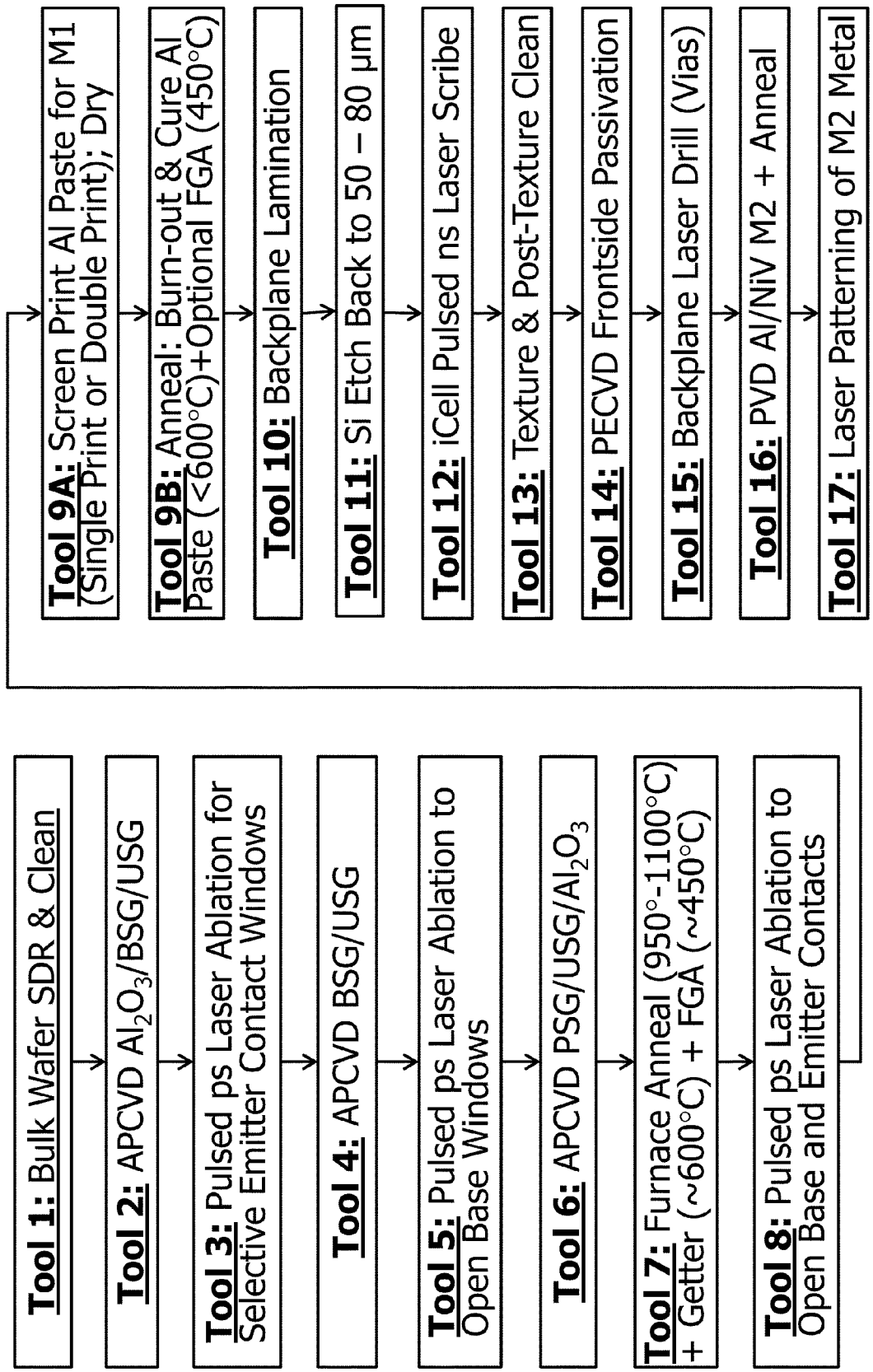
Figure 34B:
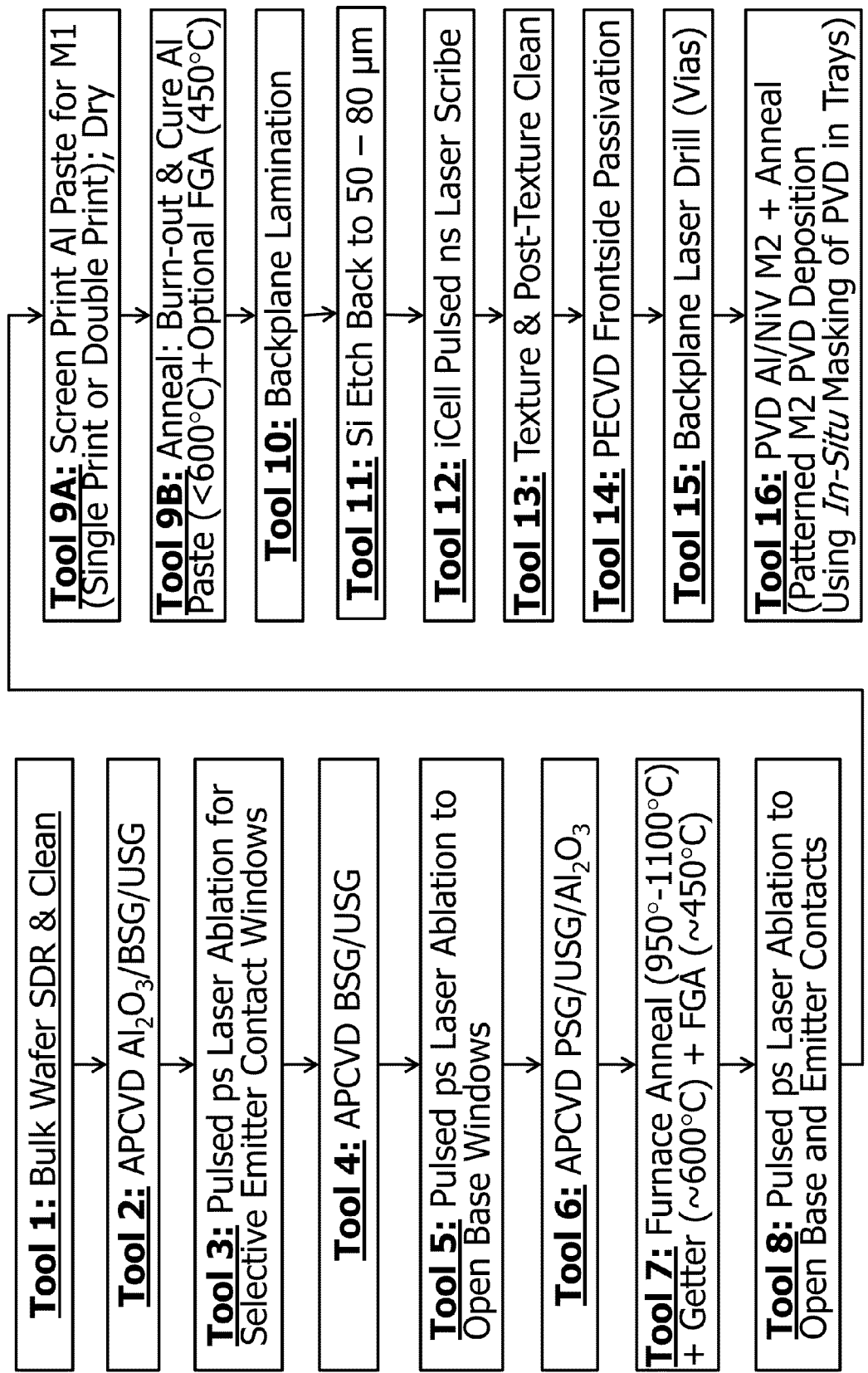
Figure 34D:
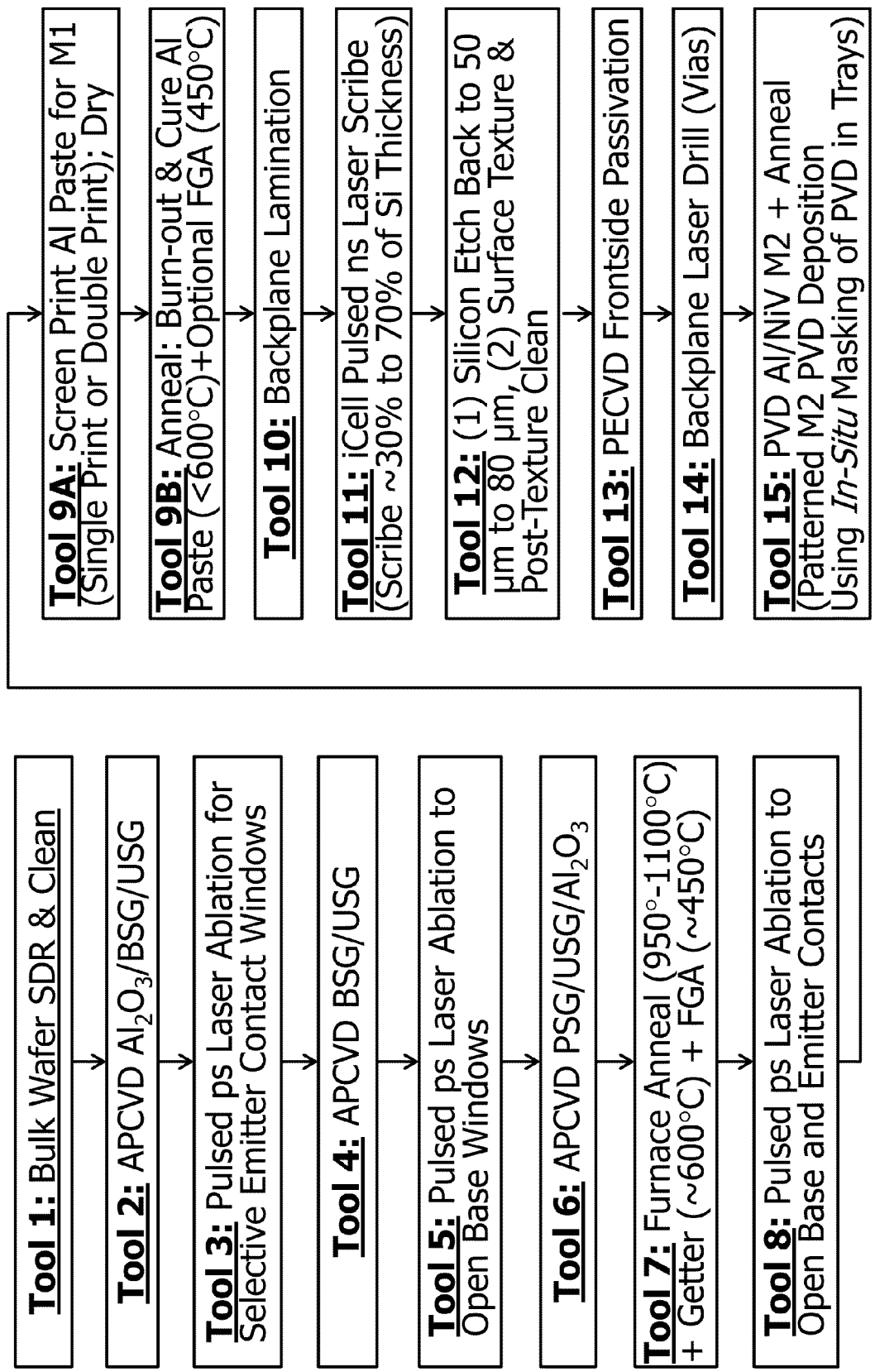

Partitioning laser scribe to form the trench isolation regions for the monolithic solar cell isles of the icell (may also be referred to as "iCell" cut/scribe/trench in the process flows). With reference to FIG. 34A, this laser partitioning scribe (Tool 12) may be removed from the flow and Tools 11 and 13 combined into a single wet processing equipment (i.e., 15 process tools without isle partitioning as compared to 17 process tools with isle partitioning in the flow of FIG. 34A)—a process removal step which holds true in all process flows.

A silicon etch back is performed to reduce the absorber thickness to a range of approximately 50 to 80 microns (Tool 11 in FIG. 34A, note this tool number reference varies in different process flow embodiments) and subsequently another 5 to 15 micron thickness reduction during the texture etch process (Tool 13 in FIG. 34A, note this tool number reference varies in different process flow embodiments) for a final silicon absorber thickness in the range of approximately 35 to 75 microns although thinner or thicker absorber Si may be formed.

Trench isolation regions may be formed (may also be referred to as "iCell" scribe/cut/trench in the process flows) before the Si etch back (wafer thinning), between the Si etch back and cell sunnyside (frontside) texture, or alternatively at any point after backplane lamination depending on process flow constraints and desired cell structure.

Process flows may start with quasi-mono or CZ n-type Si wafers.

Isolation trenches are formed using pulsed ns laser scribing after Si etch back (wafer thinning)

Al paste and furnace anneal processing are used to form patterned M1.

FIGS. 34A through 34D are process flow embodiments for the manufacture of interdigitated back contact solar cells with no FSF or BSF formation for base conductivity—in other words no additional n+ doping in the n-type base for reducing the base resistance is used. Flows 34A and 34B describe flows without and with In-Situ Masking of PVD for M2 and the isle laser cut ("iCell Pulse ns Laser Scribe") is performed between Si thinning Etch Back and sunnyside Texture/Post-Texture Clean. Flow 34A shows PVD M2 without in-situ PVD masking of M2 and using laser ablation patterning. Flow 34B shows PVD M2 with in-situ PVD shadow masking for patterned M2. Flows 34C and 34D describe flows without and with In-Situ shadow Masking of PVD for M2 and the isle laser cut is performed before Si Etch Back (Reduces Tool Count by One). Flow 34C shows PVD M2 without in-situ PVD shadow masking of M2 and using pulsed laser ablation patterning. Flow 34D shows PVD M2 with in-situ PVD shadow masking for patterned M2

FIGS. 35A through 35D are process flow embodiments for the manufacture of interdigitated back contact solar cells with a buried BSF for base conductivity—in other words additional n+ doping in the n-type base for reducing the base resistance, process shown using POCl3 doping after SDR followed by POCl3 glass etch+Si etch. Flows 35A and 35B describe flows without and with In-Situ shadow Masking of PVD for M2 and the isle laser cut is performed between Si Etch Back and Texture/Post-Texture Clean. Flow 35A shows PVD M2 without in-situ PVD shadow masking of M2 and using pulsed laser ablation patterning. Flow 35B shows PVD M2 with in-situ PVD shadow masking for patterned M2. Flows 35C and 35D describe flows without and with In-Situ shadow Masking of PVD for M2 and the isle laser cut performed before Si Etch Back (Reduces Tool Count by One). Flow 35C shows PVD M2 without in-situ PVD shadow masking of M2 and using pulsed laser ablation patterning. Flow 35D shows PVD M2 with in-situ PVD masking for patterned M2.

FIGS. 36A through 36D are process flow embodiments for the manufacture of interdigitated back contact solar cells with a buried BSF for base conductivity—in other words additional n+ doping in the n-type base for reducing the base resistance, process shown using phosphorus ion implantation and subsequent shared furnace anneal (ion implant places the peak of P below the subsequent emitter-base junction). Flows 36A and 36B describe flows without and with In-Situ Masking of PVD for M2 and the isle laser cut between Si Etch Back and Texture/Post-Texture Clean. Flow 36A shows PVD M2 without in-situ PVD shadow masking of M2 and using pulsed laser ablation patterning. Flow 36B shows PVD M2 with in-situ PVD shadow masking for patterned M2. Flows 36C and 36D describe flows without and With In-Situ Masking of PVD for M2 and isle laser cut performed before Si Etch Back (Reduces Tool Count by One). Flow 36C shows PVD M2 without in-situ PVD shadow masking of M2 and using pulsed laser ablation patterning. Flow 36D shows PVD M2 with in-situ PVD shadow masking for patterned M2.

FIGS. 38A through 38D are process flow embodiments for the manufacture of interdigitated back contact solar cells with laser-doped FSF for base conductivity—in other words additional n+ doping in the n-type base for reducing the base resistance, process shown using laser doping on front-side after Si etch back and texture/clean (pulsed ns laser doping is done after applying the phosphorus liquid source, post texture). Laser-doped FSF may serve two objectives: improved front-side passivation and reduced base resistance (for example doping depth ~0.1 to 0.5 microns, surface conc. ~1E17 to 5E19 $cm^{-3}$, lower surface concentrations for deeper doping and vice versa).

Flows 38A and 38B describe flows without and with In-Situ Masking of PVD for M2 and isle laser cut between Si Etch Back and Texture/Post-Texture Clean. Flow 38A shows PVD M2 without in-situ PVD shadow masking of M2 and using pulsed laser ablation patterning. Flow 38B shows PVD M2 with in-situ PVD shadow masking for patterned M2. Flow 38C is for PVD M2 without in-situ PVD shadow masking of M2 and using pulsed laser ablation patterning. Flow 38D shows PVD M2 with in-situ PVD shadow masking for patterned M2.

FIGS. 39A through 39D are process flow embodiments for the manufacture of interdigitated back contact solar cells with pulsed laser FSF for base conductivity—in other words additional n+ doping in the n-type base for reducing the base resistance, process shown using laser doping on front-side after Si etch back and texture/clean (pulsed ns or ps laser is applied after depositing a thin sub-250 nm layer of n+ phosphorus or arsenic doped amorphous Si, to perform epitaxial alignment of the doped amorphous Si to reduce base resistance, with surface conc. ~1E17 to 5E20 $cm^{-3}$, lower surface concentrations used for thicker n+ amorphous Si and vice versa).

Flows 39A and 39B describe flows without and with In-Situ Masking of PVD for M2 and isle laser cut between Si Etch Back and Texture/Post-Texture Clean. Flow 39A shows PVD M2 without in-situ PVD shadow masking of M2 and using pulsed laser ablation patterning. Flow 39B shows PVD M2 with in-situ PVD shadow masking for patterned M2. Flows 39C and 39D describe flows without and with In-Situ Masking of PVD for M2 and isle laser cut before Si Etch Back (Reduces Tool Count by One). Flow 39C shows PVD M2 without in-situ PVD shadow masking of M2 and using pulsed laser ablation patterning. Flow 39D shows PVD M2 with in-situ PVD shadow masking for patterned M2.

FIGS. 40A through 40D are process flow embodiments for the manufacture of interdigitated back contact solar cells with ion implantation FSF for base conductivity—in other words additional n+ doping in the n-type base for reducing the base resistance, process shown using ion implantation of phosphorus or arsenic on the textured sunny side followed by laser annealing to activate implanted dopant after Si etch back and texture/clean (pulsed ns laser is applied after implanting a thin, for example sub-500 nm, implanted layer of n+ phosphorus or arsenic doped layer, to form an activated n+ layer to reduce base resistance, with surface conc. ~1E17 to 5E20 $cm^{-3}$, lower surface concentrations used for thicker n+ amorphous Si and vice versa).

Flows 40A and 40B describe flows without and with In-Situ Masking of PVD for M2 and isle laser cut performed between Si Etch Back and Texture/Post-Texture Clean. Flow 40A shows PVD M2 without in-situ PVD shadow masking of M2 and using pulsed laser ablation patterning. Flow 40B shows PVD M2 with in-situ PVD shadow masking for patterned M2. Flows 40C and 40D describe flows without and with In-Situ Masking of PVD for M2 and isle laser cut performed before Si Etch Back (Reduces Tool Count by One). Flow 40C shows PVD M2 without in-situ PVD shadow masking of M2 and using pulsed laser ablation patterning. Flow 40D shows PVD M2 with in-situ PVD shadow masking for patterned M2.

Figure 41A:
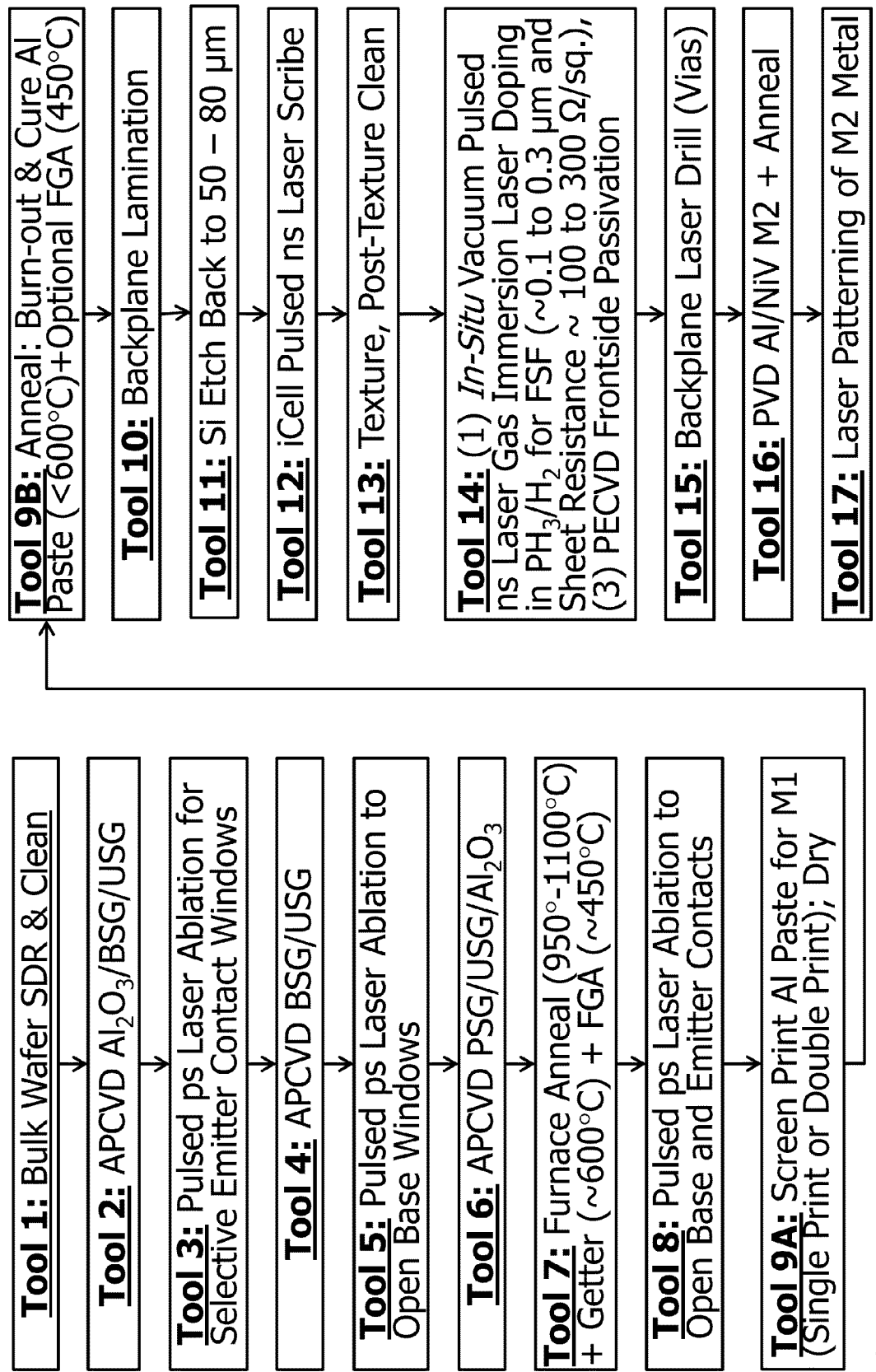
FIGS. 41A through 41B are process flow embodiments for the manufacture of interdigitated back contact solar cells with gas immersion FSF.
Figure 41B:
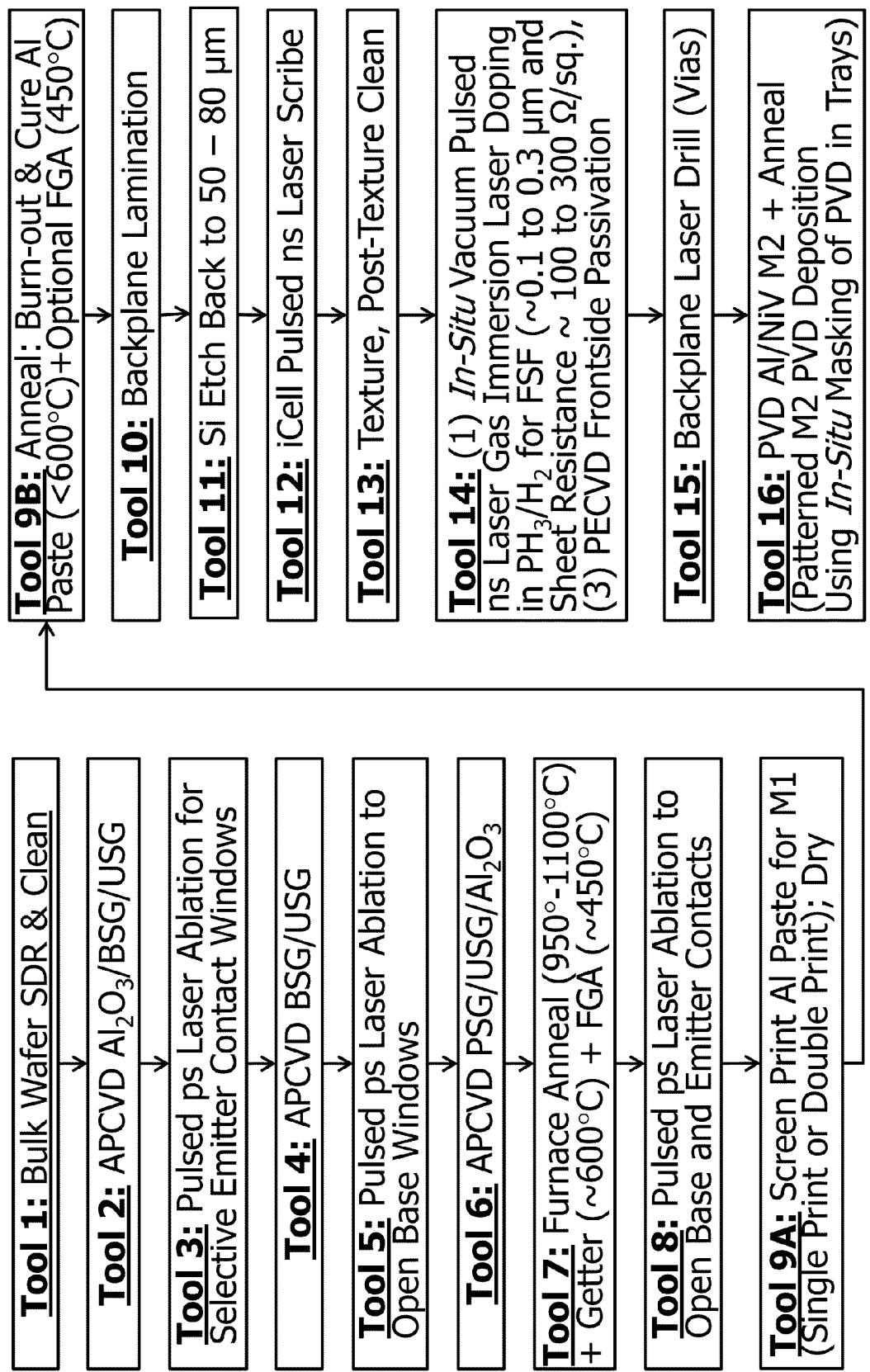
Figure 42:
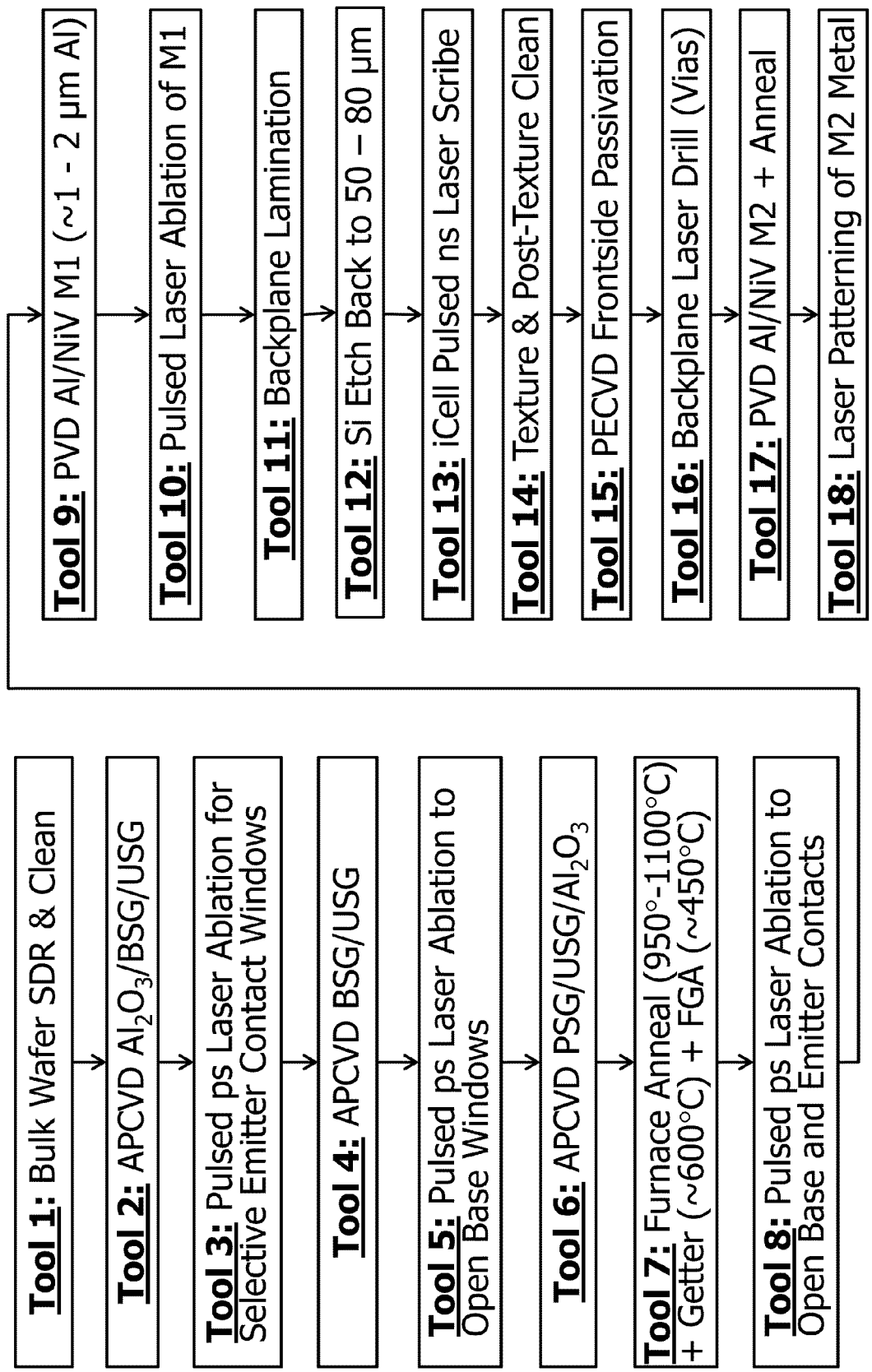
FIG. 42 is a process flow embodiment for the manufacture of interdigitated back contact solar cells with pulsed ns laser scribing of isolation trenches using PV—Al/NiV.

FIGS. 41A through 41B are process flow embodiments for the manufacture of interdigitated back contact solar cells with gas immersion FSF for base conductivity—in other words additional n+ doping in the n-type base for reducing the base resistance, process shown using laser gas immersion doping in $PH_3$ on front-side (FSF depth ~0.1 to 0.3 μm) after Si etch back and texture/clean (pulsed ns laser is applied in $PH_3/H_2$ for gas-immersion laser doping to reduce base resistance, with surface conc. ~1E18 to 5E20 $cm^3$, lower surface conc. used for deeper doped region and vice versa).

Flows 41A and 41B describe flows without and with In-Situ Masking of PVD for M2 and isle laser cut performed between Si Etch Back and Texture/Post-Texture Clean. Flow 41A shows PVD M2 without in-situ PVD shadow masking of M2 and using pulsed laser ablation patterning. Flow 41B shows PVD M2 with in-situ PVD shadow masking for patterned M2.

FIG. 42 is a process flow embodiment for the manufacture of interdigitated back contact solar cells with no FSF or BSF for base conductivity and pulsed ns laser scribing of isolation trenches using PV—Al/NiV and laser ablation patterning of M1.

Figure 43:
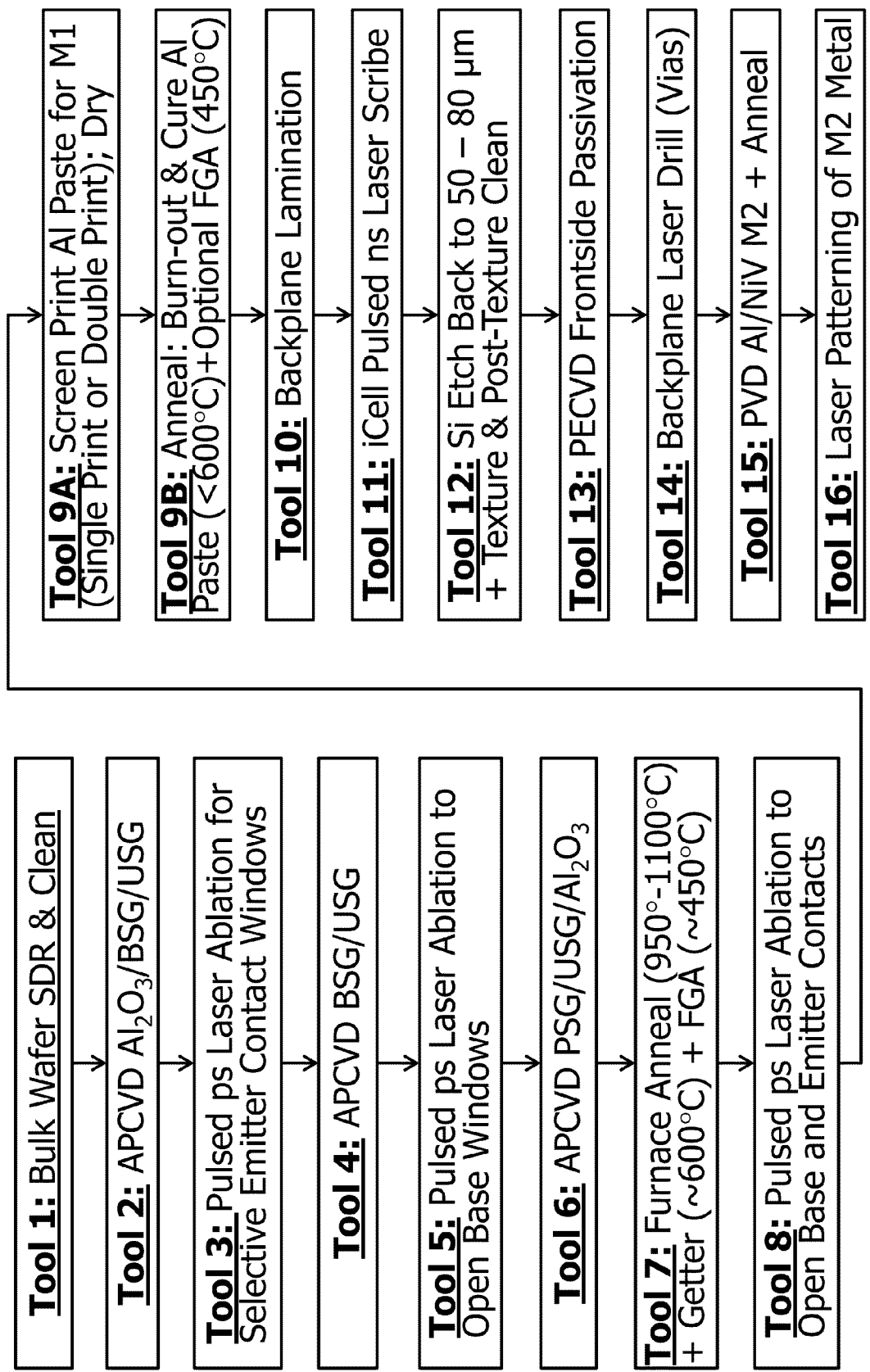
FIG. 43 is a process flow embodiment for the manufacture of interdigitated back contact solar cells using pulsed ns laser scribing of isolation trenches on pre-etch thick silicon.

FIG. 43 is a process flow embodiment for the manufacture of interdigitated back contact solar cells using pulsed ns laser scribing of isolation trenches on pre-etch thick silicon.

Different metallization options for first metal (M1) layer include, among others, screen printing or stencil printing or deposition using physical vapor deposition (PVD) such as a DC magnetron plasma sputtering process with a subsequent patterning step, for instance using pulsed laser ablation patterning. M1 material choices include, among others, screen printed aluminum (Al), aluminum with silicon and/or germanium content, aluminum and silver combinations (if different metals are to be used for emitter and base), as well as nickel, for instance deposited in a patterned or blanket way using ink jet printing. Material choices for M1 PVD also include Al, Al with Si and/or Ge, followed by Ni or NiV. The considerations outlined below should be weighed relating to material choices for M1.

Advantages of using PVD Al/NiV (with Al in the range of from a fraction of ~1 μm to 2 μm and relatively thin NiV in the range of ~0.1 μm to 0.50 μm) and pulsed laser ablation patterning instead of screen-printed patterned Al paste and furnace anneal include the fact that PVD provides much lower near-bulk Al resistivity of ~2.7 μΩ·cm, almost a factor of about 15× to 100× lower than the cured Al paste resistivity, hence, reducing the required Al layer thickness to about a fraction of 1 μm up to about 2 μm (compared to about 15 μm to 30+μm for Al paste)

Compared to paste much thinner PVD Al reduces the M1 stress on thin silicon and compare to screen-printed Al paste much thinner PVD Al facilitates backplane lamination due to reduced surface topography on patterned M1 with the much thinner PVD Al layer. Eliminating the screen printing process from the process flow may lead to higher mechanical yield in the production line as screen printing can be a primary source of wafer breakage in the line (the only contact type tool in the flow). Eliminating screen printing may also enable the use of thinner and less expensive starting wafers without serious breakage concerns. PVD Al is also much more pure than Al paste (e.g., much less impurities such as Fe) and thus potentially enables higher Voc and higher resulting cell efficiency. PVD Al may reduce the overall M1 resistance and provide lower M2-M1 via plug/contact resistance thus reducing the number of required via holes drilled into the backplane, resulting in higher productivity for the backplane laser drilling process.

Disadvantages of using PVD Al/NiV and pulsed laser ablation instead of screen printed Al include the possible risk of punching through the much thinner PVD Al M1 during backplane drilling. The necessary patterning step, for example in the case of laser ablation, also bears a risk of Al/NiV laser ablation damage and minority carrier lifetime degradation in the solar cell. Further, a PVD plus laser ablation toolset also carries a higher Capex cost compared to screen print with subsequent furnace cure.

In the process flows described previously, the screen printed aluminum layer for M1 may be replaced with PVD Al/NiV followed by pulsed laser ablation of Al/NiV. It is also possible to combine processes, such as using a lower PVD layer for good and low contamination contact formation, followed by a screen printed thickening layer to provide a thicker landing pad layer for the laser via hole drill process to stop on. This second layer process may also serve as a mask for a subsequent etching and patterning process to remove the thinner PVD layer where it is not desired—thus the laser ablation process and associated risk of damaging the back surface passivation may be avoided. In other words, the screen printed layer would serve as a mask for the PVD etching by choosing etches and metal combinations that allow for selective etching of the PVD layer at a higher rate than the screen printed layer. Alternatively the etching may be performed with a less selective chemistry and rely that the metal in the screen printed area is much thicker than the metal in the PVD only area. In the latter case, the etching needs to be timed suitably.

Additional known options for the M1 layer may be incorporated into the disclosed process flows. For instance, it is also possible to deposit a very thin layer that may be transferred into a silicide using a rather low temperature process. An example is nickel or cobalt and the formation of a nickel silicide or cobalt silicide. Other materials, such as titanium and other refractory metals are also possible; however, nickel may be advantageous due to its low consumption of silicon and low silicidation reaction temperature. The nickel silicide is only formed in the contact areas which are previously opened (oxide is removed), for example using a pulsed picoseconds or femtoseconds laser ablation process in the contact areas. After nickel deposition (by PVD) and thermal anneal, nickel silicide is formed only in the open areas where nickel is in contact with silicon. Afterwards, remaining unreacted nickel may be stripped from the dielectric region, forming localized self-aligned contacts. As contact resistance values with silicides may be relatively low, such a process may be used to lower the overall contact area percentage and thereby reduce the overall back surface recombination velocity (BSRV), which can lead to higher open circuit voltages and higher resulting cell efficiencies. This silicidation may also be performed in conjunction with a local nickel deposition, for instance, using ink jet deposition of nickel dots which may be reacted, thereby removing the need of selectively wet etching unreacted nickel from other regions.

The presented process and resulting cell structure may utilize a flexible, CTE matched backplane to provide a cell design with increased flexibility, especially in conjunction with the thin or thinned absorber layer. The absorber layer may already be thin (below about 80 μm), for instance formed as a deposited epitaxial thin-film growth onto a reusable template with a kerfless process, or may require thinning, for example, after lamination for the case of a thicker (approximately 100 to 180 μm thick) starting CZ or otherwise crystalline wafer or when formed as a thicker deposited epitaxial growth onto a reusable template. Cell flexibility lends itself to flexible module encapsulation concepts, for example glass free modules providing a very thin, lightweight and flexible module. These same flexible module attributes may also further reduce installation and overall balance of system (BOS) costs for such manufactured modules.

Additional methods for the patterning of the backside structures (emitter and base junction regions as well as the contact region opening for the M1 to make contact to the emitter and base contact regions) are further provided. Generally, back surface recombination velocity is to be kept low for high performance IBC cells. Damage to the structured regions which may be caused by laser processing can be detrimental to the BSRV and with it to the attainable open circuit voltage performance. As the structuring of the back side relies on the selective removal of oxide by pulsed laser ablation, for example doped glasses from certain regions using a laser, much care is to be taken to reduce and/or avoid damage from the laser process. Pulsed picoseconds and femtoseconds lasers may avoid such damage but may still leave some residual damage which can reduce the resulting cell efficiency.

Figure 44A:
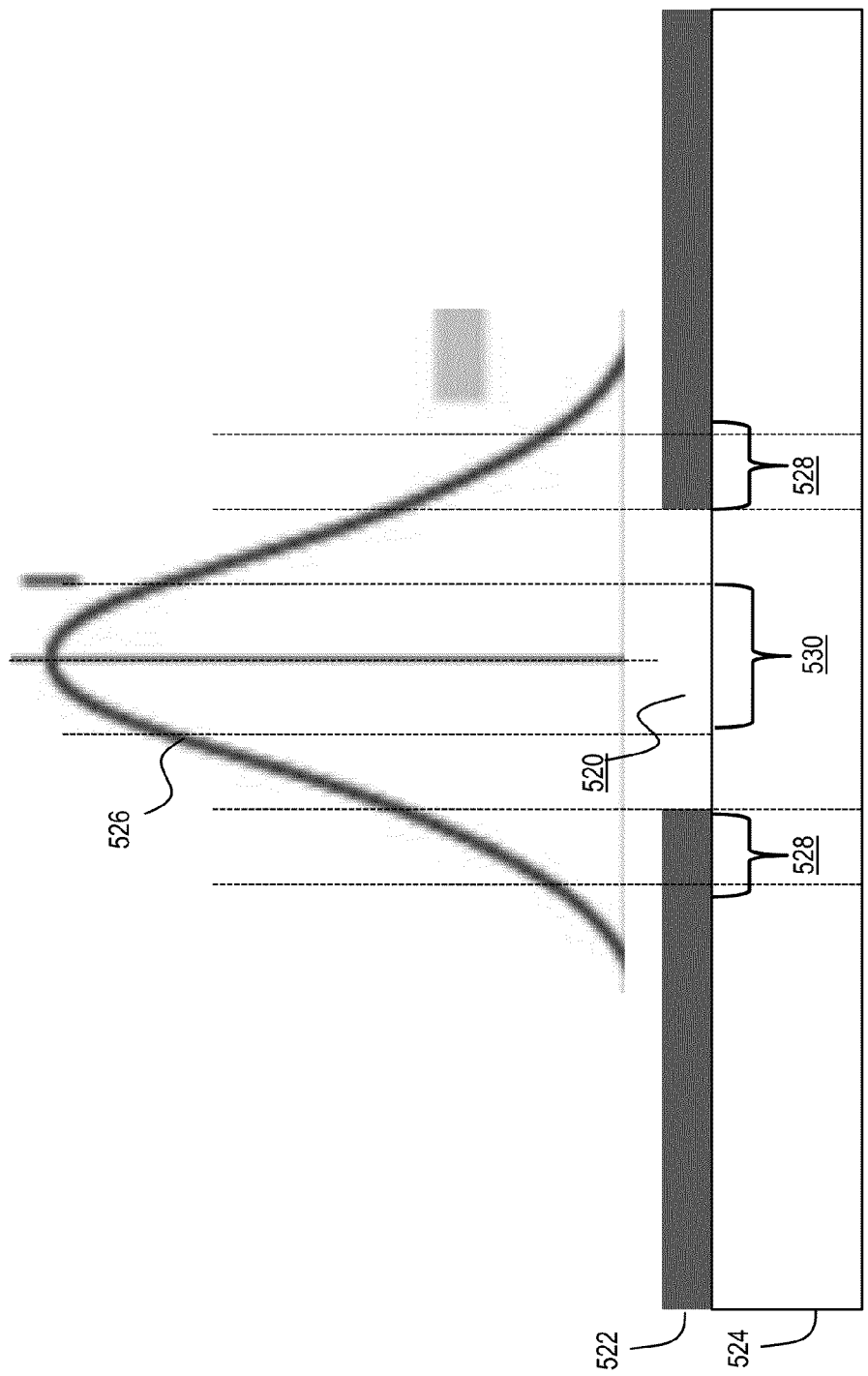
FIG. 44A is a cross-sectional diagram showing direct oxide ablation of a BSG (or PSG) layer on a silicon layer.
Figure 44B:
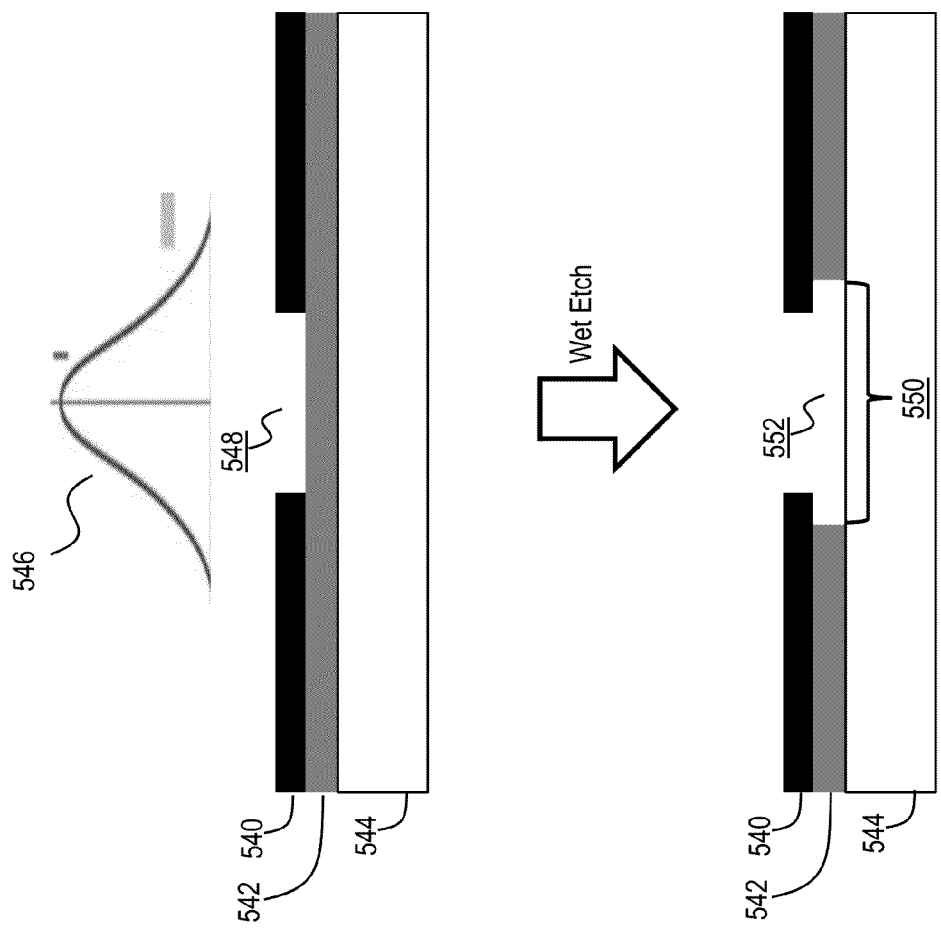
FIG. 44B is a cross-sectional diagram showing ablation of a hardmask layer on a BSG 9 or PSG) layer on a silicon layer.

As an alternative process, the use of masking layers and subsequent masking layers patterning using lasers is provided, for example with an oxide removal performed using a wet etching step such as using buffered or unbuffered hydrofluoric acid (HF). The cross-sectional diagrams of FIGS. 44A and 44B illustrate these concepts. FIG. 44A is a cross-sectional diagram showing direct oxide ablation using a ps laser of a BSG (or PSG) layer on a silicon layer. Laser ablated opening 520 is formed by laser beam distribution 526 in BSG (or PSG) layer 522 exposing Si layer 524. Damaged Si regions may be formed in Si at glass to Si interfaces 528 and excess beam energy region 530.

FIG. 44B is a cross-sectional diagram showing ablation of a hardmask using a ps or ns laser and wet etch opening of a BSG (or PSG) layer on a silicon layer. Laser ablated opening 548 is formed by laser beam distribution 546 in hard mask layer 540 on BSG (or PSG) layer 542 on silicon layer 544. Hard mask layer 540 may be a temporary hard mask such as a resist or polymer or a permanent hard mask such as a-Si. A wet etch then forms wet etch opening 552 exposing damage free region 550 in silicon layer 544. For example, the masking layer may be applied in the form of amorphous silicon on top of the deposited glass, in some instances in the same atmospheric pressure deposition tool, or alternatively using PECVD or PVD. The thin (in the range of approximately 50 to about several hundred Angstroms thick) amorphous Si (a-Si) is then selectively ablated with the laser and provides a hard mask for the subsequent etching step. The unablated a-Si in the untreated regions need not be removed, but merely oxidized as part of the subsequent furnace anneal step. This process may readily be implemented for the case of the selective emitter window and the base window opening processes.

As an alternative to the use of a-Si, the masking layer may for example also consist of a polymer such as resist or photoresist or other organic material. The thickness of the polymer may be less than a micron and the application method may have a very high polymer or resist utilization rate, such as roller coating or spray coating. A key requirement of the polymer or resist is that it adheres well to the glass and may sustain the oxide etching process using buffered or unbuffered HF.

The subsequent laser step, in one embodiment, then ablates the resist or polymer, then the glass underneath is locally etched away, followed by stripping of the resist or polymer (in some instances in the same tool as the etch). This method buys a large process margin for laser processing as the polymer may be ablated at a much lower laser fluence than even the a-Si or the glass, thereby resulting in undamaged contact regions. This method also allows for the use of nanosecond lasers which are cheaper and cheaper to operate than picoseconds lasers. And this process may readily be implemented for the contact opening laser process step prior to M1 contacting, as the polymer or resist is removed after the glass etch.

At the penalty of a higher material cost the polymer or resist may also be photosensitive, for example with a positive photoresist action and the laser process only exposing the photoresist (rather than ablating it). In this case, the ensuing wet step first develops the resist in a batch or inline bath, followed by the local glass etching, followed by the resist removal and cleanup step (in some instances all performed in one wet tool).

FIGS. 45 through 49 show several representative process flow embodiments for the fabrication of a backplane-attached back contact solar cell wherein: (i) no post-lamination wet processing is performed, and (ii) the silicon wafer is not thinned beyond the thinning performed by the SDR and texture processes. These process flows result in back-contact solar cells with thicker absorber layers (typically in the range of about 100 µm up to about 150 µm) as compared to earlier process flows. In FIGS. 45 through 49, the frontside passivation includes a thin thermal oxide underlayer in conjunction with a hydrogenated silicon nitride field-assisted passivation layer (also serving as anti-reflection coating or ARC layer). The passivation layer may, for example, be a stack of PECVD hydrogenated amorphous silicon and silicon nitride (without the thin thermal oxide).

Figure 45:
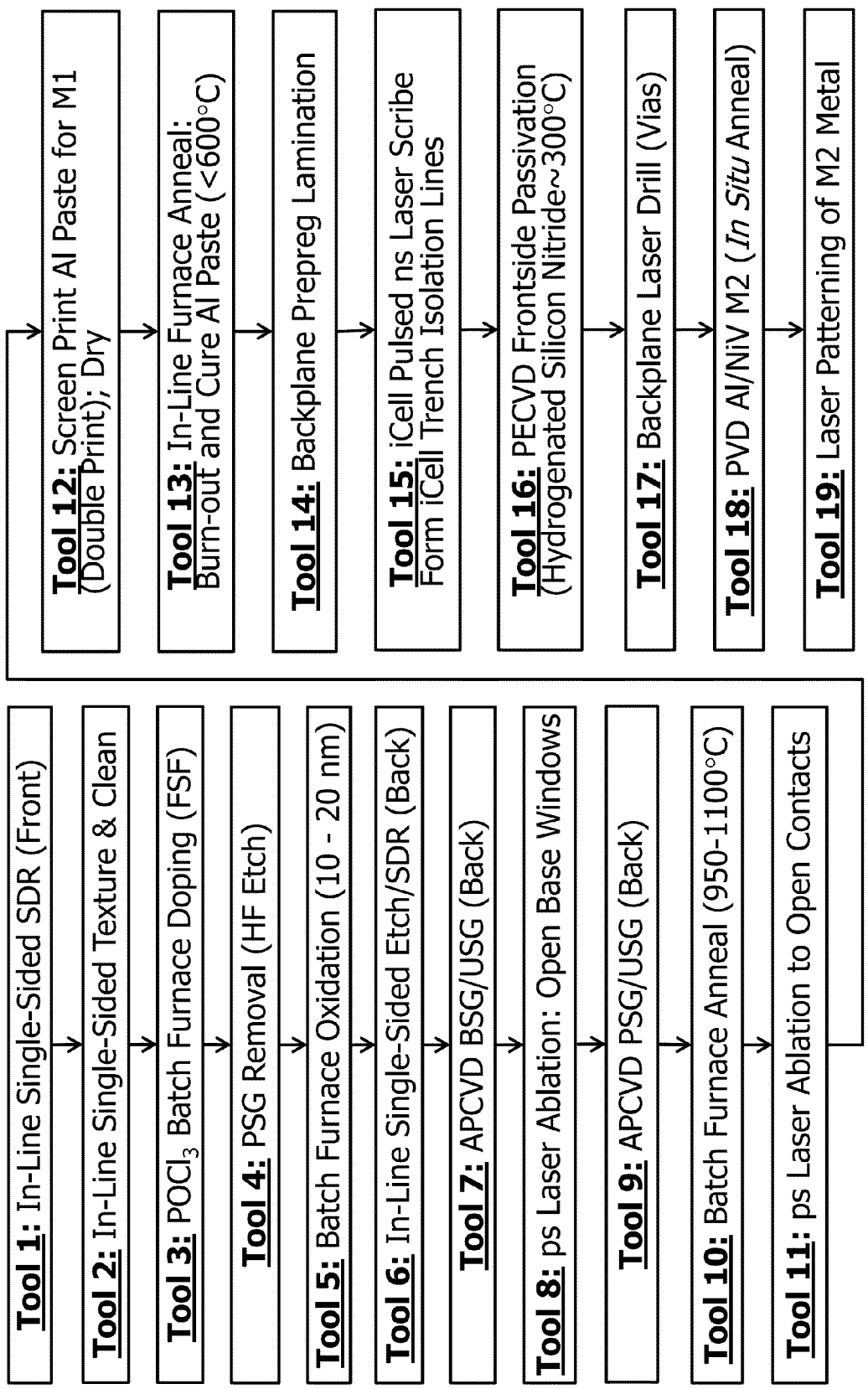
FIGS. 45 through 49 show several representative process flow embodiments for the fabrication of a backplane-attached back contact solar cell.
Figure 46:
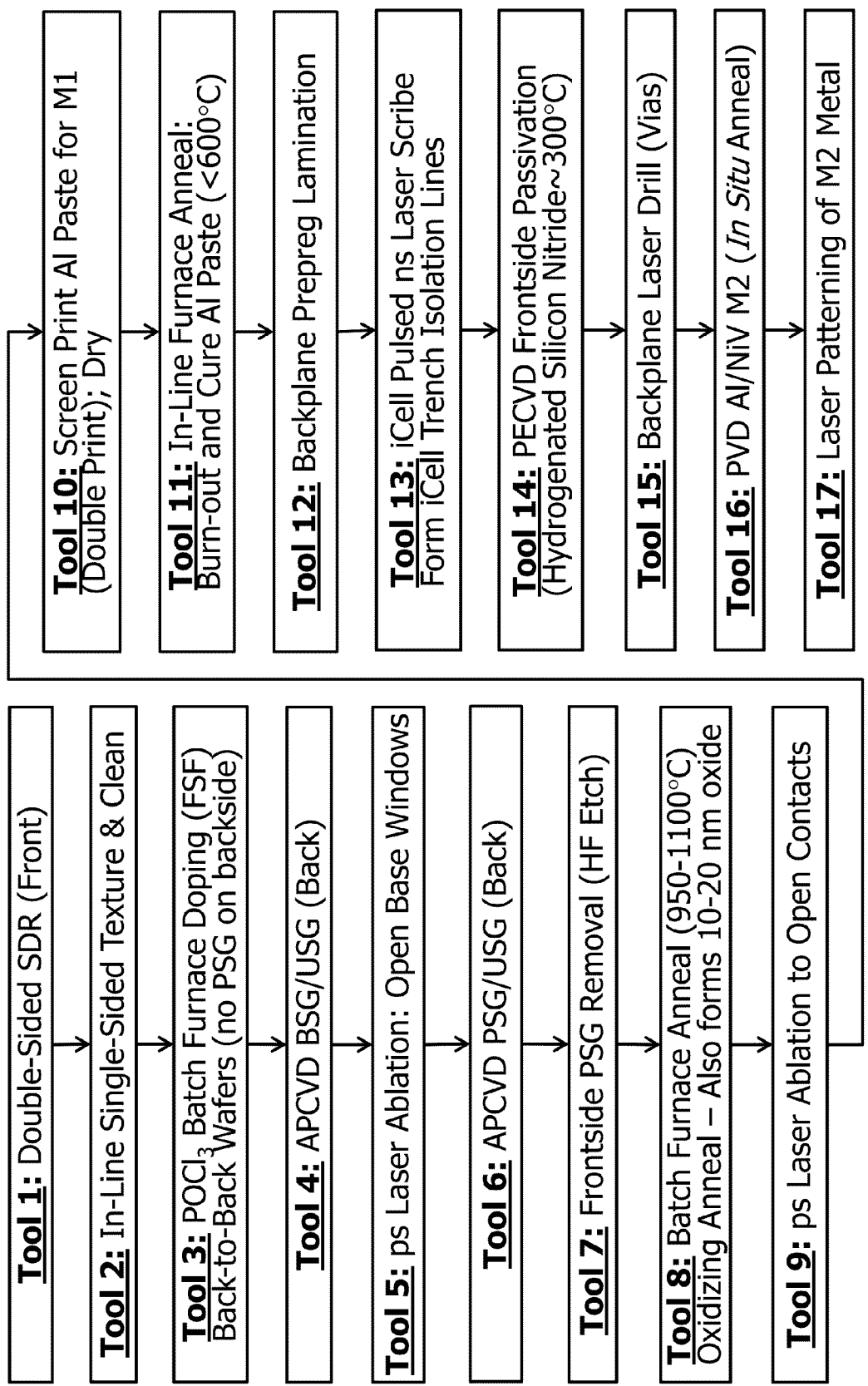
Figure 47:
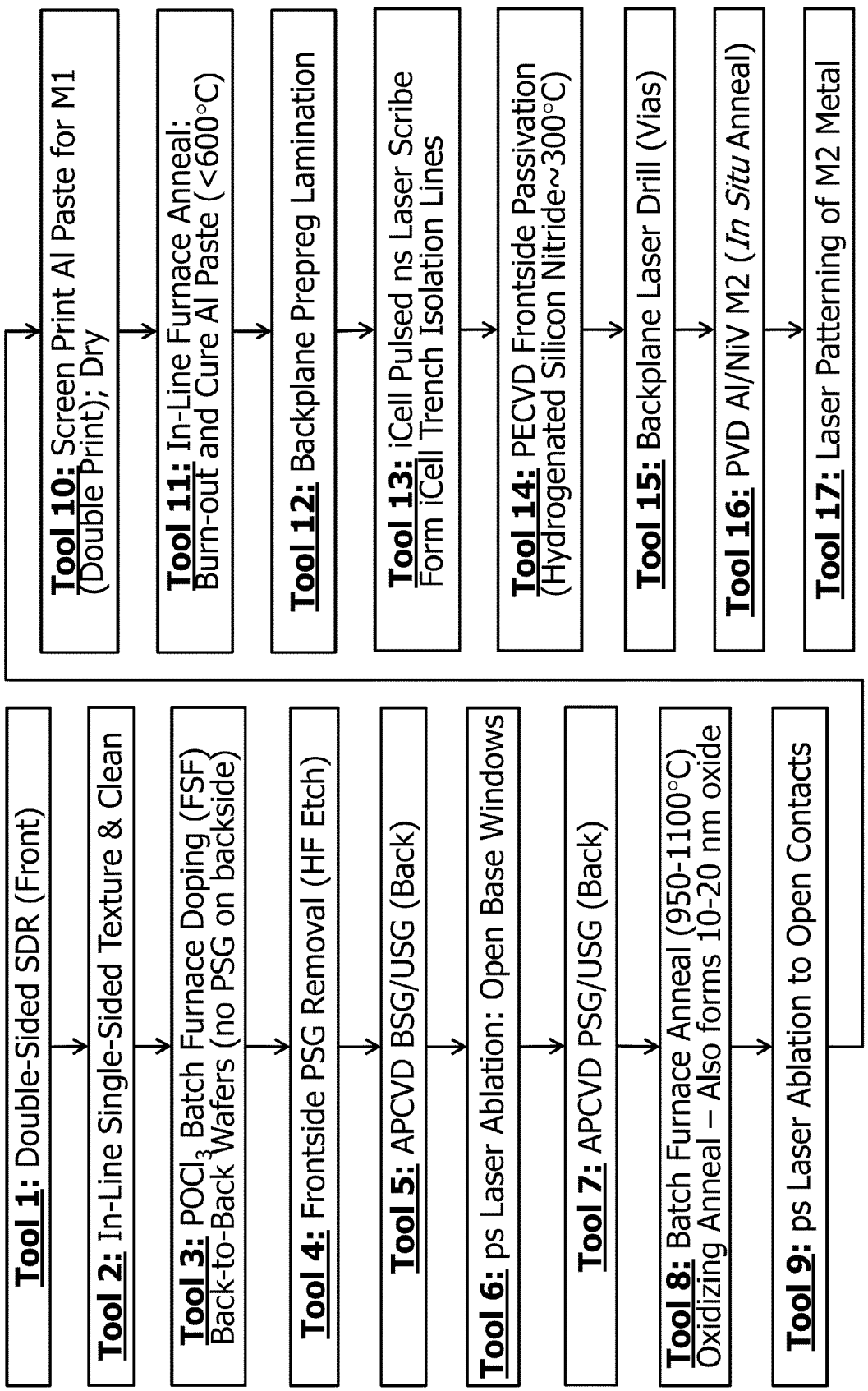
Figure 48:
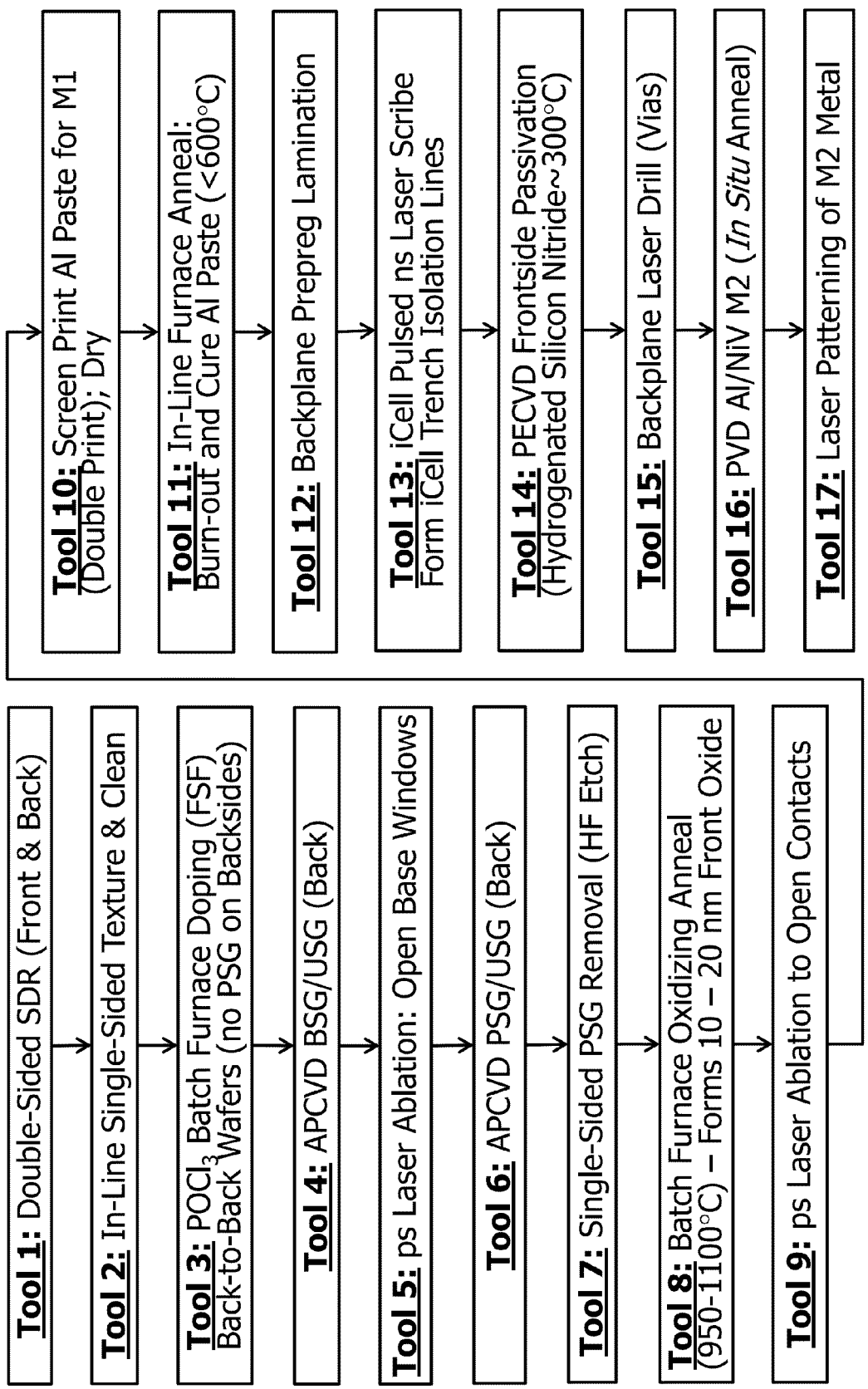
Figure 49:
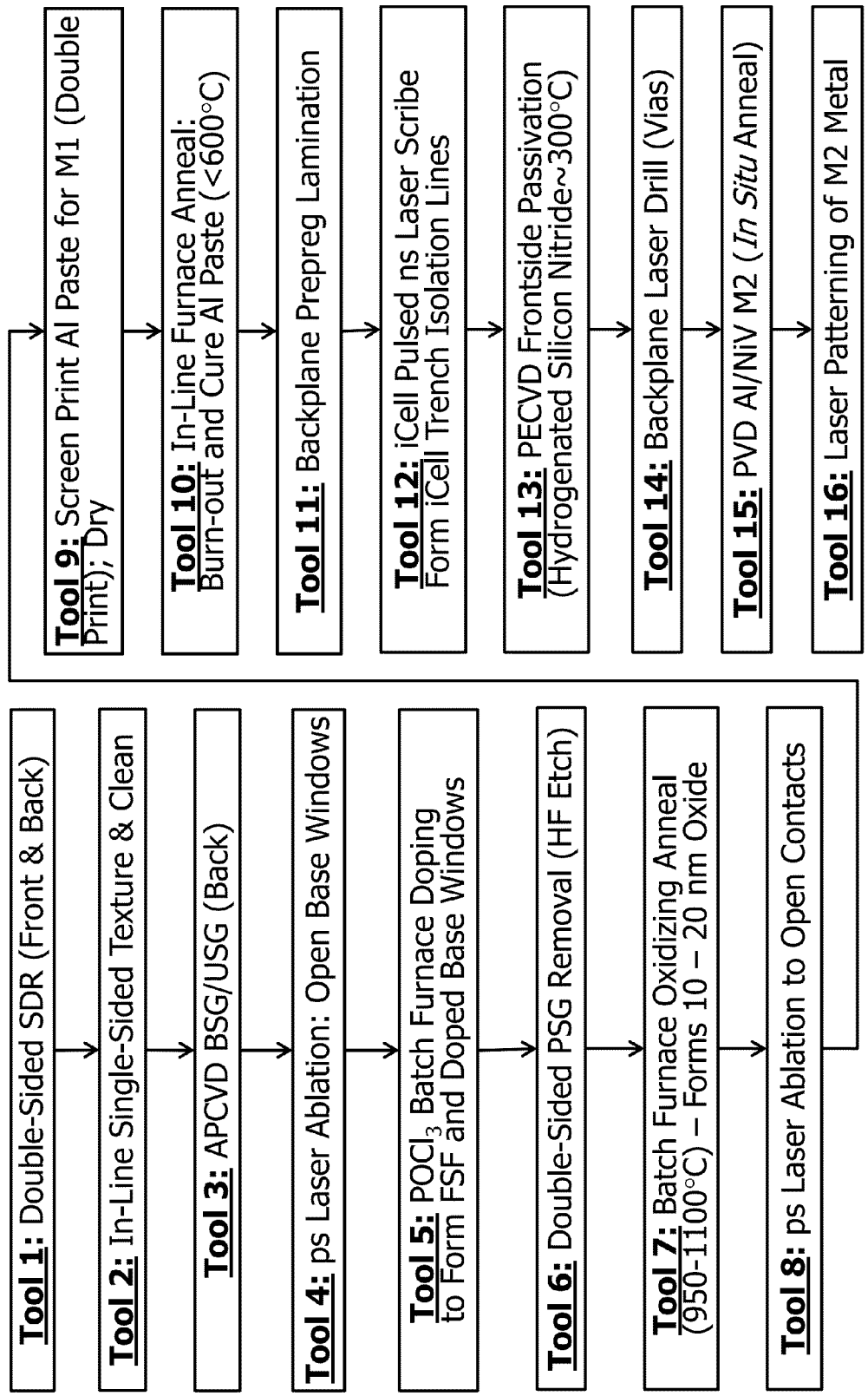

In FIGS. 45 through 49 are bulk CZ wafer back contact solar cell process flows with no selective emitter and utilizing a Top-Hat pulsed laser ablation with no laser damage removal process. FIG. 45 is a process flow utilizing two APCVDs and three furnaces. FIGS. 46 through 48 are process flows utilizing two APCVDs and two furnaces. FIG. 49 is a process flow utilizing one APCVDs and two furnaces.

While these process flows are shown without selective emitter formation, they may be extended to include selective emitter (for example by addition of one APCVD BSG and one pulsed laser ablation process steps). Key advantages of these process flow embodiments include:

No post-lamination wet chemical processing eliminates the risk of chemical attack on the backplane or delamination of the backplane.
  Doped front surface field (FSF) may be formed conformal to the frontside texture using standard phosphorus doping furnace without any constraints associated with the backplane material and without a need for pulsed laser doping for FSF.
  The five flows depicted in FIGS. 45 through 49 result in back-contact cells with thicker absorber layers (as compared to thinned silicon absorber process flows), thus they require starting wafers with relatively higher minority carrier recombination lifetimes in order to achieve same high efficiencies as the thinned silicon solar cells produced by the process flows provided above.

As noted previously, in some instances it may be desirable to remove base and emitter doping agents after formation of solar cell back side base and emitter regions and subsequently deposit a backside passivation layer. In certain solar cell fabrication process flows, such as those described herein, removing doping agents and residue (for example by etching and referred to as etch back or strip etch) post base and emitter formation (e.g., post dopant diffusion) allows for deposition of a backside passivation layer post high temperature anneal dopant processing which may mitigate and improve passivation layer quality and characteristics. In other words, the solar cell backside passivation layer is not subject to a thermal anneal for base/emitter formation (e.g., dopant drive-in), thus removing anneal temperature restraints for the passivation layer (resulting in increased passivation layer material selection options) and avoiding possible passivation layer damage caused during the base/emitter formation anneal (in some instances certain passivation layers are temperature sensitive, e.g., aluminum oxide, and may experience unfavorable effects during high temperature processing). Further, a dopant agent etch back, may also remove damage (e.g. laser damage) from the solar cell absorber itself caused during base/emitter region formation.

The base and emitter dopant etch strip methods described in detail herein provide for the low damage, high efficiency, and low cost fabrication of silicon back contact solar cells and particularly thin silicon back contact solar cells. Etch strip processes may utilize a wet etching process to remove doping layer and include, but are not limited to, wet etch using aqueous HF or vapor HF, dilute KOH, etc. Importantly, these fabrication flows perform an annealing process for base and emitter region formation before backside passivation layer deposition (e.g., a backside passivation layer such as aluminum oxide, amorphous silicon, amorphous silicon and silicon oxide, aluminum oxide and silicon oxide, or aluminum oxide and silicon nitride). Further, doping oxides, such as those shown as aluminum oxide shown as APCVD boron-doped aluminum oxide herein, may be doping oxides such as silicon oxide for example APCVD boron-doped silicon oxide depending on etchant.

Importantly, the detailed process flows provided are for descriptive purposes and one skilled in the art may combine, add or remove, alter, or move within an overall process flow the various processing steps disclosed. In other words, elements from each of these process flows may be combined together or with other known solar cell manufacturing methods. Commonalities and variations among the detailed flows may be combined, removed, or otherwise adjusted consistent with solar cell fabrication practice. The described materials, such as passivation materials (e.g., backside passivation dielectric may be aluminum oxide plus silicon oxide), dopants, and metallization materials and processes, such as etching, annealing, deposition (e.g., atmospheric pressure vapor deposition APCVD, plasma enhanced chemical vapor deposition PECVD, atomic layer deposition ALD, etc.), and contact opening processes may be substituted with known materials and processes consistent with solar cell fabrication methods. Solar cell processing factors to consider when determining process flow include, but are not limited to: tool count, capital expenditure, fabrication complexity, temperature considerations. For example, with reference to FIG. 50A replacing processing in Tool 7 (Screen Print Al/Si Paste to Form Patterned M1; Dry/Burn-off/Cure Using Integrated In-Line Furnace; In-Line Test) with a combination of the processing in Tool 8 PVD, Tool 9, and Tool 10 of FIG. 60.

Further, although not shown, additional backend processing steps such as annealing may be performed. For example, an annealing step of approximately 350° to 450° C. in, for example, forming gas, nitrogen, or a vacuum environment may be performed after frontside passivation (for example $Al_2O_3$ deposition). With reference to FIG. 50A, this annealing may be performed:

1. In Tool 12;
2. Using a separate Tool after Tool 12;
3. Integrated with Tool 14; or
4. After Tool 15

Figure 62:
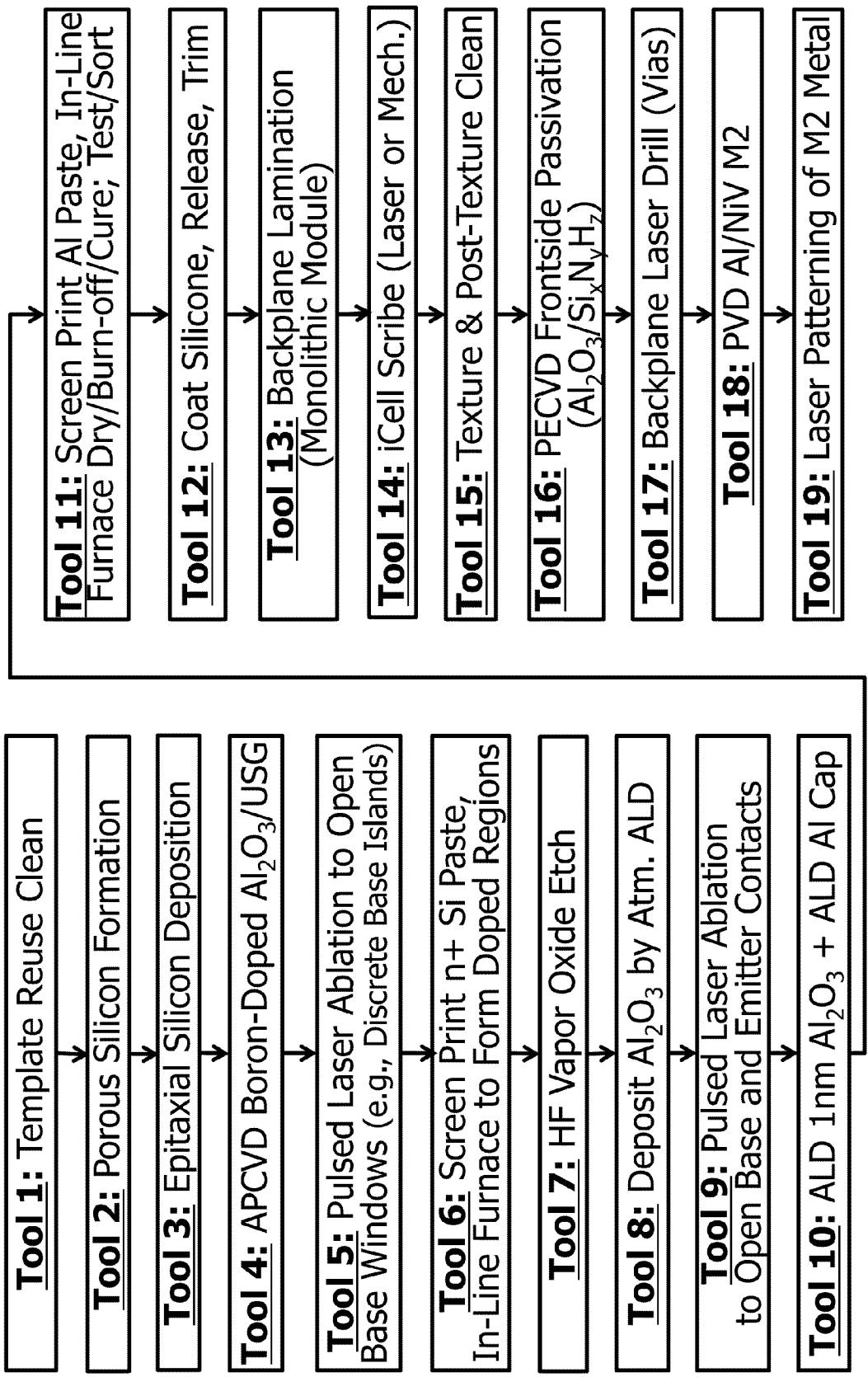
FIG. 62 is a solar cell fabrication process flow embodiment for the formation of a back contact back junction solar cell utilizing a single cascade process and tunnel contacts starting with an epitaxial thin film silicon substrate formation.

These processing methods may reduce overall tool count for both monolithic solar cells formed from bulk wafers or epitaxially grown wafers. Briefly, the process flows following may be described as: FIGS. 50 through 53 show solar cell fabrication process flow embodiments for the formation of a back contact back junction solar cell utilizing a triple print dopant paste process for field emitter, base, and emitter formation; FIGS. 54 through 56 show solar cell fabrication process flow embodiments for the formation of a back contact back junction solar cell utilizing a double print dopant paste process for base and emitter formation; FIGS. 57 through 59 show solar cell fabrication process flow embodiments for the formation of a back contact back junction solar cell utilizing a cascade process (deposition followed by patterning) forming field emitter, emitter, and base regions; FIGS. 61 and 62 show solar cell fabrication process flow embodiments for the formation of a back contact back junction solar cell utilizing a single cascade process and tunnel contacts; and FIG. 63 shows a solar cell fabrication process flow embodiment for the formation of a back contact back junction solar cell utilizing a single cascade process and tunnel contacts starting with an epitaxial thin film silicon substrate formation.

Figure 50B:
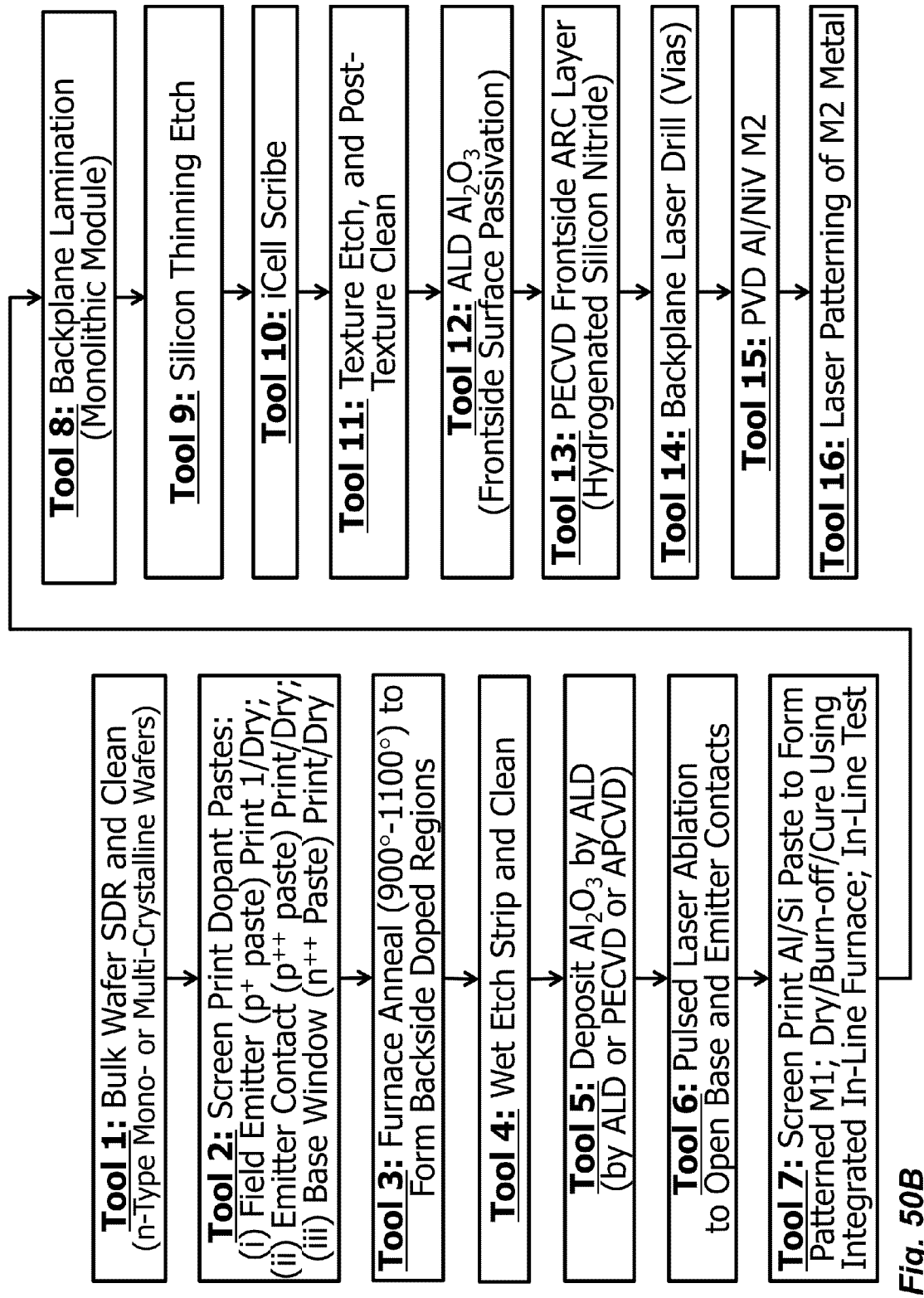
FIGS. 50A through 53 are solar cell fabrication process flow embodiments for the formation of a back contact back junction solar cell utilizing a triple print dopant paste process for field emitter, base, and emitter formation.

FIGS. 50A through 50B are solar cell fabrication process flows for the formation of a back contact back junction solar cell utilizing a triple print dopant paste process for field emitter, base, and emitter formation. In Tool 2 of FIG. 50A three dopant pastes are pattern printed on the solar cell backside: a field emitter paste, an emitter paste, and a base window (paste). For example, dopant pastes may be inkjet or screen printed among other known pattern paste deposition methods in Tool 2. For example, dopant pastes may be silicon nanoparticle pastes among other known paste compositions such as doped oxide paste. Field emitter paste, emitter paste, and base window pastes may be concurrently printed in an inkjet tool and then concurrently annealed in a single furnace tool—thus concurrently forming field emitter, emitter, and base regions on the backside surface of the solar cell. Alternatively, these pastes may be individually printed and annealed—in other words an annealing process after each individual dopant print. The solar cell back surface is then wet etch stripped and cleaned to remove remaining dopant agent and doping agent residue. A backside passivation layer is then deposited on the solar cell backside (shown as aluminum oxide but also be other passivation materials including aluminum oxide with silicon oxide). Base and emitter contacts are opened through the passivation layer to corresponding underlying base and emitter regions and additional solar cell fabrication steps may be performed.

Additional fabrication steps, as described herein and similar throughout FIGS. 50A through 63, include the formation of a first level metallization layer (M1), backplane lamination, an optional front surface thinning etch, texturization and/or clean, frontside passivation, backplane via hole formation, and the formation of a second level metallization layer (M2). iCell scribing may be performed by laser processing or mechanical cutting processes. Solar cell frontside processing may include fabrication steps consistent with the detailed flows described and steps may be deleted, added, or combined with known solar cell fabrication practice. Generally, the fabrication steps of Tools 12 to 15 in the following process flows may be combined or otherwise reduced.

FIG. 50B is a solar cell fabrication flow consistent with FIG. 50A with the silicon thinning etch, iCell cut, and texture etch and post texture clean steps performed in an alternative sequence and alternative tool combination.

Figure 51A:
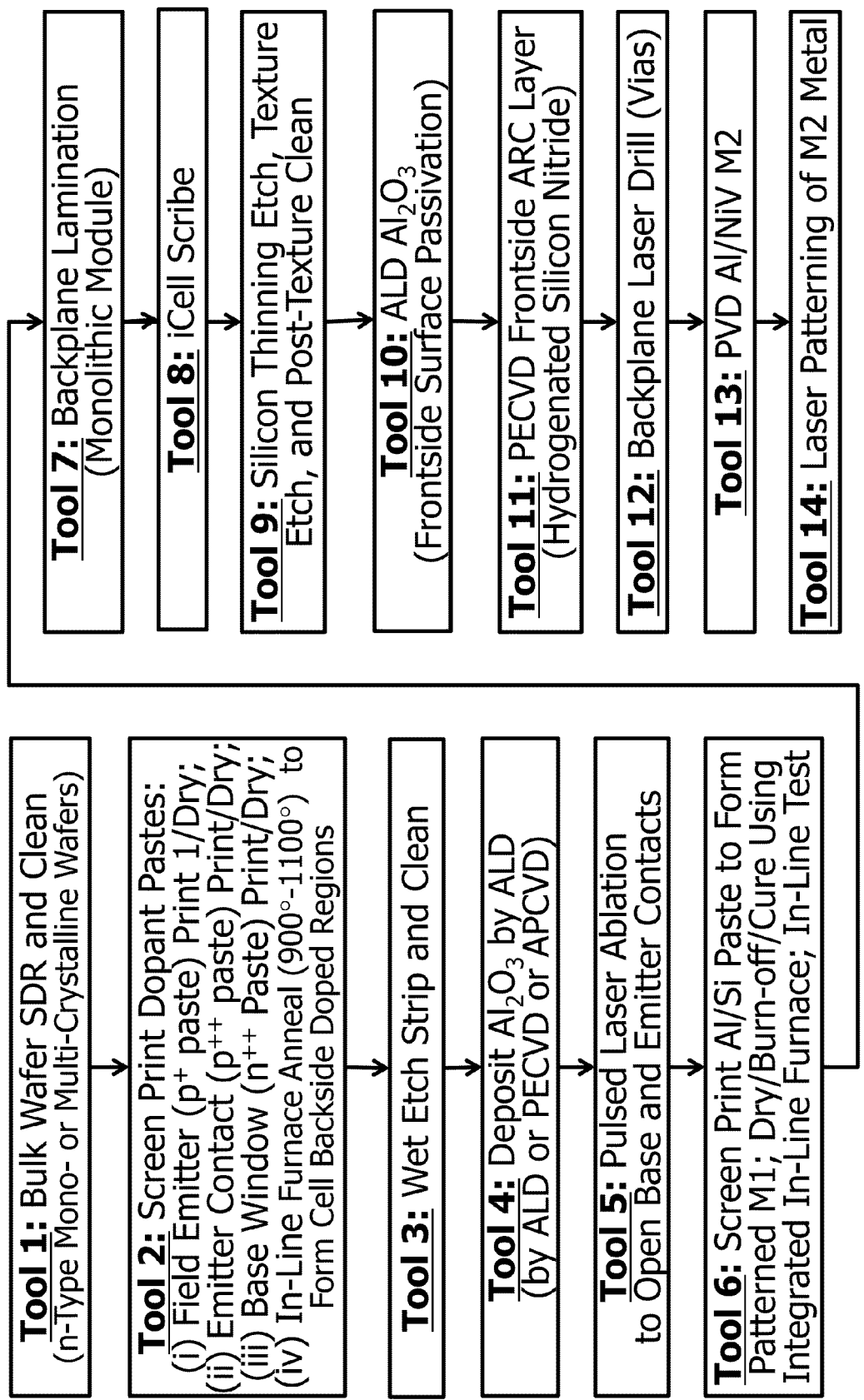
Figure 51B:
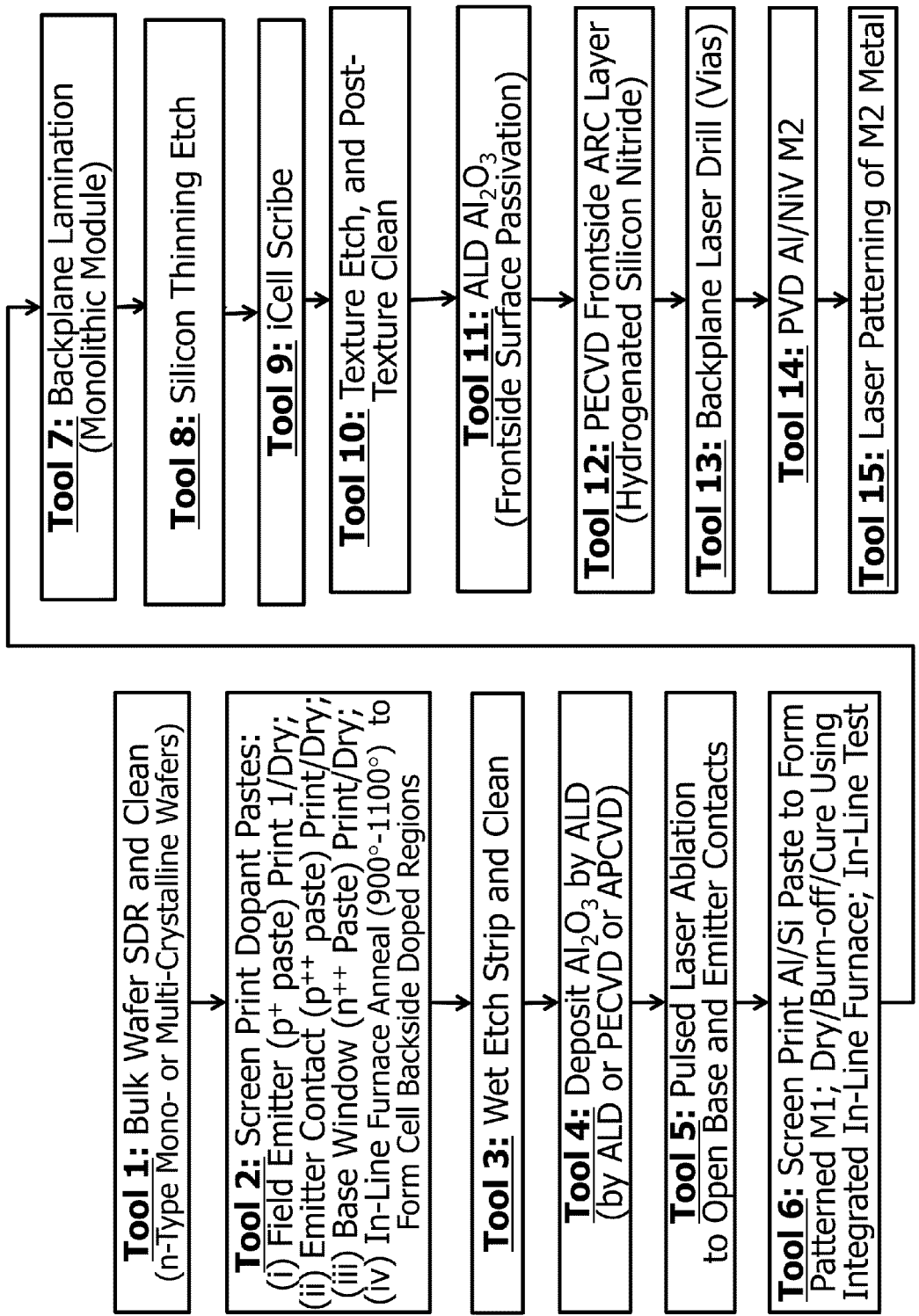

FIGS. 51A through 51B are solar cell fabrication process flows for the formation of a back contact back junction solar cell utilizing a triple print dopant paste process with an in-line furnace (e.g., in-line batch furnace) for base and emitter region formation in Tool 2. FIG. 51A is consistent with the flow of FIG. 50A with an in-line furnace anneal performed in Tool 2 along with dopant paste print. FIG. 51B is consistent with the flow of FIG. 50B with an in-line furnace anneal performed in Tool 2 along with dopant paste print.

Figure 52A:
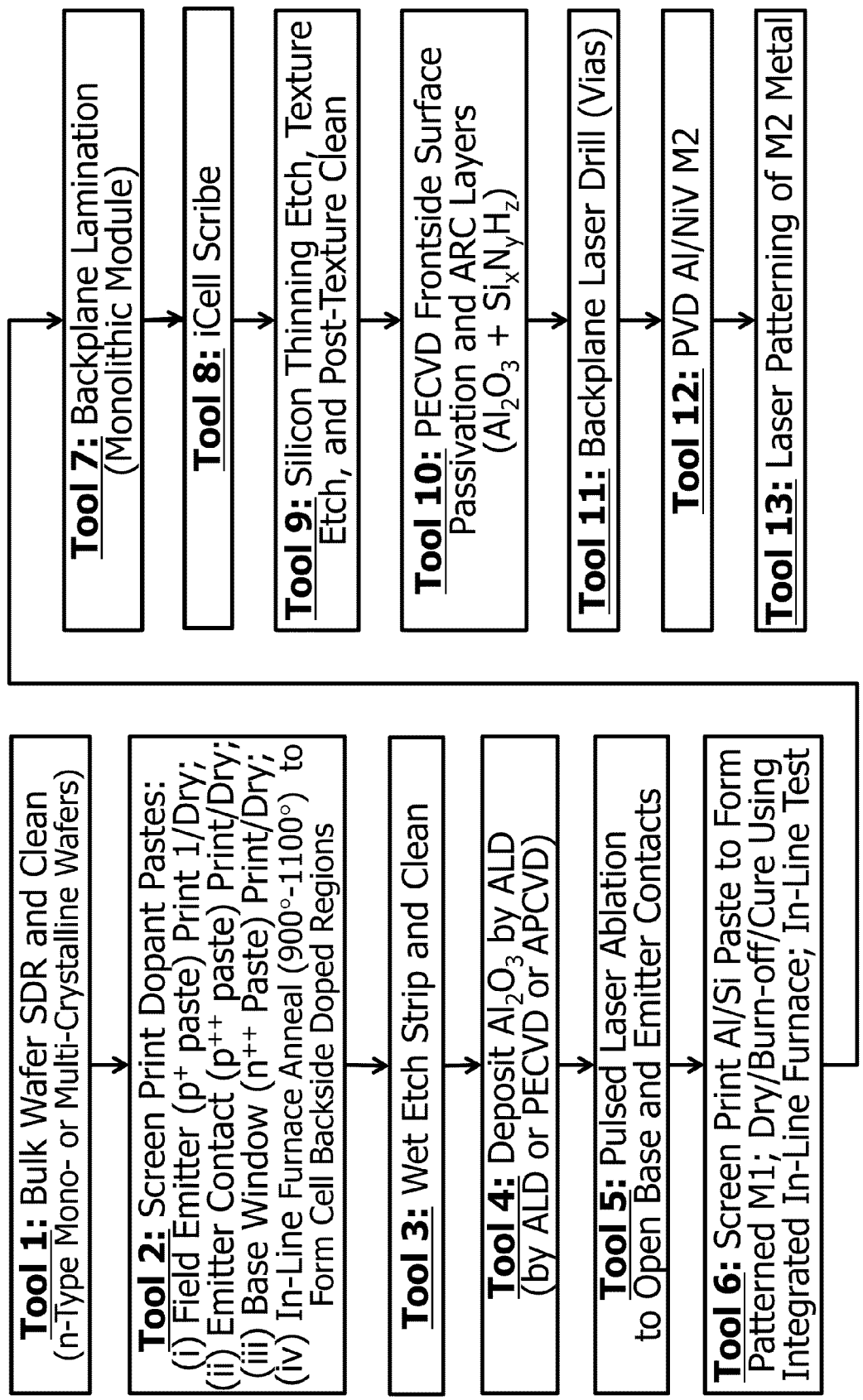
Figure 52B:
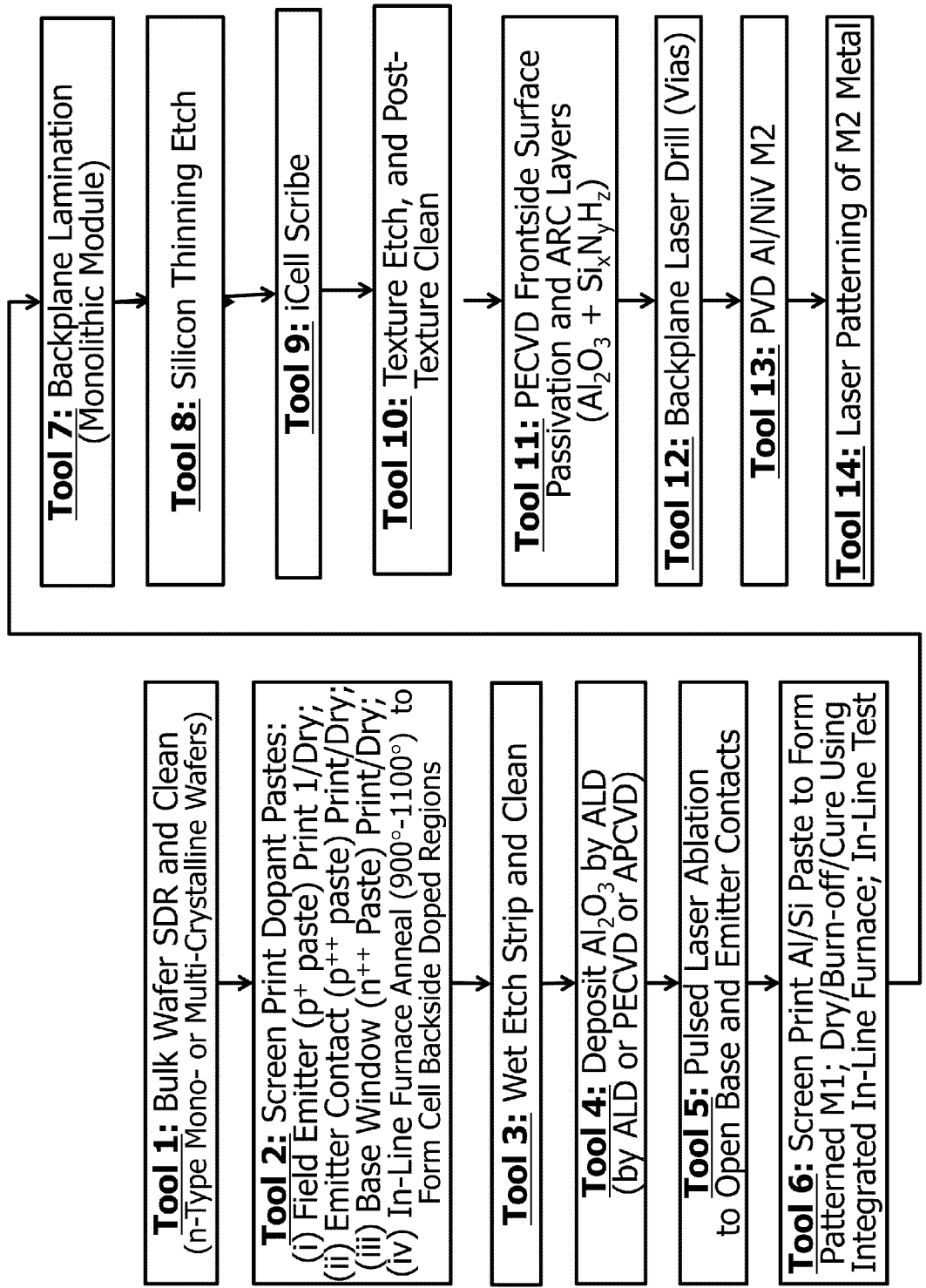

FIGS. 52A through 52B are solar cell fabrication process flows for the formation of a back contact back junction solar cell utilizing a triple print dopant paste process with an in-line furnace for base and emitter region formation in Tool 2 and dual frontside surface passivation process in Tool 10 and Tool 11, respectively. FIG. 52A is consistent with the flow of FIG. 51A with a frontside passivation step performed in Tool 10. FIG. 52B is consistent with the flow of FIG. 51B with a frontside passivation step performed in Tool 11.

Figure 53:
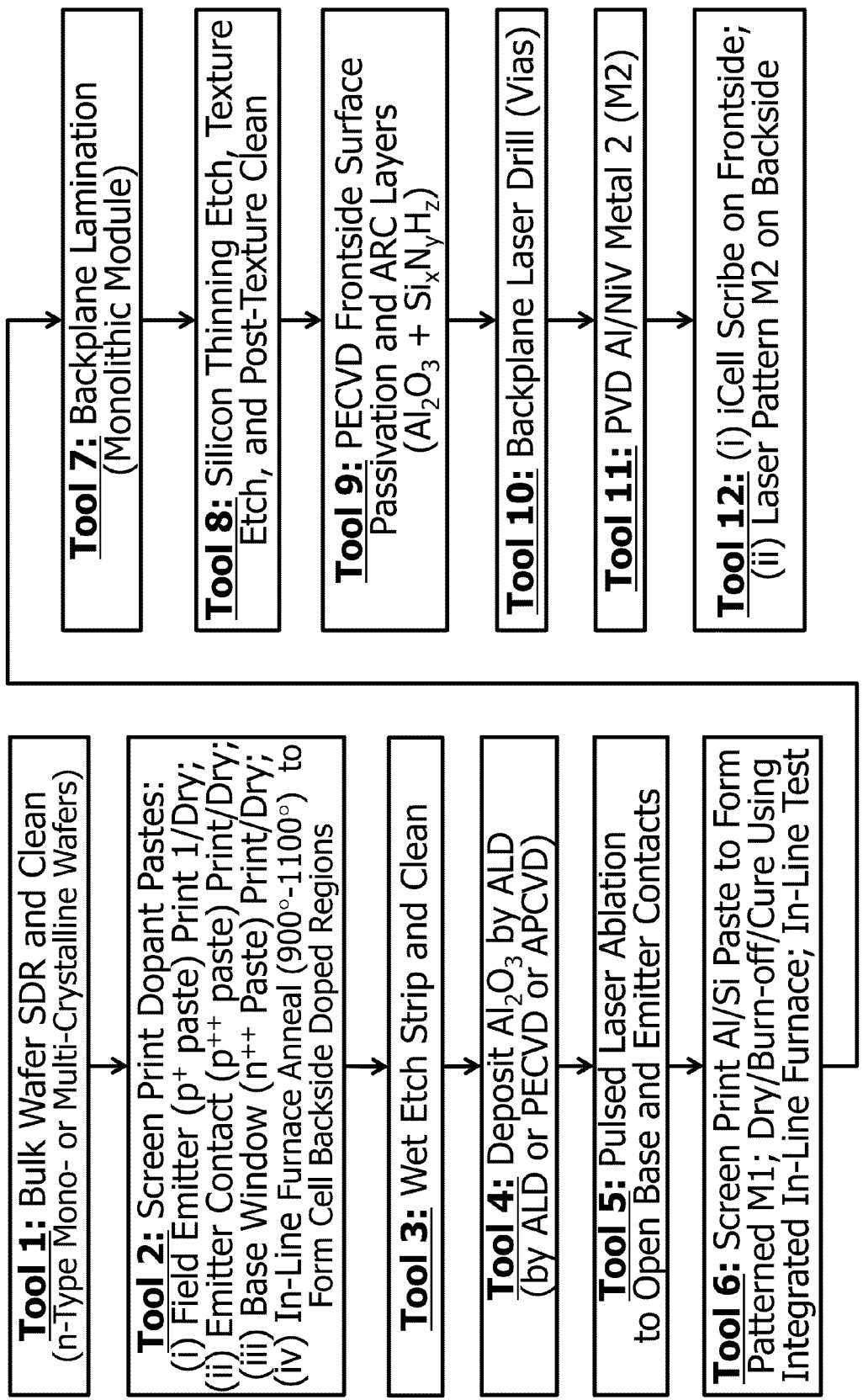

FIG. 53 is a solar cell fabrication flow consistent with FIG. 52A with the iCell cut combined with second level metallization layer patterning in Tool 12.

Figure 54A:
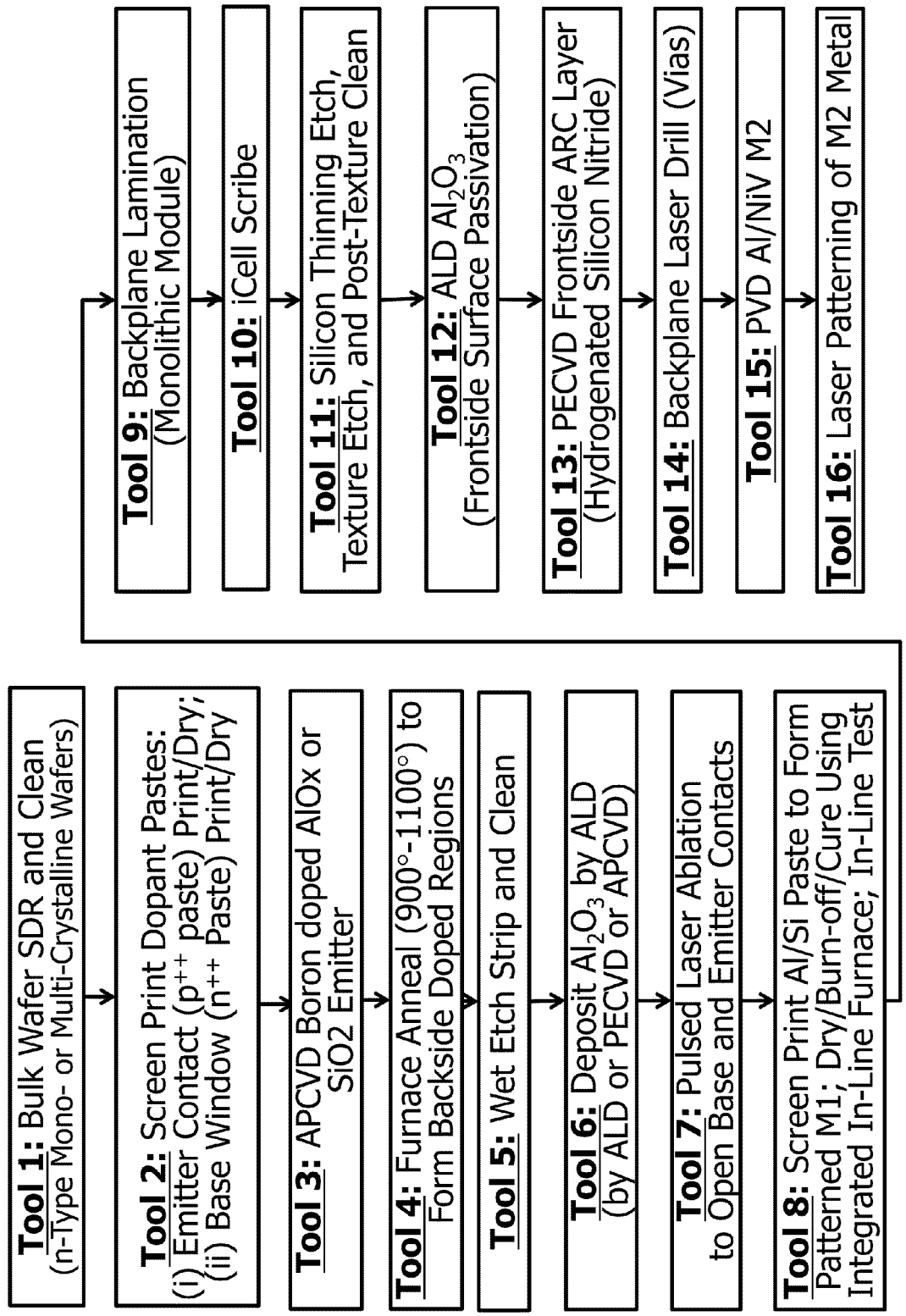
FIGS. 54A through 56B are solar cell fabrication process flow embodiments for the formation of a back contact back junction solar cell utilizing a double print dopant paste process for base and emitter formation.
Figure 54B:
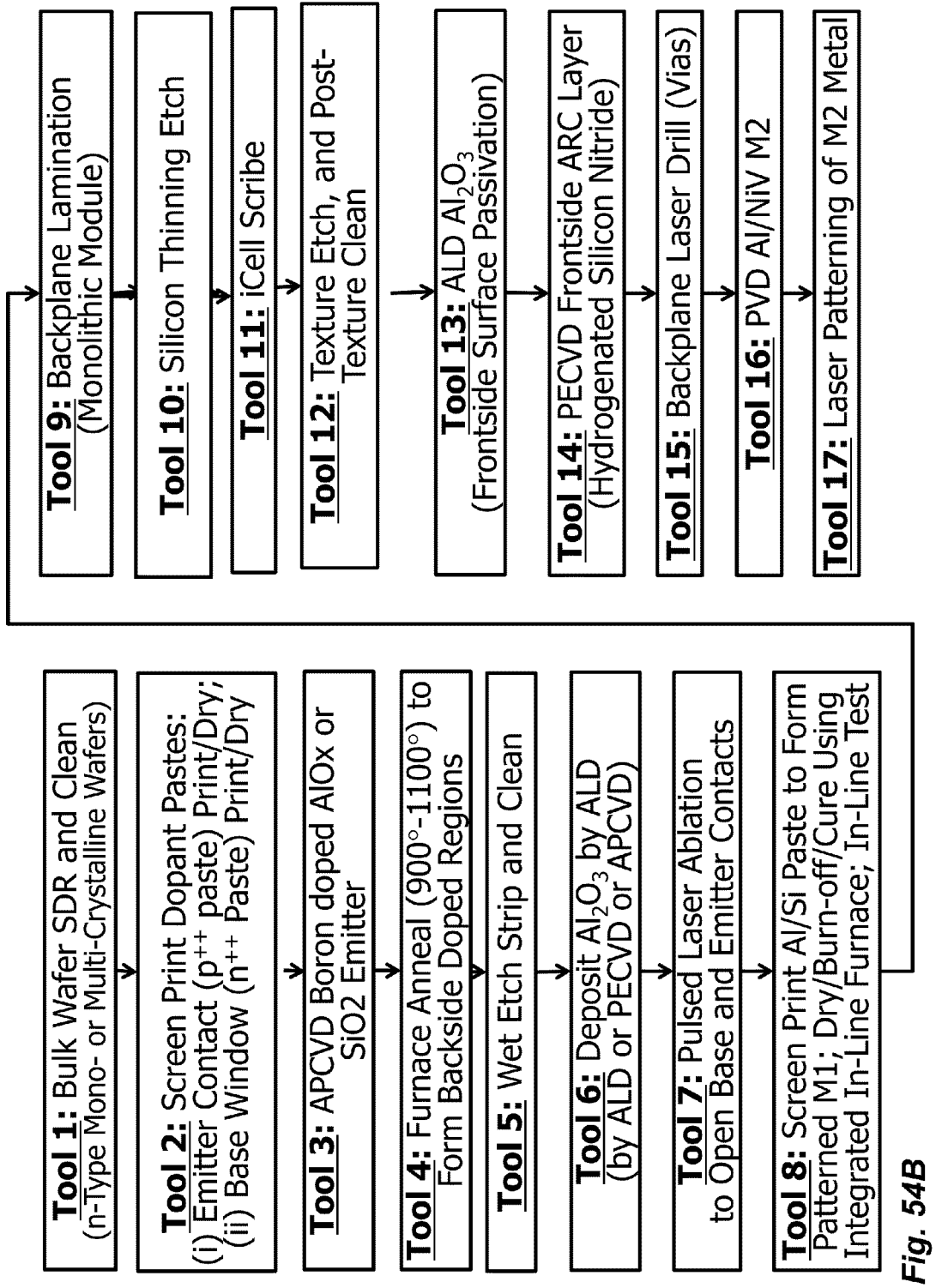

FIGS. 54A through 54B are solar cell fabrication process flows for the formation of a back contact back junction solar cell utilizing a double print dopant paste process for base and emitter formation. As compared to the base and emitter region formation portions of the flow of FIG. 50A using Tool 2, in the flow of FIG. 54A two dopant pastes are pattern printed on the solar cell backside using Tool 2: an emitter paste and a base window (paste). And a field emitter is then deposited across the cell backside using Tool 3 APCVD. Backside base and emitter regions are formed in an annealing process after which the remaining dopants are stripped and the backside surface is cleaned for the deposition of a backside passivation layer. Thus, double print embodiments may reduce the amount of dopant paste used as compared to a triple print embodiment (i.e., two paste prints of base and emitter in a double print process as compared to three paste prints of field emitter, base, and emitter in a triple print process). For example, dopant pastes may be inkjet or screen printed among other known pattern paste deposition methods in Tool 2. For example, dopant pastes may be silicon nano-particle pastes among other known paste compositions such as doped oxide paste.

FIG. 54B is a consistent with the flow of FIG. 50B and having a double print of base and emitter paste in Tool 2 and field emitter formation in Tool 3.

Figure 55A:
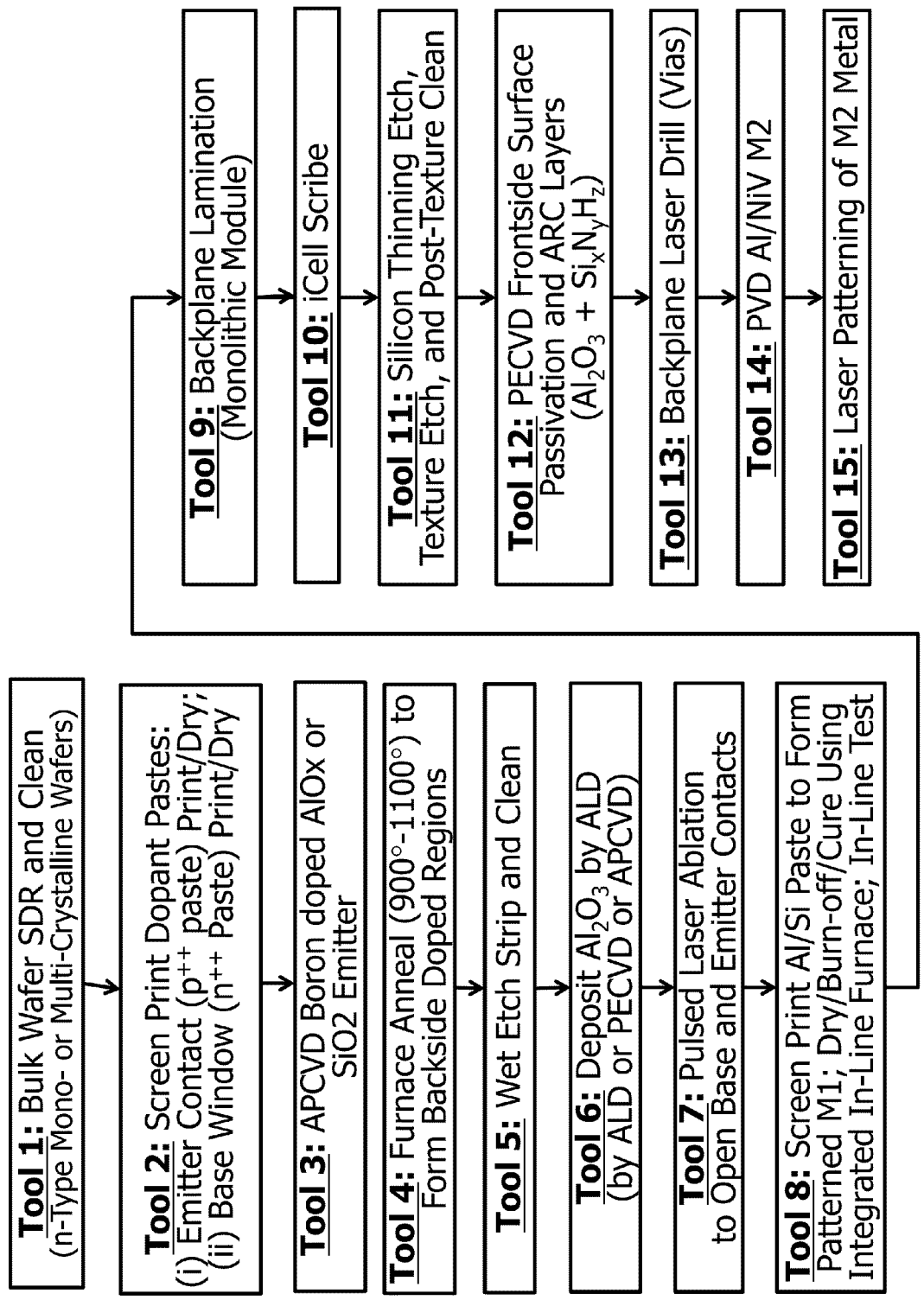
Figure 55B:
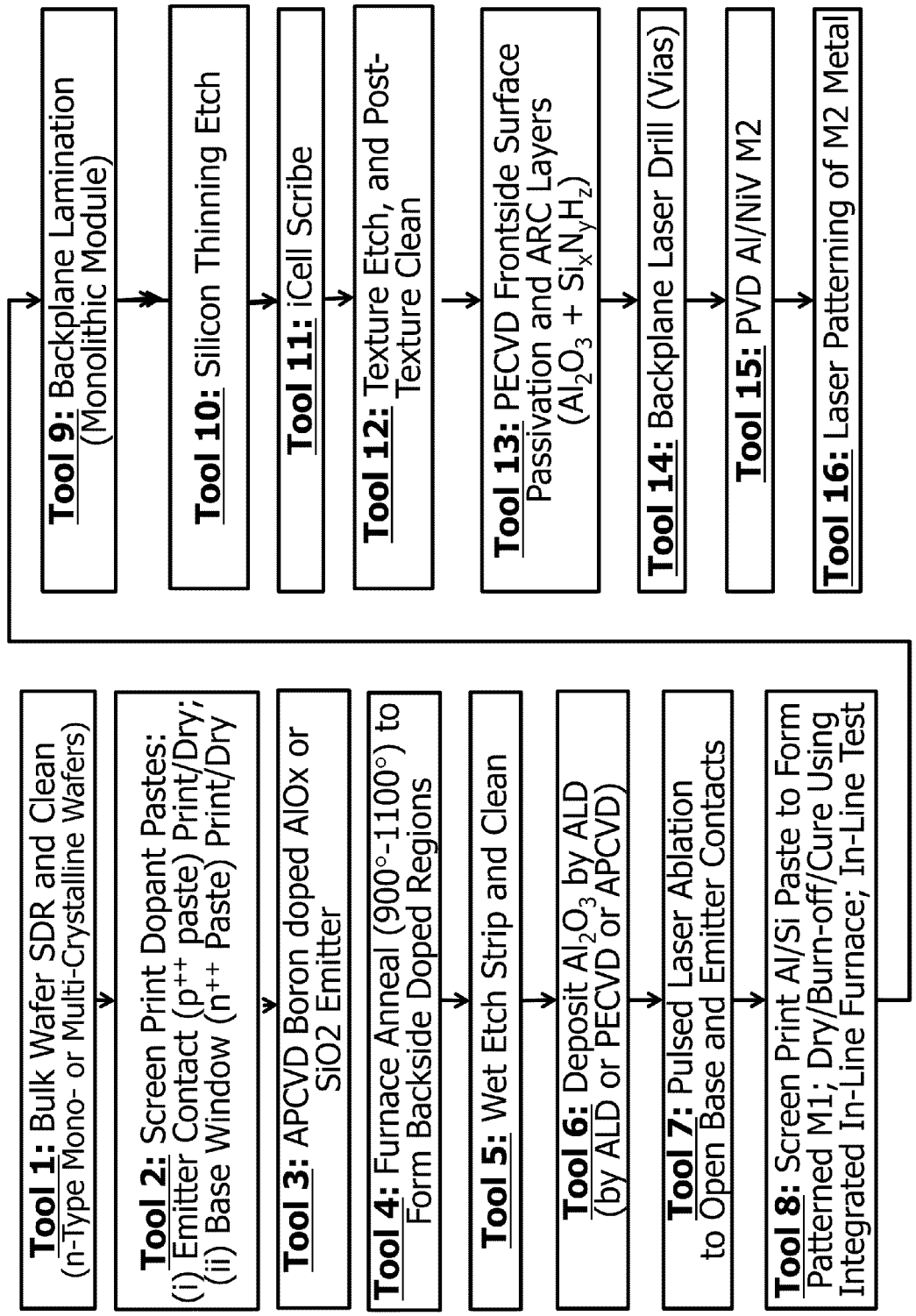

FIGS. 55A through 55B are solar cell fabrication process flows for the formation of a back contact back junction solar cell utilizing a double print dopant paste process for base and emitter region formation in Tool 2 and dual frontside surface passivation process in Tool 12 and Tool 13, respectively. FIG. 55A is consistent with the flow of FIG. 54A with a frontside passivation step performed in Tool 12. FIG. 55B is consistent with the flow of FIG. 54B with a frontside passivation step performed in Tool 13.

Figure 56A:
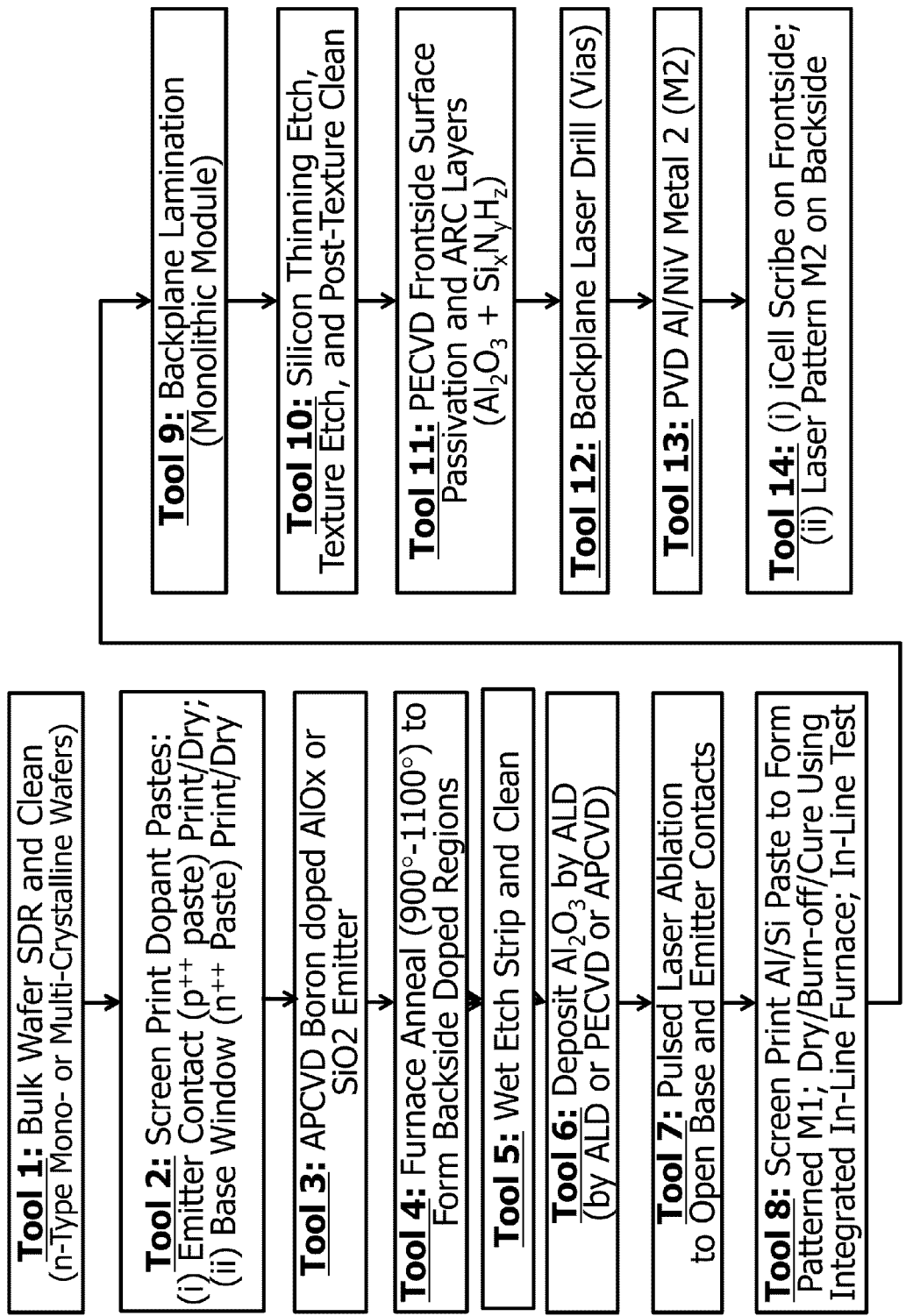

FIG. 56A is a solar cell fabrication flow consistent with FIG. 55A with the iCell cut combined with second level metallization layer patterning in Tool 14.

Figure 56B:
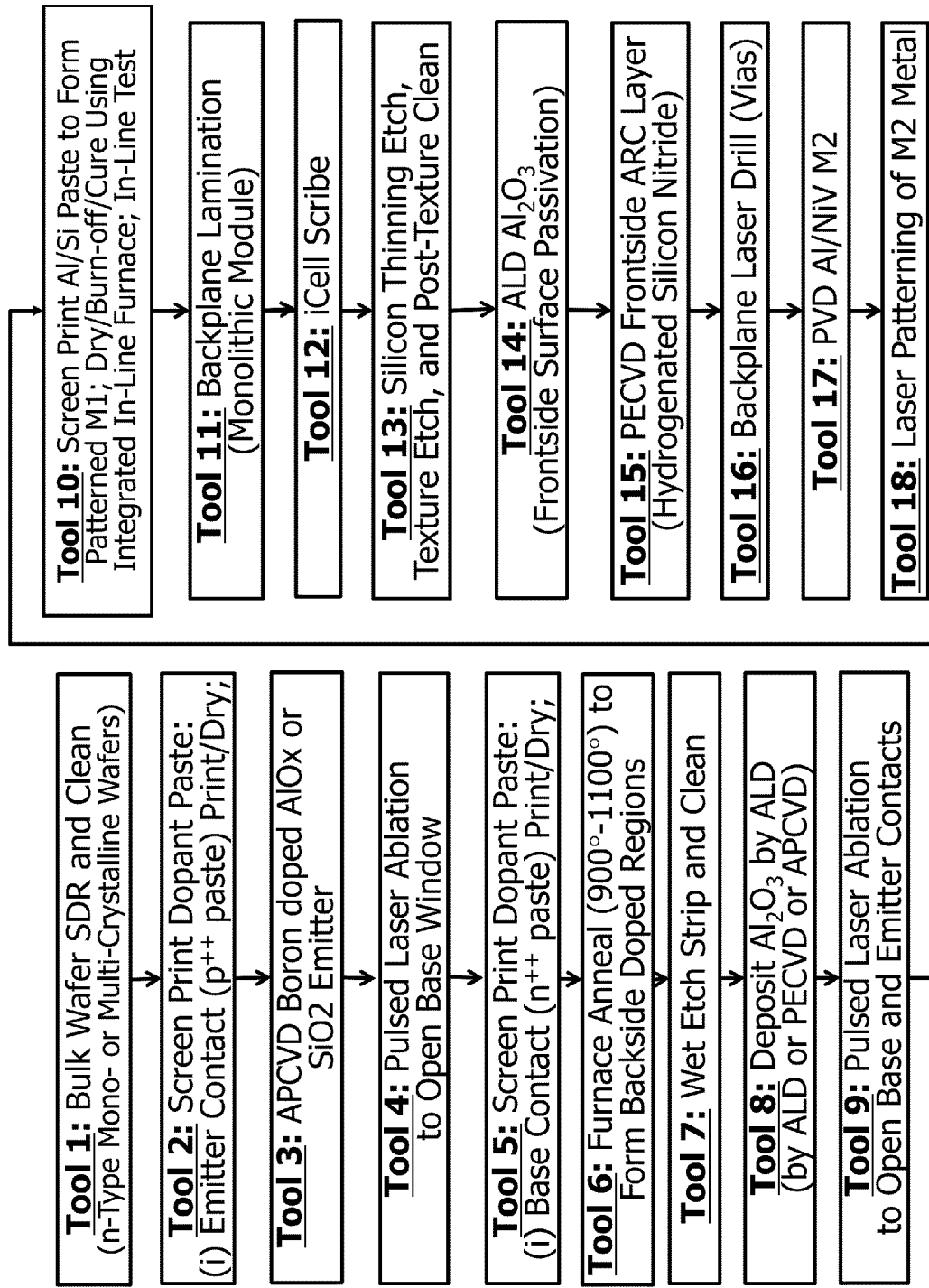

FIG. 56B is a solar cell fabrication flow consistent with FIG. 56A and having a separated double print with the addition of base window patterning. In some instances, this flow may be advantageous to reduce cross-doping of doping regions. Emitter contact dopant paste is printed in Tool 2, field emitter is deposited in Tool 3, base windows are opened in Tool 4, and base contact dopant paste is printed in Tool 5 thus physically separating the emitter contact dopant paste and based contact dopant paste by the APCVD field emitter layer.

Figure 57A:
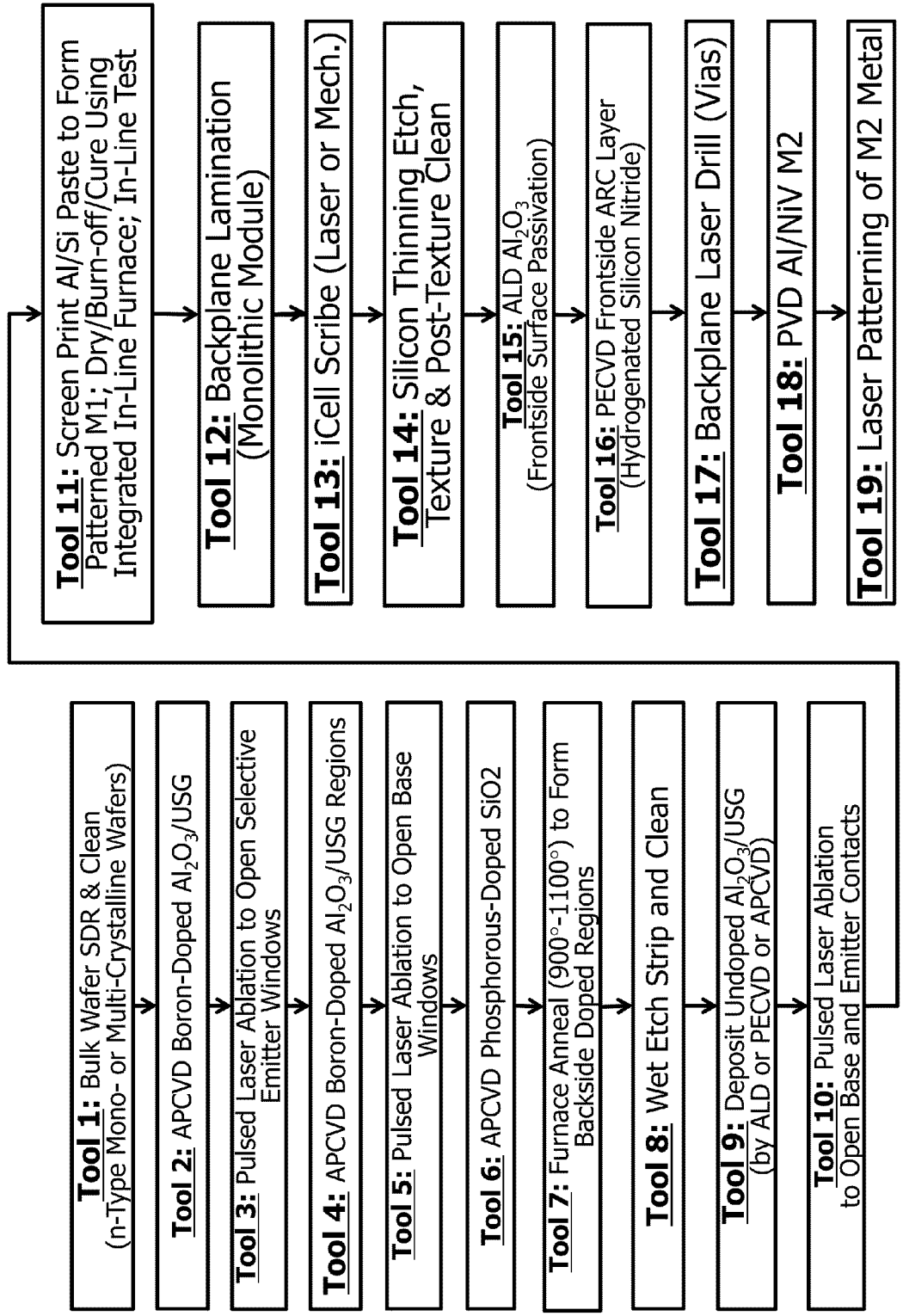
FIGS. 57A through 59 are solar cell fabrication process flow embodiments for the formation of a back contact back junction solar cell utilizing a cascade process (deposition followed by patterning) forming field emitter, emitter, and base regions.
Figure 57B:
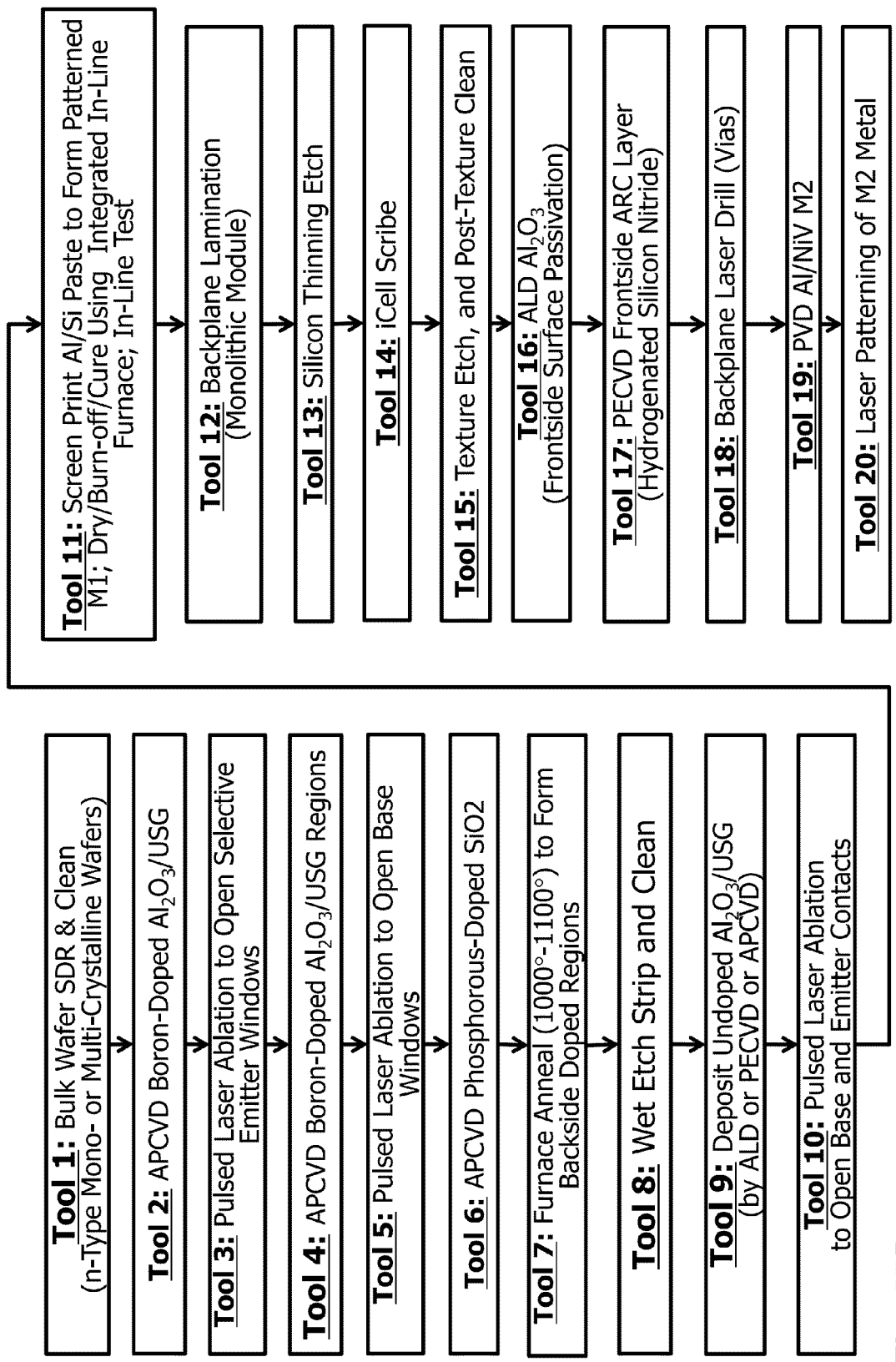

FIGS. 57A through 57B are solar cell fabrication process flows for the formation of a back contact back junction solar cell utilizing a cascade process (deposition followed by patterning) forming field emitter, emitter, and base regions (shown in Tools 2 through 6). Specifically, the process flow of FIG. 57A shows an example of an APCVD cascade dry base flow with all dry AlOx and ns laser ablation processing for base and emitter region formation. As compared to dopant paste, the cascade flows provided blanket deposit a field emitter dopant followed by patterning and blanket deposition of emitter and base dopants. A concurrent annealing step, shown in FIG. 57A as Tool 4, simultaneously forms backside base and emitter regions process after which the remaining dopants are stripped and the backside surface is cleaned for the deposition of a backside passivation layer. Considerations relating to this fabrication flow may include cost reduction as compared to a dopant paste based method, avoiding and/or reducing cross doping, an increase in the quantity of tools, and laser damage caused by laser ablation to open emitter and base solar cell backside surface regions for doping (for example Tool 3 and Tool 5 shown in FIG. 57A).

FIG. 57B is a consistent with the flow of FIG. 50B and having a cascade process (deposition followed by patterning) for field emitter, emitter, and base formation.

Figure 58A:
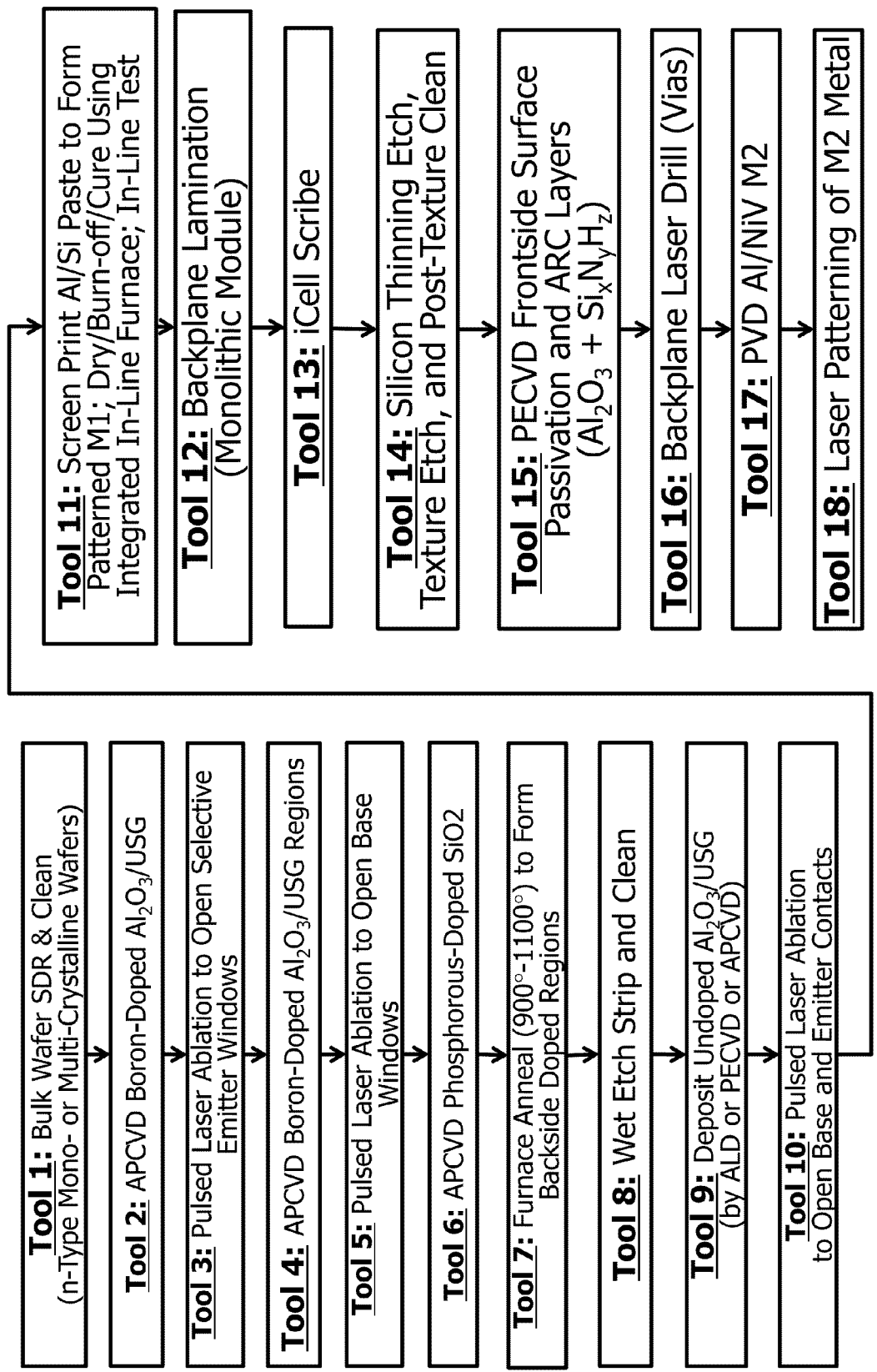
Figure 59:
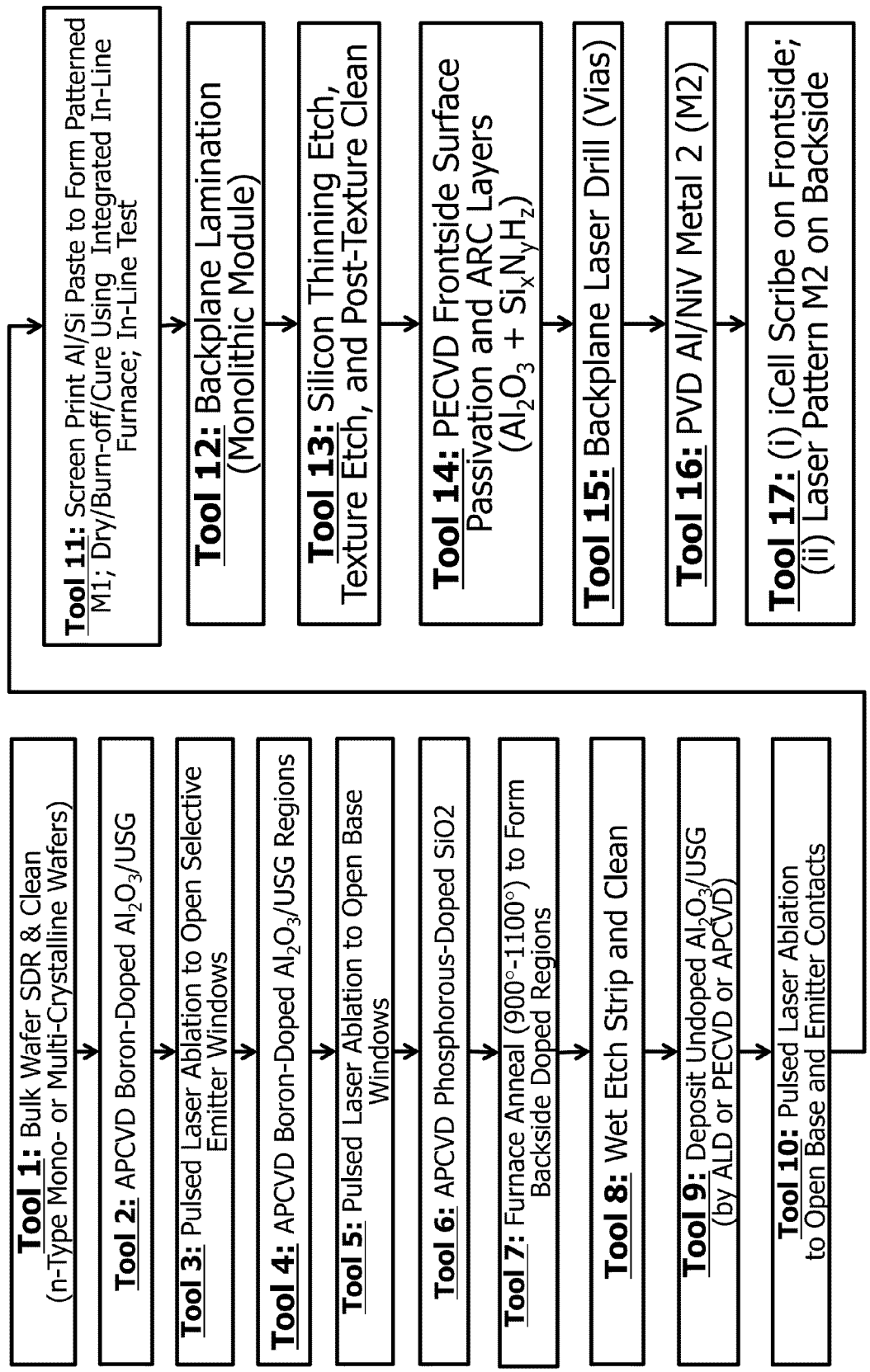

FIGS. 58A through 58B are solar cell fabrication process flows for the formation of a back contact back junction solar cell utilizing are solar cell fabrication process flows for the formation of a back contact back junction solar cell utilizing a cascade process (deposition followed by patterning) forming field emitter, emitter, and base regions in Tools 2 through 6 and dual frontside surface passivation process in Tool 15 and Tool 16, respectively. FIG. 58A is consistent with the flow of FIG. 57A with a frontside passivation step performed in Tool 15. FIG. 58B is consistent with the flow of FIG. 57B with a frontside passivation step performed in Tool 16.

FIG. 59 is a solar cell fabrication consistent with FIG. 57A with the iCell cut combined with second level metallization layer patterning in Tool 17.

FIG. 60 is a solar cell fabrication process flows for the formation of a back contact back junction solar cell utilizing a single cascade process (deposition followed by patterning) forming emitter and base regions (shown in Tools 2 through 4) and tunnel contacts (shown in Tool 8). Specifically, the process flow of FIG. 60 shows an example of an APCVD cascade single ablation tunnel contacts flow. FIG. 61 is a solar cell fabrication process flows for the formation of a back contact back junction solar cell utilizing a single cascade process (deposition followed by patterning) forming emitter regions only (shown in Tools 2 through 4) and tunnel contacts (shown in Tool 8).

FIG. 62 is a solar cell fabrication process flows for the formation of a back contact back junction solar cell utilizing a single cascade process (deposition followed by patterning) forming emitter and base regions (shown in Tools 2 through 4) and tunnel contacts (shown in Tool 8) consistent with the process flow of FIG. 60 and forming an epitaxial thin film substrate (as compared to the staring wafer of the fabrication flow shown in FIG. 60). HF vapor etch in Tool 7 eliminates wet processing. Al cap in Tool 10 may not be required.

The tunnel contact fabrication process flows of FIGS. 60 through 62 may in some instances provide several advantages. For example: a minimum number of materials introduced into the solar cell structure and fabrication flow (as shown only Al2O3 used for surface and junction passivation) thus decreasing complexity; no selective emitter (i.e., non-selective emitters and no field emitter) for reduced process flow complexity and cost in the primary flow; high-quality rear surface passivation by stripping the doping layers and subsequently depositing a high-quality rear passivation comprising Al2O3; and highest thermal budget after backside passivation and contact junction passivation deposition may be the M2 PVD thermal budget (~325° C.).

Further, thin PVD Al may eliminate paste firing thermal budget risk to the rear side passivation. This has several major advantages and benefits including: high quality ohmic contacts to both n and p regions (superior to Ni inkjet print); ability to deposit tunnel aluminum oxide in situ in the PVD chamber, hence, no added tool for heterojunction contacts (tunnel Al2O3 is used for both n-type and p-type contacts) resulting in lower cost; very low contact resistance and near-bulk resistivity of PVD Al enables reduction of the number of via holes improves capital efficiency (less number of via hole laser drilling tools); no NiV capping layer may result in no requirement for metal laser ablation (highly reflective PVD Al is an excellent stopping layer for CO2 via drill process); and Al M1 patterned using simple screen print wet etch (in dilute HCl).

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for making a back contact back junction solar cell, comprising:
    printing a first patterned field emitter paste on the back surface of a solar cell substrate, said patterned field emitter paste having a doping polarity opposite said solar cell substrate doping polarity;
    printing a second patterned emitter paste on said back surface of said solar cell substrate, said patterned emitter paste having a doping polarity opposite said solar cell substrate;
    forming a patterned base paste on said back surface of said solar cell substrate, said patterned base paste having a doping polarity the same as said solar cell substrate doping polarity;
    annealing said solar cell substrate, concurrently forming field emitter regions corresponding to said first patterned field emitter paste, emitter contact regions corresponding to said second patterned emitter paste, and base contact regions corresponding to said patterned base paste;
    etching said first patterned field emitter paste, said second patterned emitter paste, and said patterned base paste;
    depositing a backside passivation layer on said back surface of said solar cell;
    opening contacts to said emitter contact regions and said base contact regions through said backside passivation layer; and
    forming patterned base metallization and patterned emitter metallization making electrical interconnections to said base contact regions and said emitter contact regions.

2. The method for forming a back contact back junction solar cell of claim 1, wherein said first patterned field emitter paste, said second patterned emitter paste, and said base paste are silicon nanoparticle pastes.

3. The method for forming a back contact back junction solar cell of claim 1, wherein said backside passivation layer is aluminum oxide.

4. A method for making a back contact back junction solar cell, comprising;
    printing a patterned emitter contact paste on a back surface of a solar cell substrate, said patterned emitter contact paste having a doping polarity opposite said solar cell substrate doping polarity;
    forming a patterned base contact paste on said back surface of said solar cell substrate, said patterned base contact paste having a doping polarity the same as said solar cell substrate doping polarity;
    depositing a field emitter doped oxide covering said back surface of said solar cell substrate, said patterned emitter paste, and said patterned base paste, said field emitter doped oxide having a doping polarity opposite said solar cell substrate doping polarity;
    annealing said solar cell substrate concurrently forming field emitter regions corresponding to said field emitter doped oxide, emitter contact regions corresponding to said patterned emitter paste, and base contact regions corresponding to said patterned base paste;
    etching said field emitter doped oxide, said patterned emitter contact paste, and said patterned base contact paste;
    depositing a backside passivation layer on said back surface of said solar cell;
    opening contacts to said emitter contact regions and said base contact regions through said backside passivation layer; and
    forming patterned base metallization and patterned emitter metallization with electrical interconnections to said base contact regions and said emitter contact regions.

5. The method for forming a back contact back junction solar cell of claim 4, wherein said emitter contact paste and said base contact paste are silicon nanoparticle pastes.

6. The method for forming a back contact back junction solar cell of claim 4, wherein said field emitter doped oxide is deposited using an APCVD process.

7. The method for forming a back contact back junction solar cell of claim 4, wherein said field emitter doped oxide comprises aluminum oxide.

8. The method for forming a back contact back junction solar cell of claim 4, wherein said field emitter doped oxide comprises boron-doped silicon oxide.

9. The method for forming a back contact back junction solar cell of claim 4, wherein said backside passivation layer is aluminum oxide.

* * * * *